United States Patent
Hashimoto et al.

(10) Patent No.: US 7,635,653 B2
(45) Date of Patent: Dec. 22, 2009

(54) METHOD OF FABRICATING A SEMICONDUCTOR CIRCUIT HAVING A PLURALITY OF MOS TRANSISTORS AND FLASH MEMORY

(75) Inventors: Hiroshi Hashimoto, Kawasaki (JP); Koji Takahashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 291 days.

(21) Appl. No.: 11/134,419

(22) Filed: May 23, 2005

(65) Prior Publication Data

US 2007/0093027 A1 Apr. 26, 2007

Related U.S. Application Data

(62) Division of application No. 09/960,399, filed on Sep. 24, 2001, now abandoned.

(30) Foreign Application Priority Data

Jun. 21, 2001 (JP) .............................. 2001-188186

(51) Int. Cl.
*H01L 21/31* (2006.01)
*H01L 21/469* (2006.01)
(52) U.S. Cl. .............................. 438/766; 257/E21.625
(58) Field of Classification Search .......... 257/E21.625; 438/766
See application file for complete search history.

(56) References Cited

U.S. PATENT DOCUMENTS

| 5,472,892 | A | 12/1995 | Gwen et al. ................. 257/316 |
| 5,788,871 | A * | 8/1998 | Huh ............................. 216/84 |
| 6,198,140 | B1 | 3/2001 | Muramoto et al. .......... 257/392 |
| 6,265,739 | B1 | 7/2001 | Yaegashi et al. ............. 257/296 |
| 6,380,020 | B1 * | 4/2002 | Shimizu ...................... 438/225 |

FOREIGN PATENT DOCUMENTS

| JP | 05-308128 | 11/1999 |
| JP | 2000-349164 | 12/2000 |

OTHER PUBLICATIONS

Kamgar, A., et al., "Impact of nitrogen implant prior to the gate oxide growth on transient enhanced diffusion", Dec. 7-10, 1997, IEDM 1997, p. 695-8.*

* cited by examiner

*Primary Examiner*—Howard Weiss
(74) *Attorney, Agent, or Firm*—Kratz, Quintos & Hanson, LLP

(57) ABSTRACT

A semiconductor integrated circuit that includes thereon a flash memory and a plurality of MOS transistors using different power supply voltages is formed by a process in which a thermal oxidation process is applied to one of the device regions while covering the other device regions by an oxidation-resistant film.

14 Claims, 118 Drawing Sheets

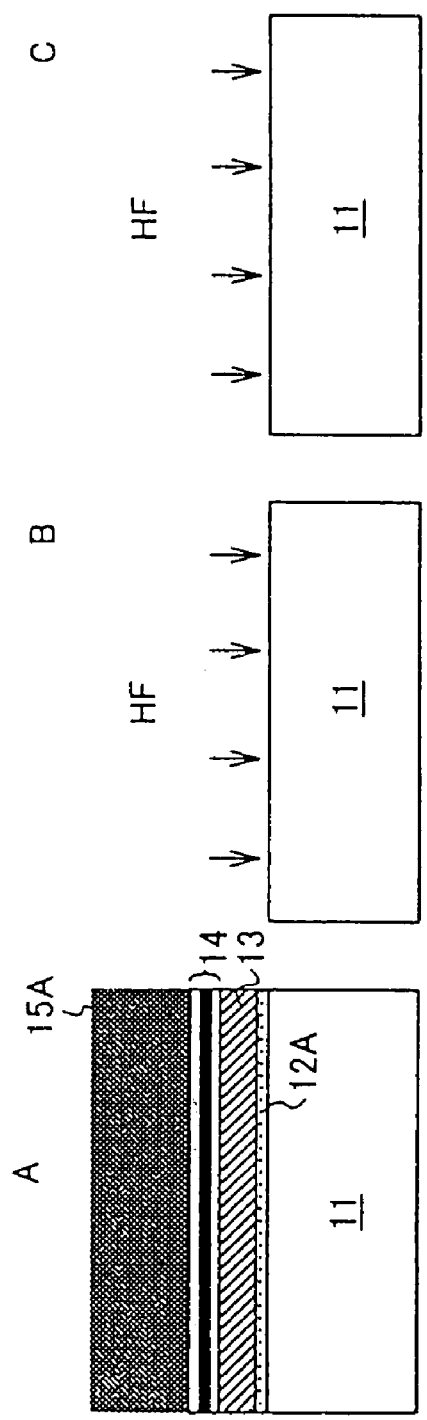
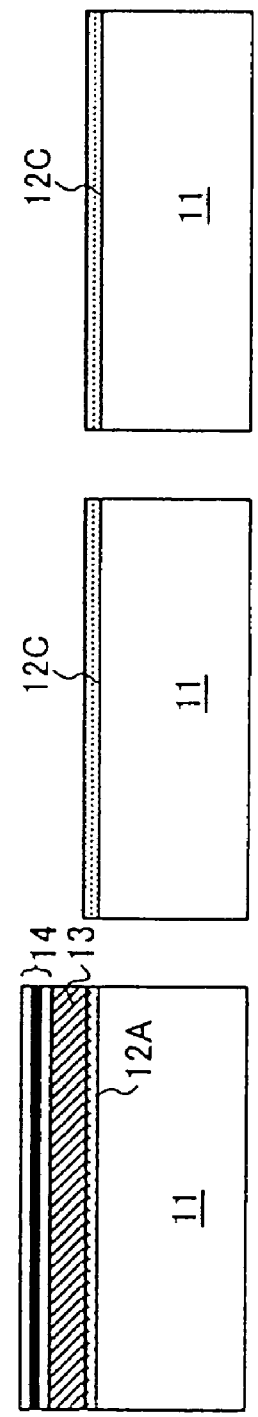
FIG. 1C PRIOR ART
FIG. 1D PRIOR ART

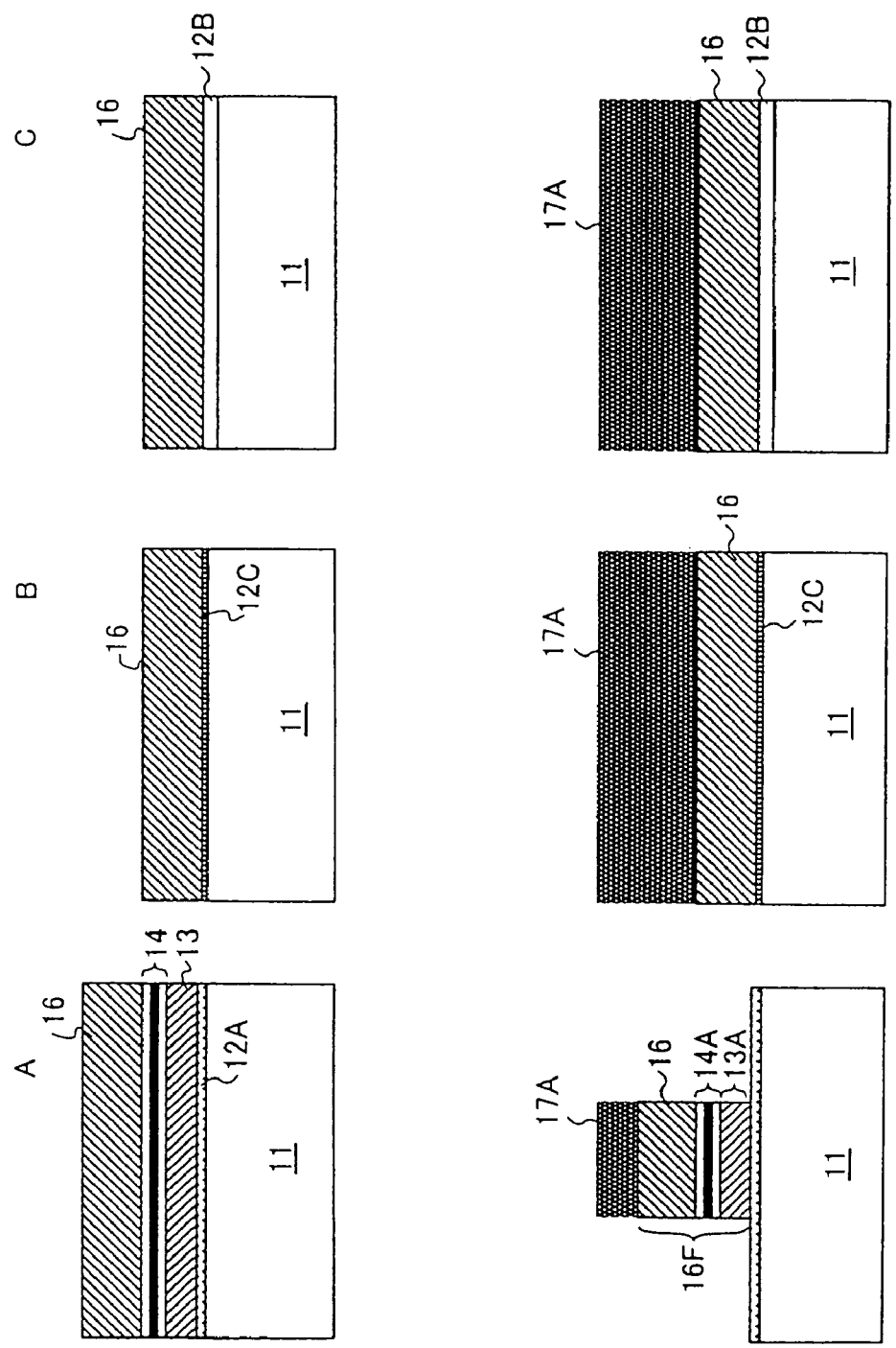

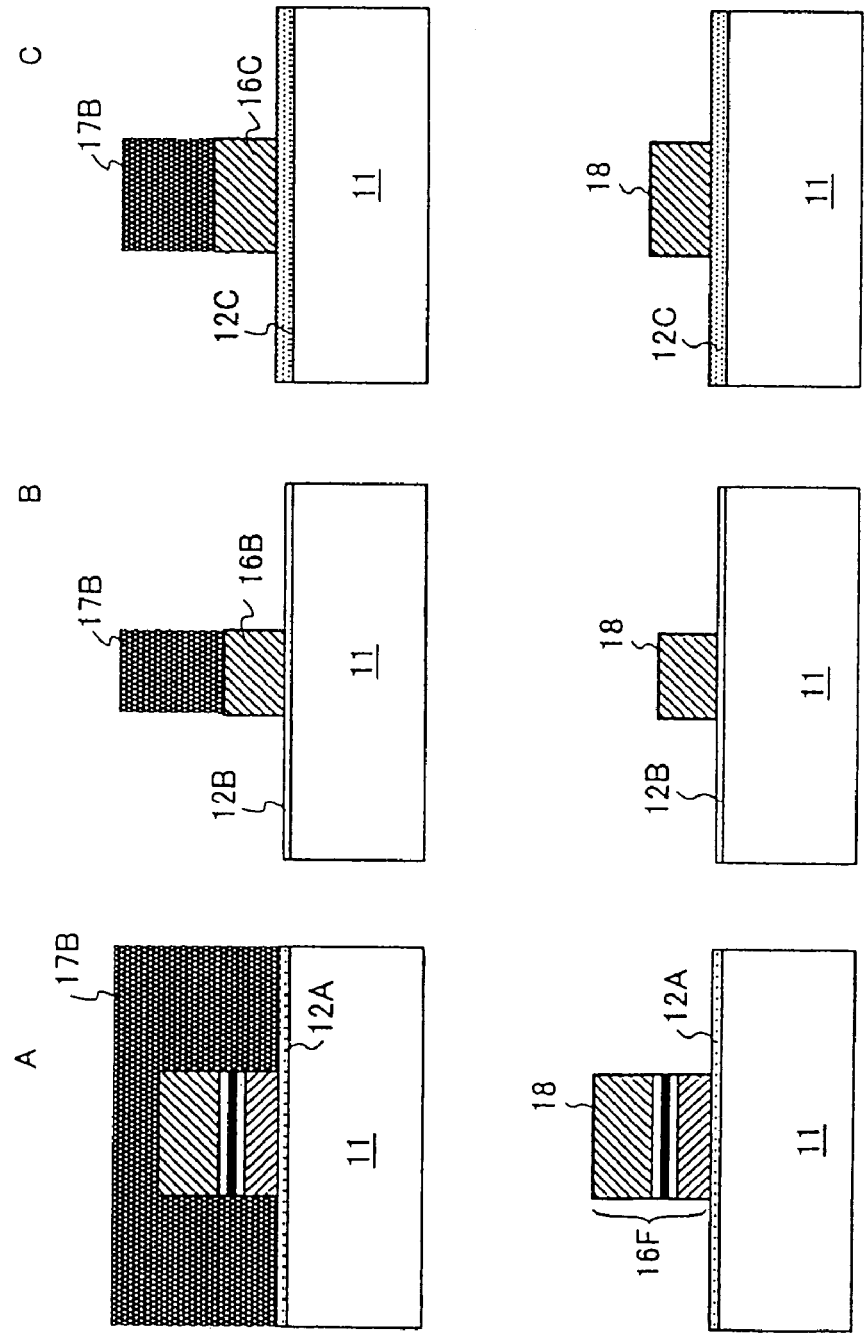

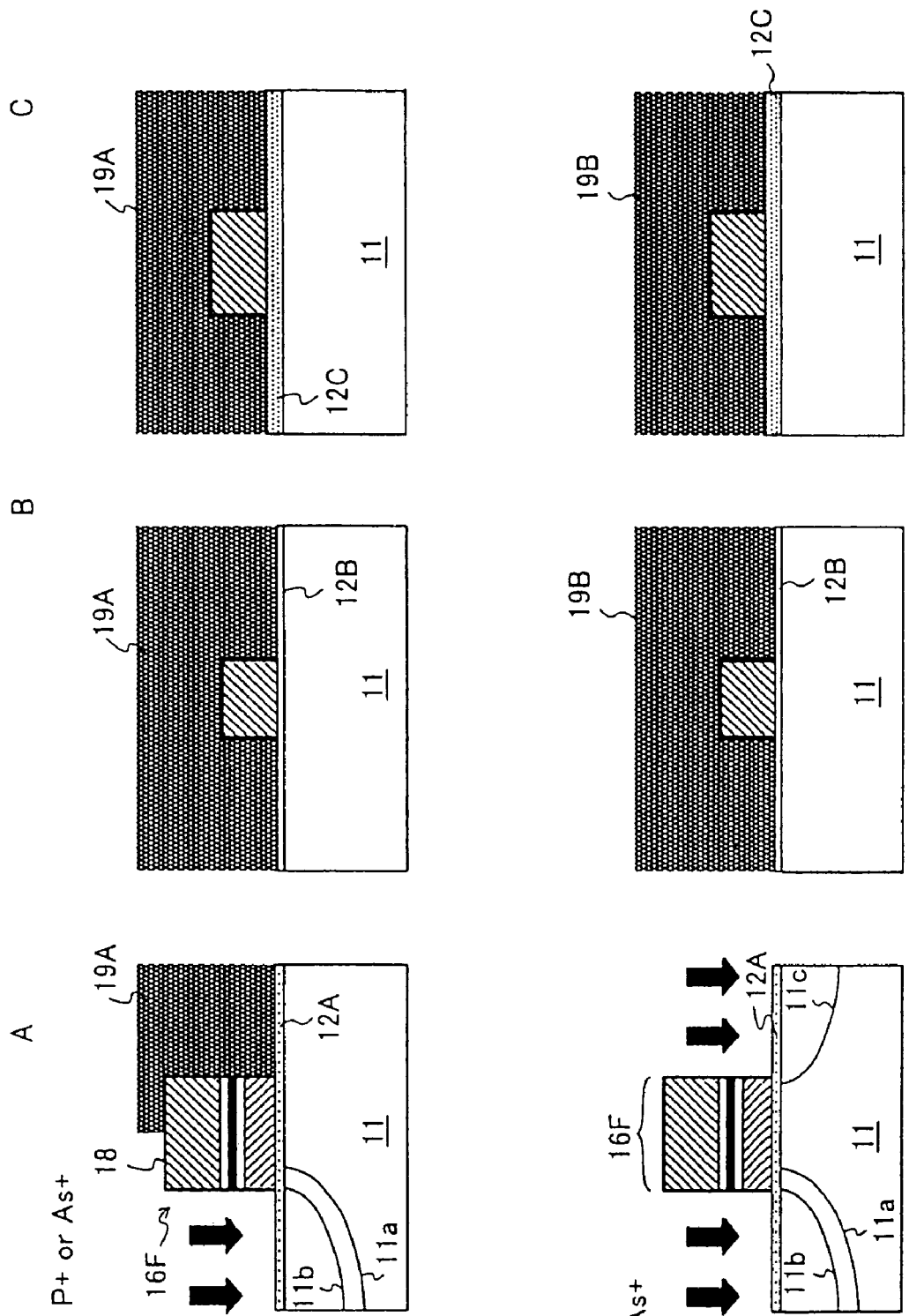

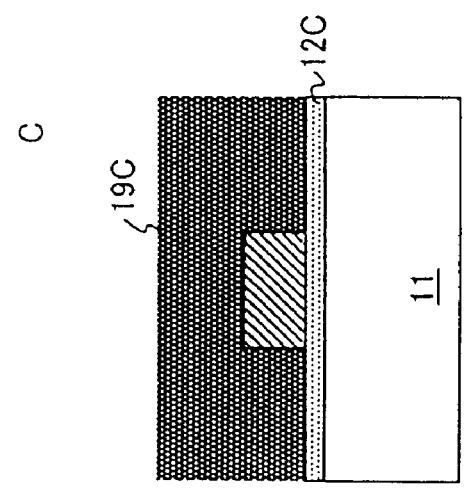
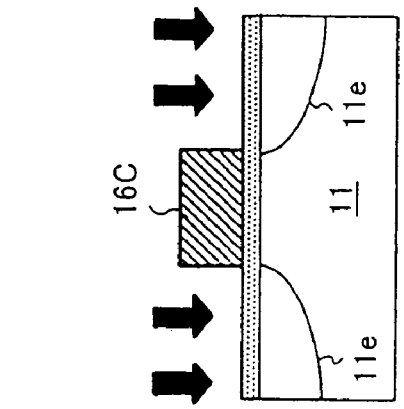
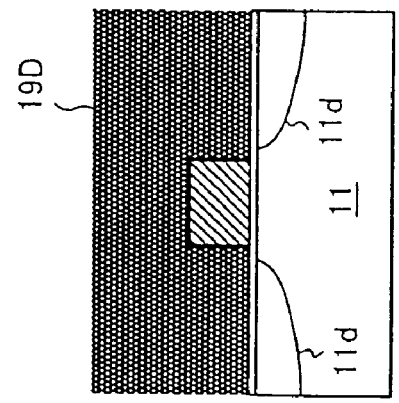
FIG. 1M
PRIOR ART
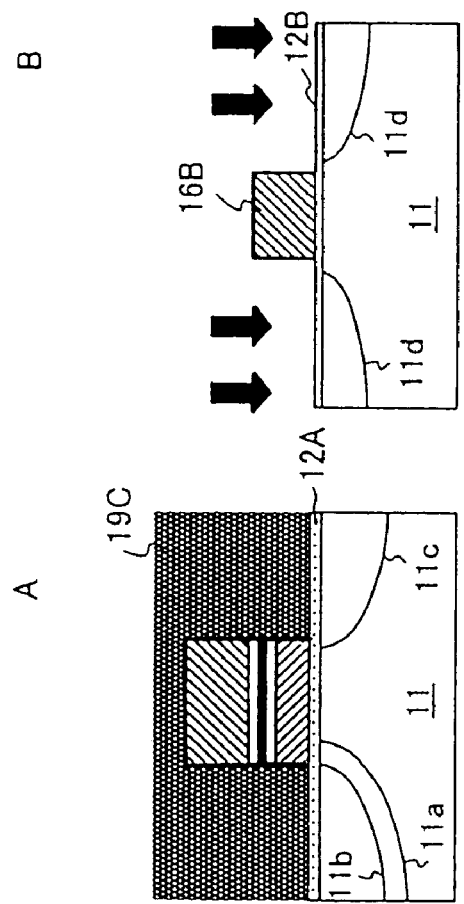
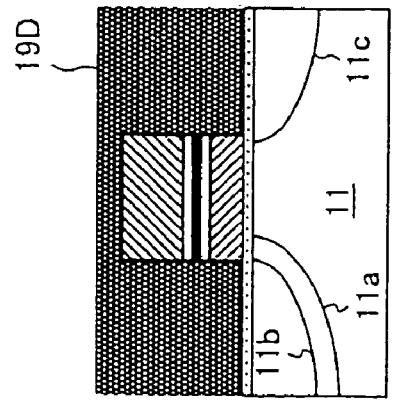
FIG. 1N
PRIOR ART

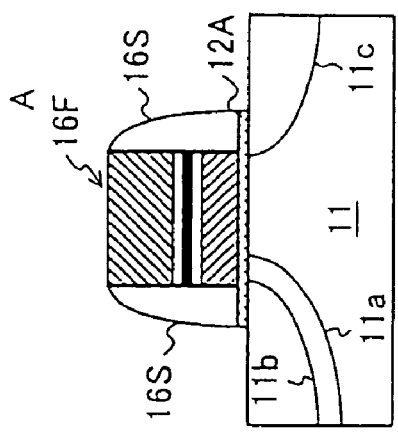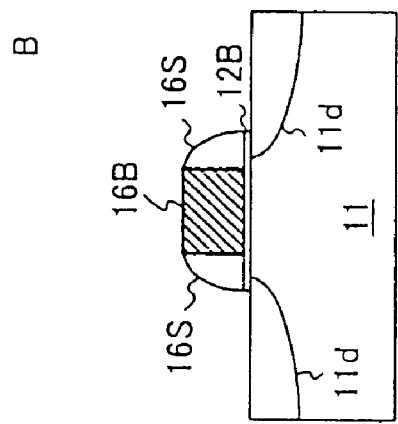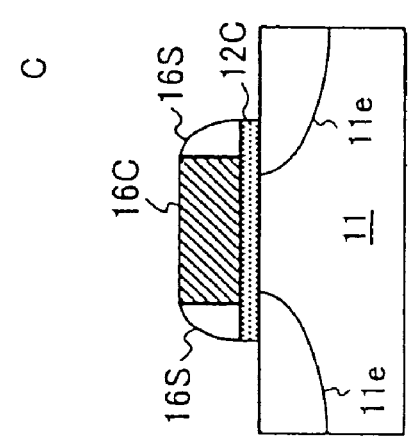
FIG. 1O PRIOR ART
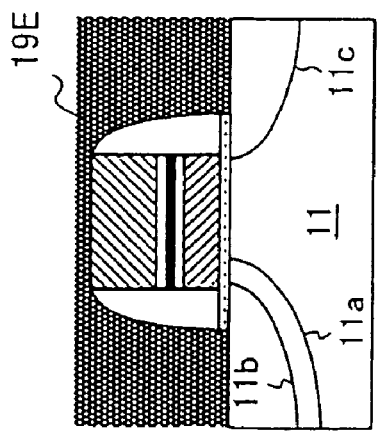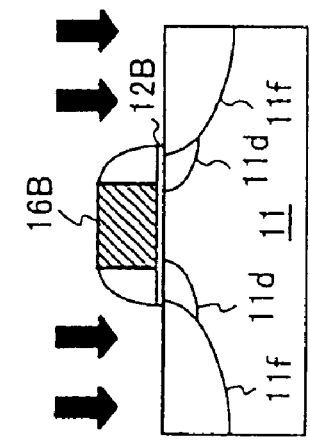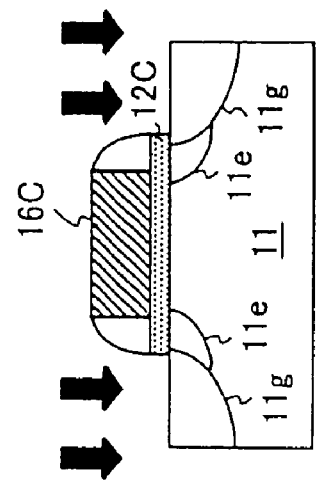
FIG. 1P PRIOR ART

A

B

C

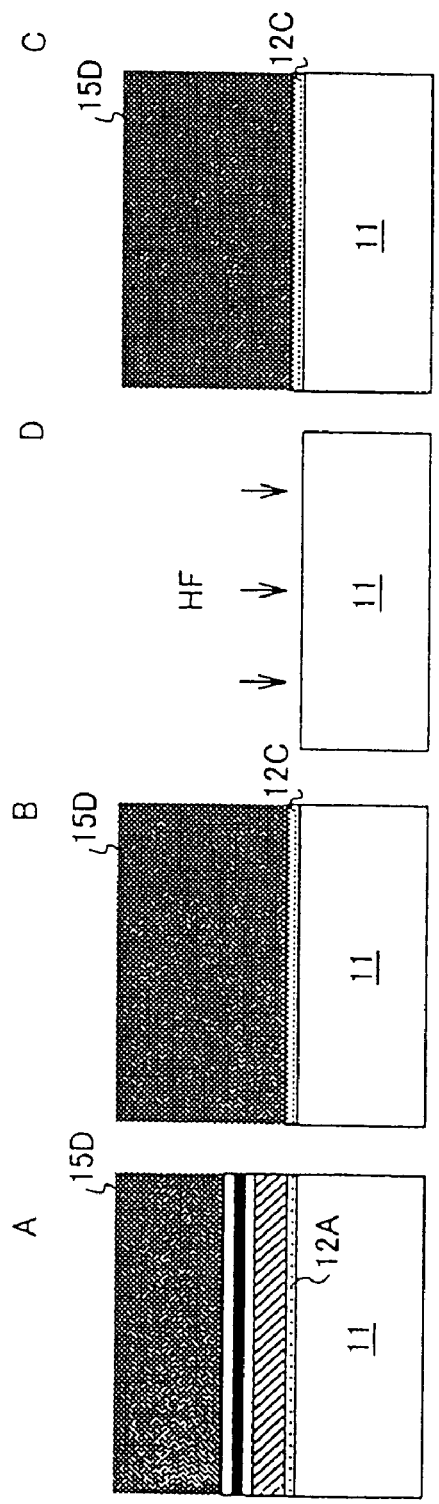
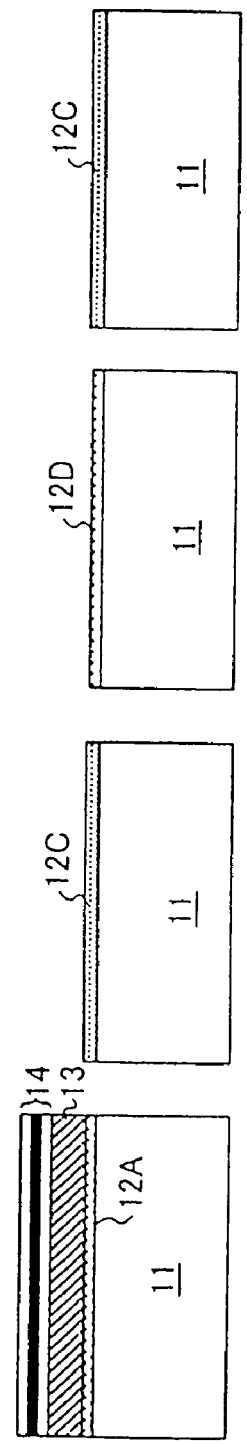
FIG. 8E PRIOR ART
FIG. 8F PRIOR ART

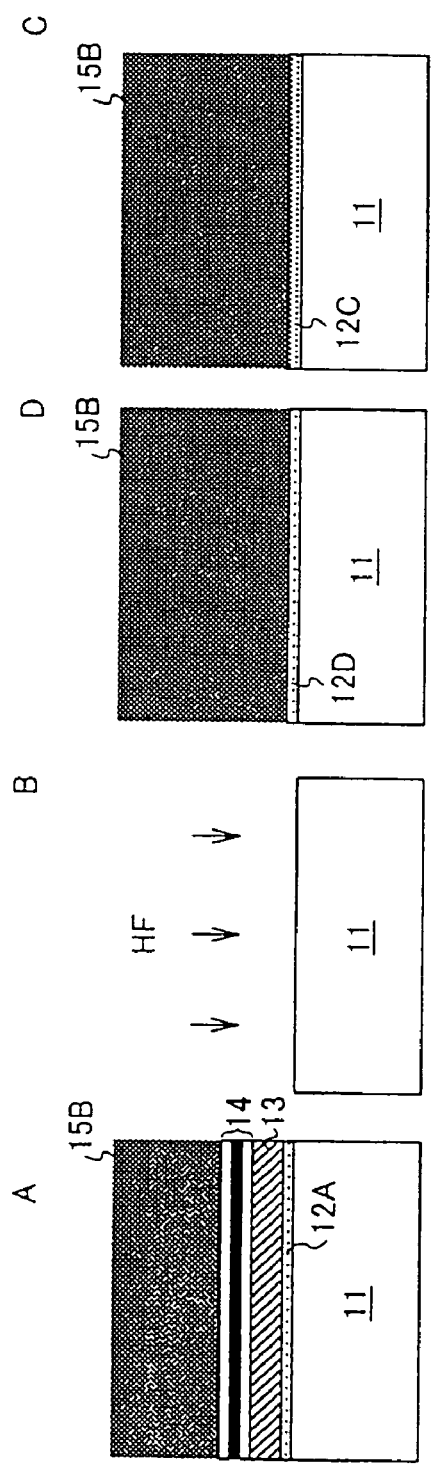
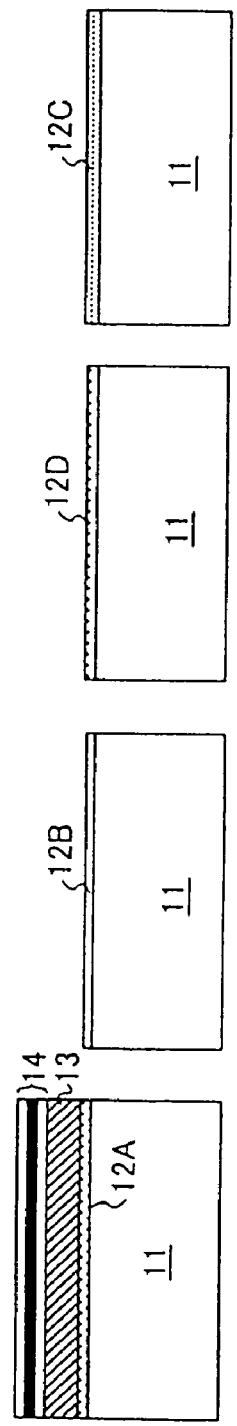
FIG. 8G PRIOR ART
FIG. 8H PRIOR ART

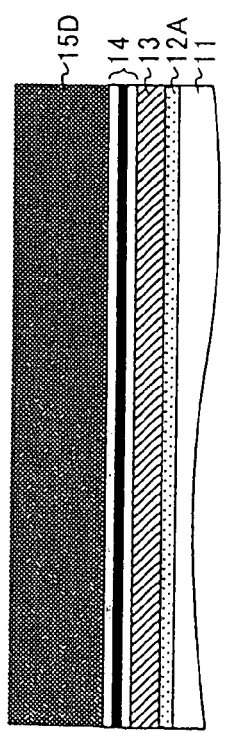
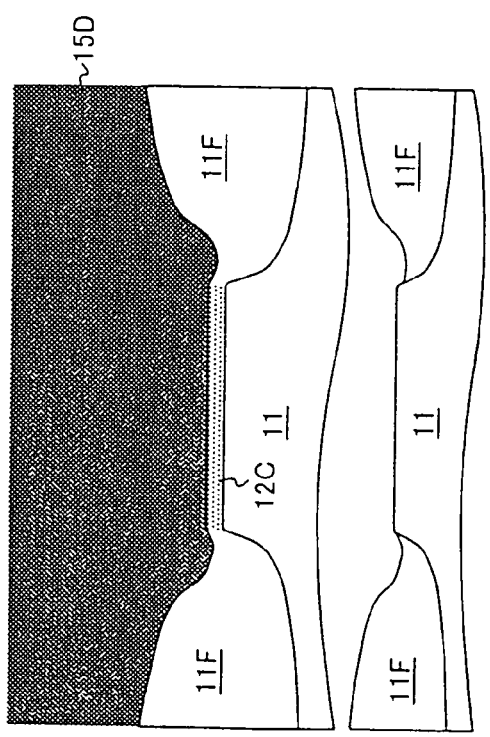
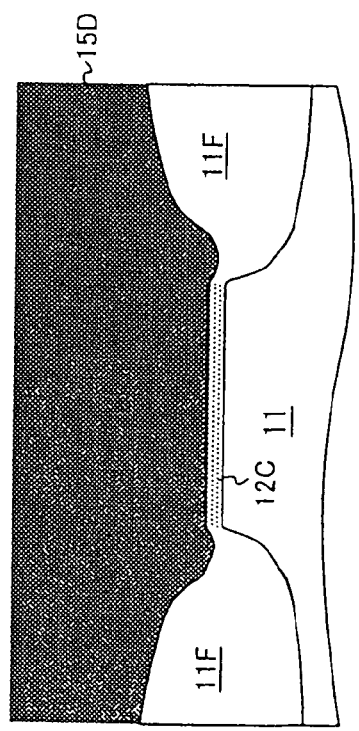
FIG. 12A
RELATED ART
FIG. 12B
RELATED ART
FIG. 12C
RELATED ART
FIG. 12D
RELATED ART

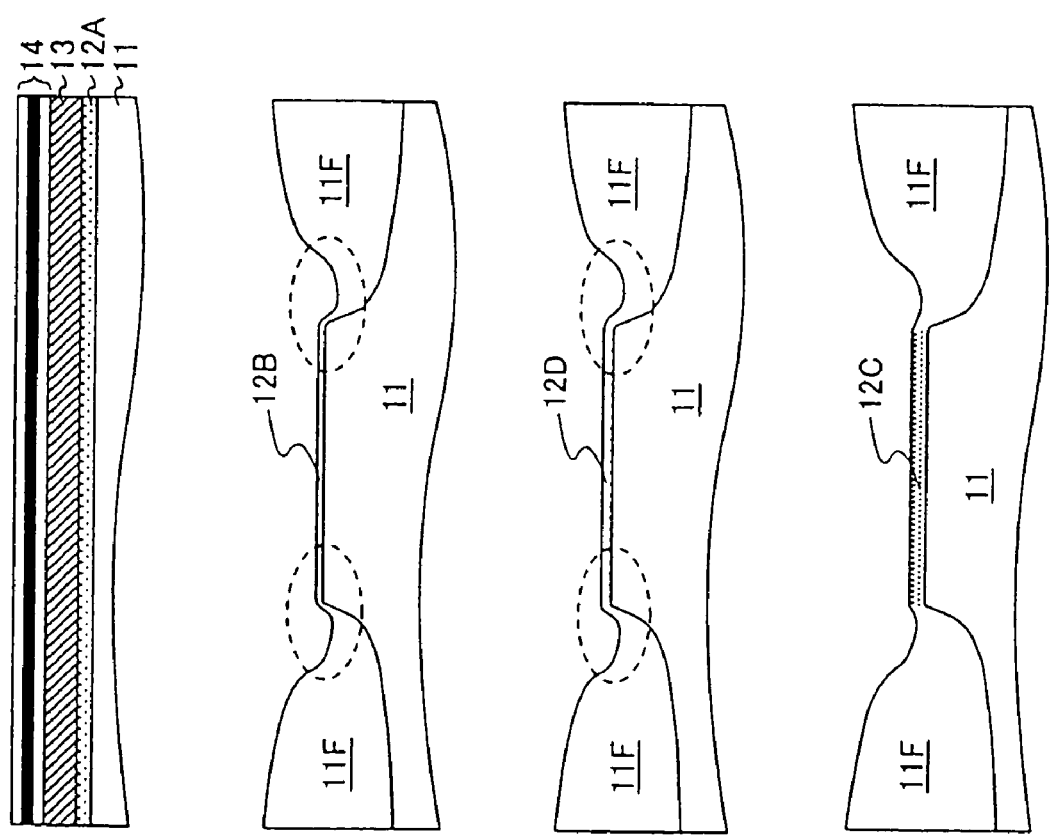

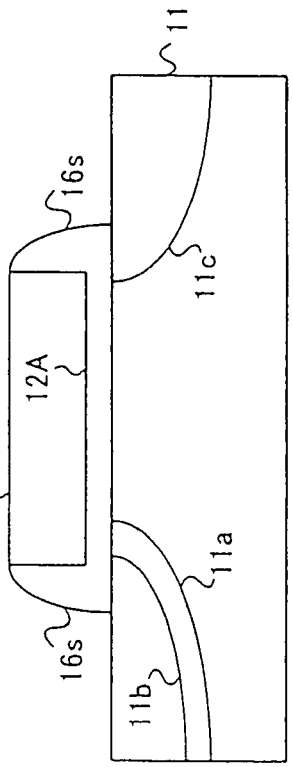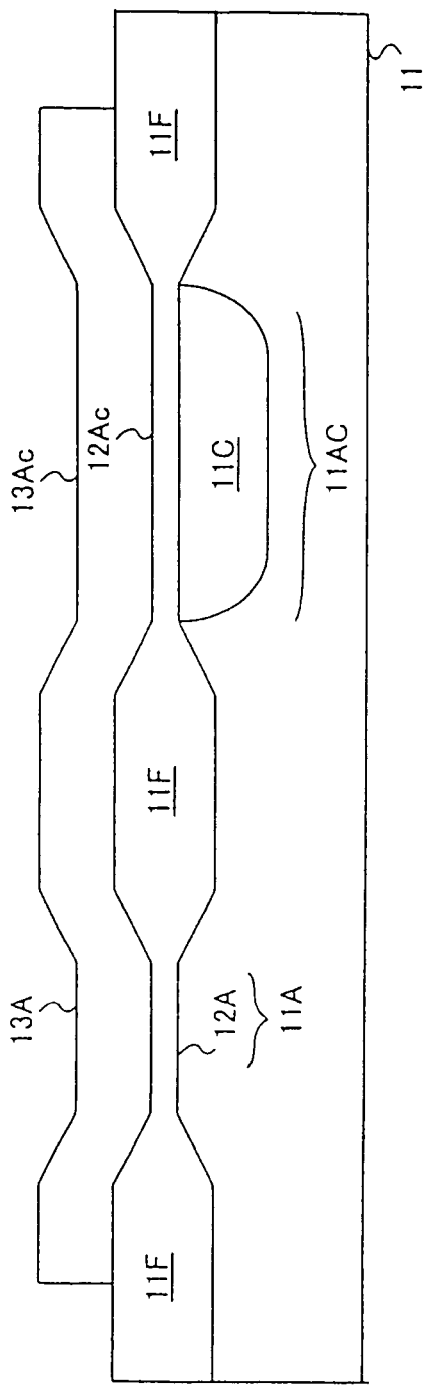
FIG. 18A
PRIOR ART
FIG. 18B
PRIOR ART

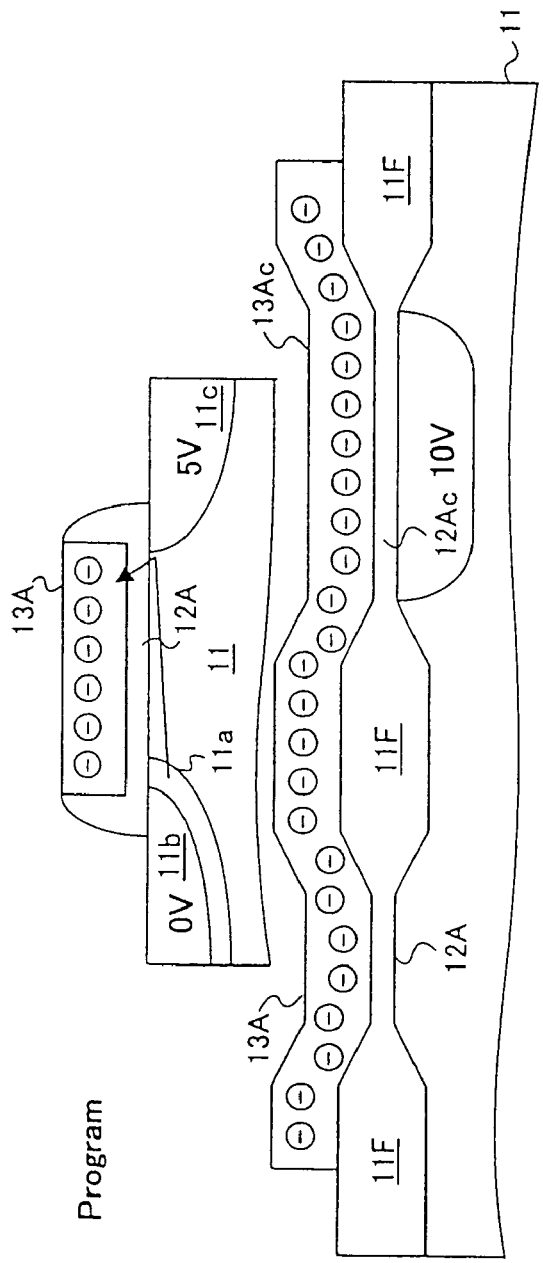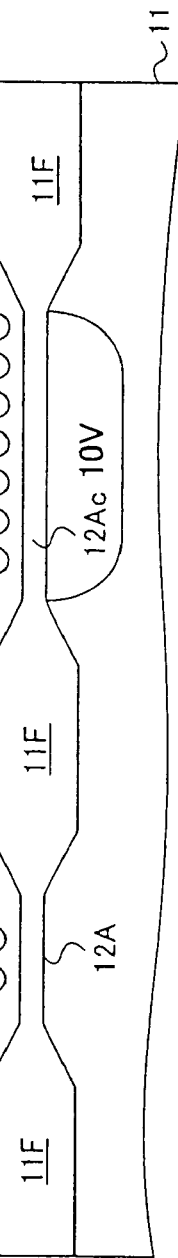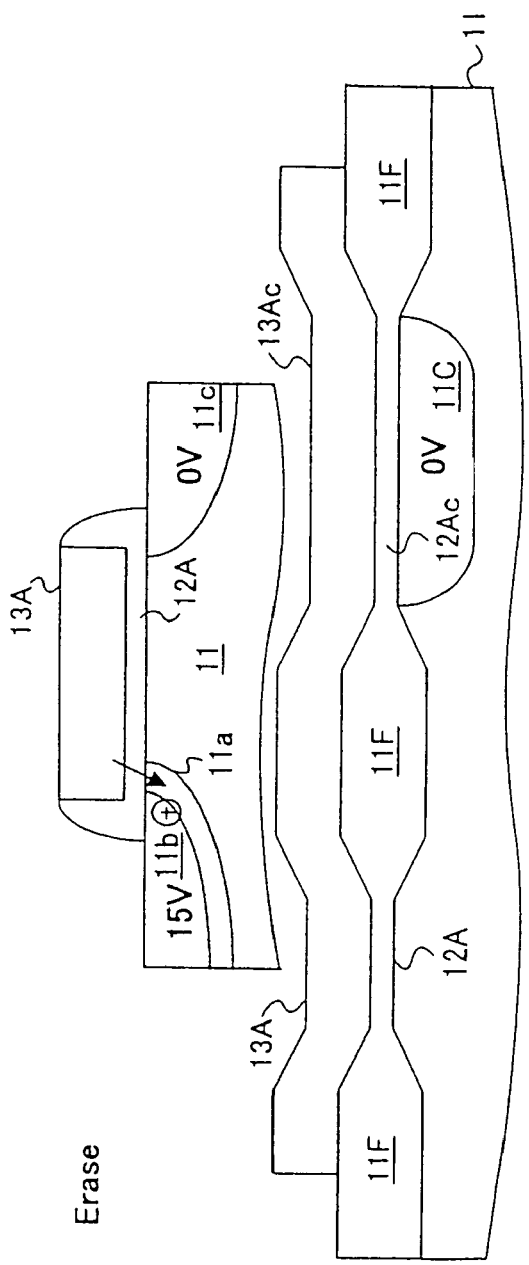
FIG. 19A PRIOR ART
FIG. 19B PRIOR ART
FIG. 19C PRIOR ART
FIG. 19D PRIOR ART

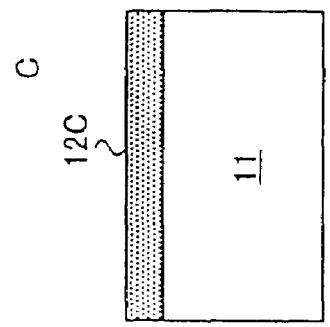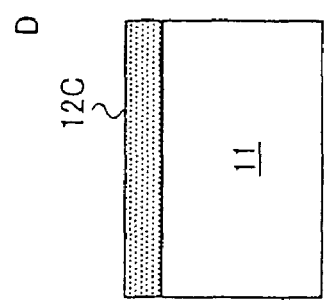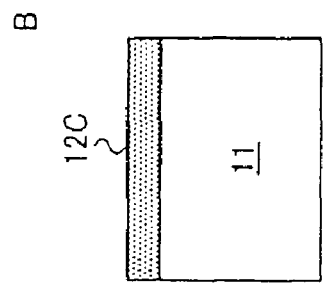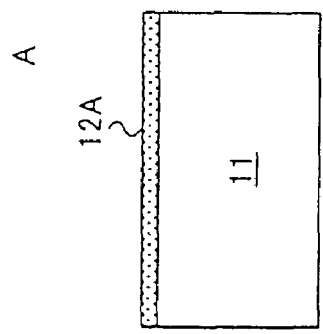
FIG. 20C PRIOR ART
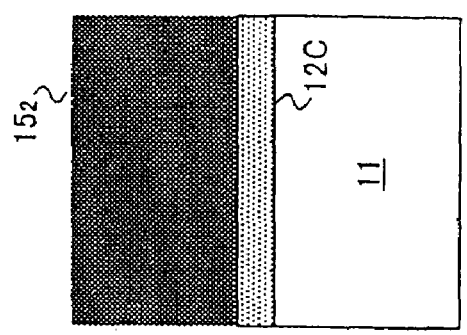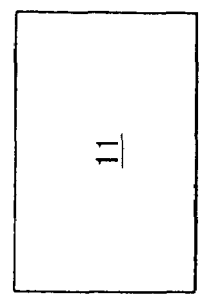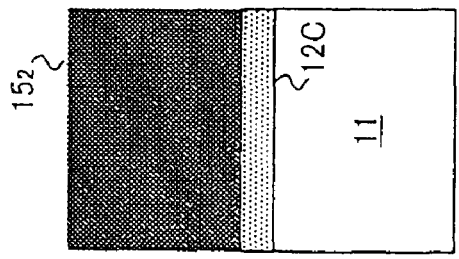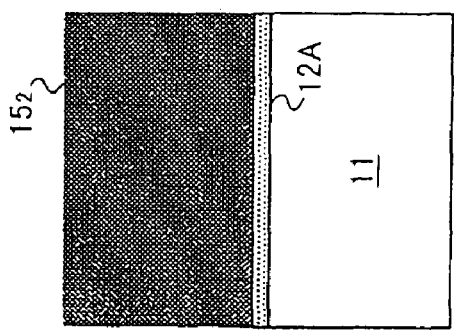
FIG. 20D PRIOR ART

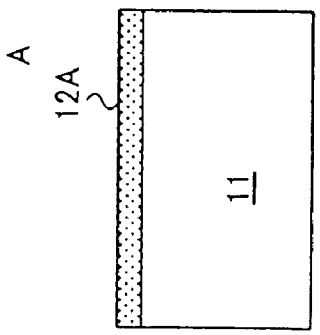
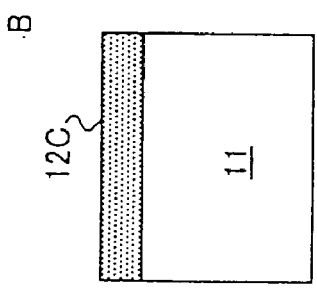
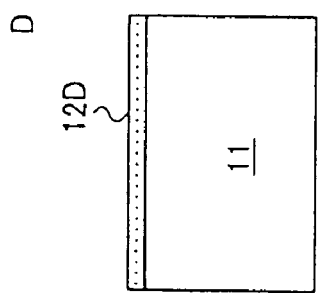
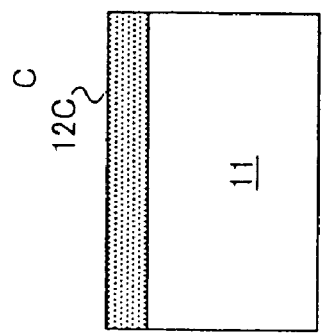
FIG. 20E
PRIOR ART
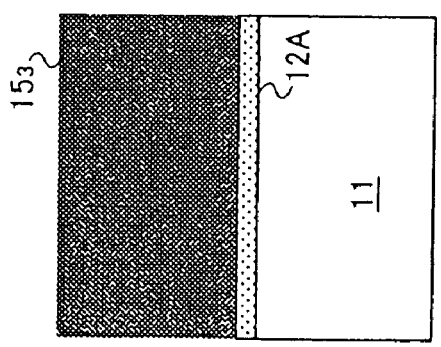
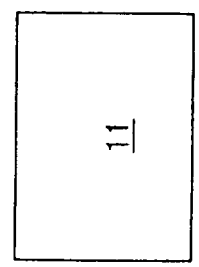
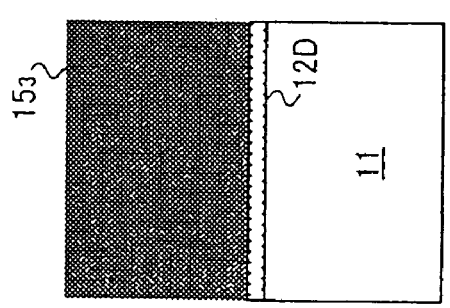
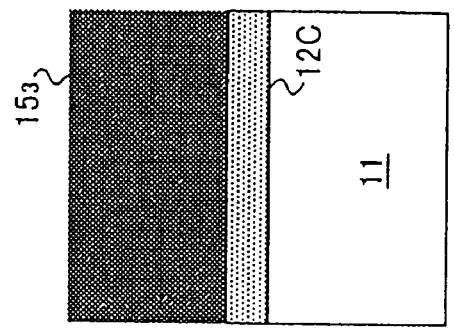
FIG. 20F
PRIOR ART

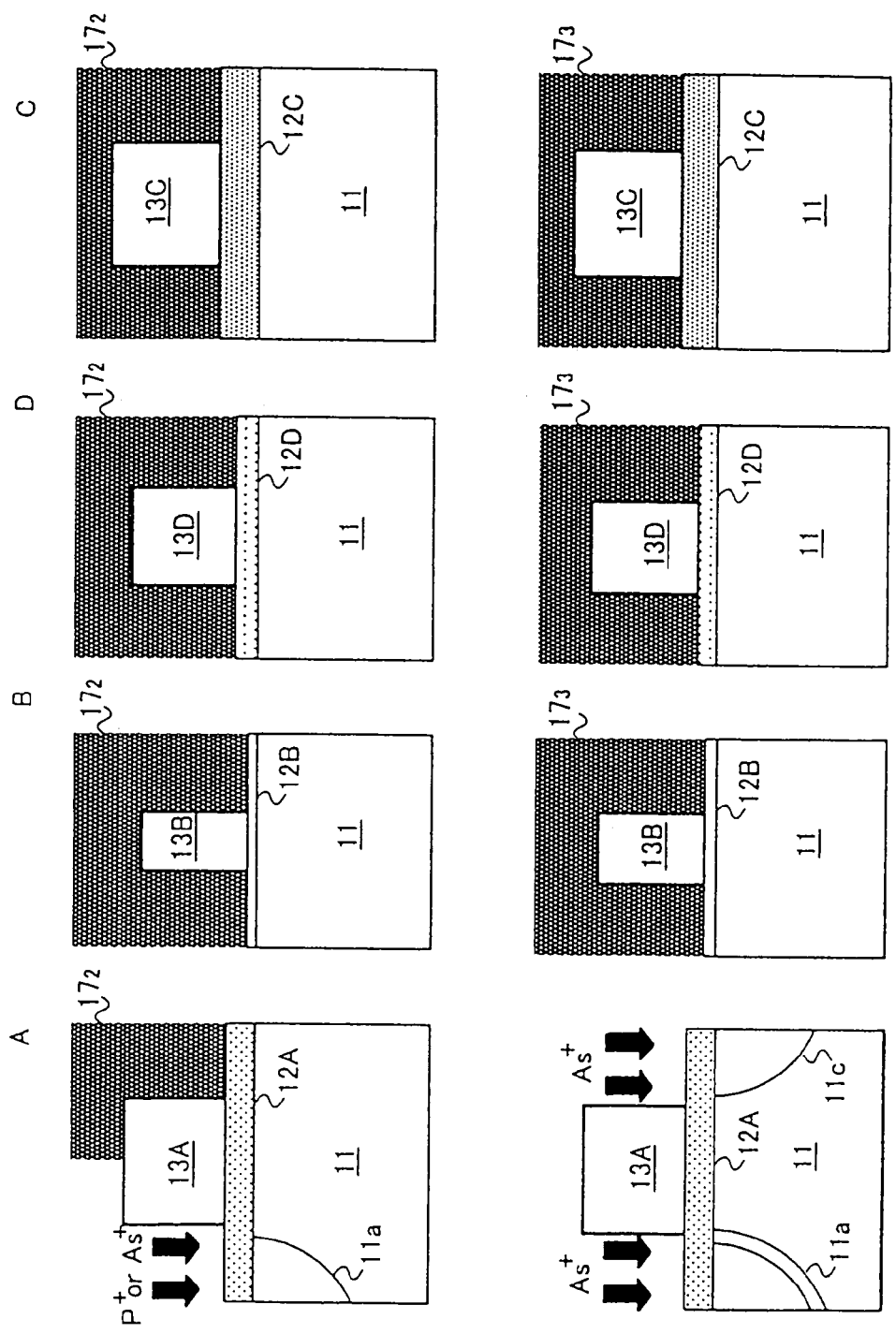

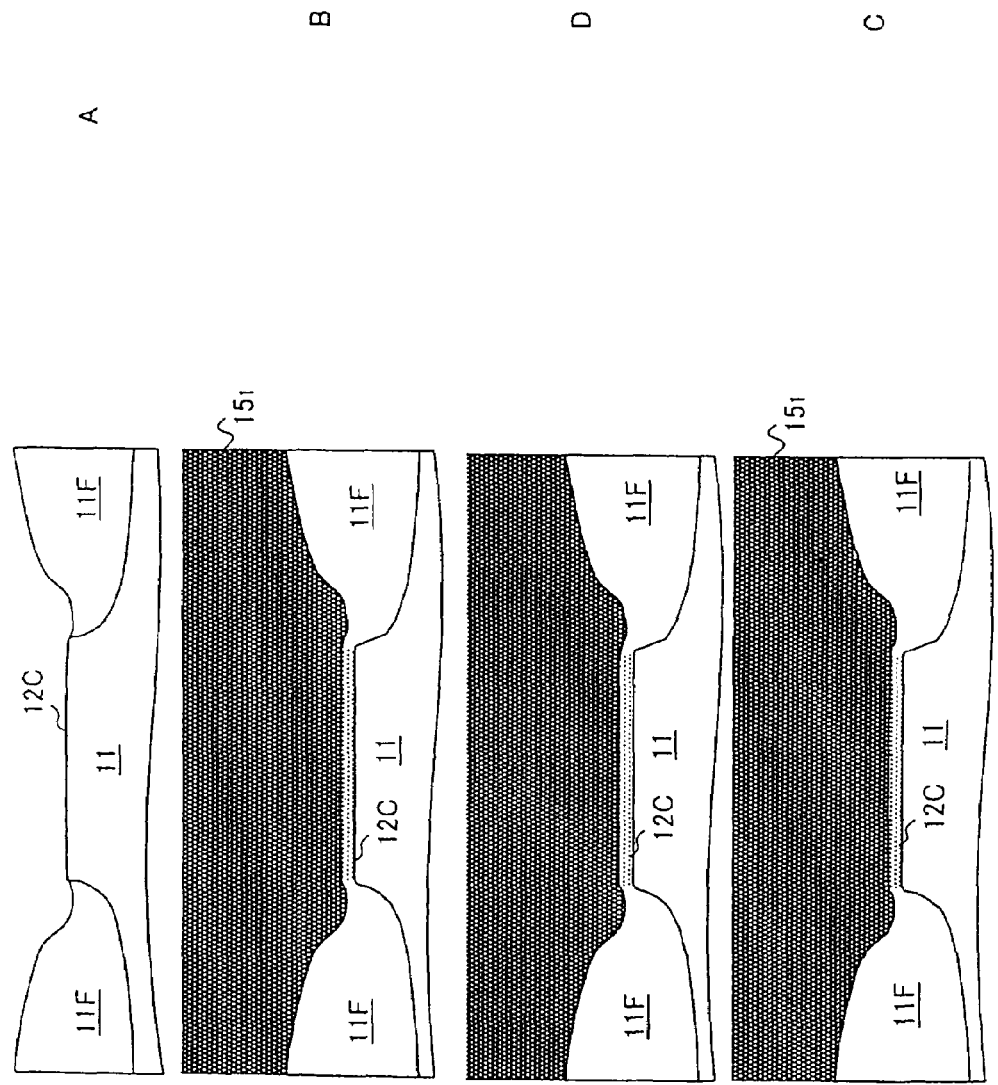

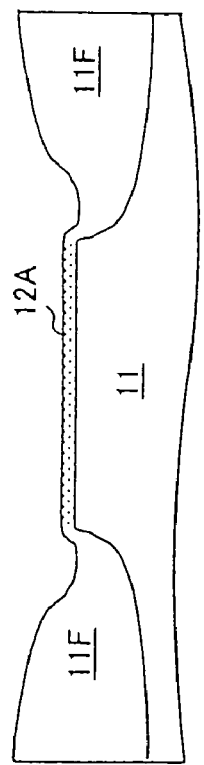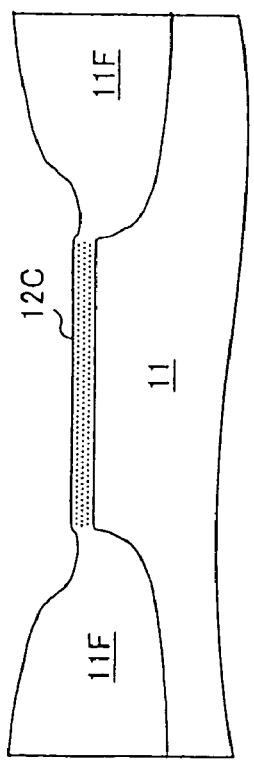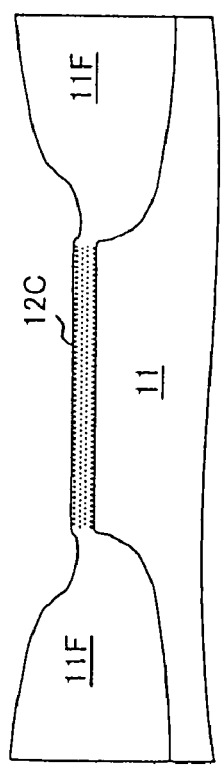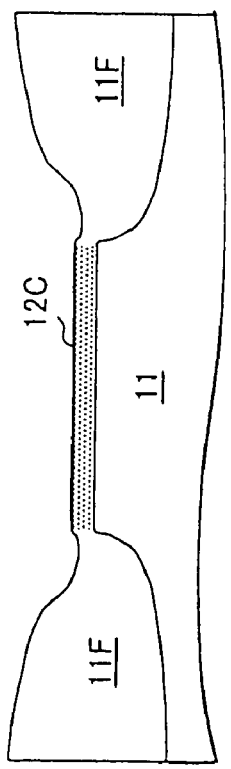
FIG. 23A RELATED ART
FIG. 23B RELATED ART
FIG. 23C RELATED ART
FIG. 23D RELATED ART

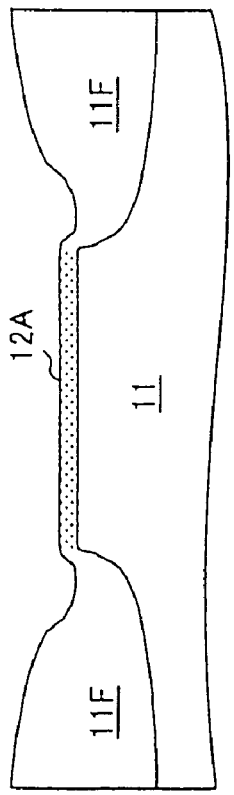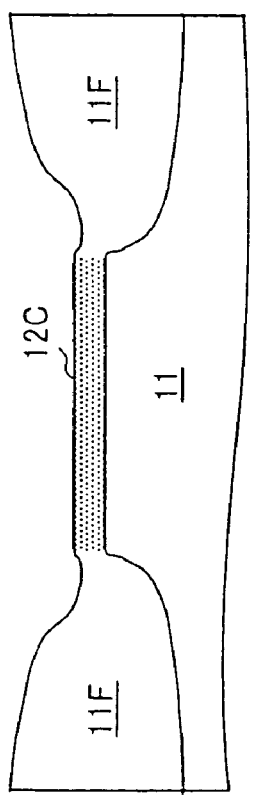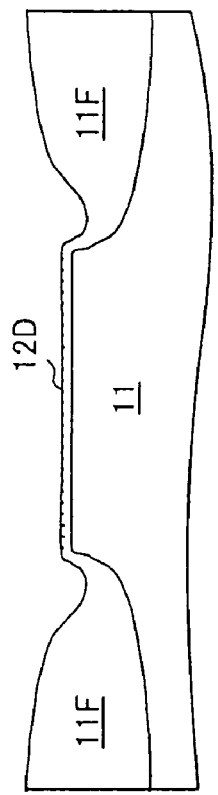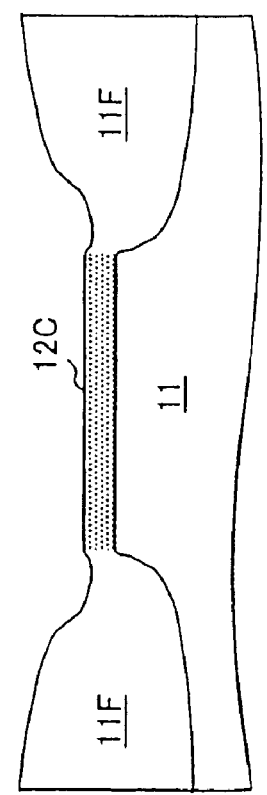
FIG. 25A RELATED ART
FIG. 25B RELATED ART
FIG. 25C RELATED ART
FIG. 25D RELATED ART

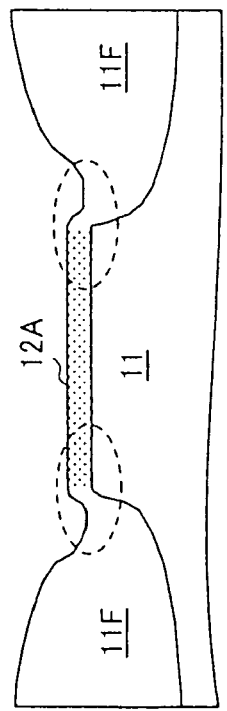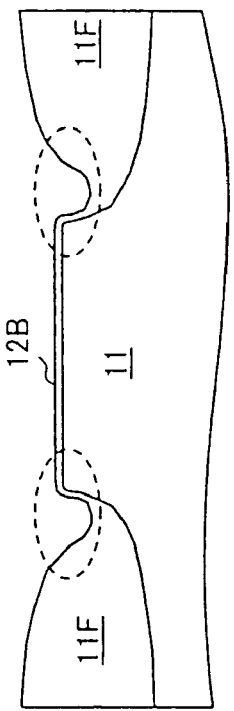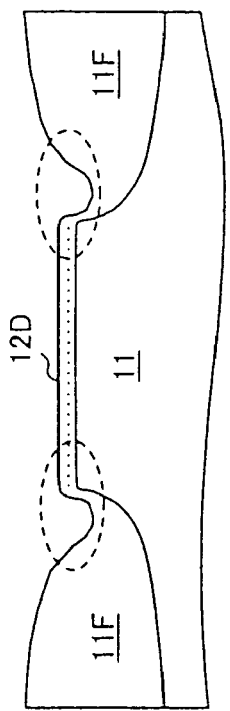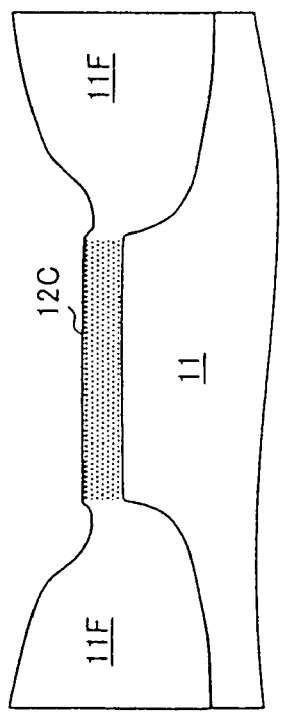
FIG. 27A RELATED ART
FIG. 27B RELATED ART
FIG. 27C RELATED ART
FIG. 27D RELATED ART

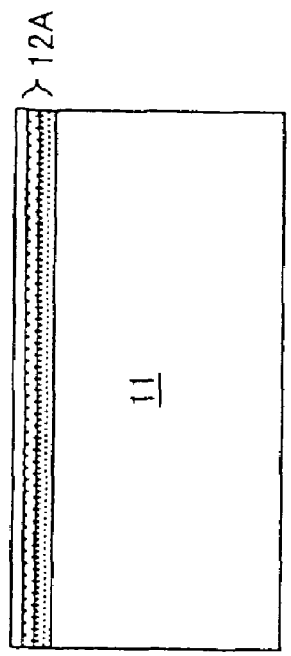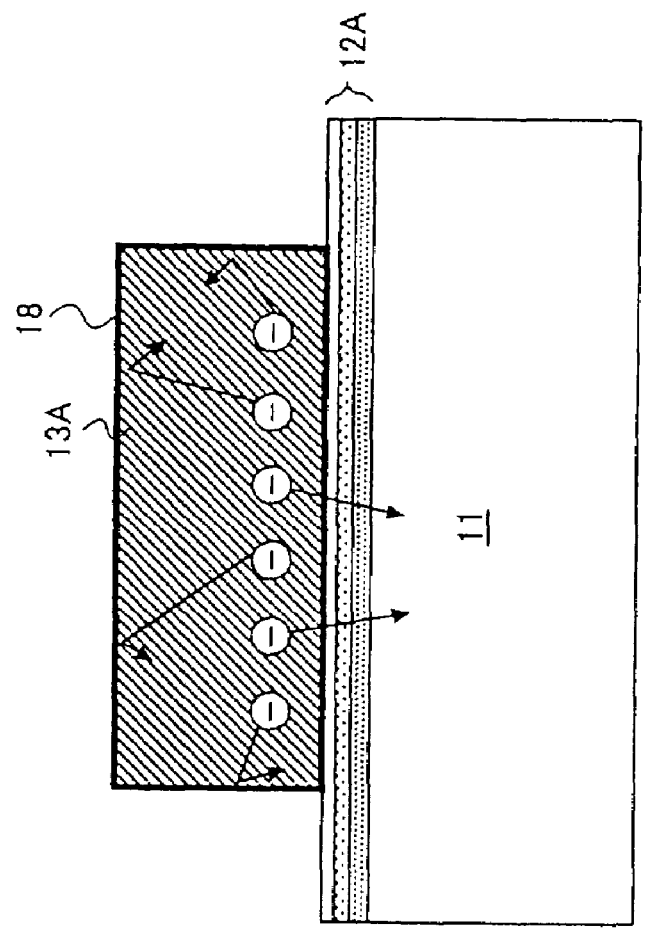
FIG. 30A
RELATED ART
FIG. 30B
RELATED ART

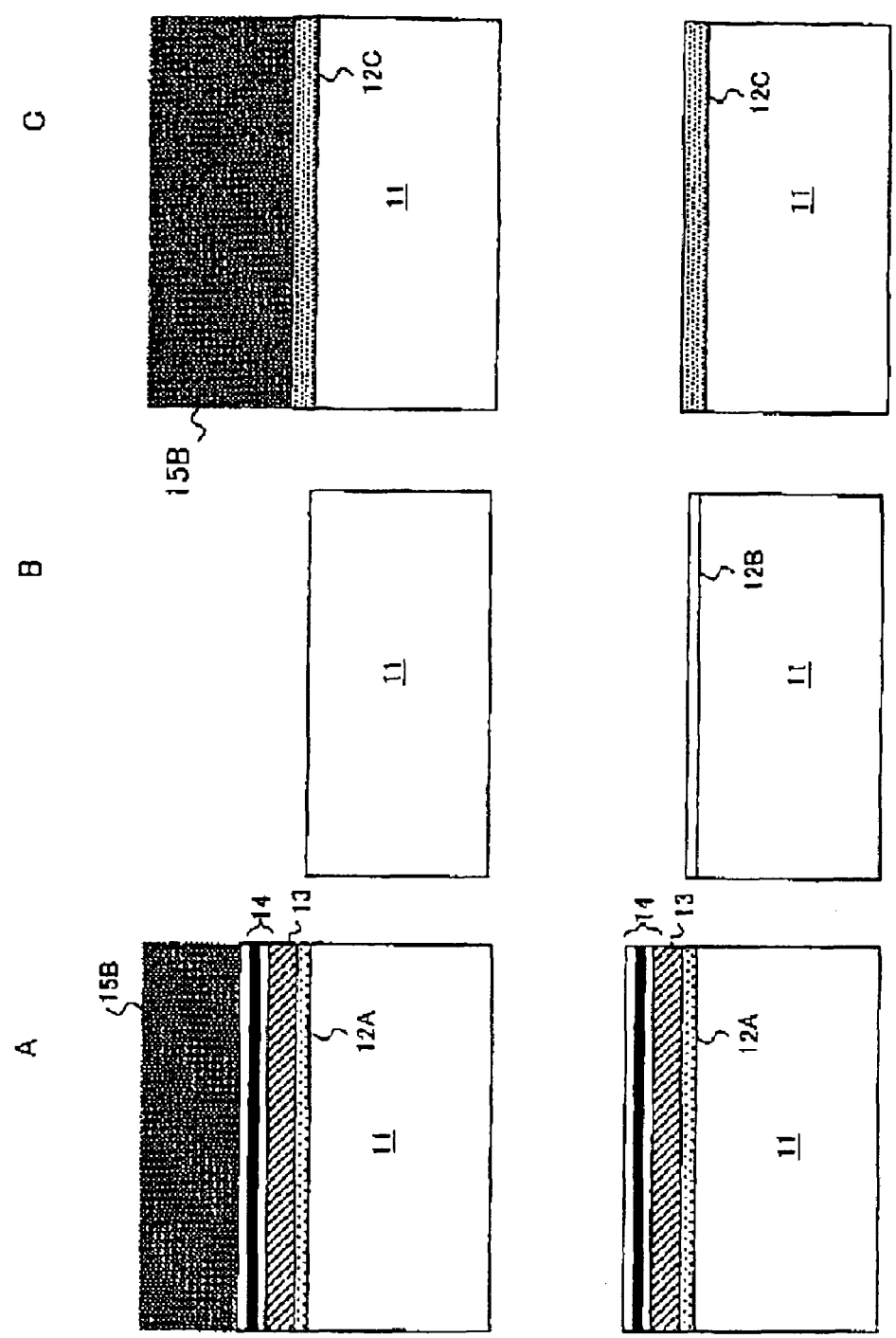

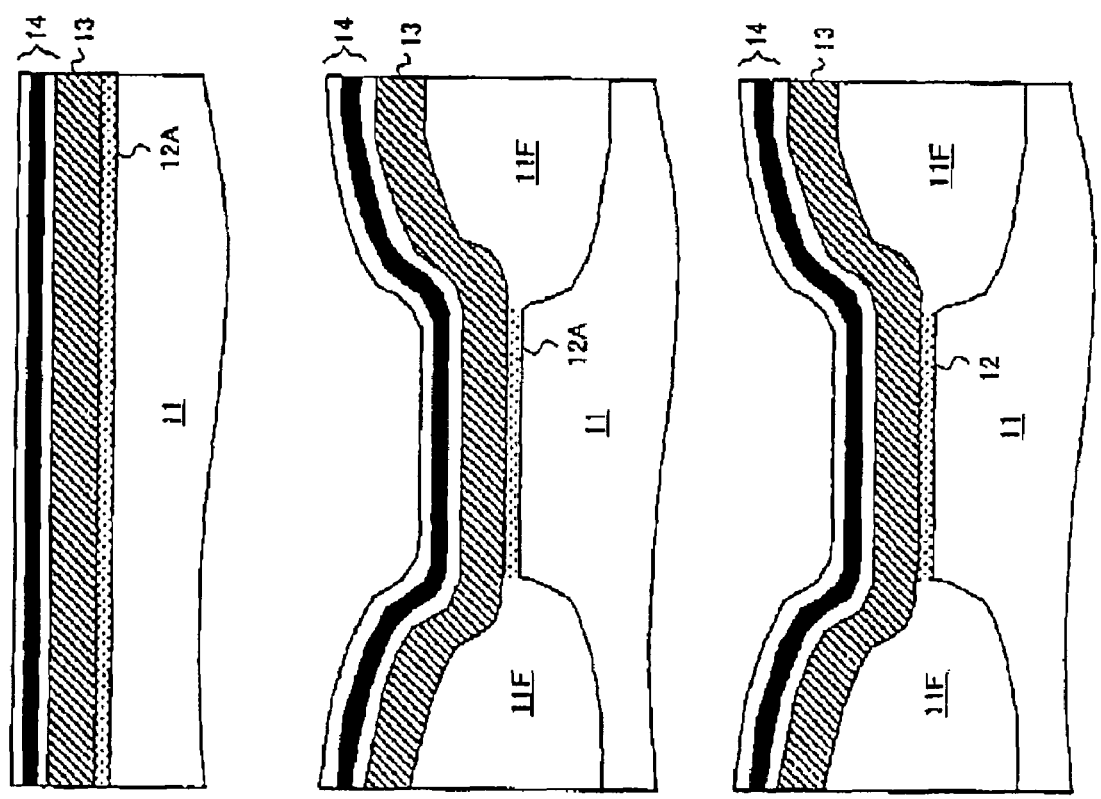

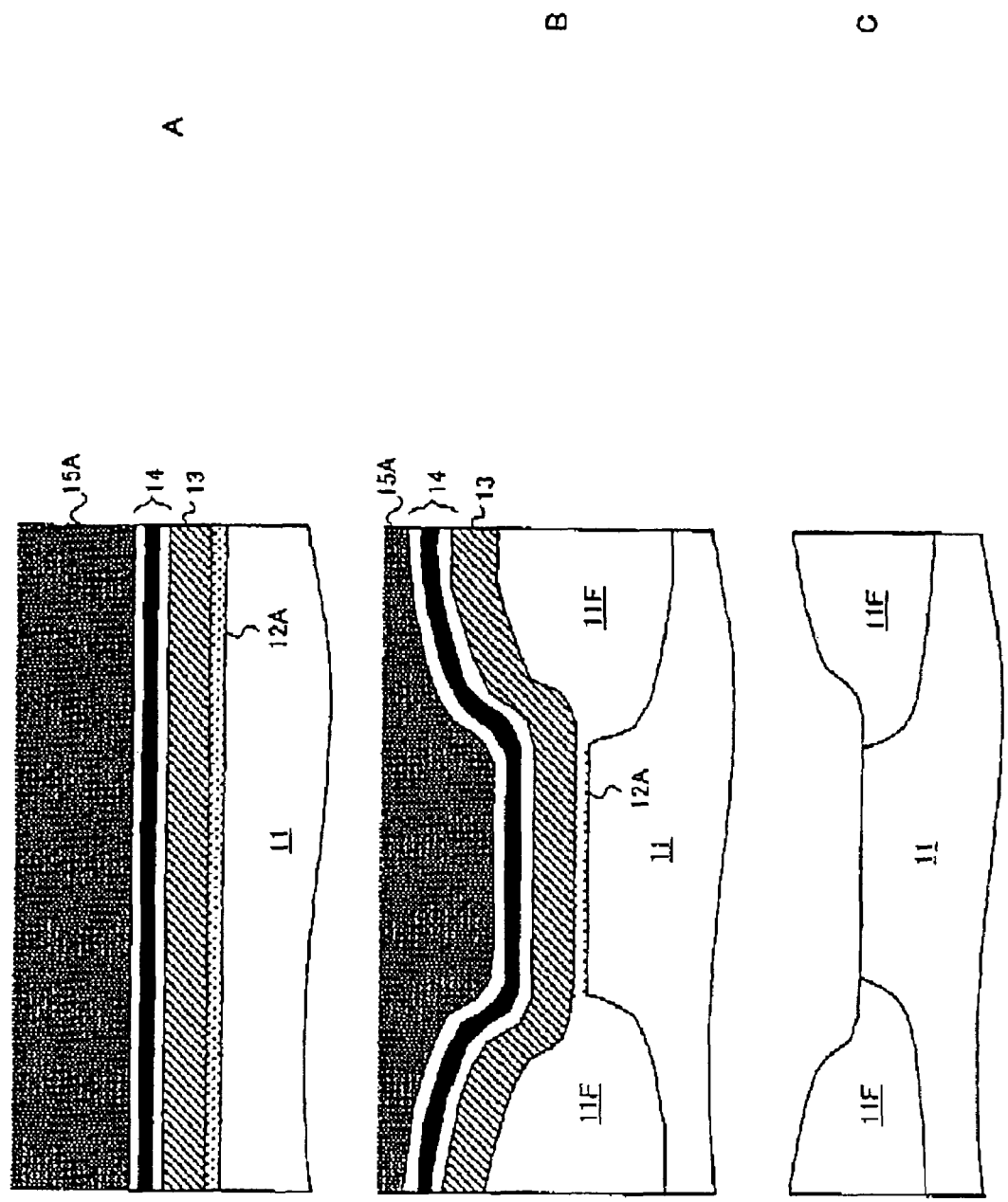

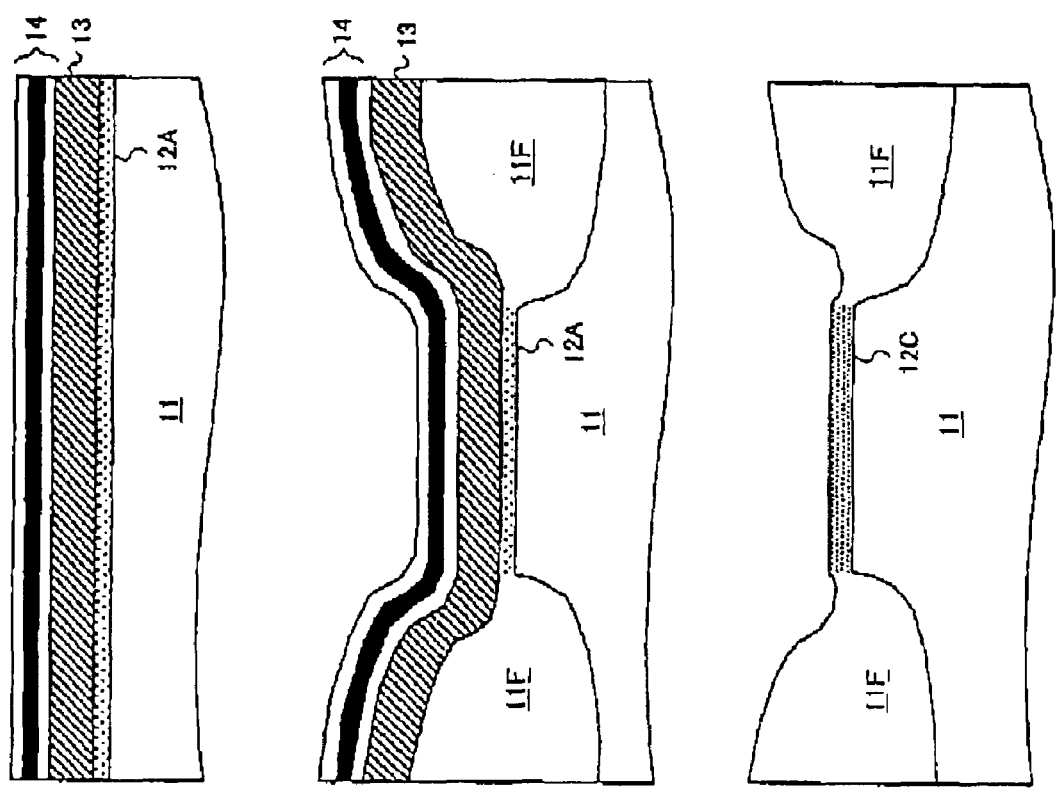

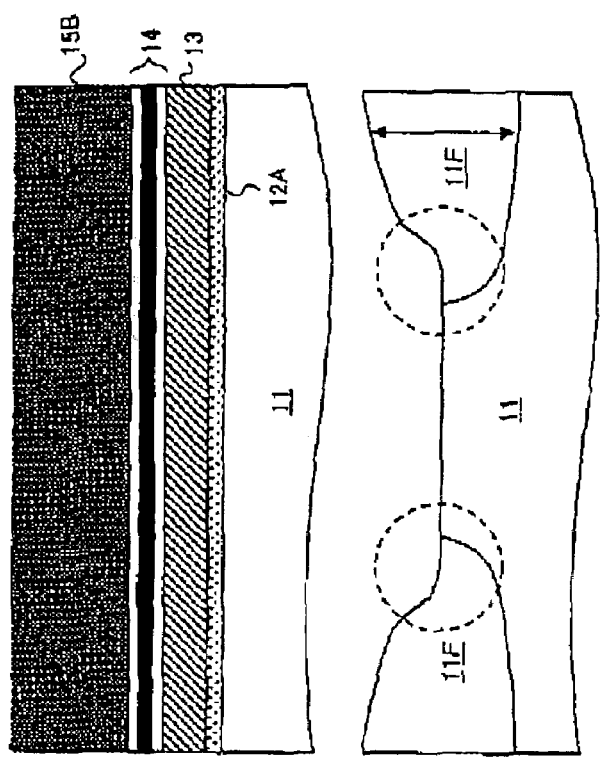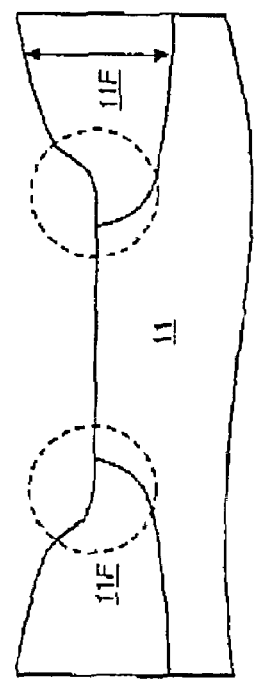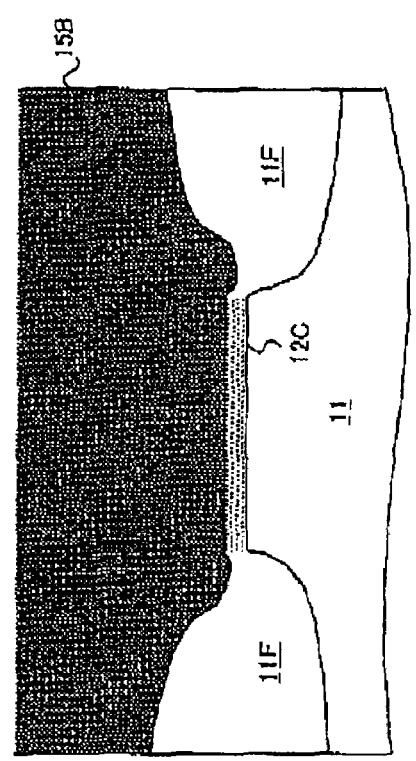
FIG. 35A
FIG. 35B
FIG. 35C

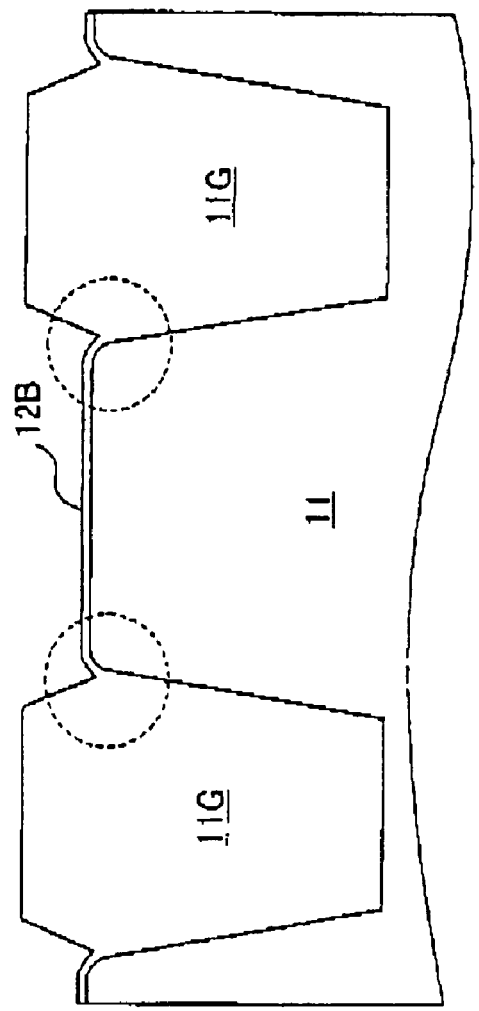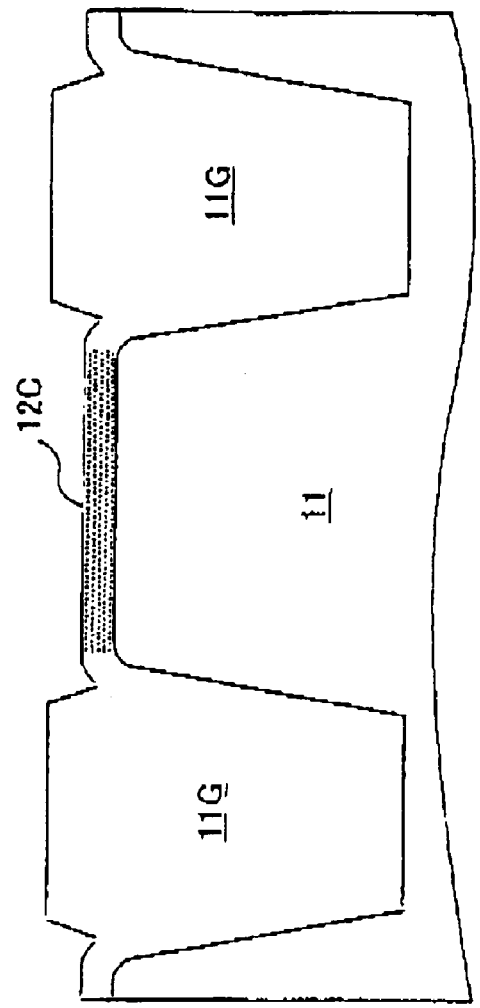
FIG. 37A
FIG. 37B

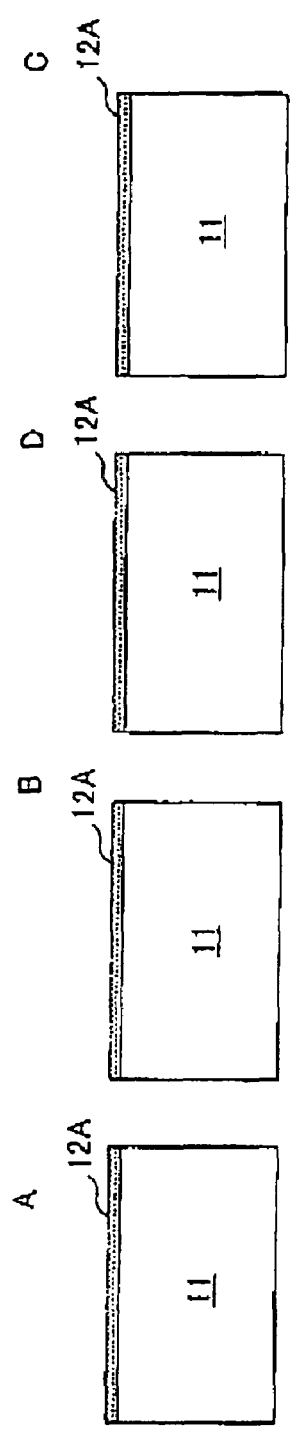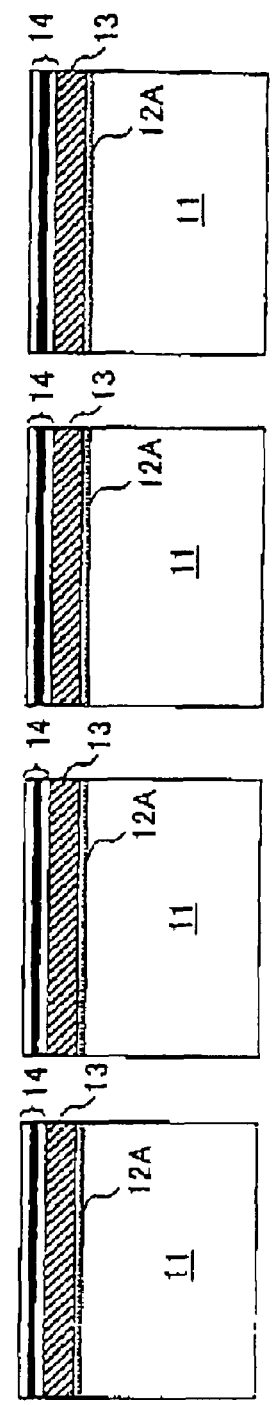

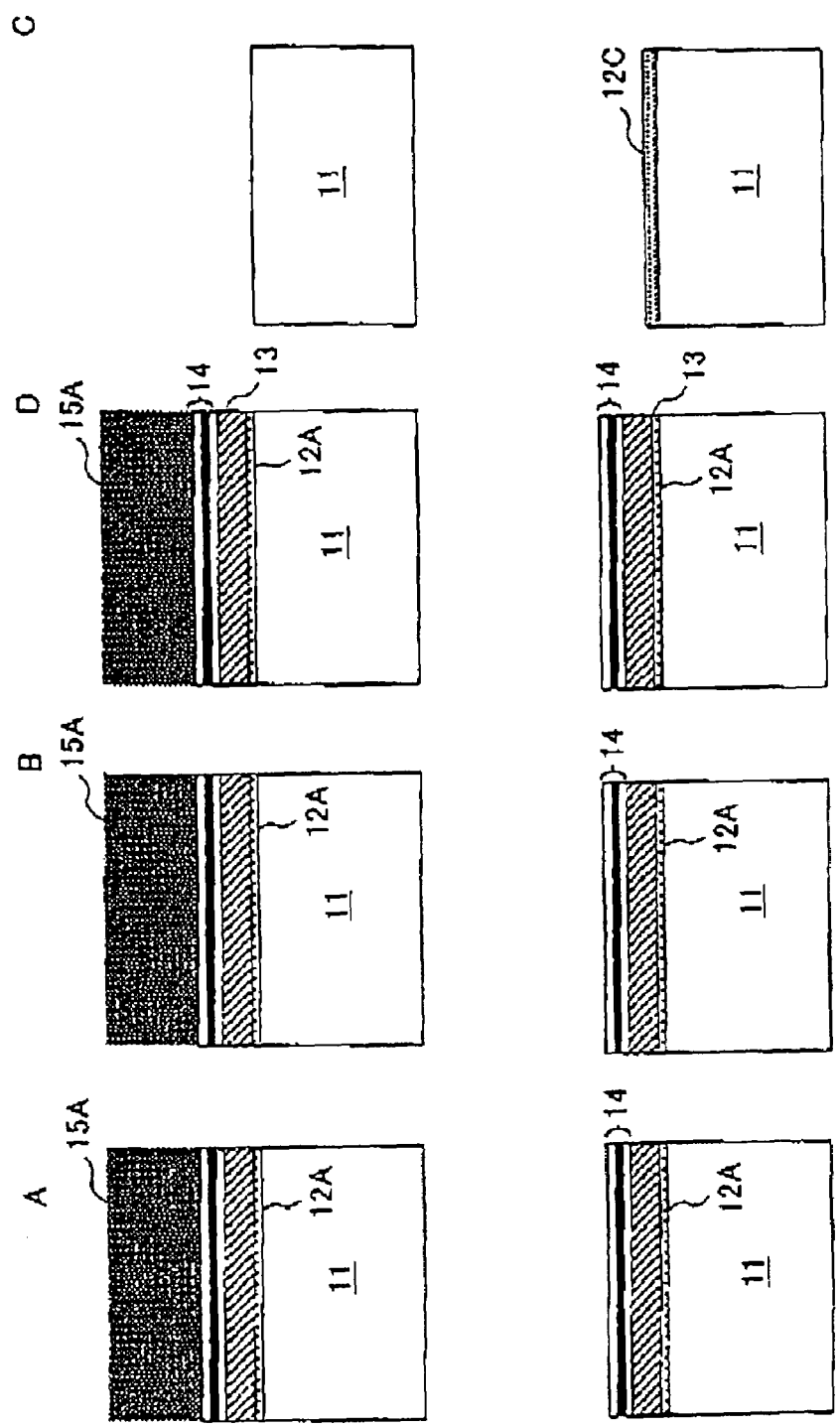

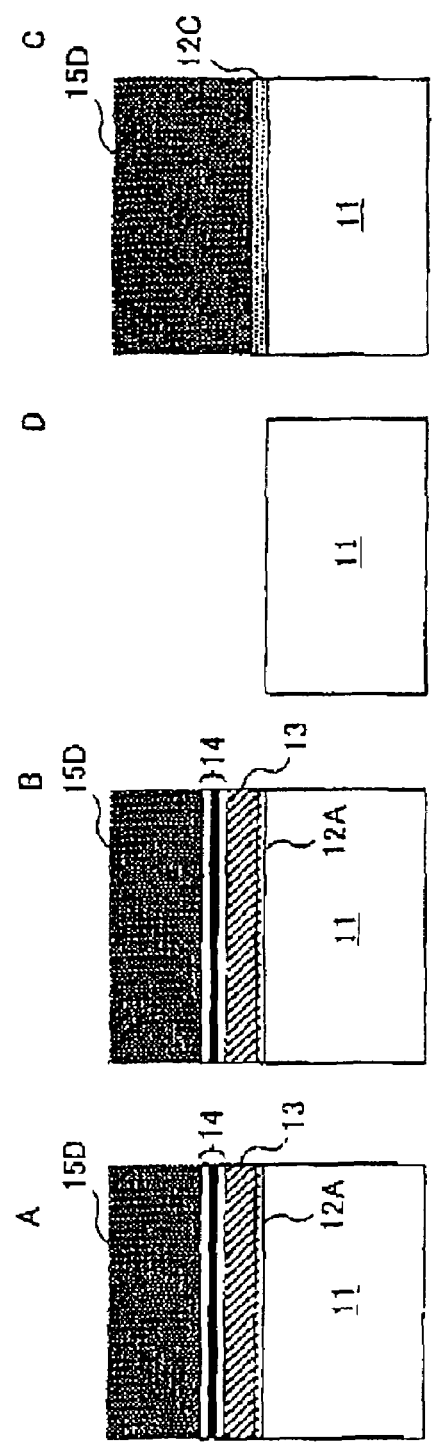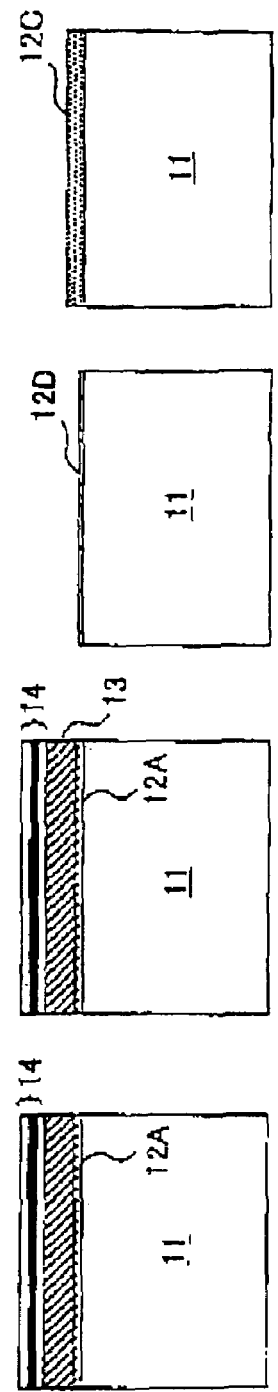
FIG. 39E
FIG. 39F

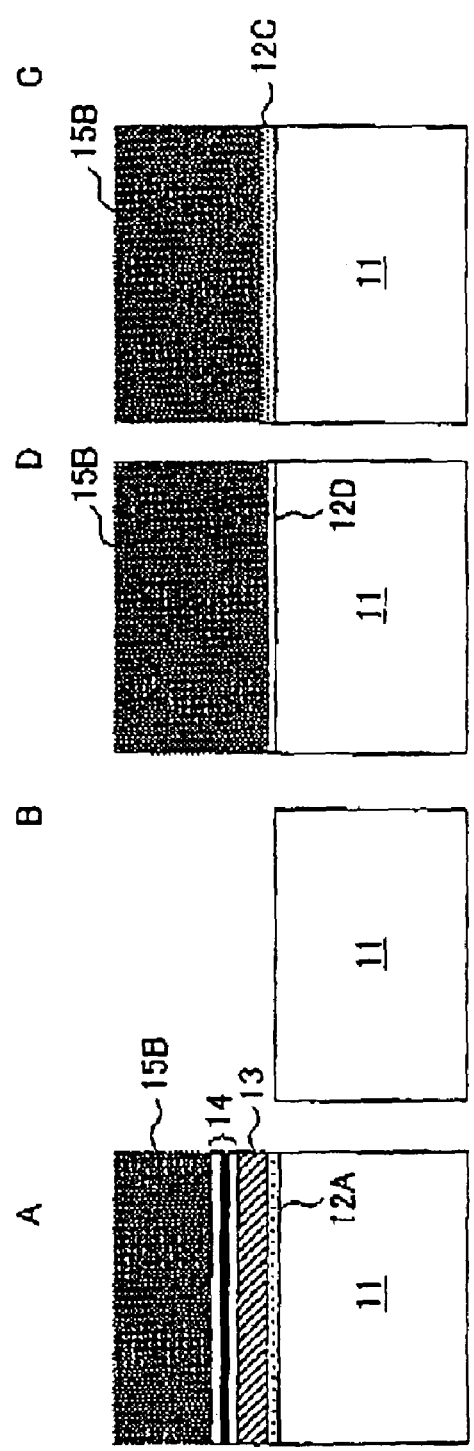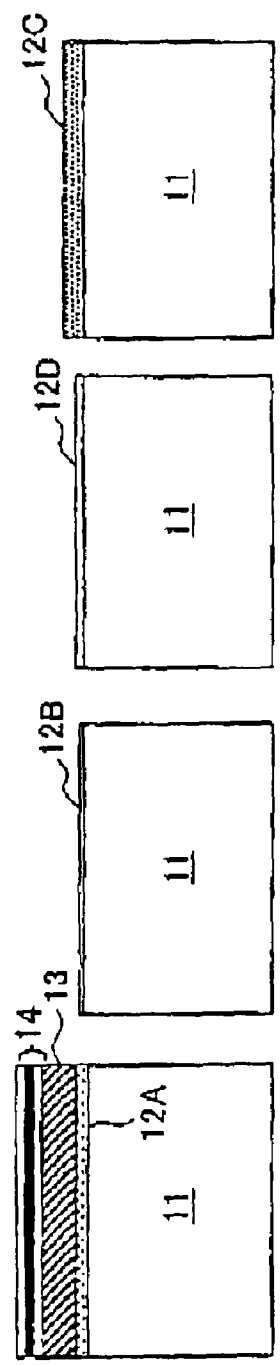

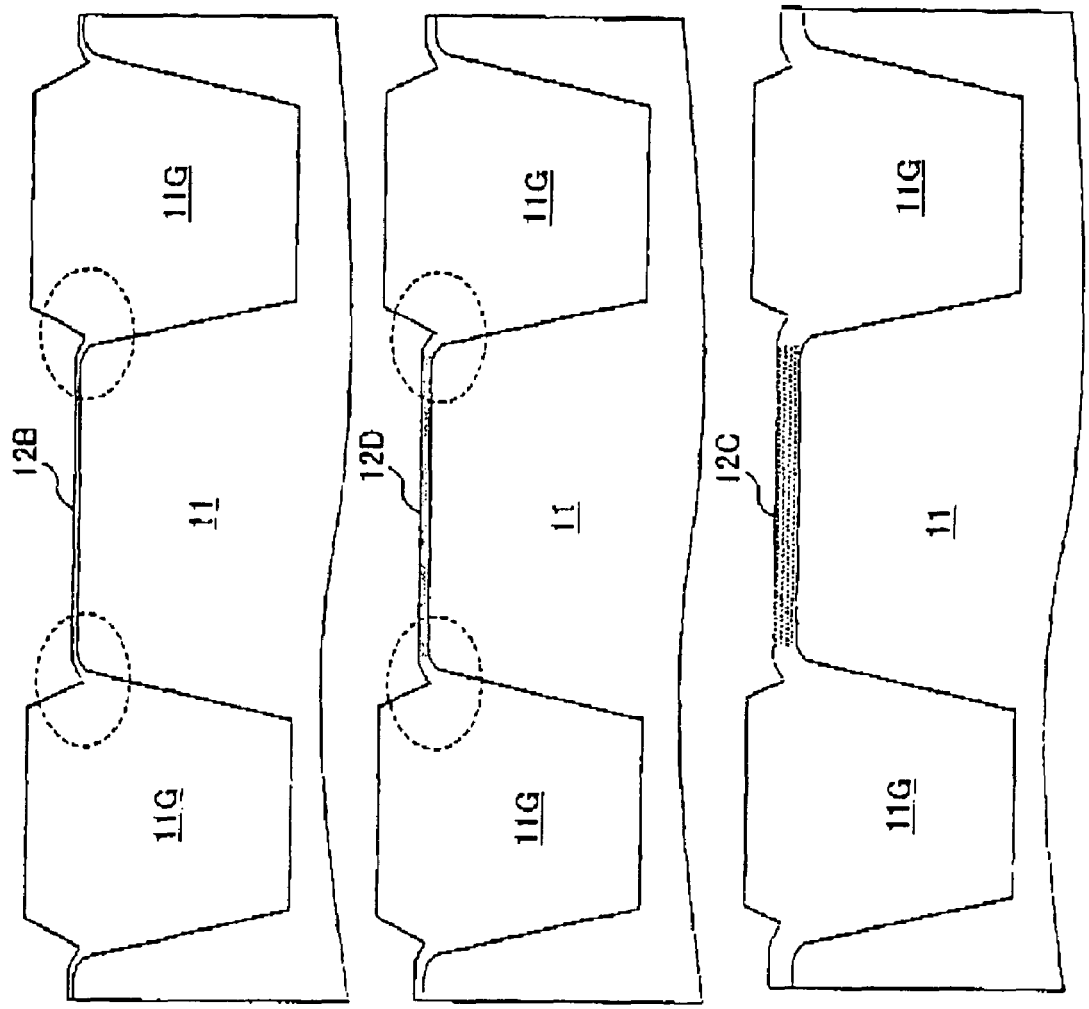

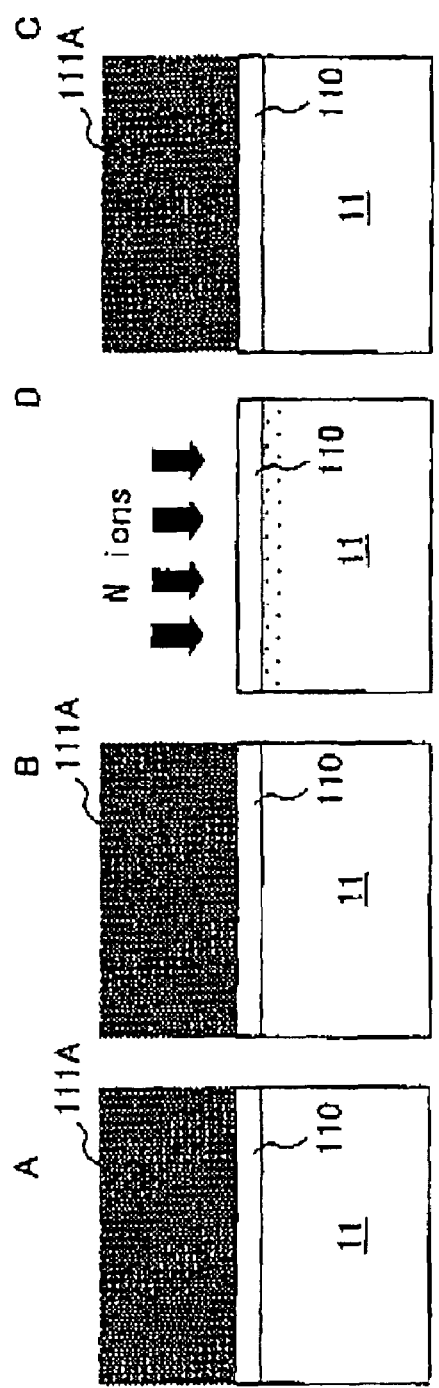
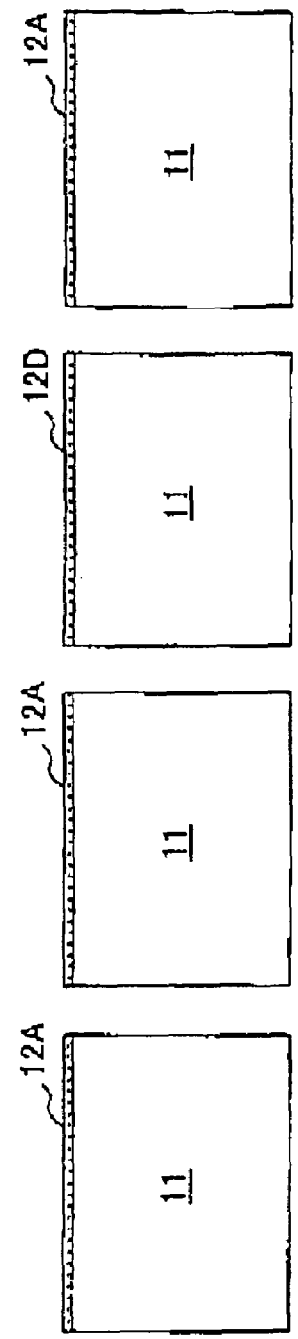
FIG. 42A
FIG. 42B

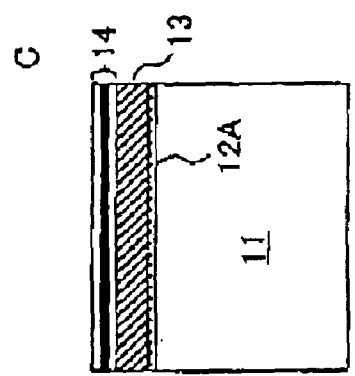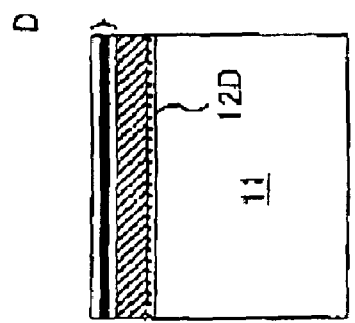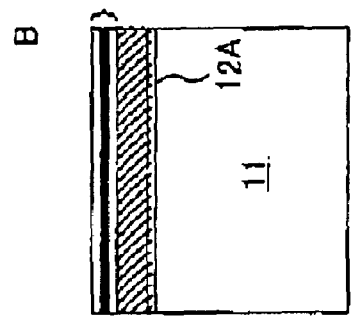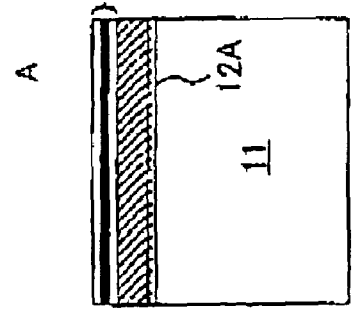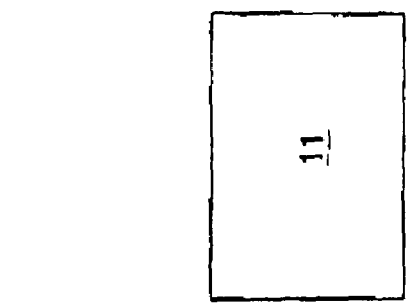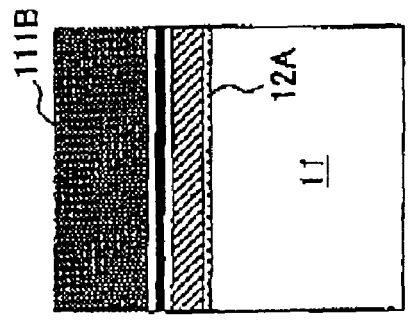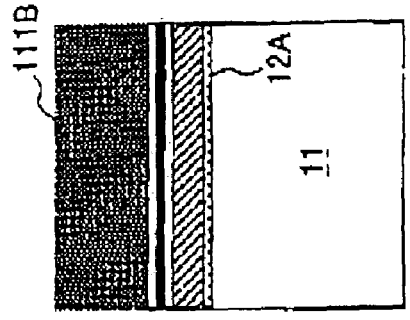
FIG. 42C
FIG. 42D

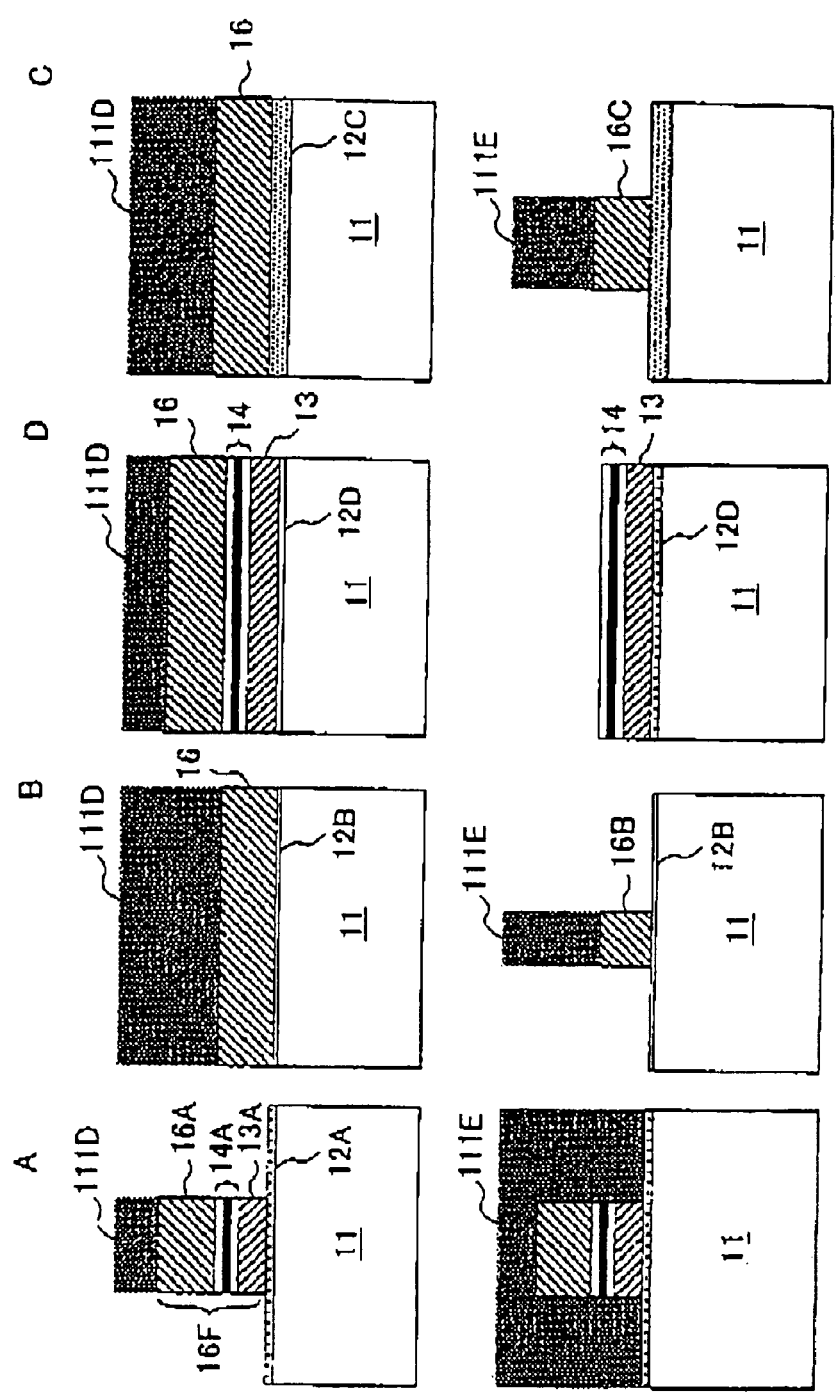

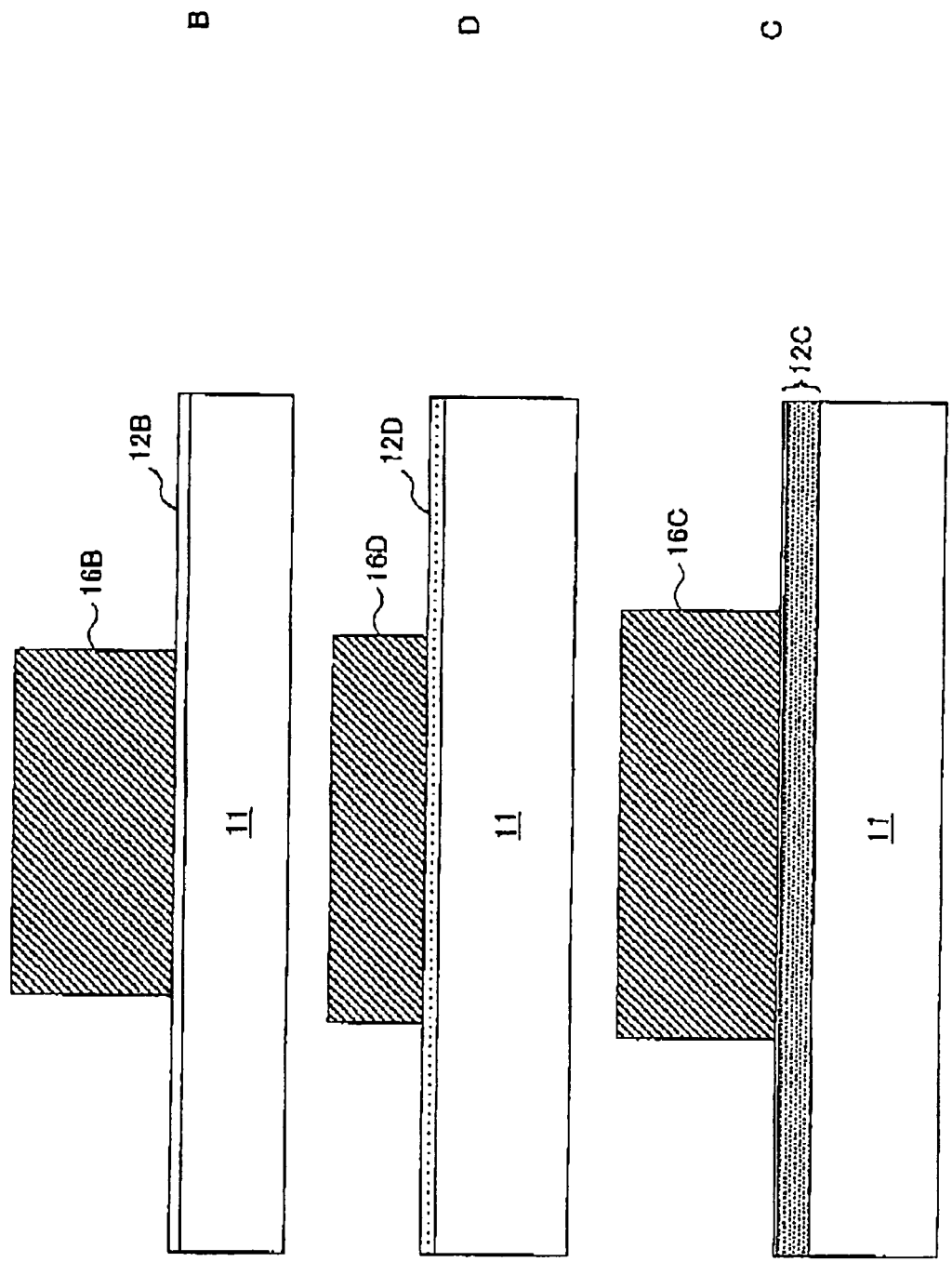

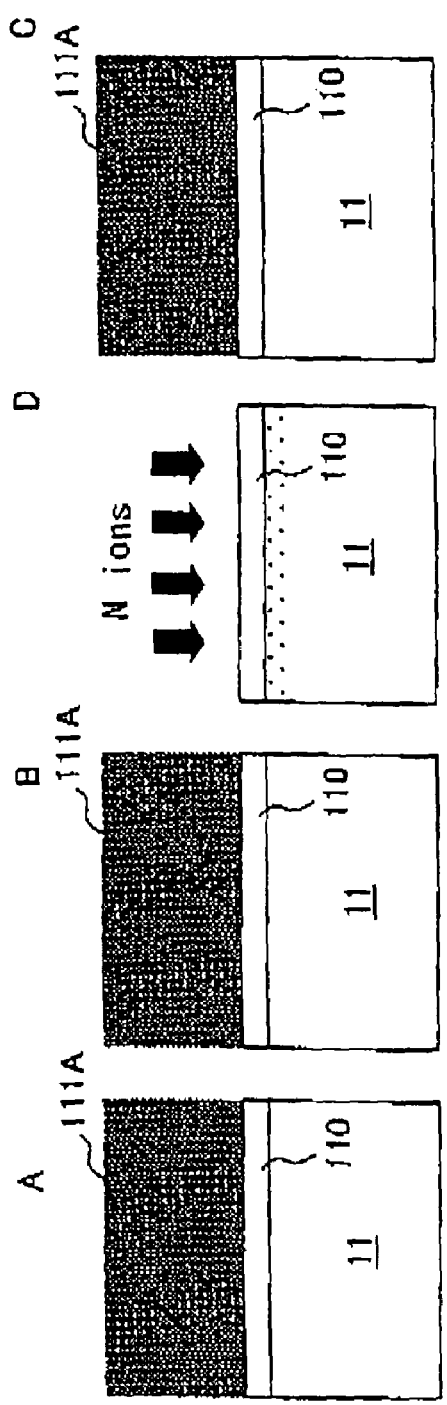
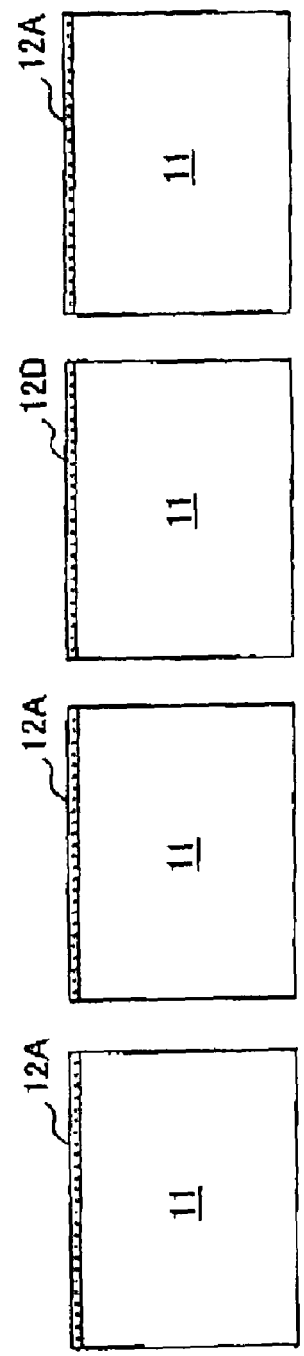
FIG. 44A
FIG. 44B

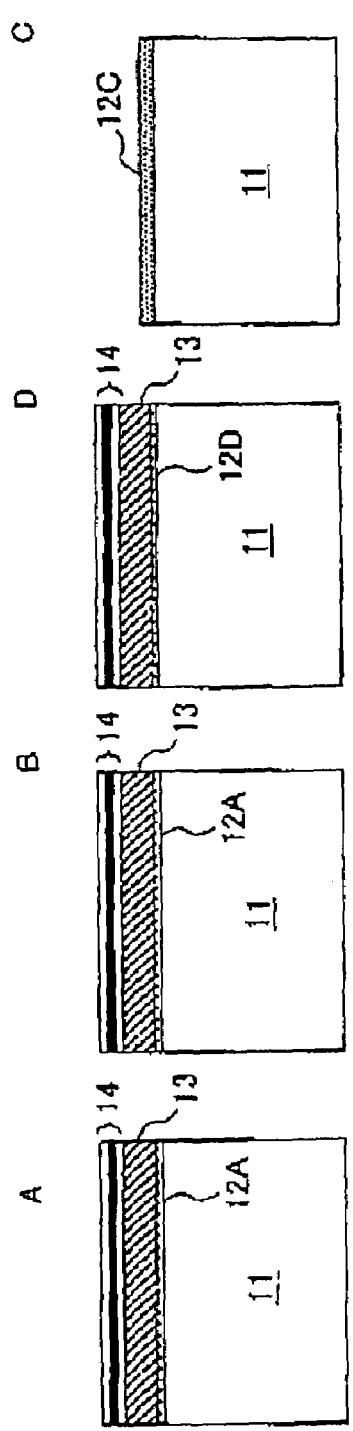
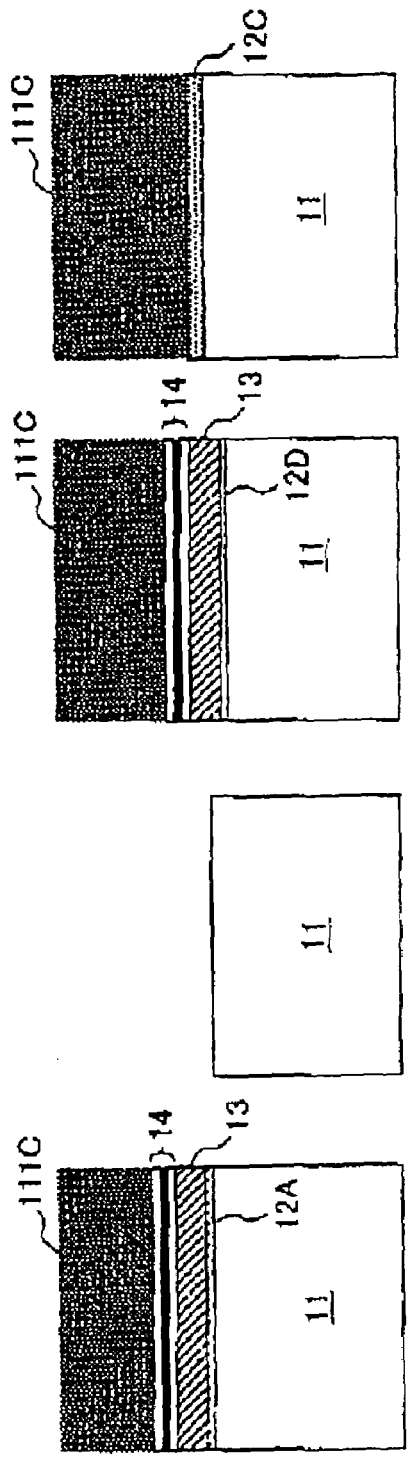
FIG. 44E
FIG. 44F

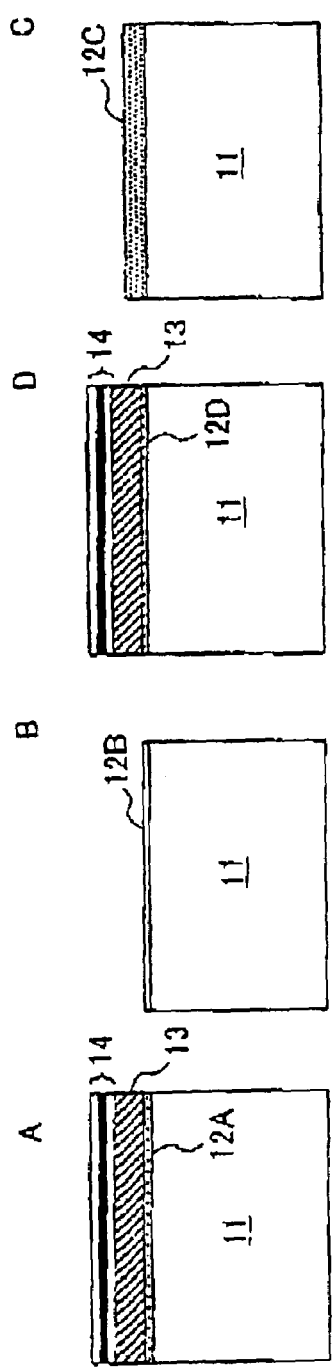
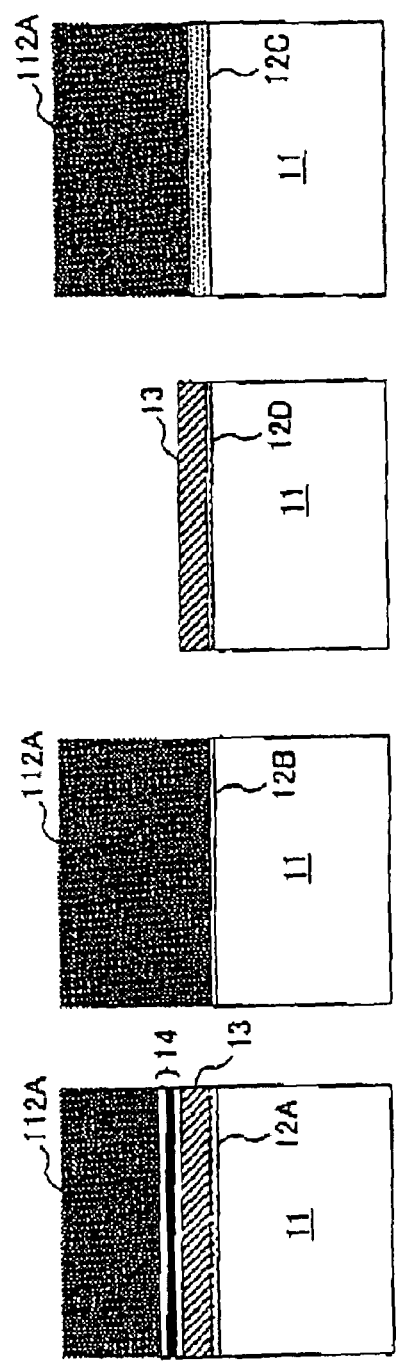
FIG. 44G
FIG. 44H

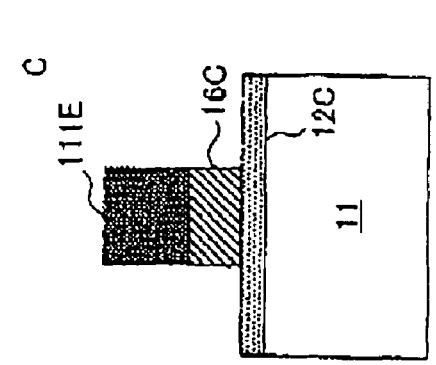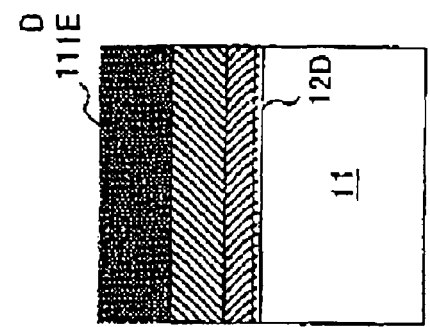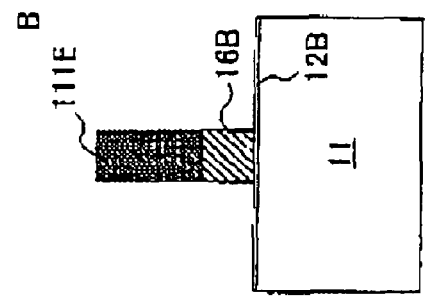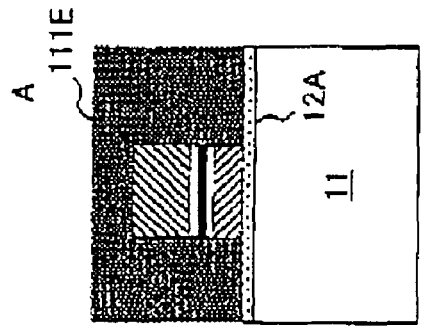
FIG. 44K
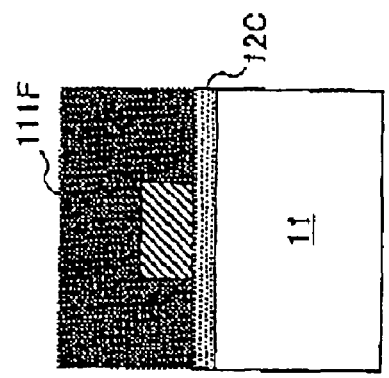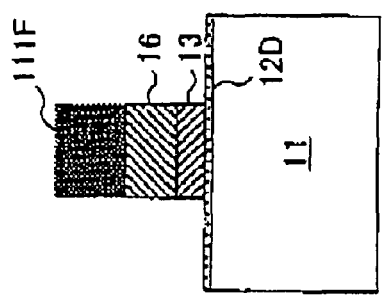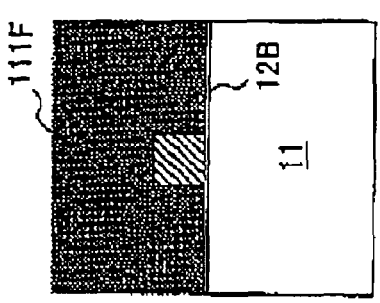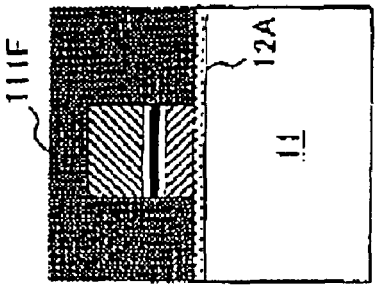
FIG. 44L

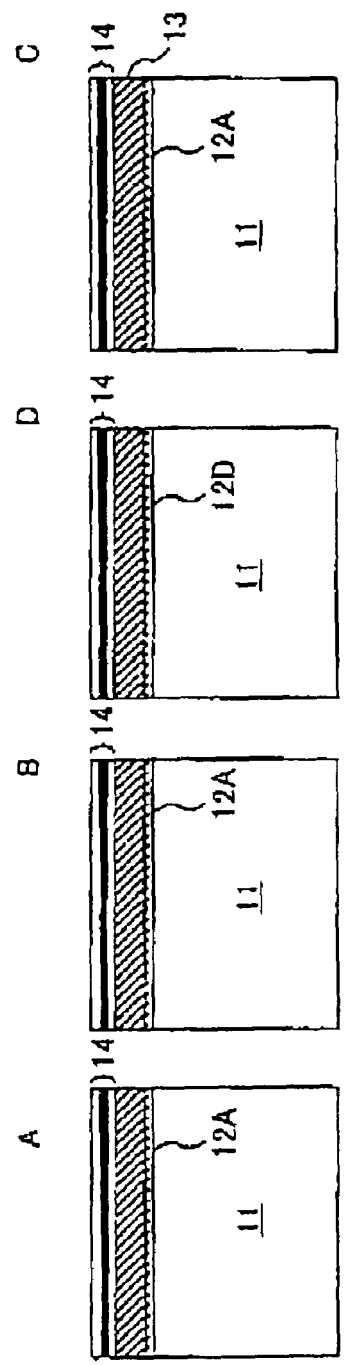
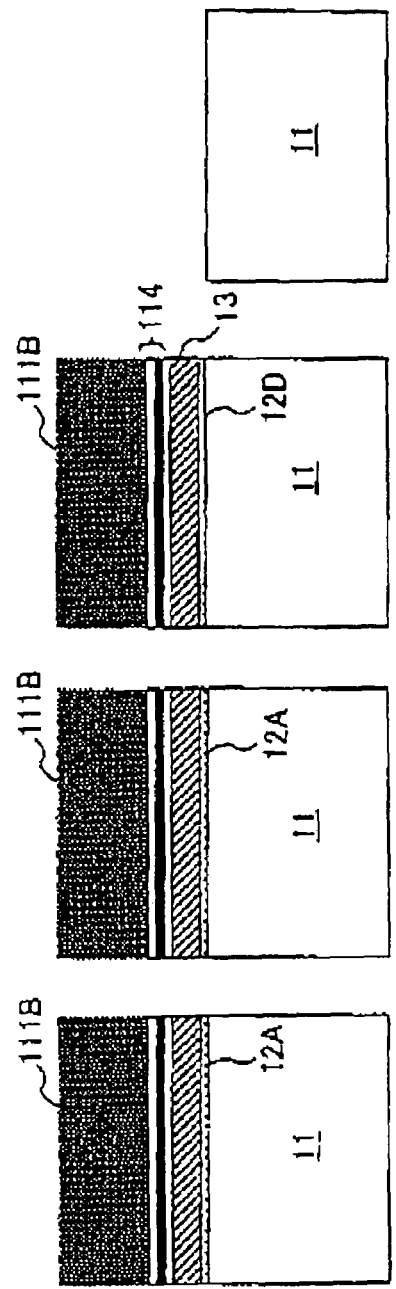
FIG. 46C
FIG. 46D

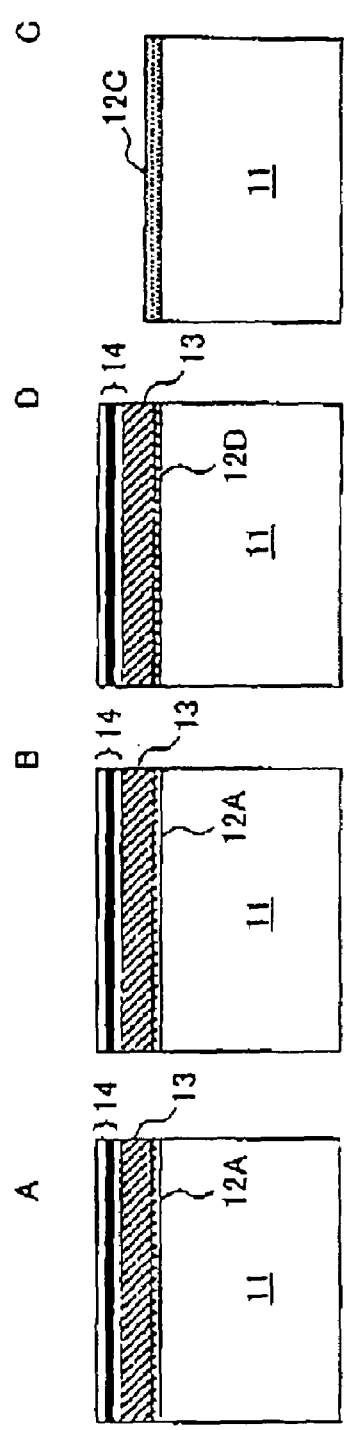
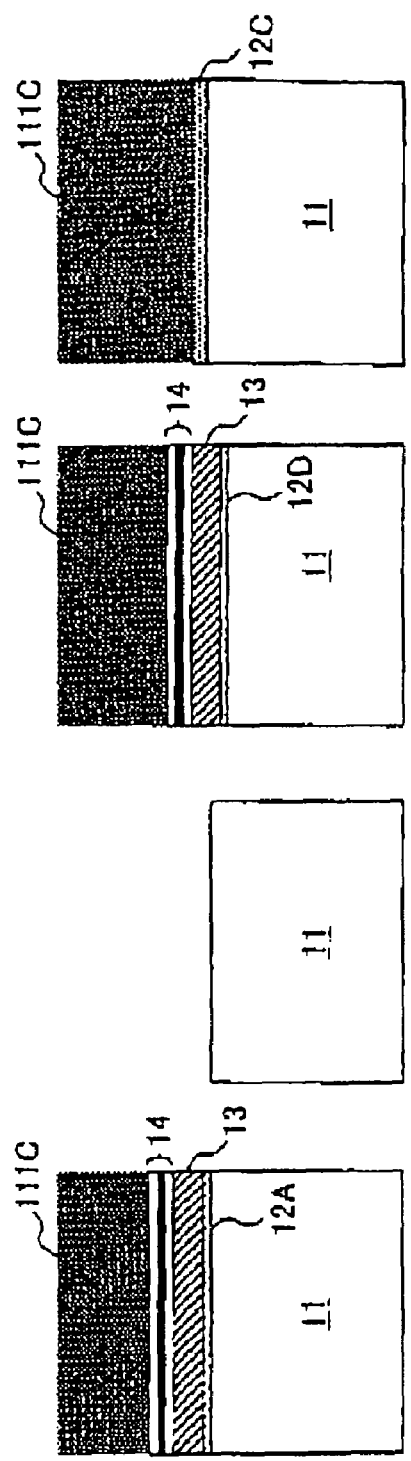
FIG. 46E
FIG. 46F

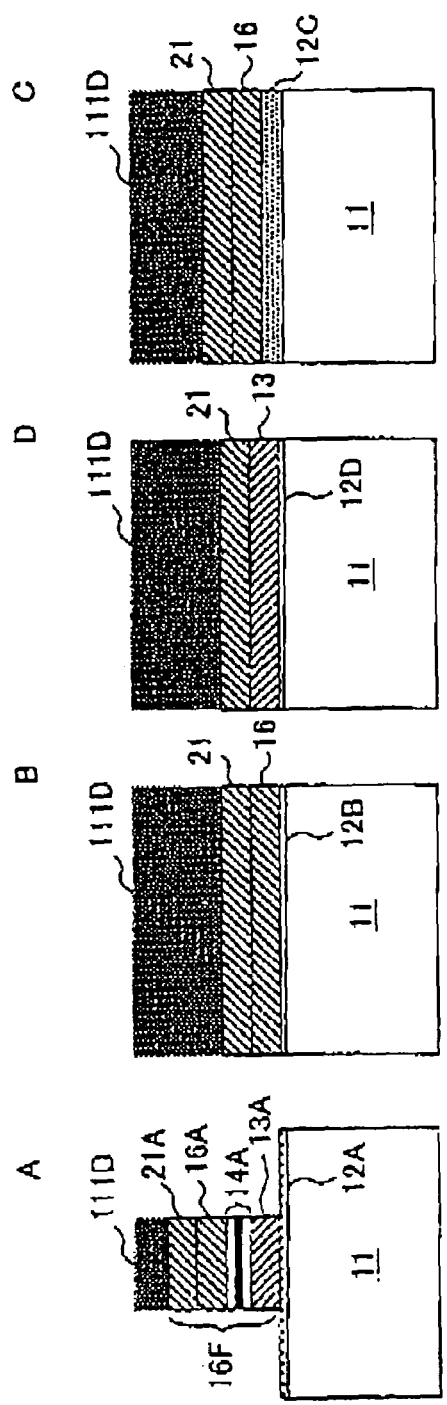
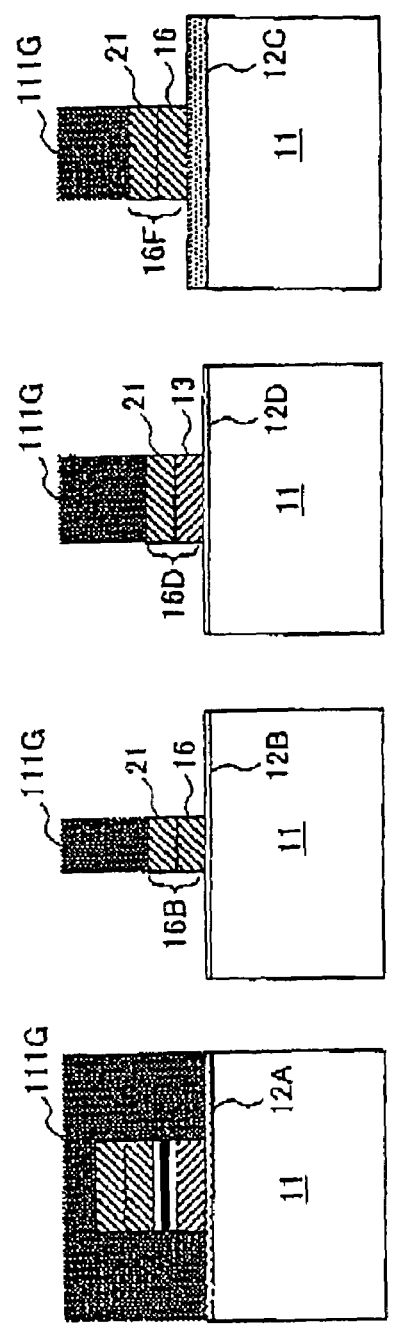
FIG. 46K
FIG. 46L

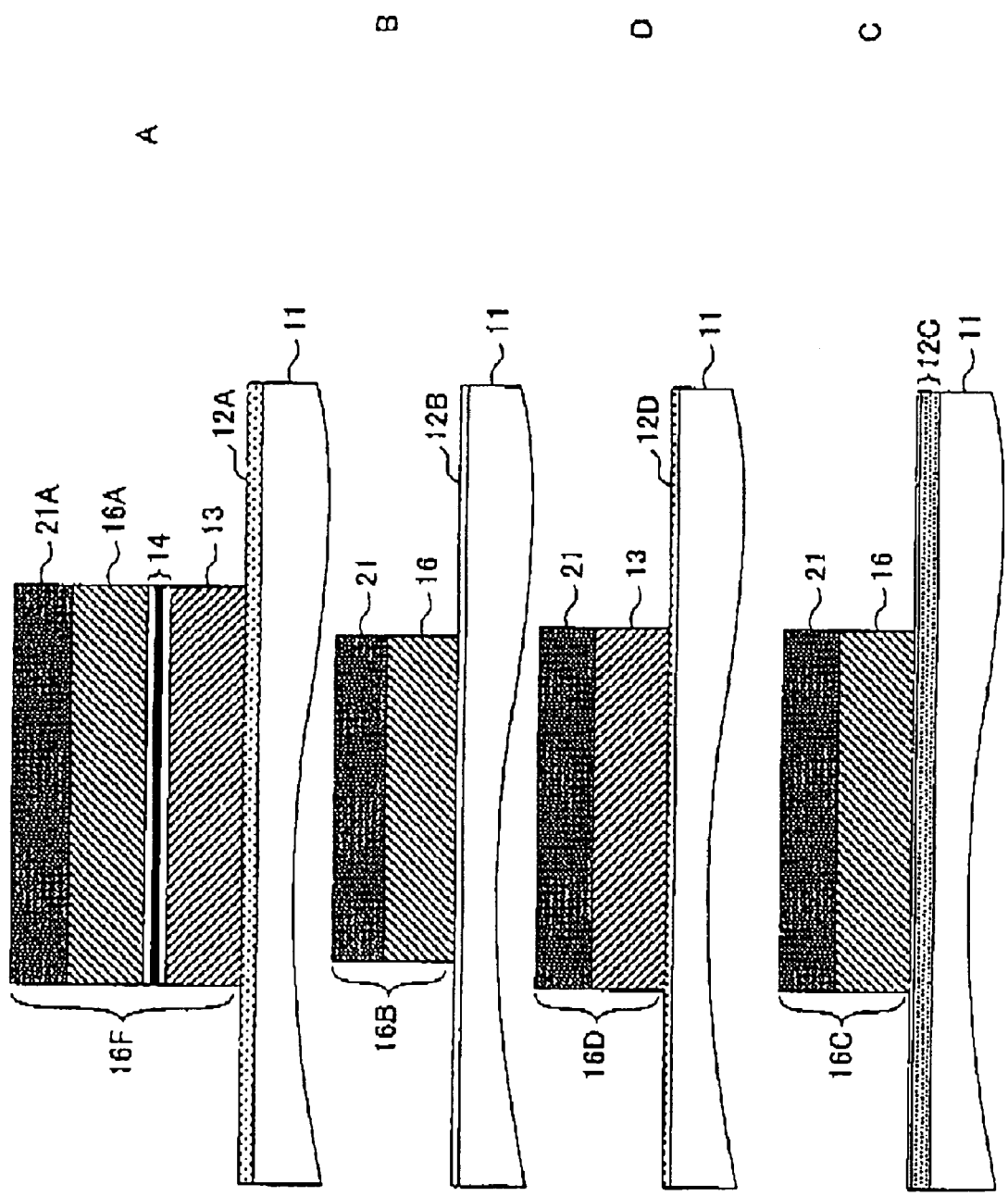

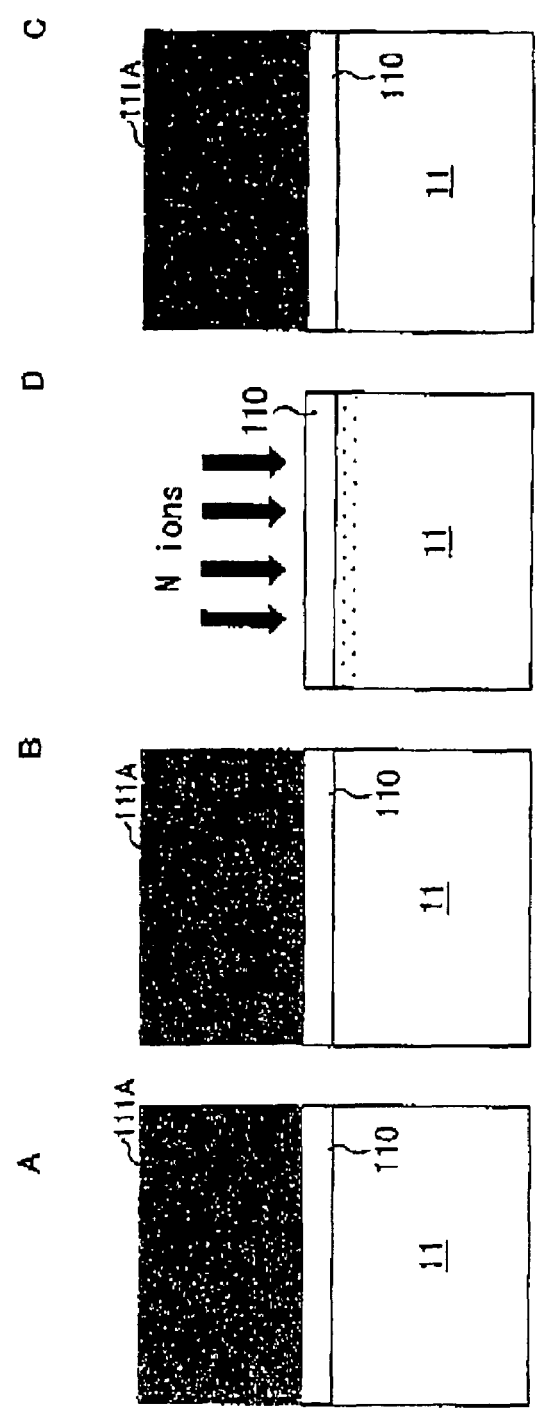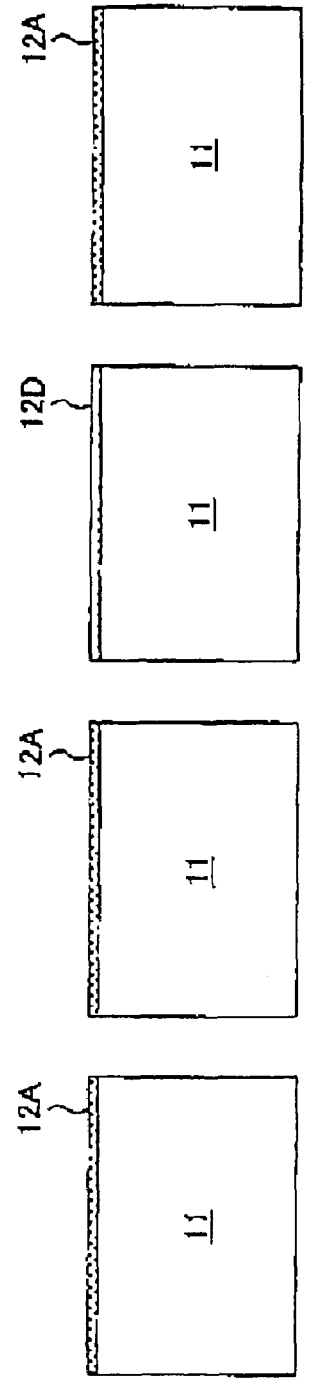
FIG. 48A
FIG. 48B

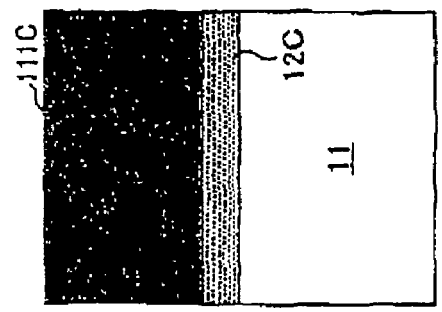
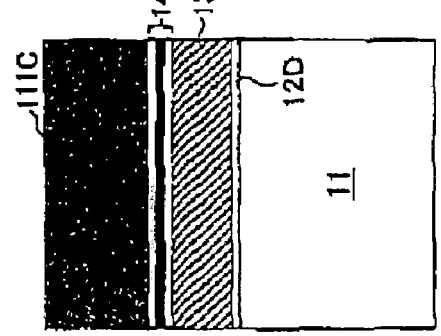
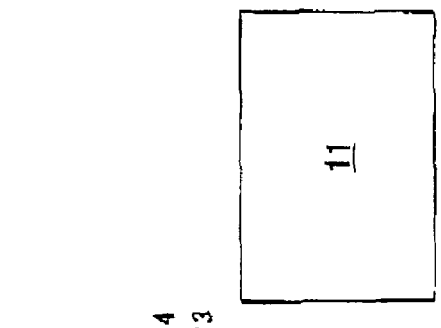
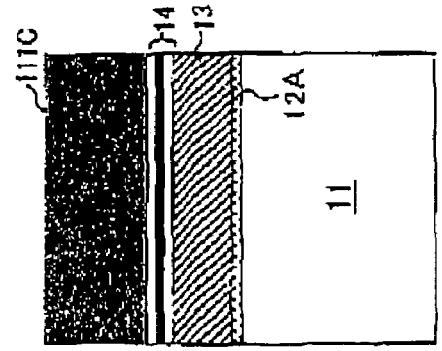
FIG. 48E
FIG. 48F

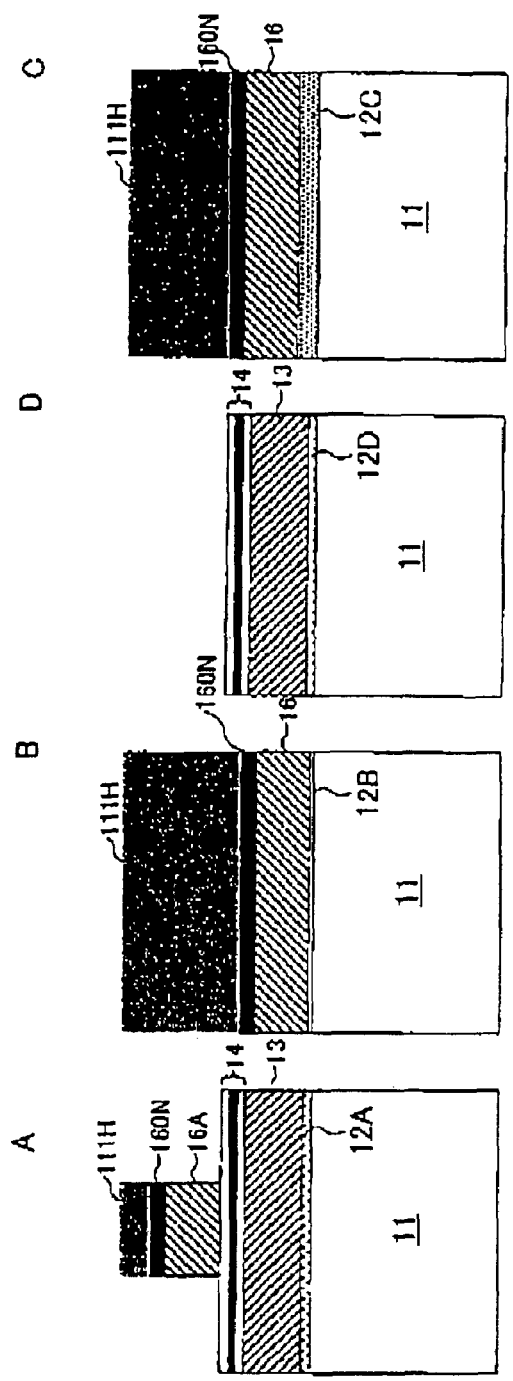
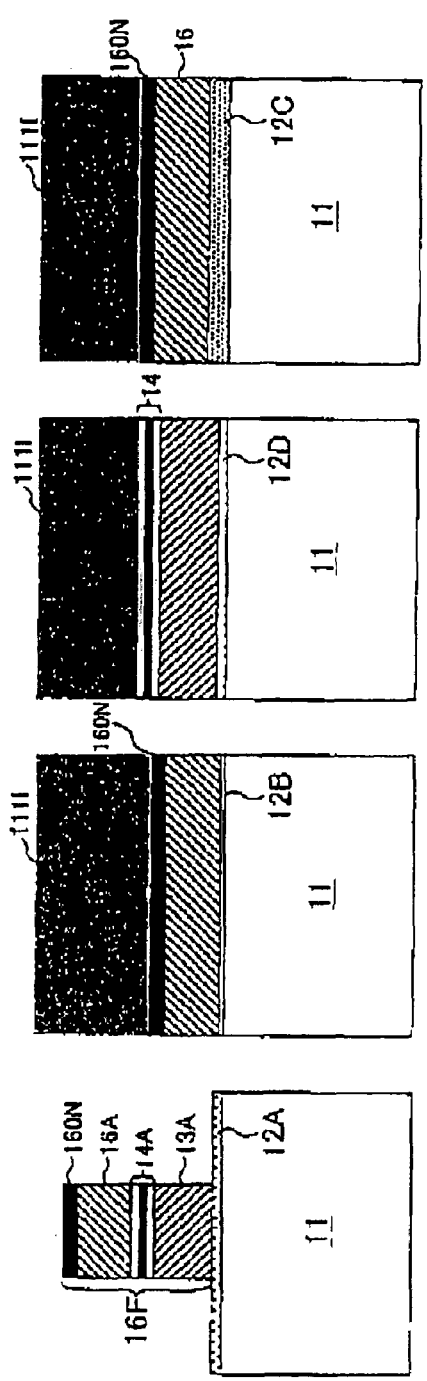
FIG. 48I
FIG. 48J

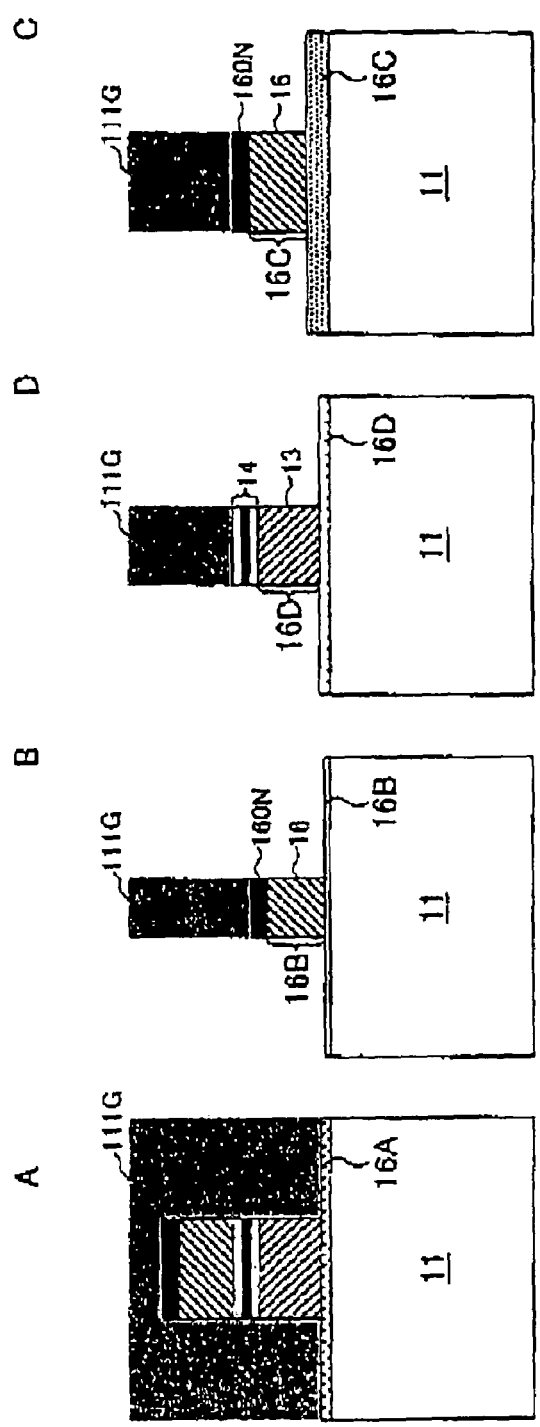

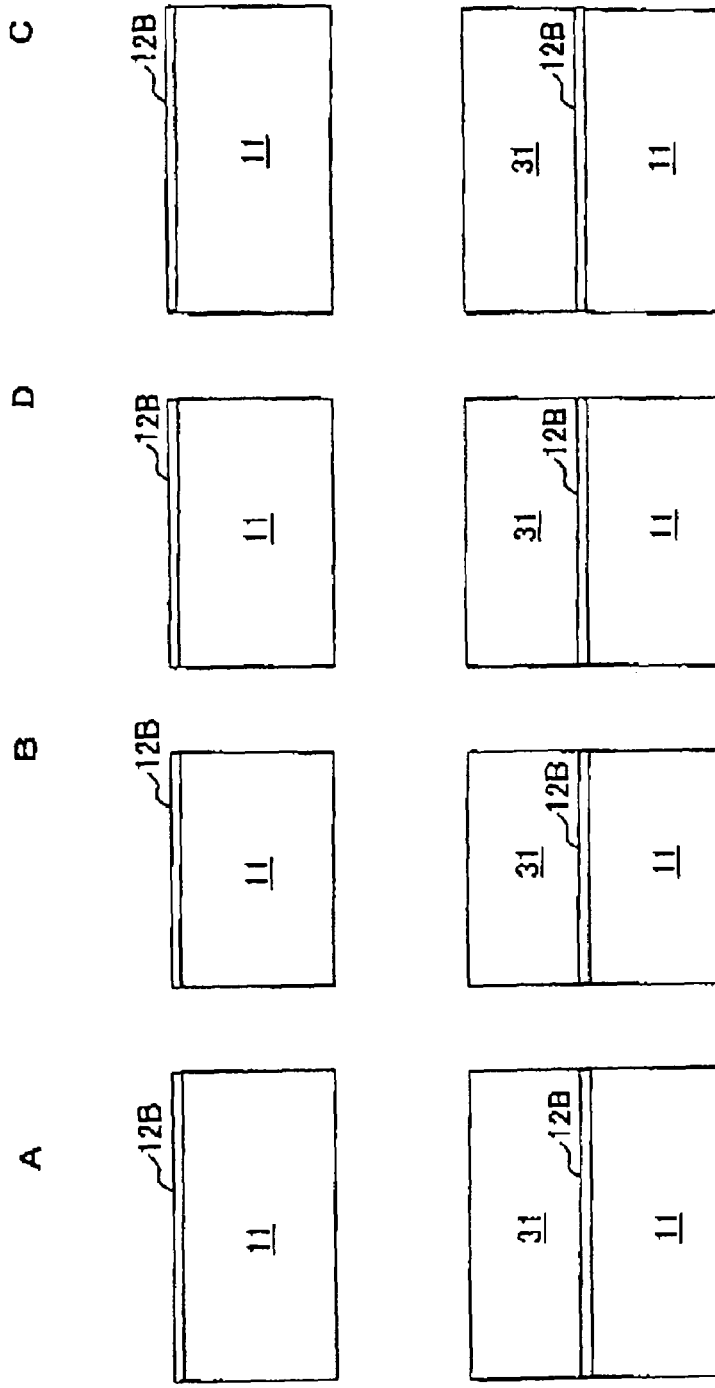

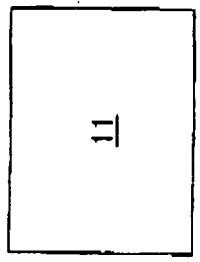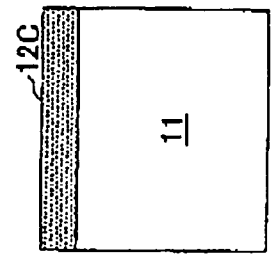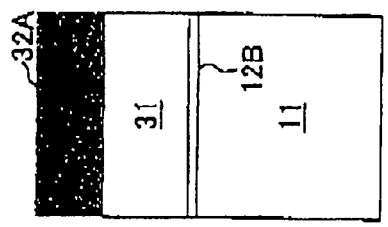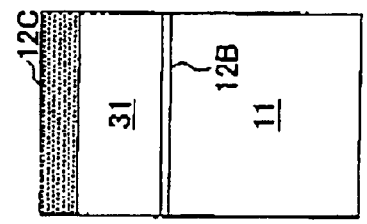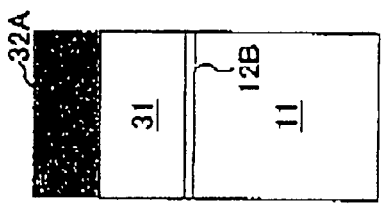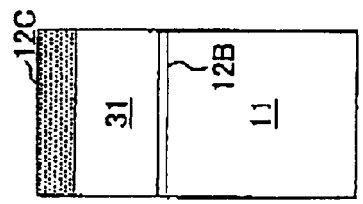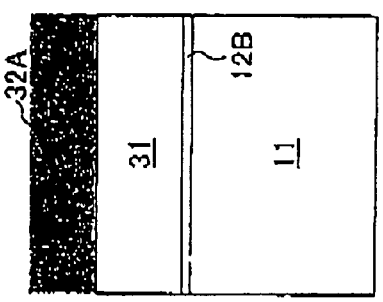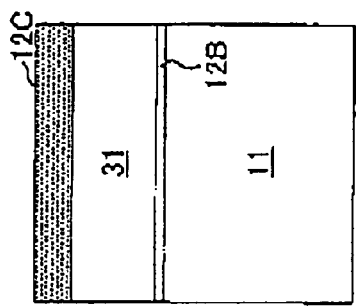
FIG. 50C
FIG. 50D

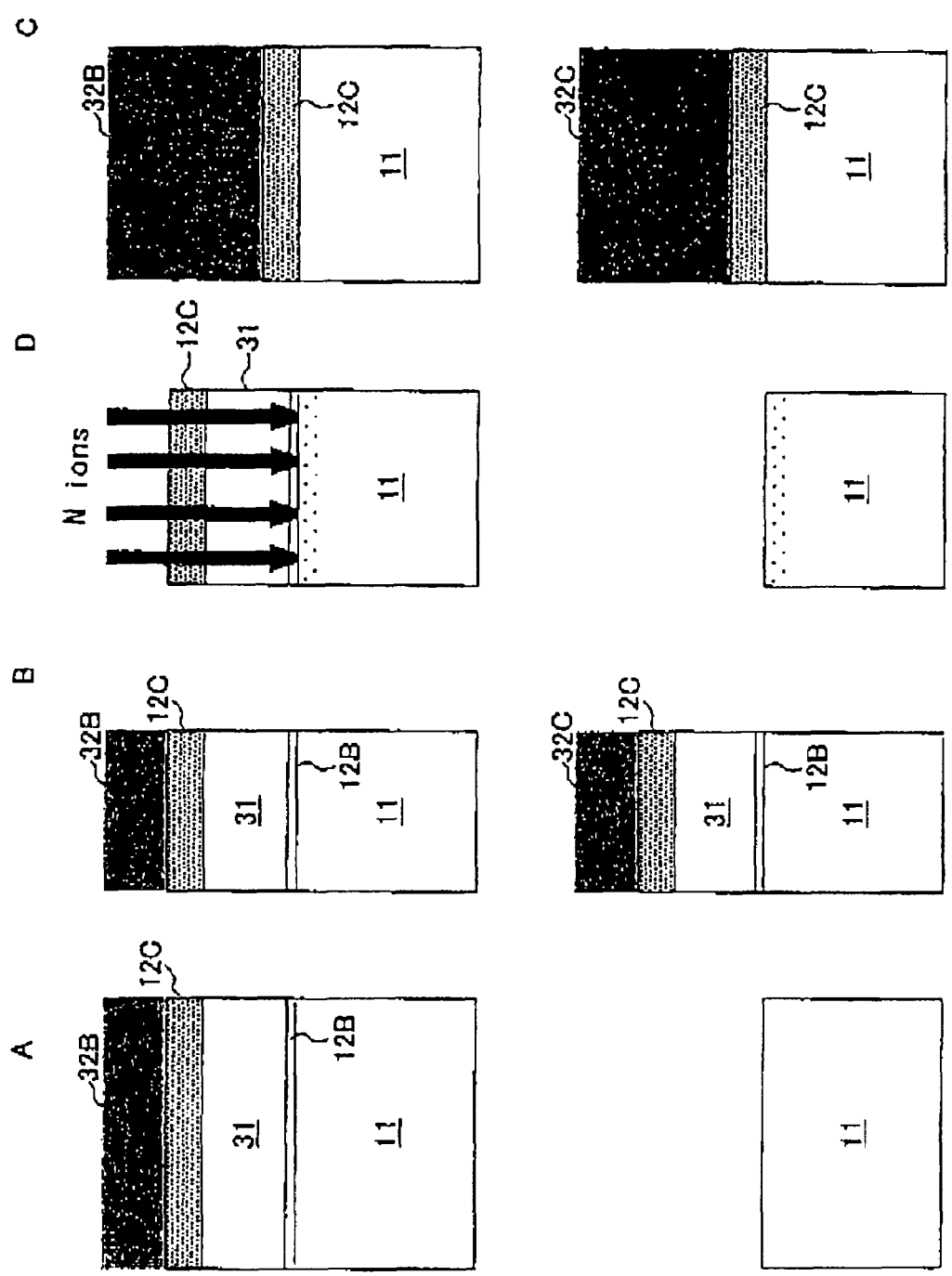

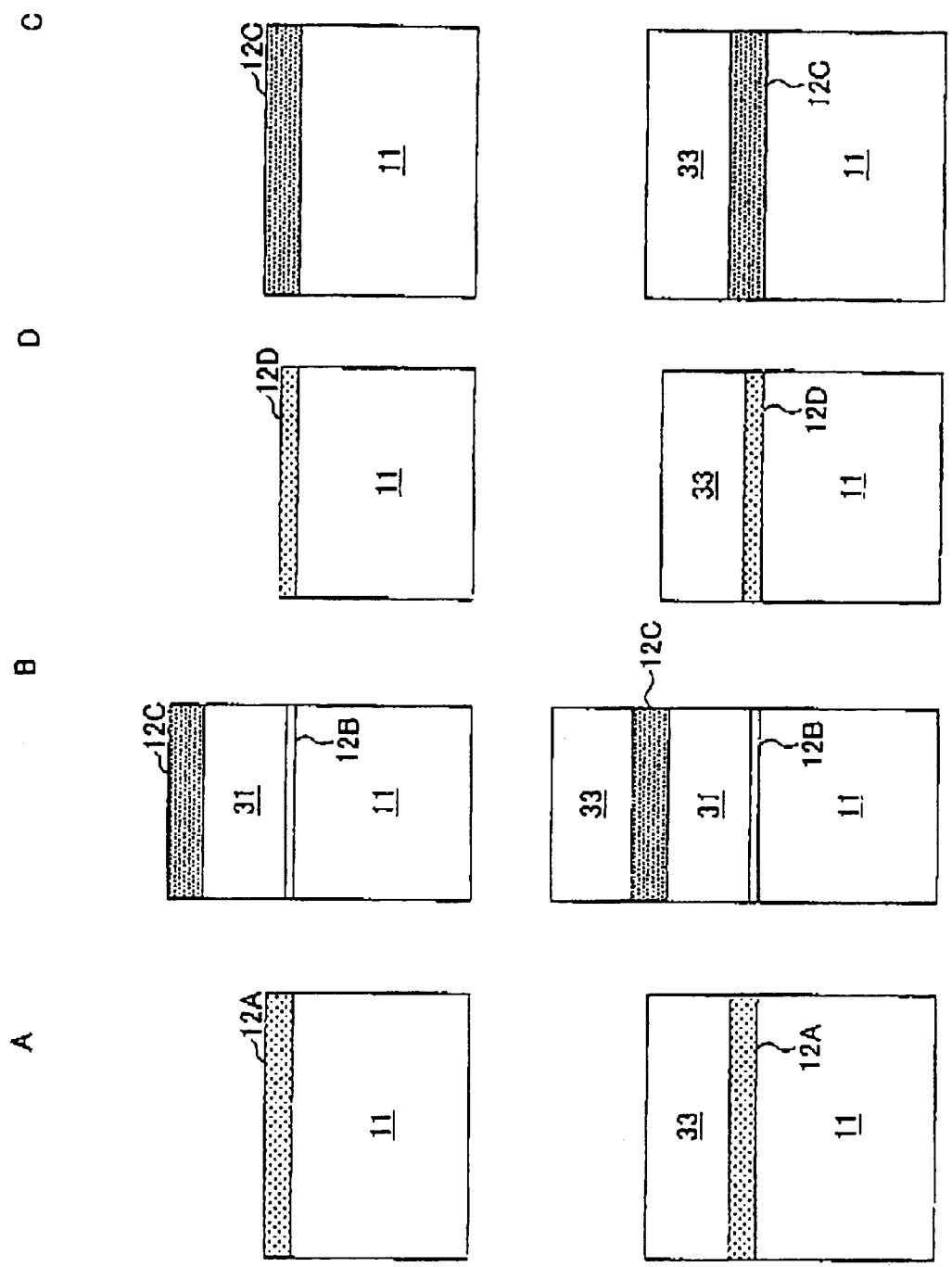

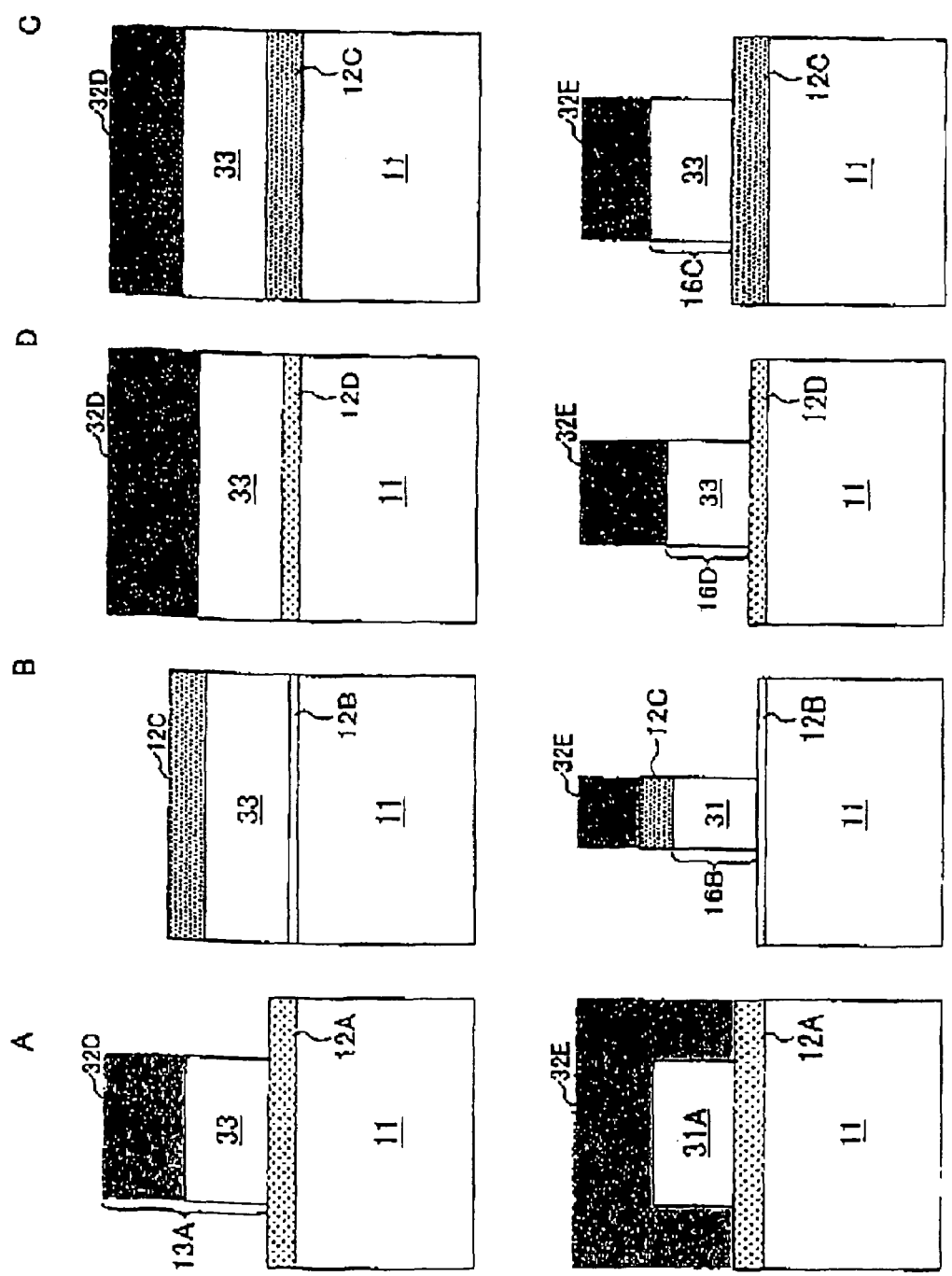

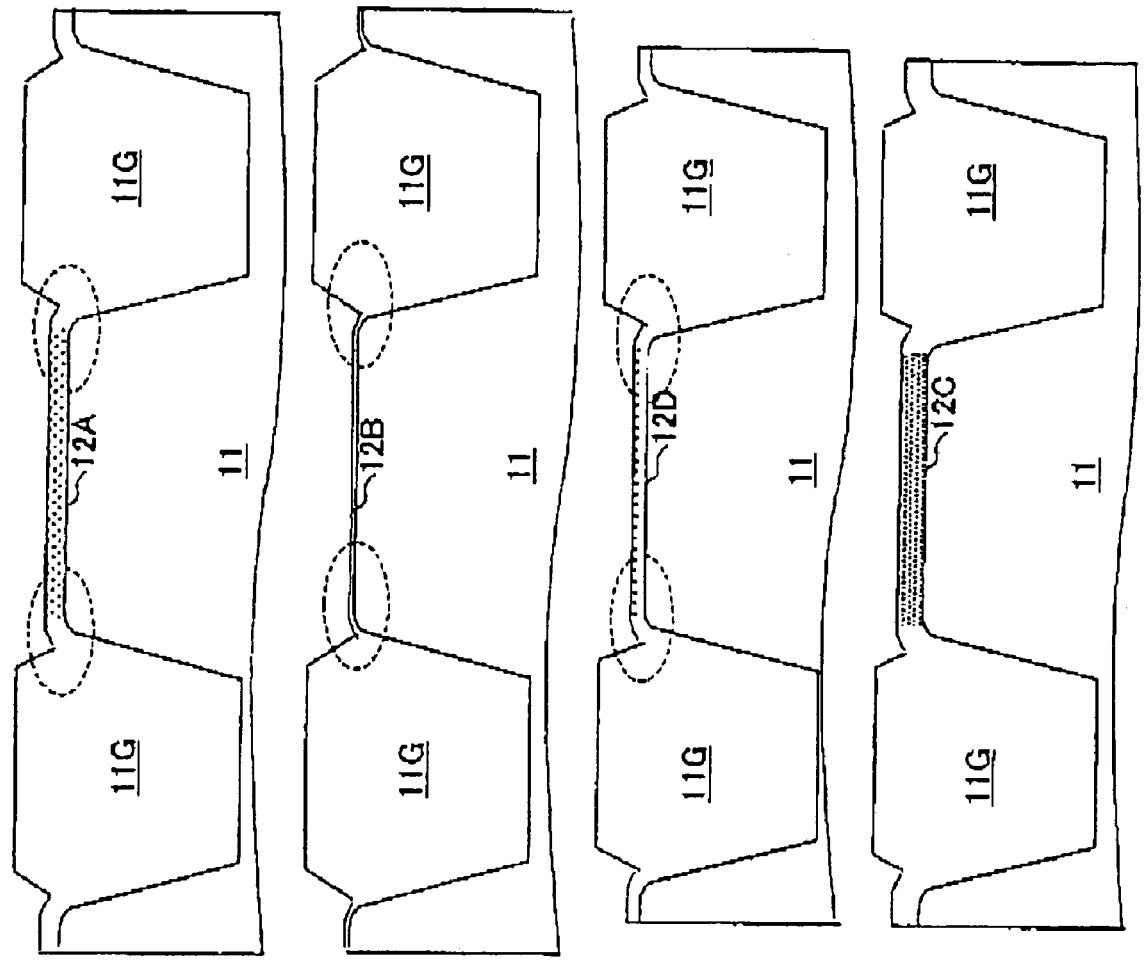

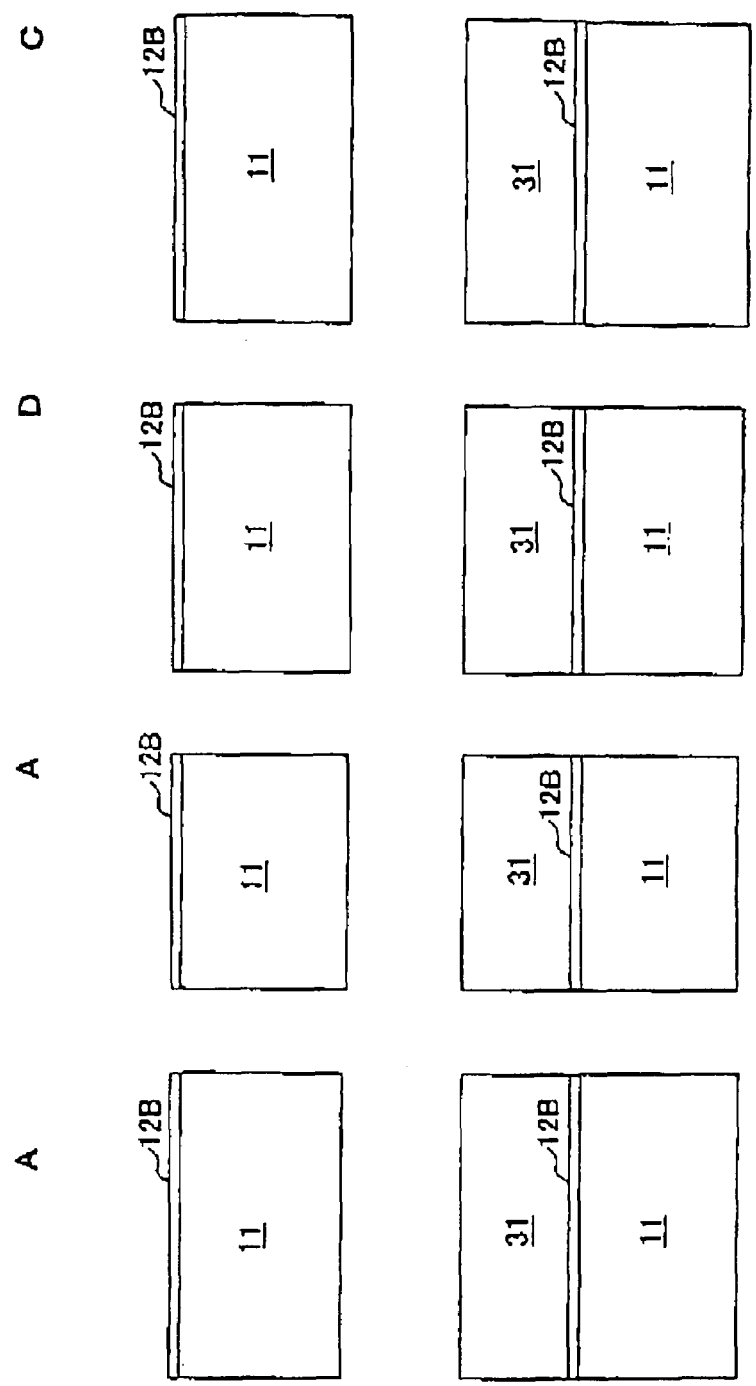

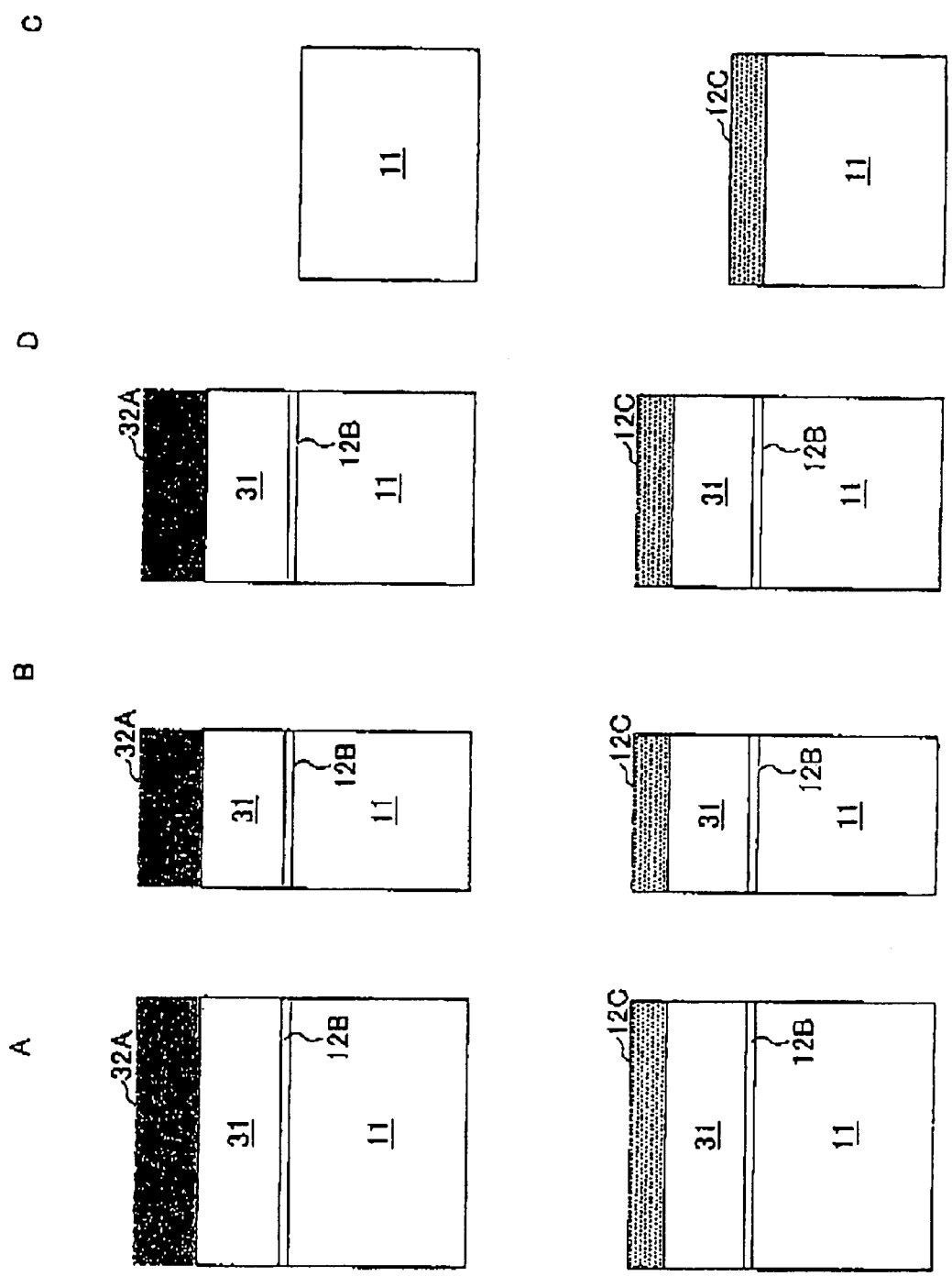

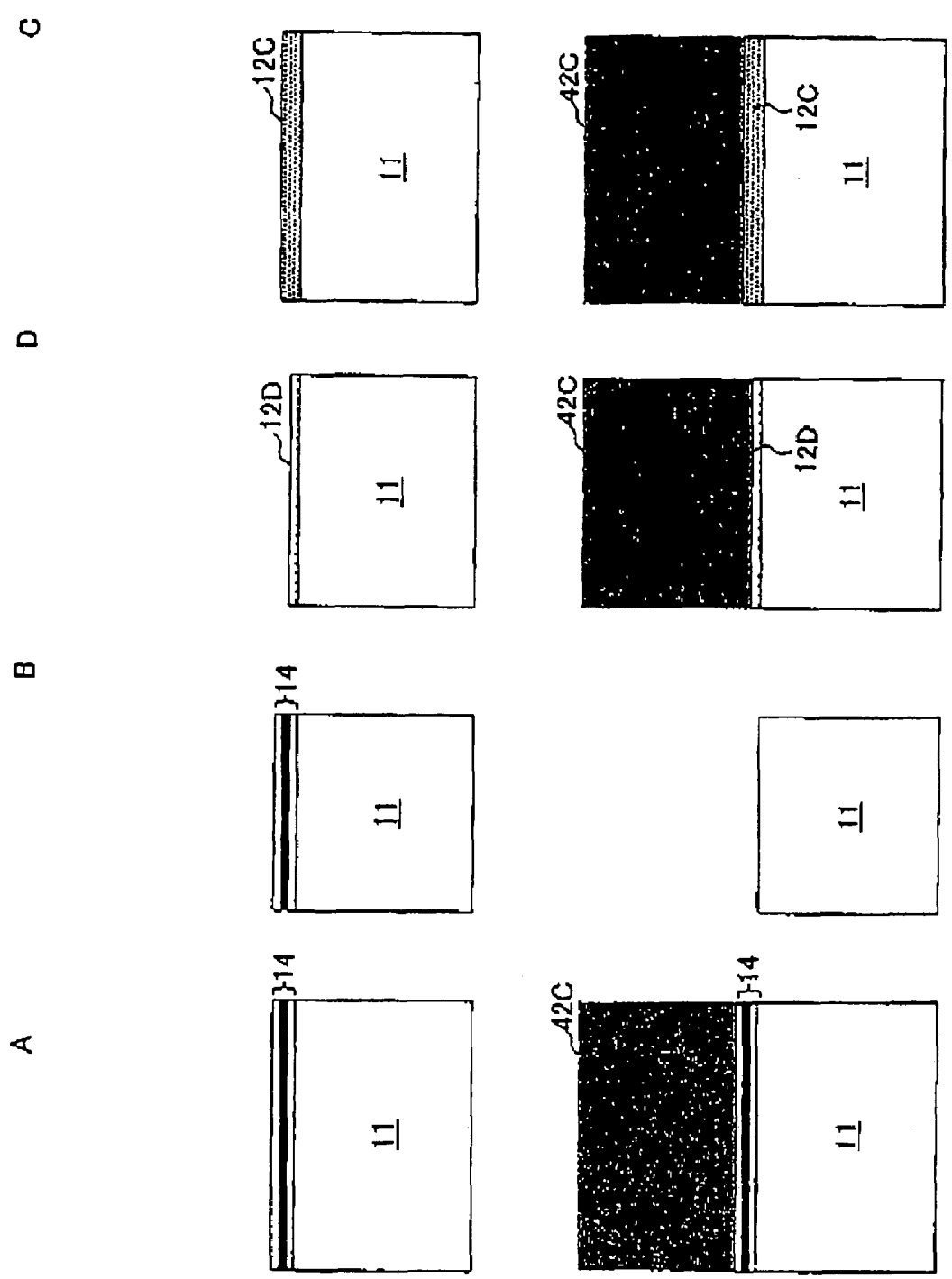

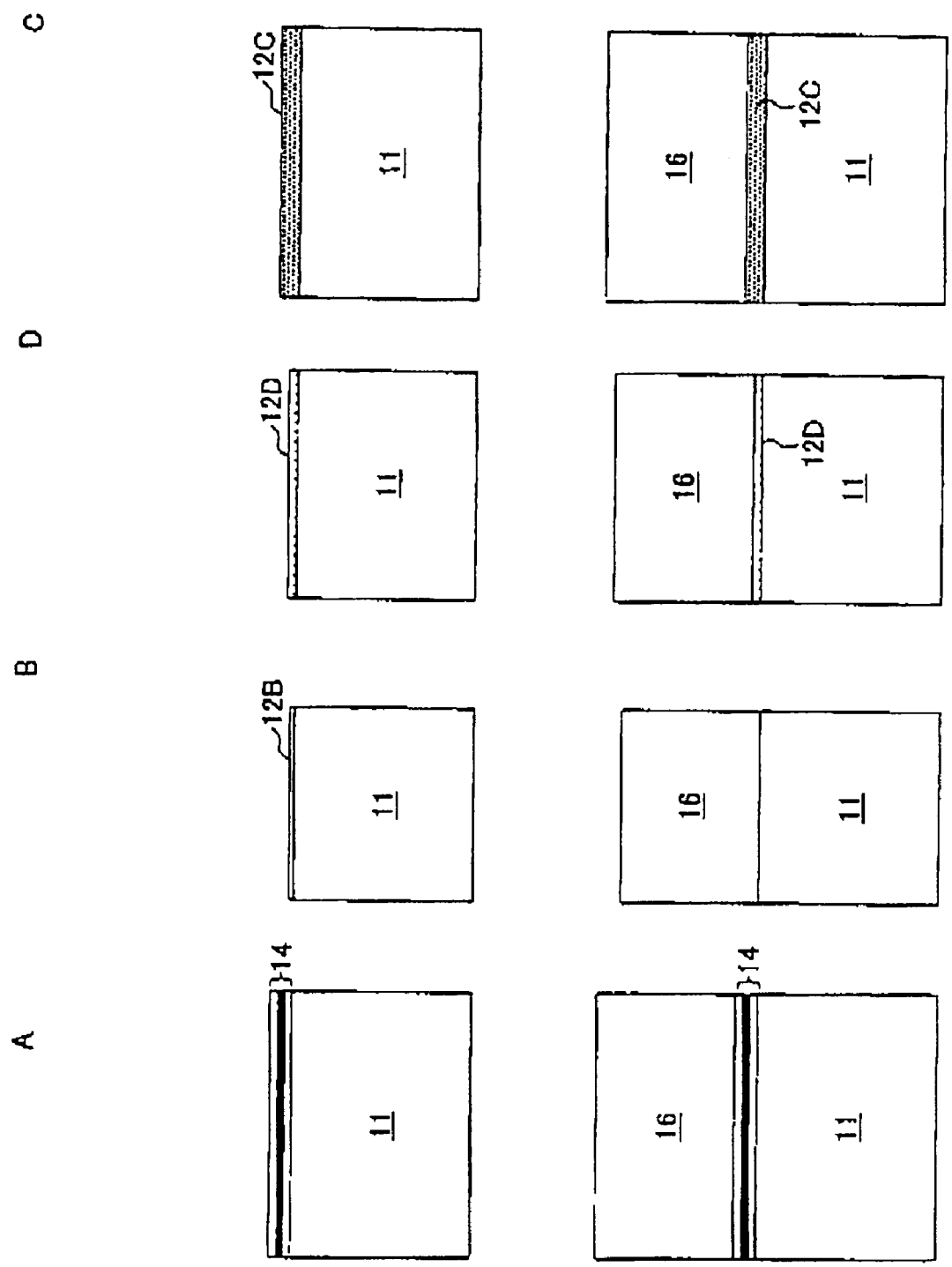

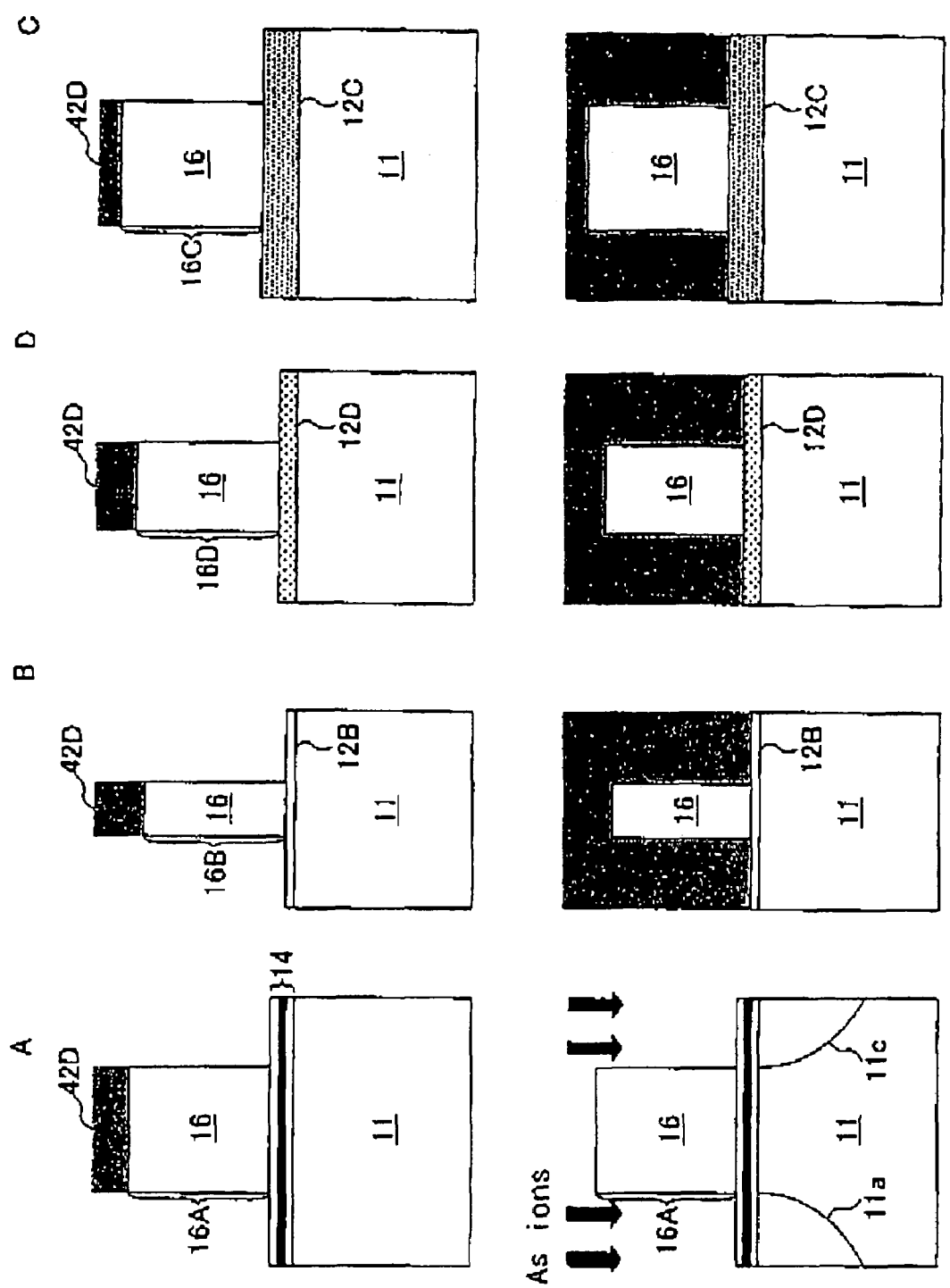

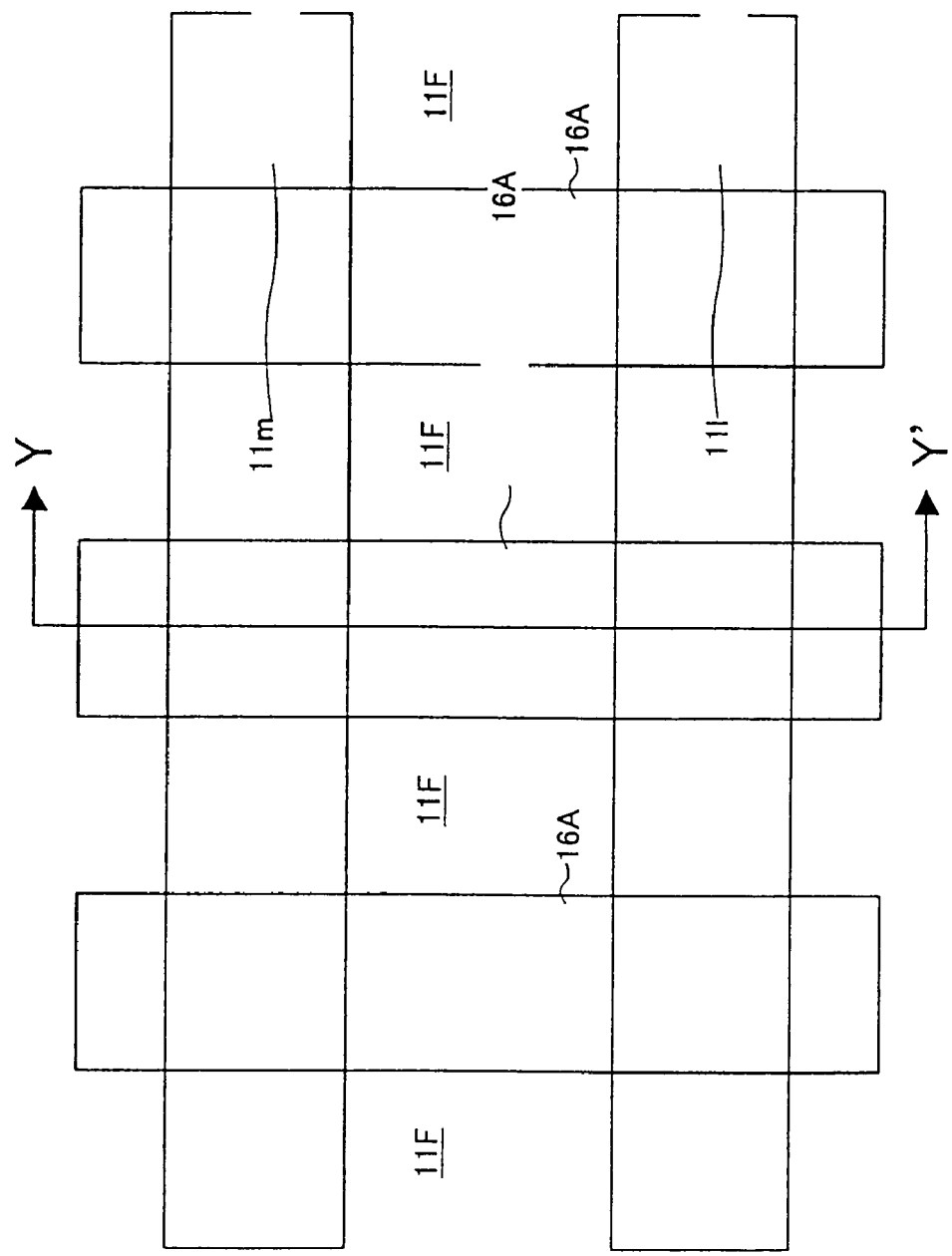

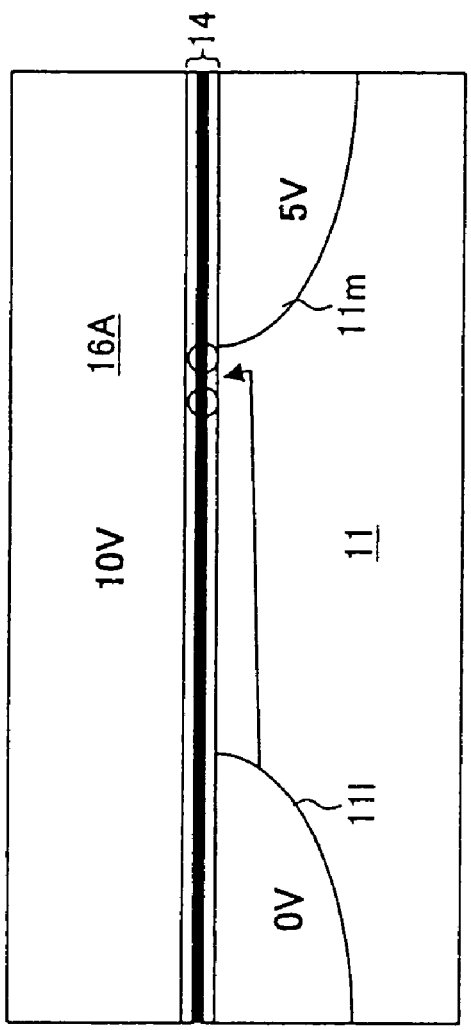
FIG. 58A  Program
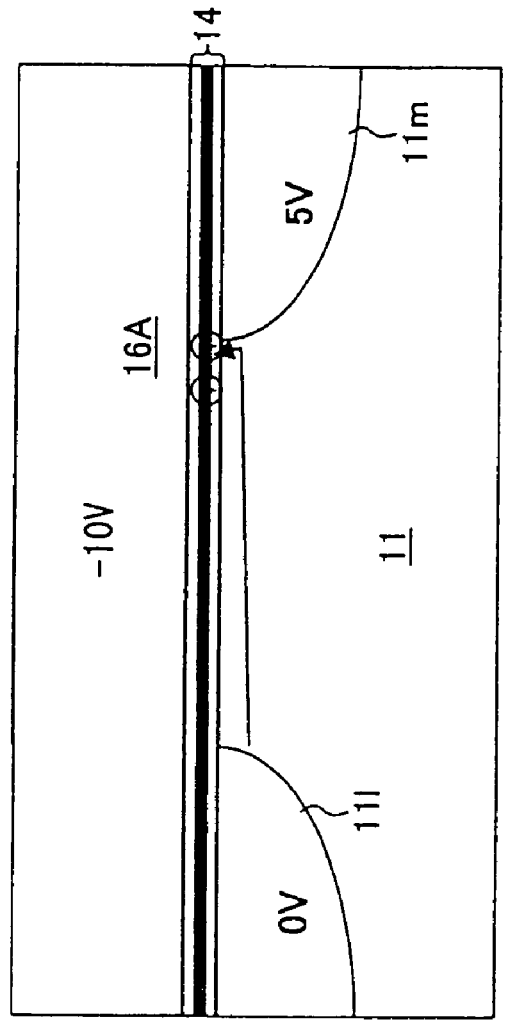
FIG. 58B  Erase

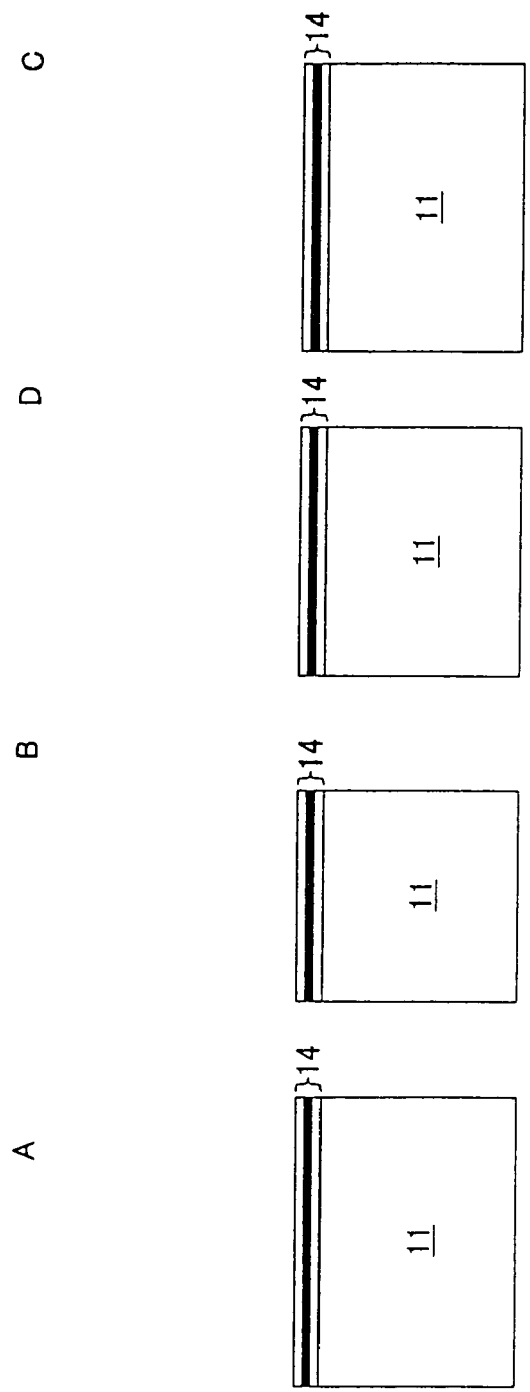
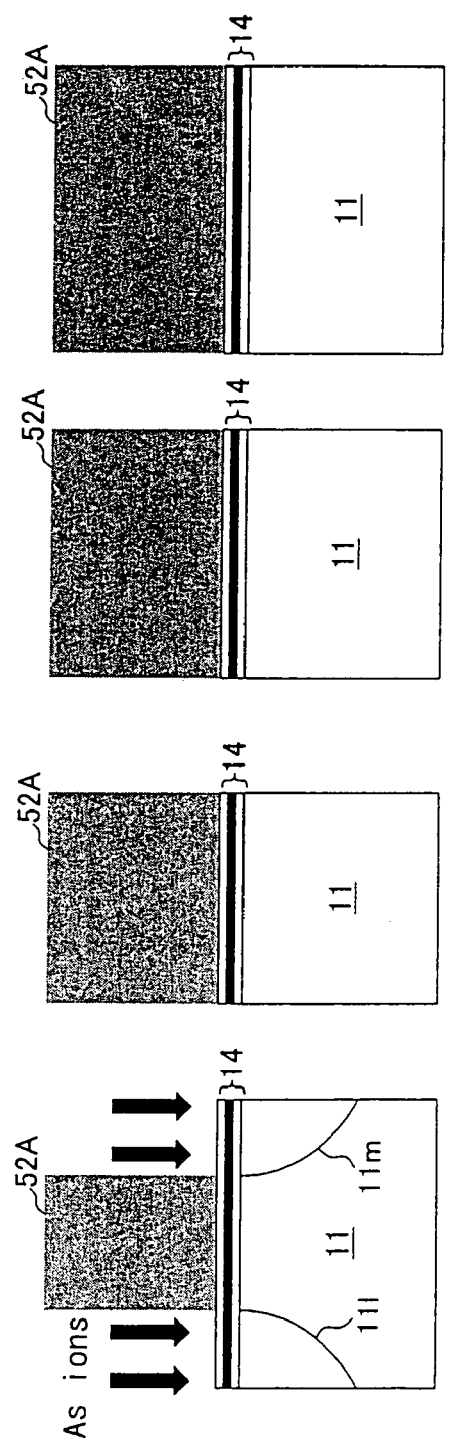
FIG. 59A
FIG. 59B

US 7,635,653 B2

METHOD OF FABRICATING A SEMICONDUCTOR CIRCUIT HAVING A PLURALITY OF MOS TRANSISTORS AND FLASH MEMORY

CROSS-REFERENCE TO RELATED APPLICATION

This application is a divisional application of U.S. application Ser. No. 09/960,399, filed Sep. 24, 2001, the entire contents of which are hereby incorporated by reference.

The present application is based on Japanese priority application No. 2001-188186 filed on Jun. 21, 2001, the entire contents of which are hereby incorporated by reference.

BACKGROUND OF THE INVENTION

This invention generally relates to semiconductor devices. Especially, this invention relates to a semiconductor integrated circuit device that includes a non-volatile semiconductor memory device. Further, this invention is related to fabrication process of a semiconductor integrated circuit that uses a plural power supply voltages.

A flash memory is a non-volatile semiconductor memory device that stores information in a floating-gate electrode in the form of electric charges. It has a simple device construction. Therefore, it is suited to construct a large-scale integrated circuit device.

In a flash memory, writing and erasing of information is done by injection and pulling out of hot-carriers to or from a floating-gate electrode through a tunneling insulation film. In this operation, a high voltage is required for producing hot-carriers. For this purpose, a boosting circuit is provided in a peripheral circuit that cooperates with a memory cell for boosting a power supply voltage. The transistor used in such a peripheral circuit is required to operate at high voltage.

Meanwhile, it is recently practiced to construct such a flash memory device together with a high-speed logic circuit on a common semiconductor substrate in the form of semiconductor integrated circuit. The transistors that are used in such a high-speed logic circuit operate at low voltage. Because of this, there is a need to use a plural power supply voltages in such a semiconductor integrated circuit.

FIG. 1A-1Q are diagrams showing the fabrication process of a conventional semiconductor integrated circuit including a flash memory. The semiconductor integrated circuit uses plural power supply voltages.

FIG. 1A is referred to.

A flash-memory cell region A, a low-voltage transistor region B and a high-voltage transistor region C are defined on a Si substrate 11 that carries thereon a field oxide film or STI structure or other device isolation structure (not shown).

In the step of FIG. 1A, a thermal oxidation processes is applied to the surfaces of the Si substrate 11 at 800-1100° C., and a tunneling oxide film 12A is formed in regions A-C with a thickness of 10 nm. Furthermore, in the step of FIG. 1B, an amorphous silicon film 13 doped with P (phosphor) is formed on the tunneling oxide film 12A with a thickness of 8-12 nm, and an insulation film 14 having an ONO structure is formed on the tunneling oxide film 12A. The ONO insulation film 14 is formed of an $SiO_2$ film 14a deposited on the amorphous silicon film 13 by a CVD process with a thickness of 5-9 nm and an SiN film 14b deposited on the $SiO_2$ film 14a with a thickness of 6-10 nm by a CVD process. Further, a thermal oxide film 14c is formed on the SiN film 14b with a thickness of 3-10 nm. The ONO film thus formed has an excellent leakage current characteristic.

Next, a resist pattern 15A is formed on the flash-memory cell region A in the process of FIG. 1C. Using the resist pattern 15A as a mask, the ONO film 14, the amorphous silicon film 13 and also the tunneling insulation film 12A on Si substrate 11 are removed in the low-voltage transistor region B and in the high-voltage transistor region C. In this way, the surface of Si substrate 11 is exposed in the low-voltage transistor region B and also in the high-voltage transistor region C. In the foregoing removal process of the tunneling insulation film 12A, a wet etching process using an HF etchant is implemented. As a result, the surface of the Si substrate 11 is exposed to the HF etchant in regions B and C.

Next, the resist pattern 15A is removed in the step of FIG. 1D. Furthermore, a thermal oxidation process is applied with a temperature of 800-1100° C. Thus, the Si substrate 11 is covered, in the regions B and C, with a thermal oxide film 12C with the thickness of 8-50 nm.

Further, a next resist pattern 15B is formed on the Si substrate 11 in the step of FIG. 1E so as to cover the ONO film 14 in the flash-memory cell region A and also the thermal oxide film 12C in the high-voltage transistor region C. Using the resist pattern 15B as a mask, the thermal oxide film 12C on the Si substrate 11 is removed by an HF treatment in the low-voltage transistor region B. As a result, the surface of Si substrate 11 is exposed. In the step of FIG. 1E, the surface of the Si substrate 11 experiences the HF treatment in region B for the second time.

The resist pattern 15B is removed in the process of FIG. 1F. Further, a thermal oxide film 12B is formed on the Si substrate 11 exposed in the region B by a thermal oxidation processes at 800-1100° C., with a thickness of 1.5-8 nm. As a result of the thermal oxidation process in the step of FIG. 1F for forming the thermal oxide film 12B, it should be noted that there occurs an increase of thickness in the thermal oxide film 12C formed on the high-voltage transistor region C.

Next, in the step of FIG. 1G, an amorphous silicon film 16 doped with P is deposited on the structure of FIG. 1F by a CVD process with a thickness of 120-250 nm. Next, the amorphous silicon film 16, the ONO film 14 and the amorphous silicon film 13 are patterned consecutively in the process of FIG. 1H while using the resist pattern 17A as a mask. In this way, a stacked gate electrode structure 16F of a flash memory, including the amorphous silicon pattern 13A, the ONO pattern 14A and the amorphous silicon pattern 16A, is formed in the flash-memory cell region A. In this stacked gate electrode structure 16F, the amorphous silicon pattern 13A functions as a floating-gate electrode. In the process of FIG. 1G, it is as well possible to form a silicide film of WSi or CoSi on the amorphous silicon film 16 according to the needs.

Next, in the step of FIG. 1I, the resist pattern 17A is removed, and a new resist pattern 17B is formed so as to cover the flash-memory cell region A. While using the resist pattern 17B as a mask, the amorphous silicon film 16 is patterned in the low-voltage transistor region B and in the high-voltage transistor region C, and a gate electrode 16B of the low-voltage transistor is formed to region B. Further, a gate electrode 16C of the high-voltage transistor is formed in the region C.

Next, the resist pattern 17B is removed in the step of FIG. 1J, and a protective oxide film 18 is formed so as to cover the stacked gate electrode structure 16F in the flash-memory cell region A and the gate electrode 16B in the low-voltage transistor region B and the gate electrode 16C in the high-voltage transistor region C by a thermal oxidation processes at 800-900° C.

Next, in the step of FIG. 1K, a resist pattern 19A is formed on the structure of FIG. 1J so as to cover the low-voltage transistor region B and the high-voltage transistor region C and so as to cover the flash-memory cell region A partially. Next, while using the resist pattern 19A and also the stacked gate electrode 16F as a mask, an ion implantation process of P$^+$ is conducted under an accelerating voltage of typically 50-80 keV with a dose of $0.5 \times 10^{14}$-$3 \times 10^{14}$ cm$^{-2}$. As a result, an n-type diffusion region 11a is formed in the Si substrate 11 adjacent to the stacked gate electrode 16F.

In the step of FIG. 1K, an ion implantation process of As$^+$ is conducted while using the resist pattern 19A as a mask under an accelerating voltage of typically 30-50 keV with a dose of $2 \times 10^{15}$-$6 \times 10^{15}$ cm$^{-2}$, and another n-type diffusion region 11b is formed inside the n-type diffusion region 11a. In the step of FIG. 1K, it should be noted that the low-voltage transistor region B and the high-voltage transistor region C are covered by the resist pattern 19A. Thus, there occurs no ion implantation in these regions.

Next, in the step of FIG. 1L, the resist pattern 19A is removed and a resist pattern 19B is newly formed so as to expose the region A and so as to cover the regions B and C. In the step of FIG. 1L, the resist pattern 19B is used as a mask and an ion implantation of As$^+$ is conducted under an accelerating voltage of 30-50 keV with a dose of $5 \times 10^{14}$-$2 \times 10^{15}$ cm$^{-2}$. As a result, the impurity concentration level in the n-type diffusion region 11b is increased and another n-type diffusion region 11c is formed in the flash memory region A while using the stacked gate structure 16F as a self-aligned mask.

Next, the resist pattern 19B is removed in the step of FIG. 1M, and the resist pattern 19C is formed on the Si substrate 11 so as to expose the low-voltage transistor region B selectively. Furthermore, in the step of FIG. 1M, a p-type impurity element or an n-type impurity element is introduced by an ion implantation process while using the resist pattern 19C as a mask, and a pair of LDD diffusion regions 11d are formed in region B of the Si substrate 11 at both lateral sides of the gate electrode 16B.

Next, in the step of FIG. 1N, the resist pattern 19C is removed, and a resist pattern 19D is formed on Si substrate 11 so as to expose the high-voltage transistor region C selectively. Further, an impurity element of p-type or n-type is introduced in the step of FIG. 1N while using the resist pattern 19D as a mask, and a pair of LDD diffusion regions 11e are formed in the Si substrate 11 at both lateral sides of the gate electrode 16C.

Further, in the process of FIG. 1O, sidewall insulation film 16s are formed on both sidewall surfaces of the stacked gate electrode 16F, the gate electrode 16B and the gate electrode 16C by deposition and etch back of a CVD oxide film, and in the step of FIG. 1P, a resist pattern 19E is formed such that the resist pattern 19E covers the flash-memory cell region A and exposes the low-voltage transistor region B and the high-voltage transistor region C. Further, a p-type impurity element or an n-type impurity element is introduced by an ion implantation process while using the resist pattern 19E and the gate electrodes 16B and 16C as a mask, and diffusion regions 11f of p$^+$-type or n$^+$-type are formed in the Si substrate 11 outside the gate electrode 16B in the region B. Similarly, diffusion regions 11g of p$^+$-type or n$^+$-type are formed in the Si substrate in correspondence to the region C outside of the gate electrode 16C. On the surface of the diffusion regions 11f or 11g, it is also possible to form a low-resistance silicide films such as TiSi or CoSi by a salicide process.

Next, in the process of FIG. 1Q, an interlayer insulation film 20 is formed on the Si substrate 11 so as to cover the regions A-C continuously, and contact holes are formed the interlayer insulation film 20 so as to expose the diffusion regions 11b and 11c in the region A. A W plug 20A is formed in the contact hole. Similarly, a contact hole exposing the diffusion region 11f is formed in the region B, and a W plug 20B is formed in the contact hole thus formed. Further, a contact hole exposing the diffusion region 11g is formed in the interlayer insulation film 20 in correspondence to the region C, and a W plug 20C is formed in the contact hole thus formed.

In the case of fabricating such a semiconductor integrated circuit, in which a flash memory including a peripheral circuit and a high-speed logic circuit are integrated, according to the process of FIGS. 1A-1Q, one encounters the following problems. In the process of FIG. 1B, the amorphous silicon film 13 and the ONO film 14 are formed on a flat surface of the Si substrate in the flash-memory cell region A or in the low-voltage transistor region B or in the high-voltage transistor region C as shown in FIGS. 2A, 2B and 2C.

Thus, in the process of removing the tunneling insulation film 12A and the amorphous silicon film 13 and the ONO film 14 from regions B and C in the step of FIG. 1C, the depression is etched by HF in region B and C as is shown in the enlarged view of FIGS. 3A-3C, and the depth of the depression increases slightly in the regions B and C.

Further, in the process of FIG. 1D, the bottom of the depression goes up a little as a result of formation of the thermal oxide film 12B in the regions B and C as shown in detail in FIGS. 4A-4C. As a result, there appears a step at the boundary between the depression and the field oxide film 11F surrounding the depression. With the removal of the thermal oxide film 12B by an HF etching treatment from the region B in the process of FIG. 1E, there inevitably appears a step corresponding to the step of FIGS. 4B and 4C on the surface of the Si substrate as is enclosed by a circle in FIGS. 5B and 5C at the boundary between the region B and the field oxide film 11F. Contrary to this, the flash-memory cell region A remains flat as shown in FIG. 5A.

A similar step is formed also at the boundary between the Si substrate surface forming the low-voltage transistor region B and the field oxide film 11F as shown in FIGS. 6B and 6C with the process of FIG. 1F forming the thermal oxide film 12B on the region B. As a result, the thickness of the thermal oxide film 12B is decreased inevitably in such a stepped part. On the other hand, the surface of the substrate 11 remains flat in the flash-memory cell region A as shown in FIG. 6A. Thus, when the gate electrode 16 is formed on such a structure in which the thickness of the thermal oxide film 12B is decreased in such a stepped part in the process of FIG. 1G to form a low-voltage transistor, the desired operational characteristics are not obtained from such a transistor.

A similar problem arises also in a semiconductor integrated circuit shown in FIGS. 7A and 7B that uses an STI structure 11G as the device isolation structure, in place of the field oxide film 11F. The problem of decrease of the film thickness of the insulation film has been known in STI structures in which the device isolation trench forms a steep angle at the top part thereof with respect to the substrate principal surface. Under these circumstances, the process of FIGS. 1A-1Q deteriorates this problem worse.

On the other hand, there are demands in these days to use plural power supply voltages in a semiconductor integrated circuit that includes a flash memory device. In such multiple voltage semiconductor integrated circuit devices, it is necessary to form MOS transistors such that the MOS transistors have a gate insulation film of optimal thickness in correspondence to the respective power supply voltages.

FIGS. 8A-8M show one possible expansion of the process of FIGS. 1A-1Q for the case the semiconductor integrated circuit includes a low-voltage transistor, a mid-voltage transistor and a high-voltage transistor in addition to the flash memory cell. It should be noted that the process of FIGS. 8A-8M are not used actually due to the problems that will be explained later. In FIGS. 8A-8M, those parts corresponding to the parts described previously are designated by the same reference numerals and the description thereof will be omitted.

FIG. 8A is referred to.

A mid-voltage transistor region D is defined on the surface of the Si substrate 11 by the field oxide film in addition to the flash-memory cell region A, the low-voltage transistor region B and the high-voltage transistor region C, and the tunneling oxide film 12A is formed uniformly on the regions A-D in the step of FIG. 8A similarly to the step of FIG. 1A.

Next, in the step of FIG. 8B corresponding to the step of FIG. 1B, the amorphous silicon film 13 and the ONO film 14 are formed consecutively on the tunneling oxide film 12A in each of the regions A-D. Next, in the step of FIG. 8C corresponding to the step of FIG. 1C, the tunneling oxide film 12A, the amorphous silicon film 13 and the ONO film 14 are removed from the part other than flash-memory cell region A while using the resist pattern 15A as a mask, and the surface of the Si substrate 11 is exposed. In the step of FIG. 8C, the surface of Si substrate 11 is exposed to HF before removing the tunneling oxide film 12A in each of the regions B-D.

Next, in the step of FIG. 8D, the Si substrate 11 is subjected to a thermal oxidizing process similar to the process of FIG. 1D, and the thermal oxide film 12C is formed in each of the regions B-D so as to cover the surface of the Si substrate 11.

Next, in the step of FIG. 8E, the resist pattern 15D is formed on the structure of FIG. 8D except for the region D, and an HF treatment is applied while using the resist pattern 15D as a mask. As a result, the thermal oxide film 12C is removed from the surface of Si substrate 11 in the region D.

Next, in the step of FIG. 8F, the resist pattern 15D is removed and a thermal oxidation processes is applied to the surface of the Si substrate 11 exposed at the region D at 800-1100° C. As a result a thermal oxide film 12D is formed with a thickness of 5-10 nm. Along with the thermal oxidation process in the step of FIG. 8F, there occurs a growth in the thermal oxide film 12C that was formed previously in the regions B and C.

Next, the resist pattern 15B is formed in the step of FIG. 8G on the structure of FIG. 8F except for the region B, similar to the process of FIG. 1E, and the thermal oxide film 12C is removed from the surface of Si substrate 11 in region B by a wet etching processing of HF while using the resist pattern 15B as a mask.

Further, in the step of FIG. 8H, the resist pattern 15B is removed and a thermal oxidation process is applied with a temperature of 800-1100° C. As a result, the thermal oxide film 12B is formed on the surface of the Si substrate 11 in the region B with a thickness of 1.5-5 nm. Along with the thermal oxidation process of FIG. 8H, there occurs a growth in the thermal oxide film 12D on thermal oxide film 12C in correspondence to the region D.

Next, in the step of FIG. 8I corresponding to the step of FIG. 1G, the structure of FIG. 8H is covered with an amorphous silicon film 16. The amorphous silicon film 16 is then patterned in the step of FIG. 8J corresponding to FIG. 1H while using the resist pattern 17A as a mask, and the stacked gate structure 16F of the flash memory is formed in the flash-memory cell region A as a result. It should be noted that the stacked gate structure 16F includes a stacking of the amorphous silicon pattern 13A, the ONO pattern 14A and the amorphous silicon pattern 16A. In the step of FIG. 8I, on amorphous silicon film 16 a low-resistance silicide film such as WSi or CoSi may be formed according to the need.

Furthermore, an amorphous silicon film 16 is patterned in region B-D in the step of FIG. 8K that corresponds to the step of FIG. 1I by using the resist pattern 17B. As a result, the gate electrode 16B of the low-voltage transistor, the gate electrode 16C of the high-voltage transistor are formed in the regions B and region C, respectively. Further, a gate electrode 16D of the mid-voltage transistor is formed in region D.

Next, in the step of FIG. 8L corresponding to the step of FIG. 1J, the gate electrodes 16B-16D and also the stacked gate electrode structure 16A are covered by a thermal oxide film 18 formed by a thermal oxidation process. Further, by conducing the process corresponding to the steps of FIGS. 1K-1P explained previously, a semiconductor integrated circuit that integrates the flash memory cell and the low-voltage transistor and the mid-voltage transistor and the high-voltage transistor is obtained on the Si substrate 11 as shown in FIG. 8M. It should be noted that the mid-voltage transistor includes a W plug 20D that extends through the interlayer insulation film 20 as shown in FIG. 8M. Further, LDD diffusion regions 11*h* and highly doped diffusion regions 11*i* are formed in the Si substrate in correspondence to the region D. In the process of FIG. 8M, the surface of the diffusion regions 11*f,* 11*g,* on 11*i* may be covered with a low-resistance silicide-film of TiSi or CoSi formed by a salicide process according to the needs.

In the fabrication process of the semiconductor integrated circuit by the process of FIGS. 8A-8M, it should be noted that a structure shown in the enlarged view of FIGS. 10A-10D is obtained in the regions A-D by forming the amorphous silicon film 13 and the ONO film 14 consecutively on the tunneling oxide film 12A in the step of FIG. 8B as shown in the enlarged view of FIGS. 9A-9D, followed by the step of removal of the films 12A, 13 and 14 from the surface of the Si substrate 11 in the step of FIG. 8C in the regions B-D while using the resist pattern 15A as a mask. As a result, the exposed surface of the Si substrate is surrounded by the field the oxide film 11F as shown in FIGS. 10B-10D, in correspondence to the regions B-D. Such an exposed part forms a depression.

Next, the thermal oxidation process of FIG. 8D is conducted and a thermal oxidation is caused in the exposed surface of the Si substrate 11 in each of the regions B-D. As a result, as shown in the enlarged view of FIGS. 11A-11D, a thermal oxide film 12C is formed on the exposed surface of the Si substrate 11 in each of the regions B-D in the state that the thermal oxide film 12C protrudes slightly in the upward direction from the boundary to the surrounding field oxide film 11F. In corresponding to this, a relative depression is formed on the surface of thermal oxide film 12C along the boundary to the surrounding field oxide film 11F in each of the regions B-D.

Next, in the step of FIG. 8E, the thermal oxide film 12C protruding in the upward direction in the region D is removed by a wet etching process while using the resist pattern 15D as a mask as shown in the enlarged view of FIGS. 12A-12D. Along with this, a depression is formed with respect to the surface of Si substrate 11 so as to enclose the region D between the region D and the field oxide film 11F.

Further, in the thermal oxidation process of FIG. 8F, there occurs a growth of the thermal oxide film 12C in the regions B and C as shown in the enlarged view of FIGS. 13A-13D as a result of formation of the thermal oxide film 12D in the region D. As a result of the growth of such a thermal oxide film 12C, the step formed between the surface of the thermal oxide film 12C and the depression surrounding the thermal oxide film 12C is increased in the regions B and C. Further, the step formed between the surface of thermal oxide film 12D and the depression surrounding the thermal oxide film 12D is increased in the region D.

Thus, it will be understood that, in the event the thermal oxide film 12C covering the surface of the Si substrate 11 in the region B is removed by a wet etching process while using the resist pattern 15B as a mask in the step of FIG. 8G, the depth of the depression (circled in FIGS. 14B and 14D) formed between the Si substrate and the surrounding field oxide film 11F in the region B is increased as shown in the enlarged view of FIGS. 14A-14D, along with the decrease of thickness of the field oxide film 11F. Further, a similar deep depression is formed also in the region D along the boundary to the surrounding field oxide film 11F.

Furthermore, in the event that the amorphous silicon film 16 constituting the gate electrode is deposited on the structure of FIGS. 15A-15D in the step of FIG. 8I, the thickness of the gate insulation film 12B or 12D becomes extremely thin especially in the low-voltage transistor region B and in the mid-voltage transistor region D in the vicinity of the depression as circled in the drawings. Thus, the threshold characteristics of the MOS transistors experienced a modification in these regions.

With such reasons, the process of FIGS. 8A-8M is not used actually in the production semiconductor devices. It should be noted that the foregoing problems are more serious in a semiconductor integrated circuit that uses the STI structure 11G instead of the field oxide film 11F for the device isolation structure, as shown in FIG. 16A-16C.

Meanwhile, there is a proposal to construct a flash memory device that uses a single-layer gate electrode structure instead of the stacked gate electrode structure in a related art of the present invention.

FIG. 17 shows the construction of a flash memory cell of a single-layer gate electrode structure in a plan view, wherein those parts corresponding to the parts described previously are designated by the same reference numerals and the description thereof will be omitted.

FIG. 17 is referred to.

It can be seen that the device region 11A is defined on the Si substrate 11 by the field oxide film 11F similarly as before. On the other hand, the floating-gate electrode pattern 13A is formed such that an end of the floating-gate electrode pattern 13A traverses the device region 11A on the Si substrate 11. Further, a source region 11a of n⁻-type and a source line region 11b of n⁺-type are formed in the device region 11A at a first side of the floating-gate electrode pattern 13A while using the floating-gate electrode pattern 13A as a self-aligned mask. Further, a drain region 11c an n⁺-type is formed in the device region 11A at the second side of the floating-gate electrode pattern 13A.

In the vicinity of the device region 11A, it can be seen that there is formed another device region 11B on the Si substrate 11, and an n⁺-type diffusion region 11C is formed in the device region 11B. Further, a coupling part 13Ac is formed at the other end of the floating-gate electrode pattern 13A so as to cover the diffusion region 11C.

FIG. 18A shows a cross-sectional view taken along a line X-X' of FIG. 17.

FIG. 18A is referred to.

It can be seen that there is formed a tunneling oxide film 12A on the Si substrate 11 between the source region 11b and the drain region 11c and that the floating-gate electrode pattern 13A is formed on the tunneling oxide film 12A. Further, it can be seen that the source region 11a of n⁻-type is formed in the Si substrate 11 outside of the n⁺-type source region 11b.

Further, it can be seen that a sidewall insulation film is formed to the sidewall surface of the floating-gate electrode pattern 13A.

FIG. 18B shows the cross-sectional view taken along a line Y-Y' of FIG. 17.

FIG. 18B is referred to.

It can be seen that the floating-gate electrode pattern 13A extends continuously on the field oxide film 11F formed on the Si substrate 11 from the device region 11A in which the flash memory cell of FIG. 18A is formed to the device region 11AC. Thereby, the end part 13Ac of the floating-gate electrode pattern 13A forms a capacitance coupling with the highly doped diffusion region 11C through the oxide film 12Ac.

Thus, at the time of writing operation ("program"), the source region 11b is grounded and a drain voltage of +5V is applied to the drain region as show in FIGS. 19A and 19B. Further, a writing voltage of +10V is applied to the highly doped diffusion region 11C. Thus, the potential of the floating-gate electrode 13A goes up and there occurs injection hot electrons into the floating-gate electrode 13A through the tunneling oxide film 12A in the device region 11A.

At the time of erasing operation ("erase"), on the other hand, the drain region 11c and the highly doped diffusion region 11C are grounded as shown in FIGS. 19C and 19D. Further, an erasing voltage of +15V is applied to the source region 11b. As a result, the electrons in floating-gate electrode 13A cause a tunneling into the source region 11a through the tunneling oxide film 12A and are absorbed by the source power supply through the source region 11b.

Thus, in the flash memory of FIG. 17, the highly doped diffusion region 11C plays the role of the control gate electrode and it is not necessary to form the ONO film 14 between the polysilicon floating-gate electrode and the polysilicon control gate electrode, contrary to the conventional flash memory having the stacked gate structure explained previously. It should be noted that it is the oxide film 12Ac that plays the role of the ONO film 14 in the flash memory of FIG. 17. As the oxide film 12Ac can be formed by a thermal oxidation process on the Si substrate 11, the oxide film 12Ac is formed with high quality.

FIGS. 20A-20O are diagrams showing the fabrication process of a semiconductor integrated circuit that includes the flash memory cell of FIG. 17 in addition to the low-voltage transistor B, the mid-voltage transistor D and the high-voltage transistor C, wherein those parts corresponding to the parts described previously are designated by the same reference numerals and the description thereof will be omitted.

FIG. 20A is referred to.

The thermal oxide film 12C is formed on the Si substrate 11 in each of the flash-memory cell region A, the low-voltage transistor region B, the mid-voltage transistor region D and the high-voltage transistor region C by a thermal oxidation processes conducted at the temperature of 800-1100° C. with a thickness of 5-50 nm. Further, the thermal oxide film 12C is removed from the flash-memory cell region A by a patterning process in the step of FIG. 20B while using a resist pattern $15_1$.

Next, the resist pattern $15_1$ is removed in the step of FIG. 20C, and a tunneling oxide film 12A is formed on the surface of the Si substrate 11 in correspondence to the region A with a thickness of 5-12 nm by conducting a thermal oxidation process with the temperature of 800-1100° C. In the step of FIG. 20C, there occurs a growth of the thermal oxide film 12C in each of the regions B-D as a result of the thermal oxidation process for forming the tunneling oxide film 12A.

Next, the thermal oxide film 12C is removed in the mid-voltage transistor region D by a patterning process in the step of FIG. 20D while using a resist pattern $15_2$. Next, in the step of FIG. 20E, a thermal oxidation process is conducted, after removing the resist pattern $15_2$, with a temperature of 800-1100° C., and the thermal oxide film 12D is on the region D with a thickness of 5-10 nm. In the step of FIG. 20E, there occurs a growth of the tunneling oxide film 12A in the region A and also a growth of the thermal oxide film 12C in the regions B and C as a result of the thermal oxidation process used for forming the thermal oxide film 12D.

Next, in the step of FIG. 20F, the thermal oxide film 12C is removed from the low-voltage transistor region B as a result of a patterning process that uses a resist pattern $15_3$. Next, in the step of FIG. 20G, a thermal oxidation process is conducted with the temperature of 800-1100° C., and a thermal oxide film 12B is formed on the region B with the thickness of 1.5-5 nm. In the step of FIG. 20G, there also occurs a growth of the tunneling oxide film 12A in the region A, a growth of thermal oxide film 12C in the region C, and a growth of the thermal oxide film 12D in the region D, as a result of the thermal oxidation process for forming the thermal oxide film 12B.

Next, the amorphous silicon film 13 doped uniformly with P is deposited on the Si substrate 11 in the step of FIG. 20H with a thickness of 120-250 nm, followed by a patterning process in the step of FIG. 20I while using the resist pattern $17_1$ as a mask. In this way, the floating-gate electrode pattern 13A is formed in the flash-memory cell region A, the gate electrode pattern 13B is formed in low-voltage transistor region B, the gate electrode pattern 13D is formed in mid-voltage transistor region D, and the gate electrode pattern 13C is formed in the high-voltage transistor region C.

Next, in the step of FIG. 20J, the surface of the floating-gate electrode pattern 13A and the surface of the gate electrode patterns 13B-13D are covered by a thermal oxide film 18 with a thickness of about 5-10 nm by conducting a thermal oxidation processes at 800-900° C., and an ion implantation process P+ or As$^+$ is conducted in the step of FIG. 20K while using the resist pattern $17_2$ as a mask. The ion implantation process is conducted under an accelerating voltage of 50-80 keV with a dose $1\times10^{14}$-$3\times10^{14}$ cm$^{-2}$, and the source region 11a is formed as a result.

Further, in the step of FIG. 20L, the regions B-D are covered by a resist pattern $17_3$ and an ion implantation process of As$^+$ is conducted into the region A while using the floating-gate electrode pattern 13A as a self-aligned mask. The ion implantation process may be conducted under an accelerating voltage of 30-50 keV with −2 of a dose $5\times10^{14}$-$1\times10^{15}$ cm$^{-2}$. As a result, the source line region 11b of n$^+$-type is formed within the source region 11a. Further, a drain region 11c of n$^+$-type is formed in the opposite side of the source region 11a with respect to the channel region.

Next, a resist pattern $17_3$ is formed in the step of FIG. 20M so as to cover the flash-memory cell region A, and a p-type or n-type impurity element is introduced by a ion implantation process. As a result, the LDD region 11d is formed in the region B and the LDD region 11e is in the region C. Further, the LDD region 11h is formed to in the region D.

Further, in the step of FIG. 20N, the sidewall oxide films 16s are formed on the both sidewall surfaces of the floating-gate electrode pattern 13A and the gate electrode patterns 13B-13D. Next, in the process of FIG. 20O, the impurity element of p-type or n-type is introduced to each of the regions B-D while covering the flash memory region A by a resist pattern $17_4$. As a result, the diffusion regions 11f-11i are formed.

In the foregoing steps of FIGS. 20A-20O, however, there arises a problem in that a deep depression is formed, as a result of repetition of thermal oxide formation and subsequent etching, along the boundary of the device regions A-D, especially along the boundary to the field oxide film 11F in each of the regions B and D as shown in the enlarged view of FIGS. 21A-21D, FIGS. 22A-22D, FIGS. 23A-23D, FIGS. 24A-24D, FIGS. 25A-25D, FIGS. 26A-26D and FIGS. 27A-27D. Because of this, there occurs a localized thinning of gate insulation film especially in the low-voltage transistor region B and in the mid-voltage transistor region D, as shown in FIGS. 27B and 27C by circles. When a MOS transistor is formed on such a region, there inevitably occurs a local modification of threshold characteristics. In the foregoing drawings, it should be noted that those parts corresponding to the parts described previously are designated by the same reference numerals and the description thereof will be omitted. It should be noted that the step of FIGS. 21A-21D corresponds to the step of FIG. 20A, the step of FIGS. 22A-22D corresponds to the step of FIG. 20B, the step of FIGS. 23A-23D corresponds to the step of FIG. 20C, the step of FIGS. 24A-24D correspond to the step of FIG. 20D, the step of FIGS. 25A-25D corresponds to the step of FIG. 20E, the step of FIGS. 26A-26D corresponds to the step of FIG. 20F, and the step of FIGS. 27A-27D corresponds to the step of FIG. 20G.

It should be noted that the problem of formation of the depression and modification of the threshold characteristics become serious in the semiconductor integrated circuits that have the STI device isolation structure 11G as shown in FIGS. 28A-28D. As shown in FIG. 28A, there is a tendency, in the semiconductor integrated circuit having an STI structure, in that a depression is formed in the boundary part of the device region also in the flash-memory cell region A, and there is a concern that the writing characteristics and erasing characteristics of the flash memory cell may be changed.

Further, in the step of FIGS. 20A-20O, it should be noted that the gate oxide films 12C and 12D are formed after plural thermal oxidation processes and plural resist processes. Thus, these gate oxide films generally have a stacked structure as they shown in FIGS. 29A-29C, and there may be a problem of film quality.

Furthermore, in the step of FIGS. 20A-20O, it should be noted that the tunneling oxide film 12A is formed as a stacking of plural thermal oxide films as shown in FIG. 30A. Thus, the tunneling oxide film 12A tends to include therein defects, and there is a tendency that the electric charges accumulated in the floating-gate electrode 13A are dissipated to the Si substrate 11 as show in FIG. 30B. When such a leakage occurs, the flash memory device cannot hold information over a time period prescribed by specification.

SUMMARY OF THE INVENTION

Accordingly, it is a general object of the present invention to provide a novel and useful semiconductor integrated circuit and fabrication process thereof wherein the foregoing problems are eliminated.

Another and more specific object of the present invention is to provide a fabrication process of a semiconductor integrated circuit including a flash memory and using plural power supply voltages, wherein the problem of depression formation in the periphery of a device region and associated problem of deterioration of reliability are eliminated.

Another object of the present invention is to provide a fabrication process of a semiconductor integrated circuit including a flash memory and using plural power supply voltages, wherein the quality of gate insulation film used in semiconductor devices constituting the semiconductor integrated circuit is improved.

Another object of the present invention is to provide a semiconductor integrated circuit including a flash memory and using plural power supply voltages, wherein the thickness of the gate insulation film used in semiconductor devices included in the semiconductor integrated circuit is controlled precisely.

Another object of the present invention is to provide a semiconductor integrated circuit including a flash memory and using plural power supply voltages and a fabrication process thereof, wherein the gate electrodes have a height that is changed in every semiconductor device and the value of the gate resistance is set up as desired.

Another object of the present invention is to provide a semiconductor integrated circuit including a flash memory and using plural power supply voltages and a fabrication process thereof, wherein the semiconductor devices in the semiconductor integrated circuit have a common height for the gate electrode except for the flash memory.

Another object of the present invention is to provide a fabrication process of a semiconductor integrated circuit device, comprising the steps of:

forming a device isolation structure on a surface of a semiconductor substrate so as to define at least a first active region, a second active region and a third active region, introducing an impurity element that suppresses oxidation of said semiconductor substrate into said first active region;

applying a thermal oxidation process to said surface of said semiconductor substrate to form a first thermal oxide film so as to cover said semiconductor substrate surface in said first active region with a first thickness and a second thermal oxide film so as to cover said semiconductor substrate surface in said second and third active regions with a second thickness;

forming an oxidation-resistant film on said surface of said semiconductor substrate so as to cover at least said first active region and said second active region and said third active region;

exposing said surface of said semiconductor substrate by removing said oxidation-resistant film and said second thermal oxide film from said third active region while leaving said oxidation-resistant film on said first and second active regions;

applying a thermal oxidation process to said semiconductor substrate to form a third thermal oxide film on said third active region with a third thickness and to increase a thickness of said second thermal oxide film simultaneously.

According to this invention, repetition of thermal oxide film formation and subsequent etching for removing the same more than twice is eliminated successfully in the fabrication process of the semiconductor integrated circuit that uses plural power supply voltages and includes therein a flash memory cell and MOS transistors having gate insulation films with different thicknesses. As a result, the problem of formation of deep depression at the boundary part between the device isolation structure and the device region and is resolved. Along with this, the problem of the MOS transistors experiencing a modification of threshold characteristics at the peripheral part of the device region due to the decrease of thickness of the gate oxide film is resolved. Further, the film quality of the thermal oxide film that forms the gate oxide film is improved in each transistor regions. Thereby, the accuracy of the film thickness is improved. Furthermore, it becomes possible to optimize the resistance value of the gate electrodes in correspondence to the film thickness of the gate electrode.

Further, it becomes possible to arrange the height of the gate electrode of the MOS transistors at a common level excluding the flash memory cell.

Other objects and further features of the present invention will become apparent from the following detailed description when read in conjunction with the attached drawings.

BRIEF DESCRIPTION OF THE DRAWINGS

FIGS. 8A-8M are diagrams showing the fabrication process of the semiconductor integrated circuit including another conventional flash memory;

FIGS. 12A-12D are further diagrams explaining the problem of the fabrication process of the different conventional semiconductor integrated circuit;

FIGS. 15A-15D are further diagrams explaining the problem of the fabrication process of the different conventional semiconductor integrated circuit;

FIGS. 16A-16C are further diagrams explaining the problem of the fabrication process of a different conventional semiconductor integrated circuit;

FIGS. 18A and 18B are diagrams showing the construction of the flash memory of FIG. 17 in a cross-sectional view;

FIGS. 19A-19D are diagrams explaining the operation of the flash memory of FIG. 17;

FIGS. 22A-22D are further diagrams showing the problems of the conventional semiconductor integrated circuit;

FIGS. 23A-23D are further diagrams explaining the problems of the conventional semiconductor integrated circuit;

FIGS. 25A-25D are further diagrams explaining the problem of the conventional semiconductor integrated circuit;

FIGS. 27A-27D are further diagrams explaining the problems of the conventional semiconductor integrated circuit;

FIGS. 30A and 30B are further diagrams explaining the problem of the conventional semiconductor integrated circuit;

FIGS. 31A-31G are diagrams showing the fabrication process of a semiconductor integrated circuit including a flash memory according to a first embodiment of this invention;

FIGS. 32A-32C are diagrams explaining the effect of this embodiment;

FIGS. 33A-33C are further diagrams explaining the effect of this embodiment;

FIGS. 34A-34C are further diagrams explaining the effect of this embodiment;

FIGS. 35A-35C are further diagrams explaining the effect of this embodiment;

FIGS. 37A and 37B are the further diagrams explaining the effect of this embodiment;

FIGS. 39A-39H are diagrams showing a second modification of the first embodiment of this invention;

FIGS. 41A-41C are further diagrams explaining the effect of this embodiment;

FIGS. 42A-42K are diagrams showing the fabrication process of a semiconductor integrated circuit including a flash memory according to a second embodiment of this invention;

FIGS. 43A-43C are diagrams showing a part of the semiconductor integrated circuit of the second embodiment of this invention;

FIGS. 44A-44L are diagrams showing the fabrication process of a semiconductor integrated circuit including a flash memory according to a 3rd embodiment of this invention;

FIGS. 46A-46L are diagrams showing the fabrication process of a semiconductor integrated circuit including a flash memory according to a fourth embodiment of this invention;

FIGS. 47A-47D are diagrams showing a part of the semiconductor integrated circuit according to the fourth embodiment of this invention;

FIGS. 48A-48K are diagrams showing the fabrication process of a semiconductor integrated circuit including a flash memory according to a fifth embodiment of this invention;

FIGS. 50A-50J are diagrams showing the fabrication process of a semiconductor integrated circuit including a flash memory according to a sixth embodiment of this invention;

FIGS. 52A-52D are further diagrams showing a part of the semiconductor integrated circuit of the sixth embodiment of this invention;

FIGS. 54A-54I are diagrams showing the fabrication process of a semiconductor integrated circuit including a flash memory according to a first modification of the sixth embodiment of this invention;

FIGS. 55A-55J are diagrams showing the fabrication process of a semiconductor integrated circuit including a flash memory according to a seventh embodiment of the present invention;

FIG. 56 is a diagram showing the construction of a flash memory according to an eighth embodiment of this invention;

FIGS. 58A and 58B are diagrams explaining the operation of the flash memory of FIG. 56; and FIGS. 59A and 59B are diagrams showing the fabrication process of the flash memory of FIG. 56.

DETAILED DESCRIPTION OF THE PREFERRED EMBODIMENTS

First Embodiment

Figure 1A:
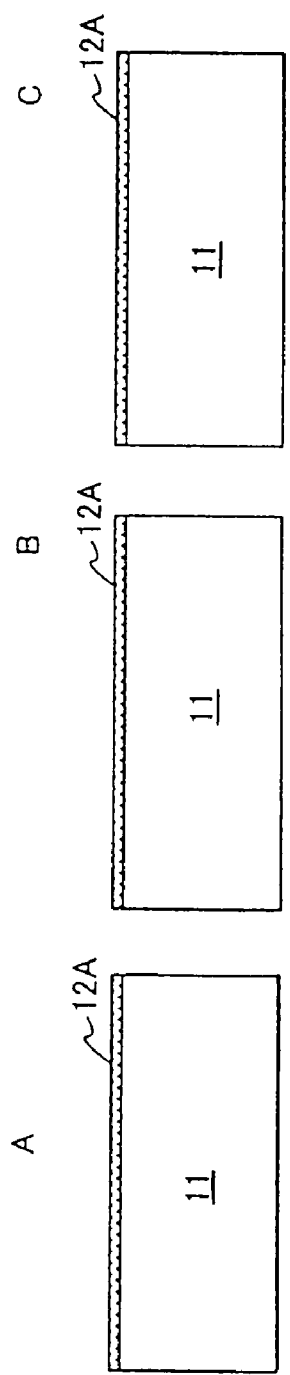
FIG. 1A-1Q are diagrams showing the fabrication process of the semiconductor integrated circuit including conventional flash memory.
Figure 1B:
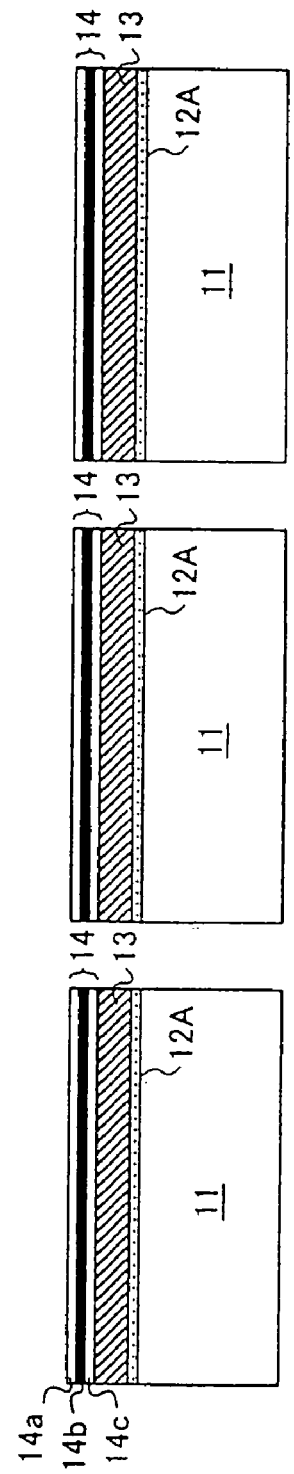
Figures 1E, 1F:
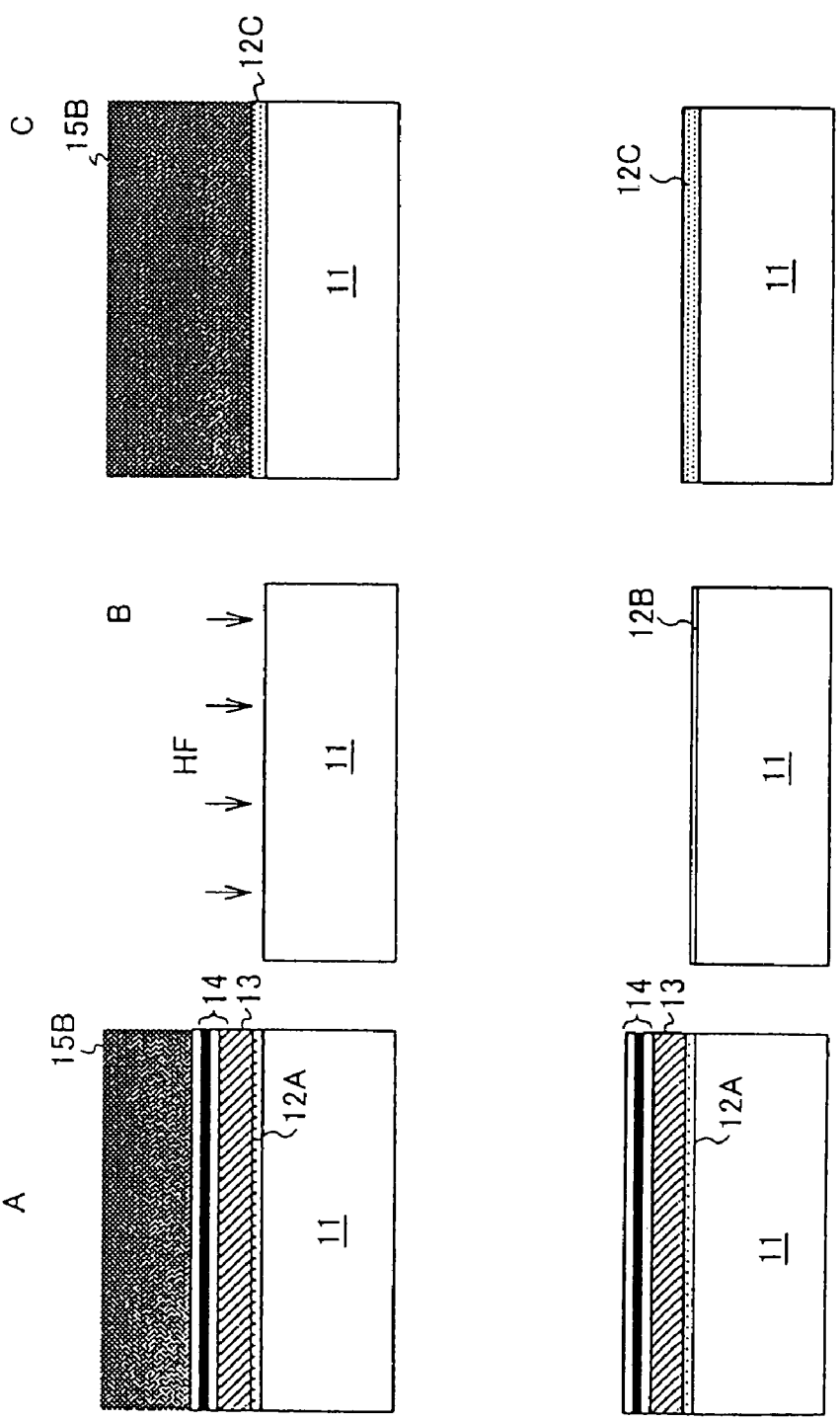
Figure 1Q:
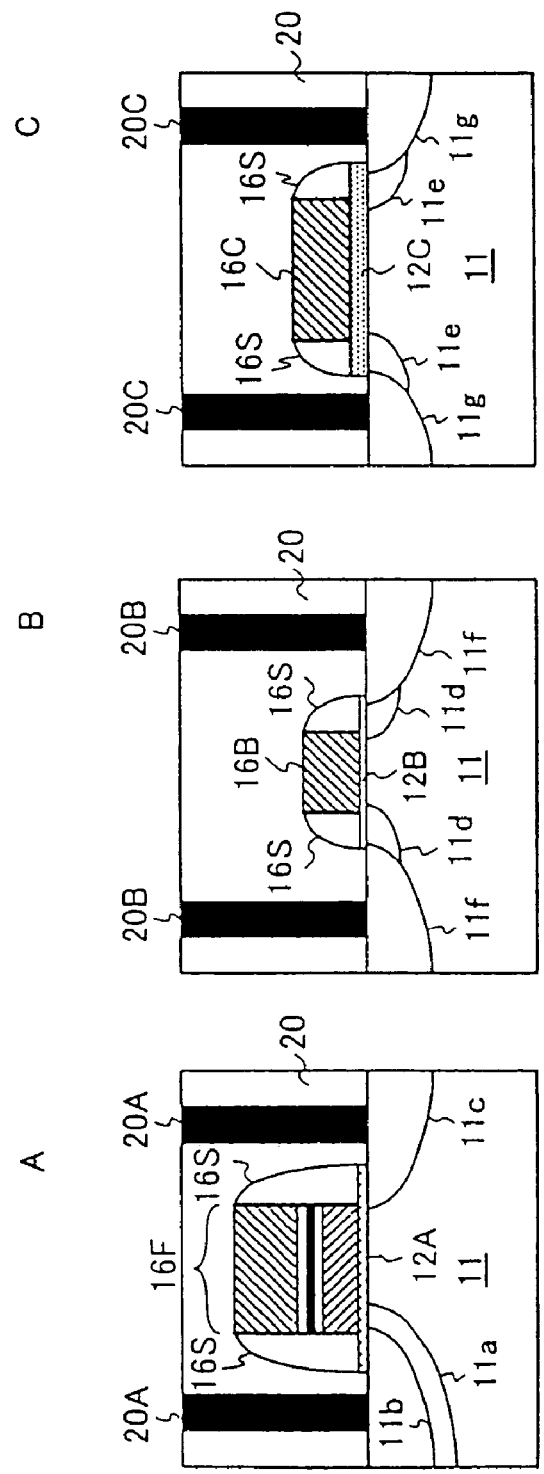
Figure 2A:
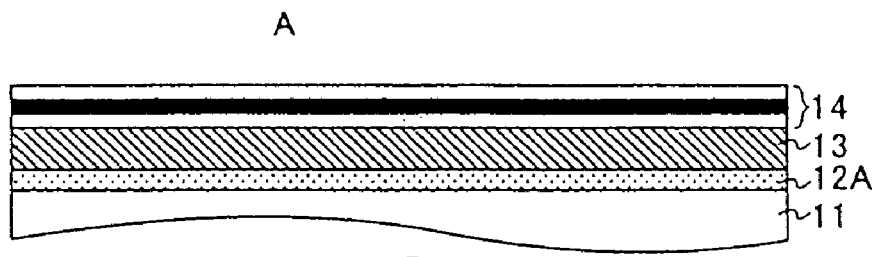
FIG. 2A-2C are diagrams explaining the problem of the fabrication process of a conventional semiconductor integrated circuit.
Figure 2B:
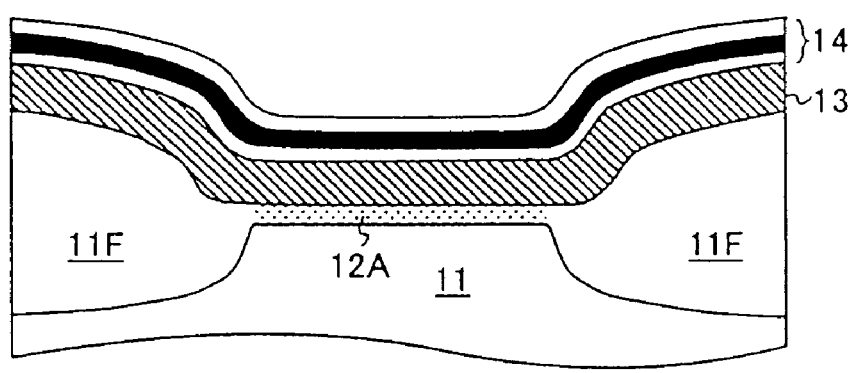
Figure 2C:
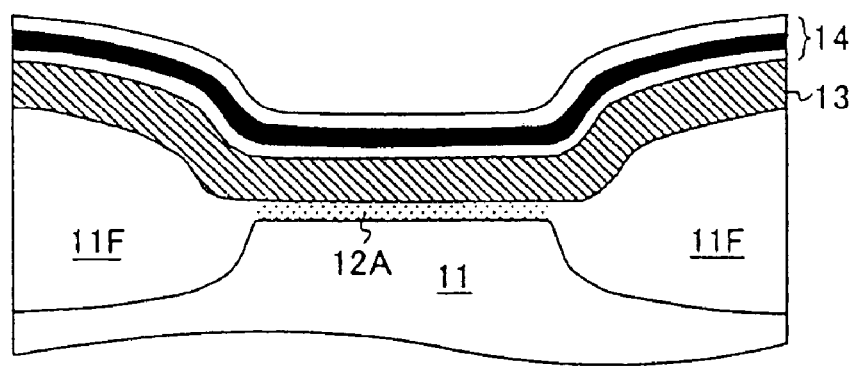
Figure 3A:
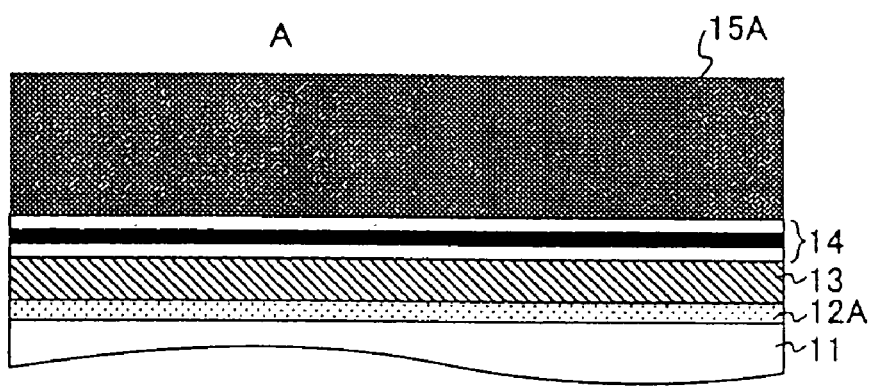
FIGS. 3A-3C are other diagrams explaining the problem of the fabrication process of a conventional semiconductor integrated circuit.
Figure 3B:
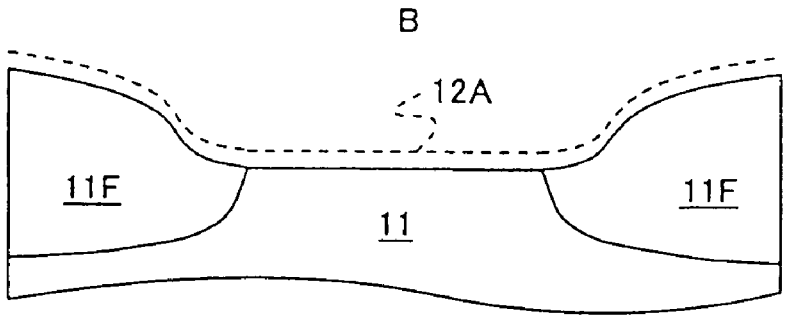
Figure 3C:
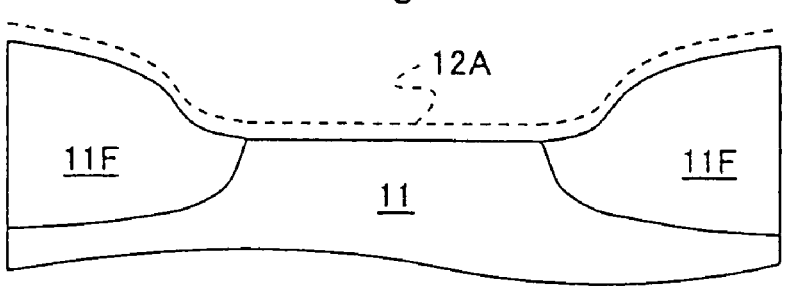
Figure 4A:
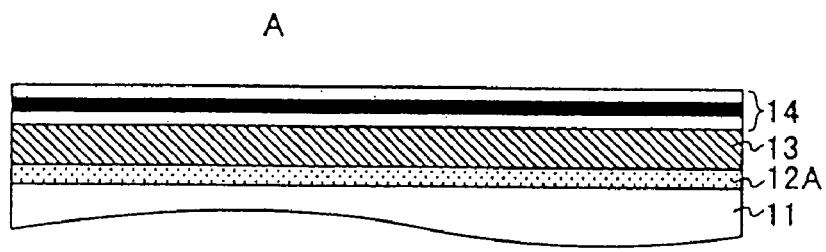
FIGS. 4A-4C are further diagrams explaining the problem of the fabrication process of a conventional semiconductor integrated circuit.
Figure 4B:
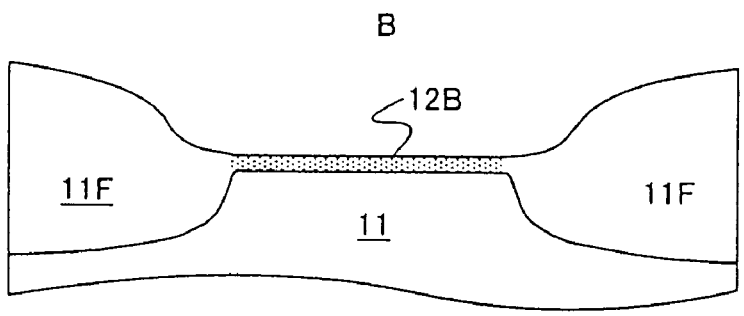
Figure 4C:
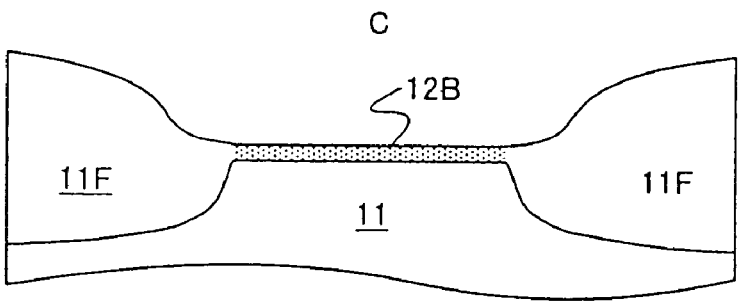
Figure 5A:
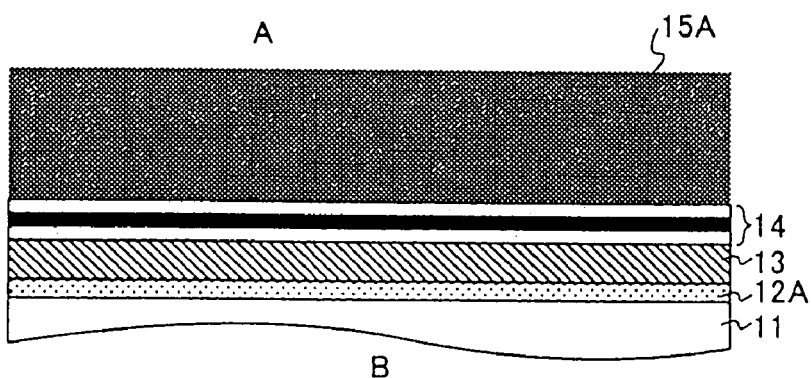
FIG. 5A-5C are further diagrams explaining the problem of the fabrication process of a conventional semiconductor integrated circuit.
Figure 5B:
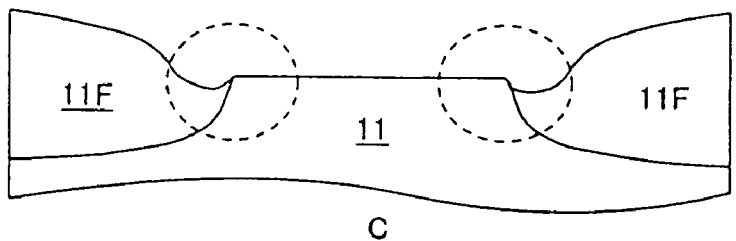
Figure 5C:
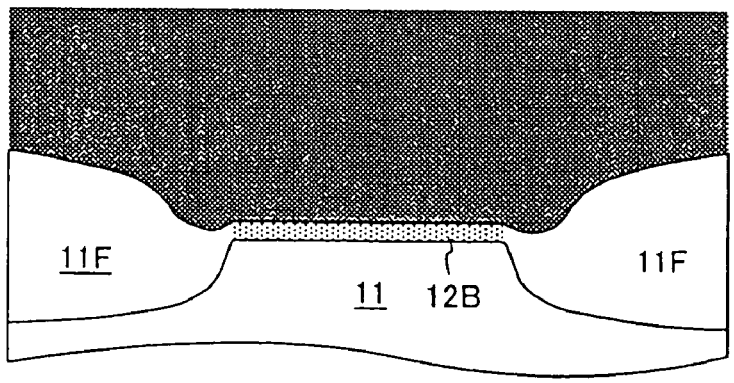
Figure 6A:
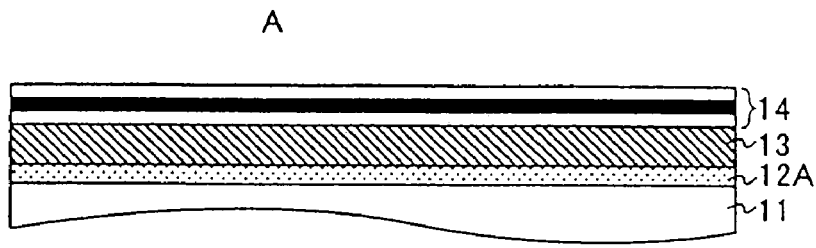
FIG. 6A-6C are further diagrams explaining the problem of the fabrication process of a conventional semiconductor integrated circuit.
Figure 6B:
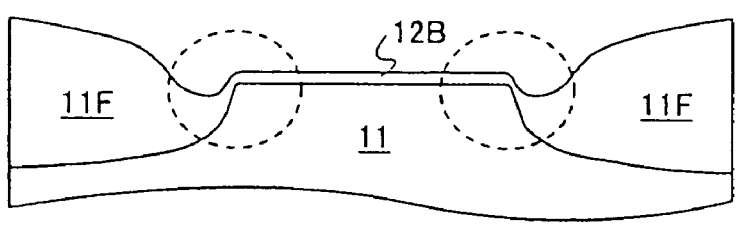
Figure 6C:
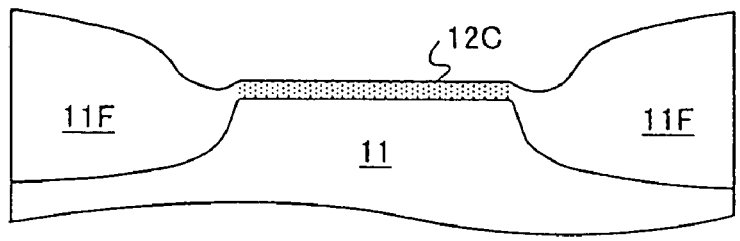

FIGS. 31A-31G show the fabrication process of a semiconductor integrated circuit according to a first embodiment of this invention, wherein those parts corresponding to the part described previously are designated by the same reference numerals and description thereof will be omitted.

FIG. 52A is referred to.

The flash-memory cell region A, the low-voltage transistor region B and the high-voltage transistor region C are defined on the Si substrate 11 by the field oxide film 11F (or STI structure) similarly to the step of FIG. 1A explained previously, and the thermal oxide film 12A is formed as a tunneling oxide film of the flash memory cell by applying a thermal oxidation processes to the Si substrate 11 at 800-1100° C. The thermal oxide film 12A is formed not only in the flash-memory cell region A on the Si substrate 11 but also in low voltage transistor region B and in the high-voltage transistor region C so as to cover the surface of the Si substrate 11.

Figure 31A:
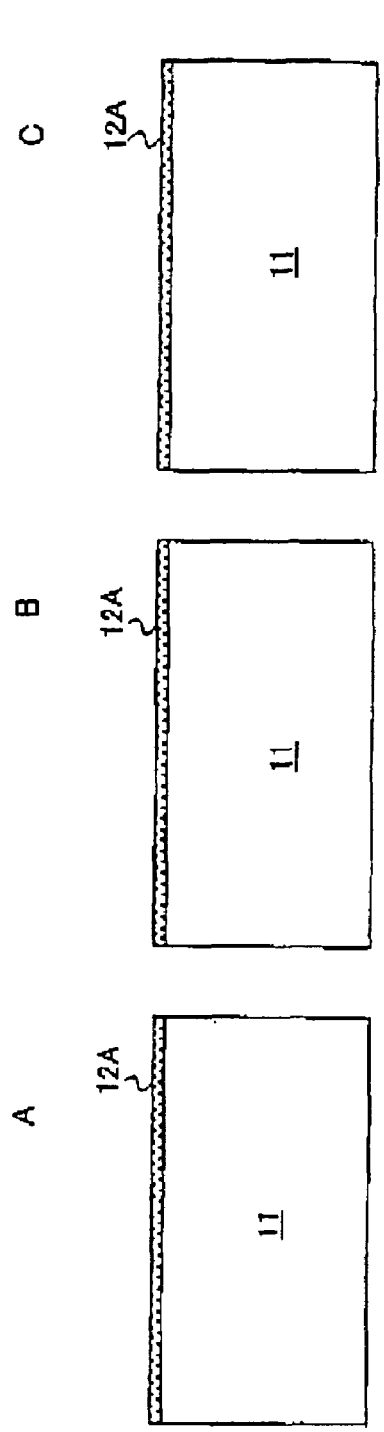
Figure 31B:
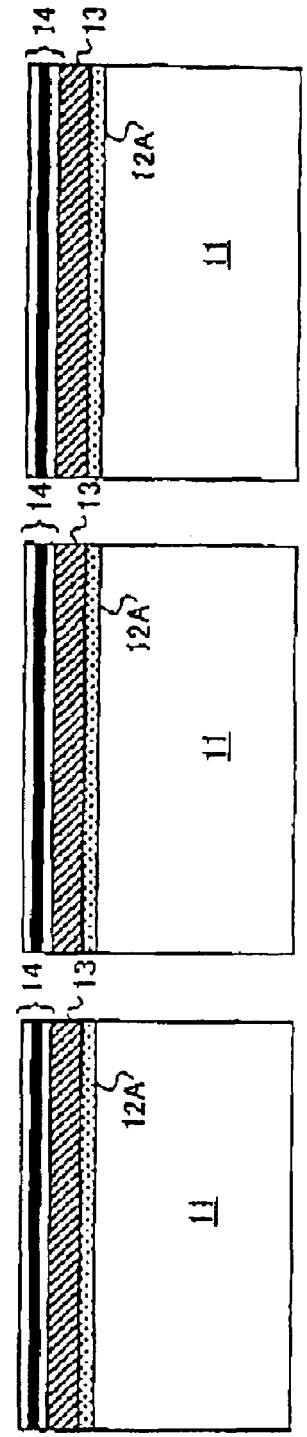

Next, in the step of FIG. 31B, the amorphous silicon film 13 doped with P to the concentration level of $1 \times 10^{20}$-$3 \times 10^{21}$ cm$^{-3}$ is formed by a CVD process on structure of FIG. 31A with a thickness of 50-120 nm, and an ONO film 14 is formed on the amorphous silicon film 13 uniformly. The ONO film 14 includes a CVD oxide film formed by a CVD process at the temperature of 600-800° C. with a thickness of 5-9 nm and an SiN film formed on the CVD oxide film by a CVD processes with a thickness of 6-10 nm at the temperature of 600-800° C. Further, a thermal oxide film is formed on the surface of SiN film with a thickness of 3-10 nm by conducting a thermal oxidation processes at 850-1000° C.

Figures 31C, 31D:
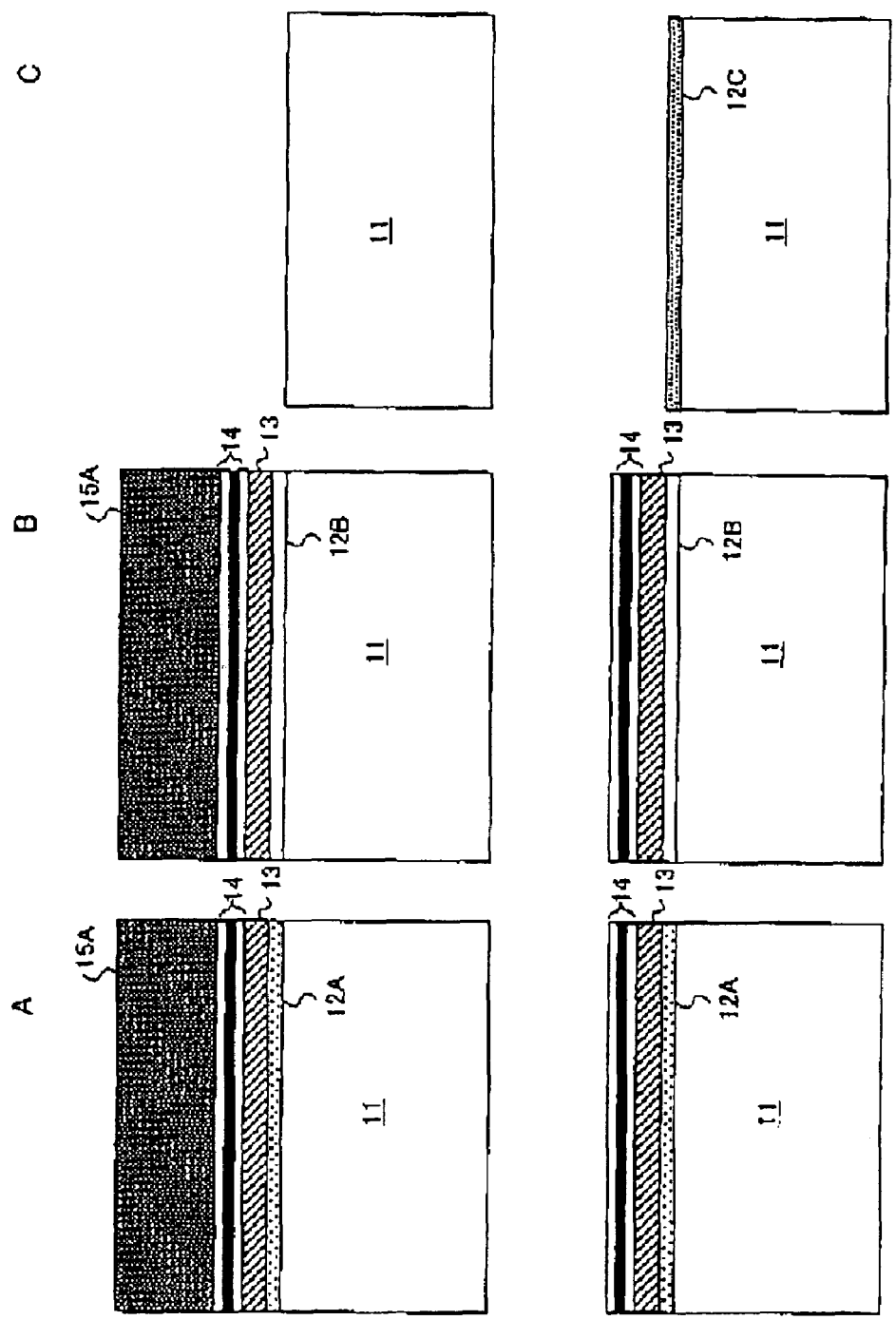

Next, in the step of FIG. 31C, the resist pattern 15A is formed on the structure of FIG. 31B so as expose the high-voltage transistor region C, and the ONO film 14, the amorphous silicon film 13 and the thermal oxide film 12A are removed by an etching process in the region C while using the resist pattern 15A as a mask. Further, in the step of FIG. 31D, the resist pattern 15A is removed, and a thermal oxidation process is applied with the temperature of 800-1100° C. As a result, the thermal oxide film 12C is formed so as to cover the surface of Si substrate 11 in the region C with a thickness of 8-50 nm. In the step of FIG. 31D, the region A and also the region B are covered by the ONO film 14. Thus, the Si substrate 11 is not oxidized in the regions A and B even when such a thermal oxidation process is applied.

Next, in the step of FIG. 31E, the resist pattern 15B is formed on the structure of FIG. 31D so as to expose the low-voltage transistor region B, and the region B is etched while using the resist pattern 15B as a mask. Thereby, the thermal oxide film 12C is removed. Further, in the step of FIG. 31F, the resist pattern 15B is removed and a thermal oxidation process is conducted at the temperature of 800-1100° C. As a result, the surface of Si substrate 11 is covered in the region B by the thermal oxide film 12B with a thickness of 1.5-8 nm.

Figure 31G:
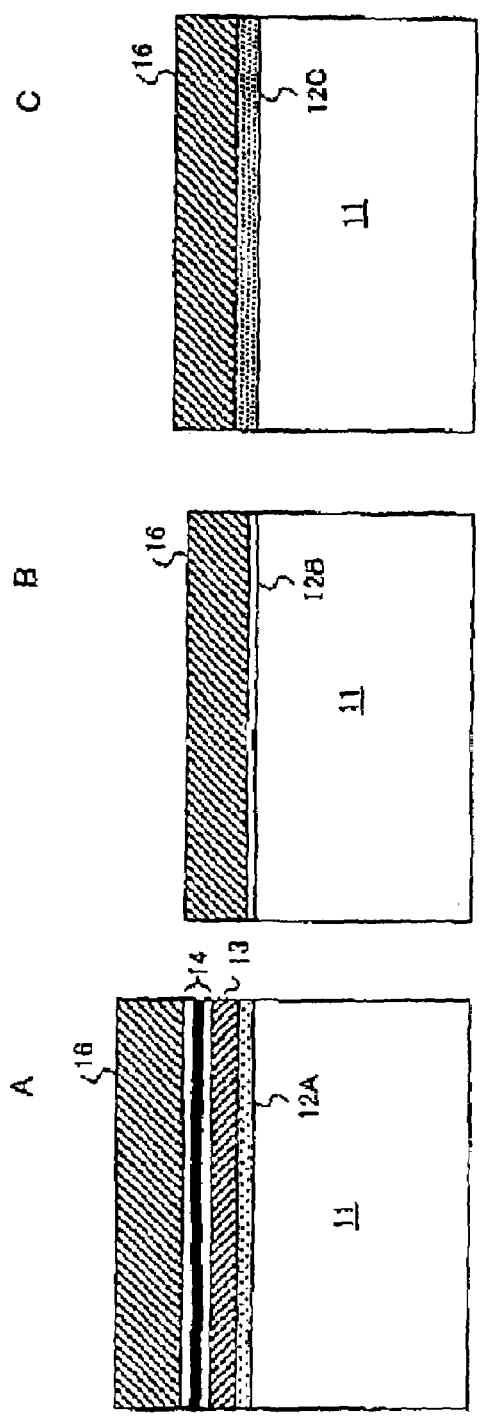

Next, in the step of FIG. 31G, an amorphous silicon film 13 doped with P with the concentration of $2 \times 10^{20}$-$3 \times 10^{21}$ cm$^{-3}$ is deposited on the structure of FIG. 31F by to a CVD process with a thickness of 120-250 nm. Further, by conducting a process similar to the one explained previously with reference to FIGS. 1I-1Q is conducted, and a semiconductor integrated circuit in which the flash memory cell A, the low-voltage transistor B and the high-voltage transistor C are integrated on the common Si substrate 11 is obtained.

FIGS. 32A-32C, FIGS. 33A-33C, FIGS. 34A-34C, FIGS. 35A-35C and FIGS. 36A-36C respectively show the regions A, B and C in the steps of FIG. 31B, FIG. 31C, FIG. 31D, FIG. 31E and FIG. 31F in an enlarged scale.

In the step of FIG. 31B, the amorphous silicon film 13 and the ONO film 14 are deposited on the Si substrate 11, while the amorphous silicon film 13 and the ONO film 14 thus deposited are removed from the region C in the step of FIG. 31C by a wet etching processing that uses HF. In this stage, no substantial depression is formed in the peripheral part of the region C as can be seen in FIGS. 33A-33C.

In the step of FIG. 31D for forming the thermal oxide film 12C on the region C, it will be noted that the Si substrate 11 is covered by the ONO film 14 having an oxidization-resistant nature in the regions A and B. Thus, there occurs no oxidization in these regions and no growth of thermal oxide film 12A takes place as shown in FIGS. 34A and 34B.

Because of this, increase of thickness of the thermal oxide film 12A is suppressed in the step of FIG. 31E, and the problem of formation of depression in the peripheral part of the region B as shown in FIG. 35B, which tends to occur when a thick thermal oxide film is etched, does not result substantially even in the case the thermal oxide film 12A is removed by a wet etching processing of HF in the region B. Further, the decrease of thickness of the field oxide film 11F in the peripheral part of the region B is small and the problem of the field reversal is suppressed effectively in the a low-voltage transistor is formed in the region B with a later process.

Figure 36A:
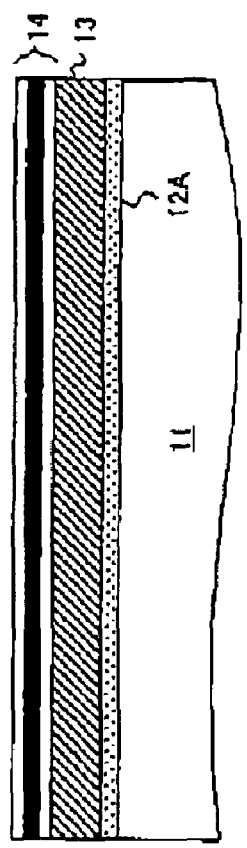
FIGS. 36A-36C are further diagrams explaining the effect of this embodiment.
Figure 36B:
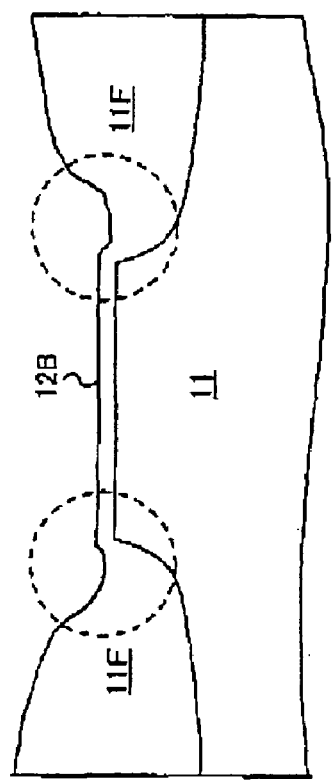
Figure 36C:
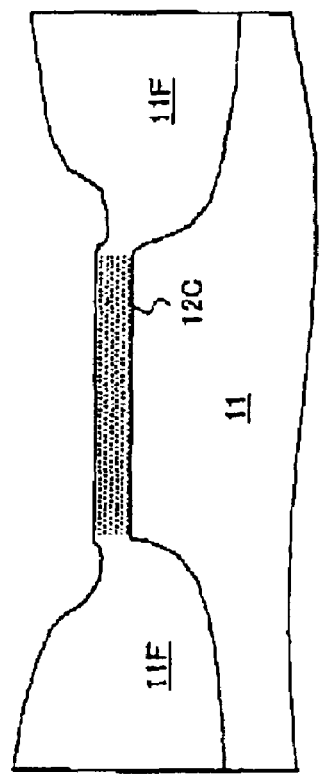

Further, as circled in FIG. 36B, the depression formed along the peripheral part of the region B is very small in the case of forming the thermal oxide film 12B in the region B in the step of FIG. 31F. Further, there occurs no decrease thickness of the field oxide film 11F in these bird's beak regions. As a result, there occurs no decrease of film thickness in the thermal oxide film 12B even in the peripheral part of the region B, and the modification of threshold voltage does not result even in the case a low-voltage transistor is formed in the region B In the step of FIGS. 31A-31G, it should be noted that the region C is exposed to HF only in the step of FIG. 31C. Further, the region B is exposed to HF only in the step of FIG. 31E. Thus, an excellent film quality is guaranteed for the thermal oxide films formed in these regions.

FIGS. 37A and 37B show case in which the process of this embodiment is applied to a Si substrate that has an STI structure.

FIGS. 37A and 37B are referred to.

Figure 7A:
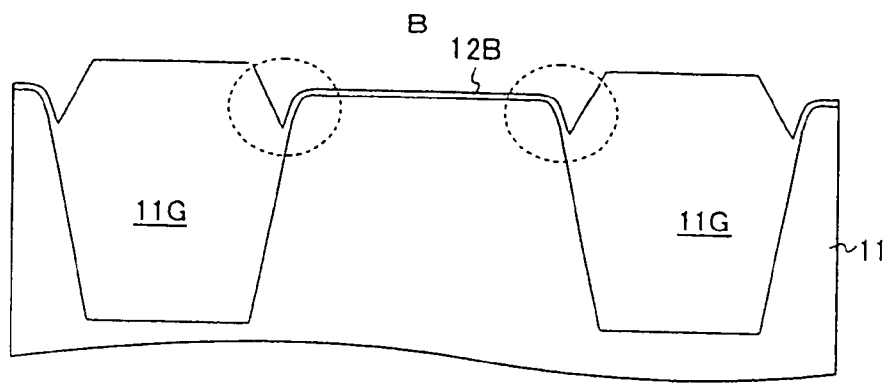
FIG. 7A-7B are further diagrams explaining the problem of the fabrication process of a conventional semiconductor integrated circuit.
Figure 7B:
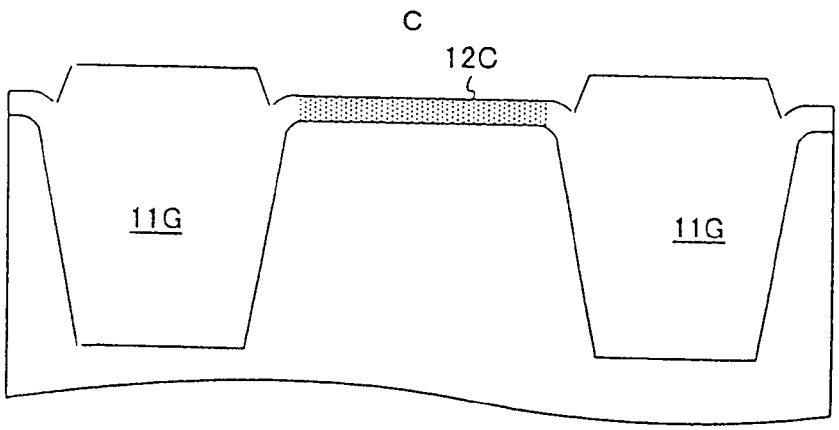
Figure 8A:
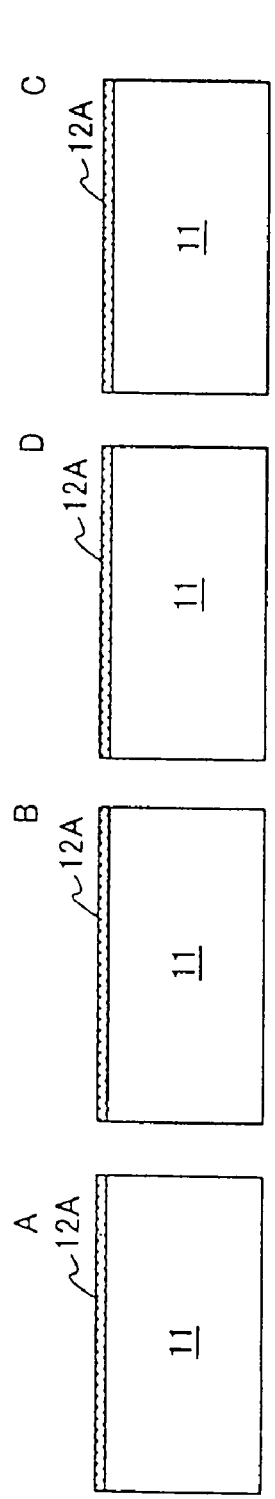
Figure 8B:
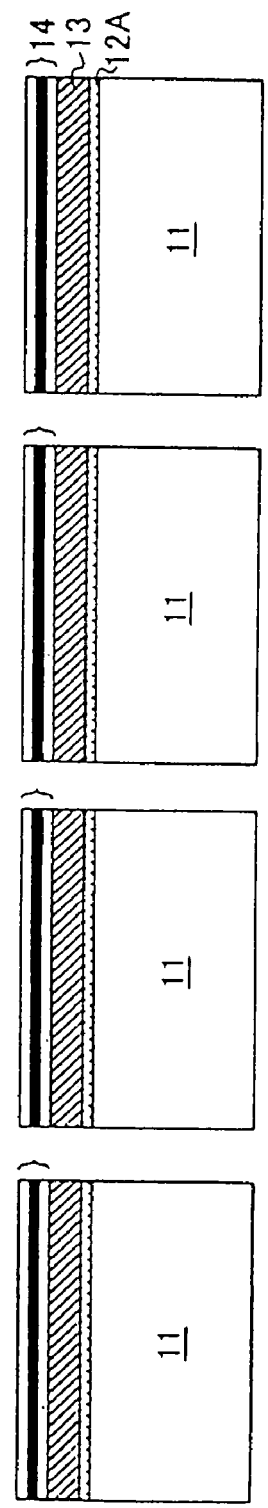
Figures 8C, 8D:
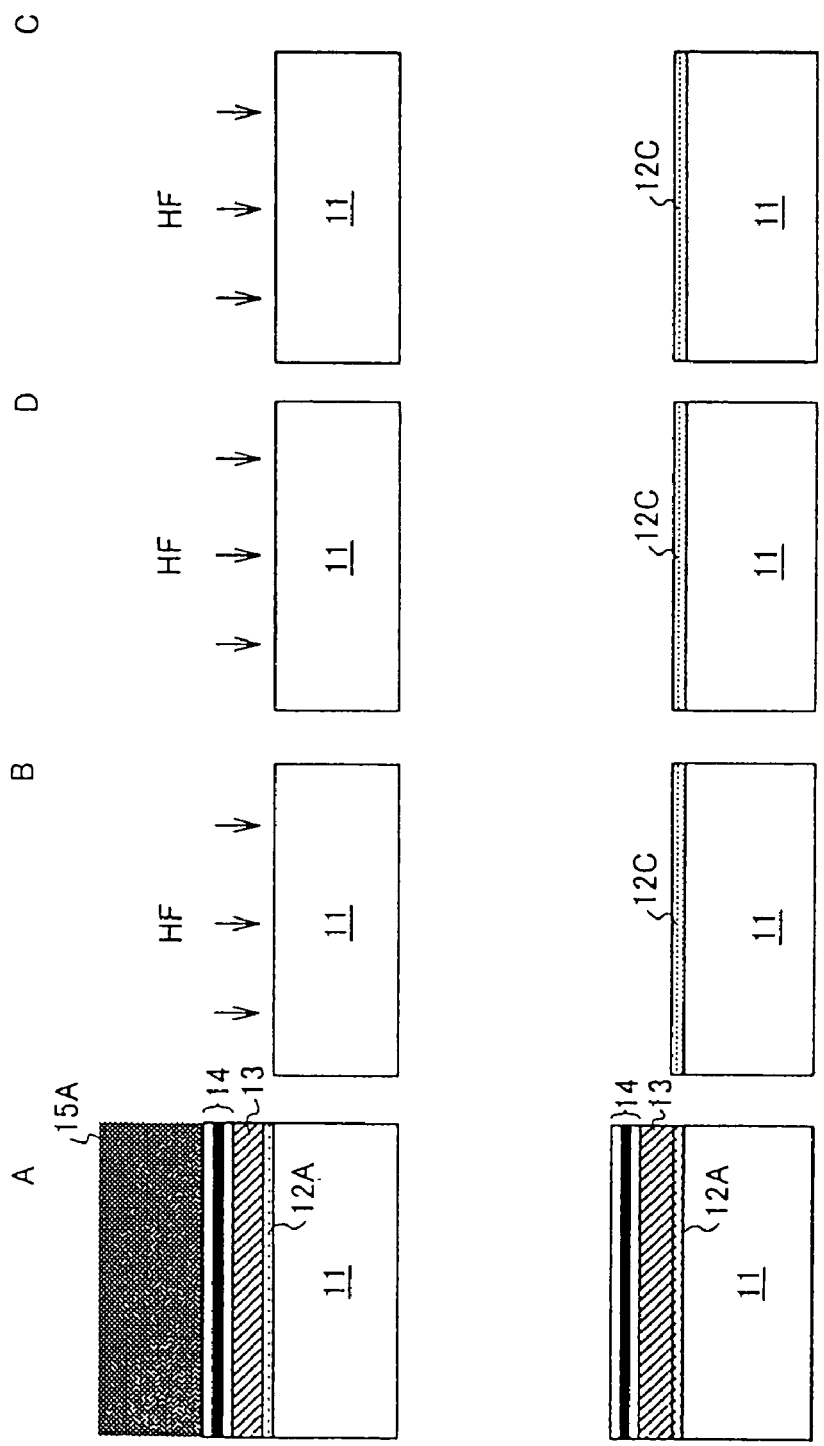
Figure 8I:
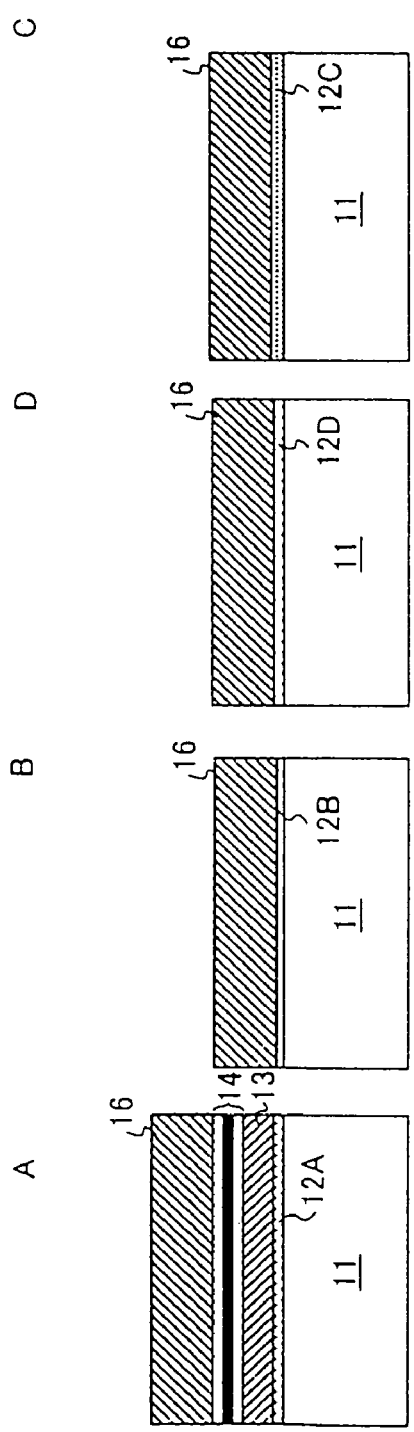
Figure 8J:
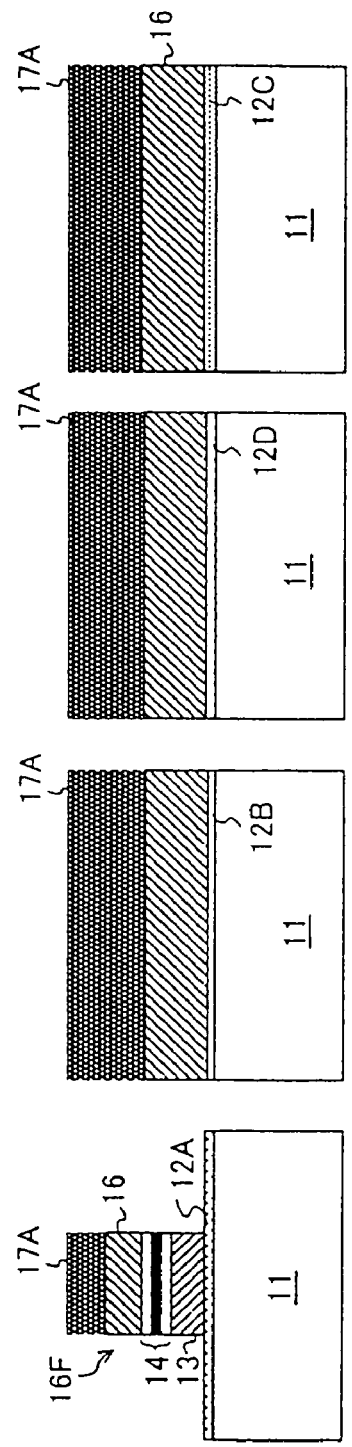
Figures 8K, 8L:
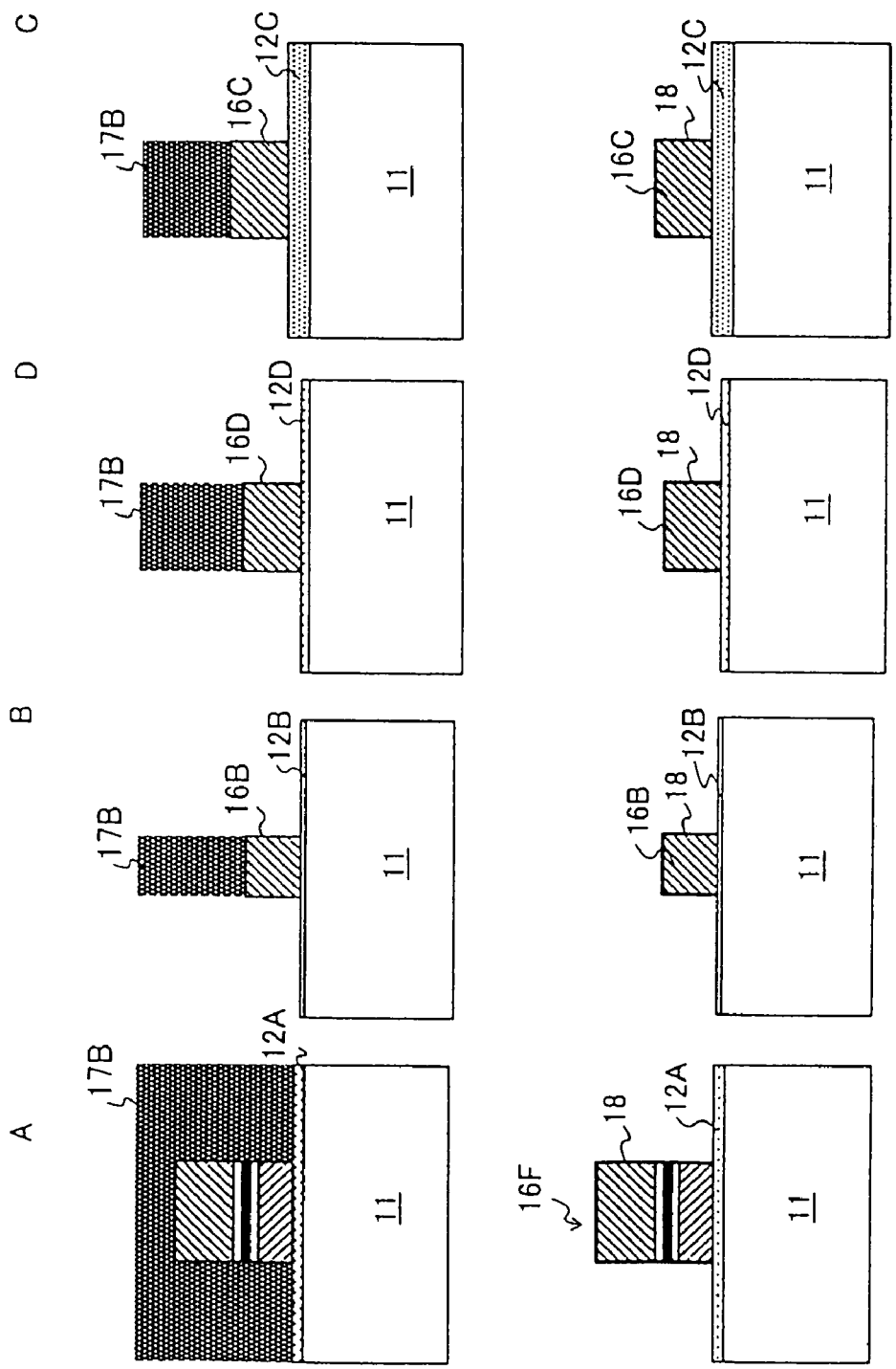
Figure 8M:
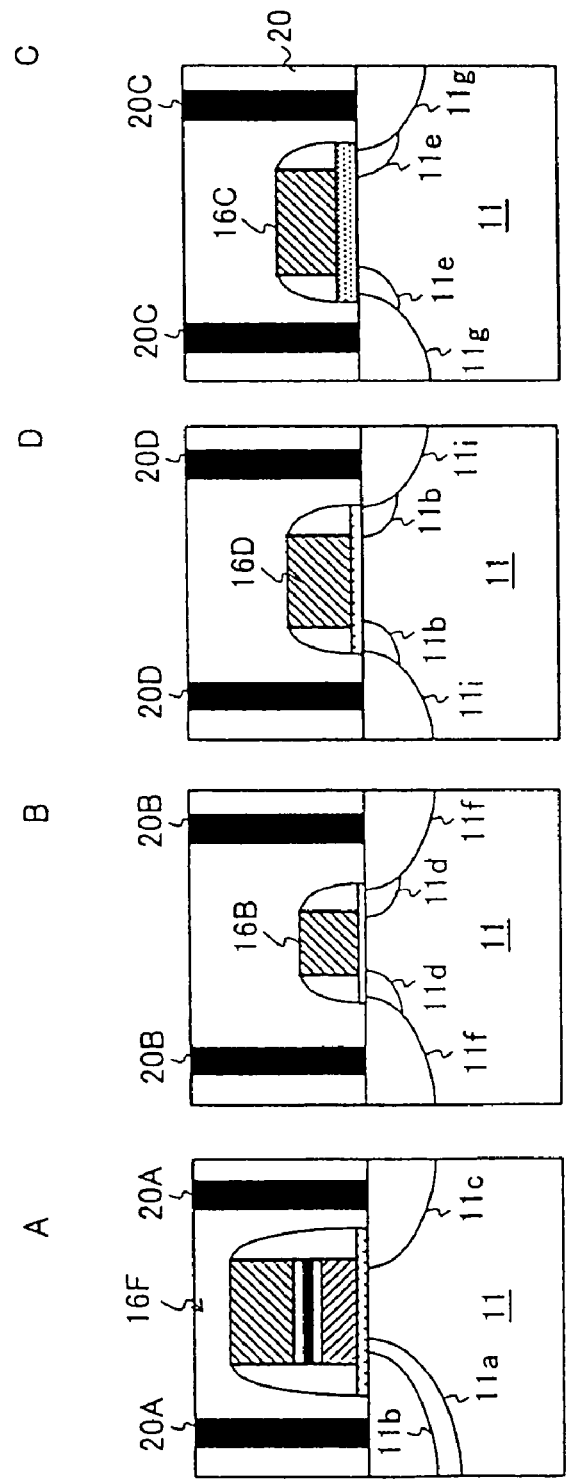
Figures 9A, 9B, 9C, 9D:
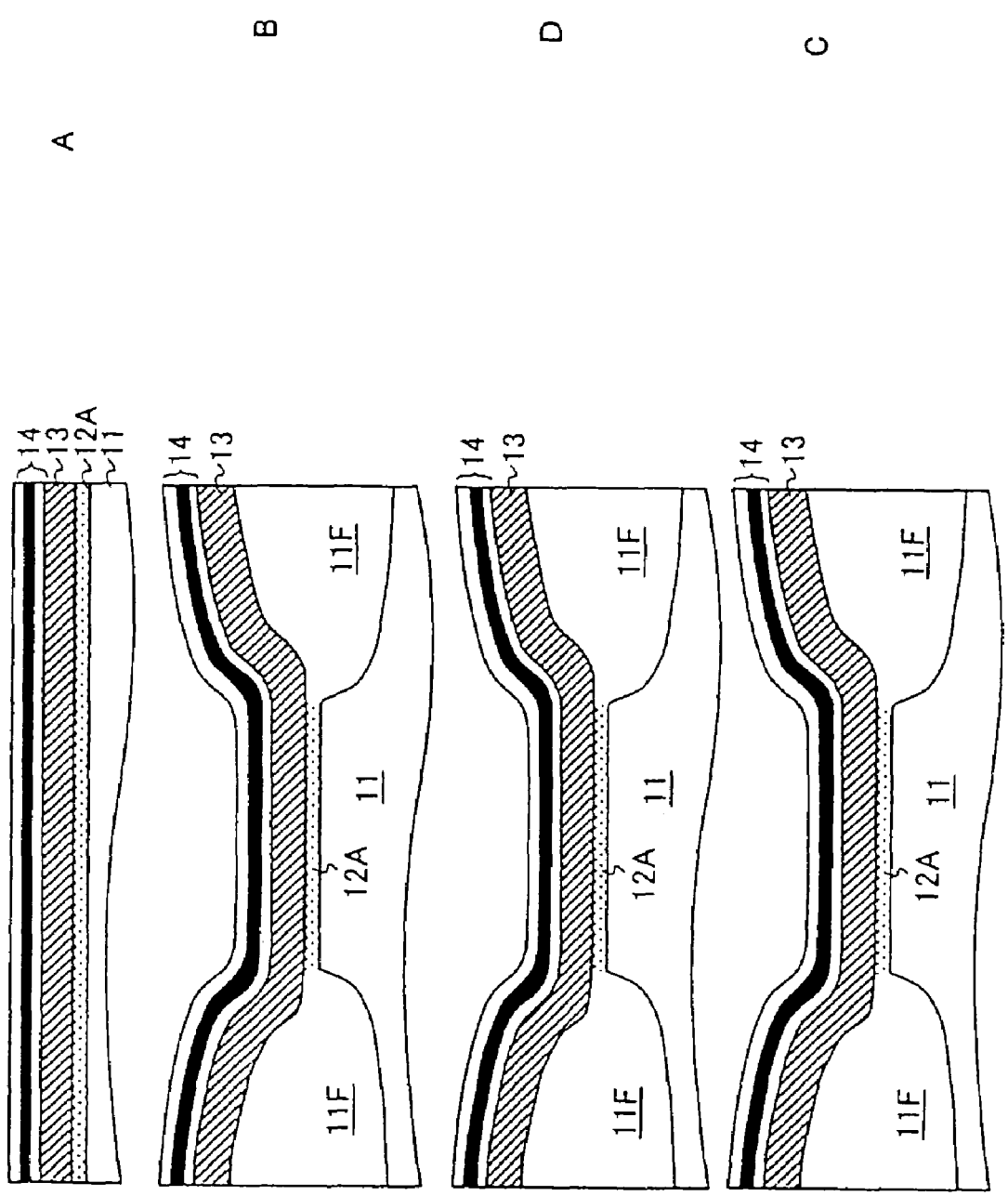
FIGS. 9A-9D are diagrams explaining the problem of the fabrication process of the different conventional semiconductor integrated circuit.
Figure 10A:
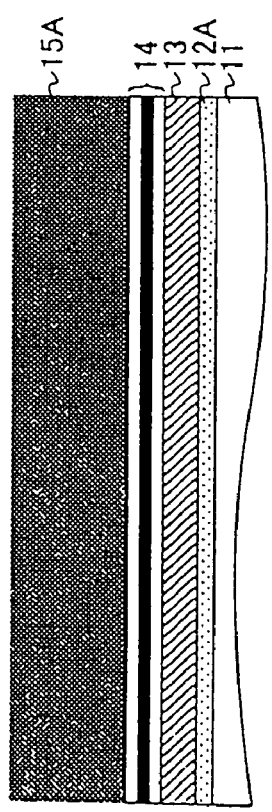
FIGS. 10A-10D are diagrams explaining the problem of the fabrication process of the different conventional semiconductor integrated circuit.
Figure 10B:
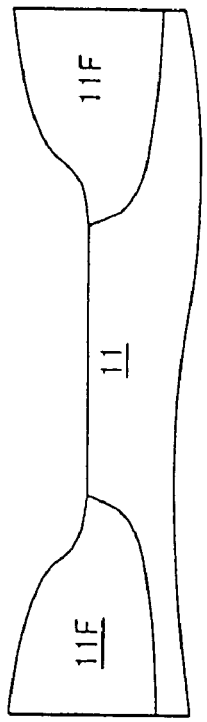
Figure 10C:
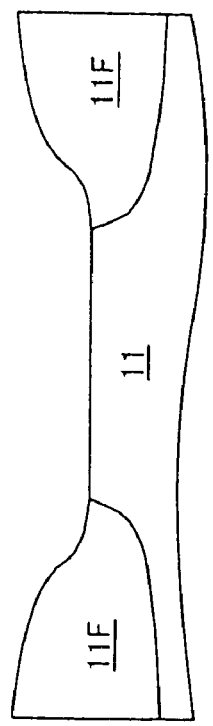
Figure 10D:
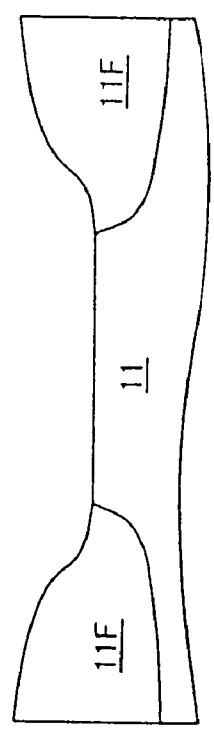
Figure 11A:
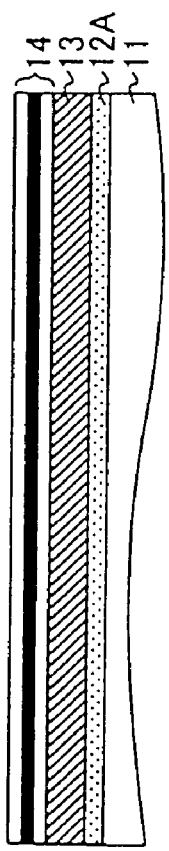
FIGS. 11A-11D are further diagrams explaining the problem of the fabrication process of the different conventional semiconductor integrated circuit.
Figure 11B:
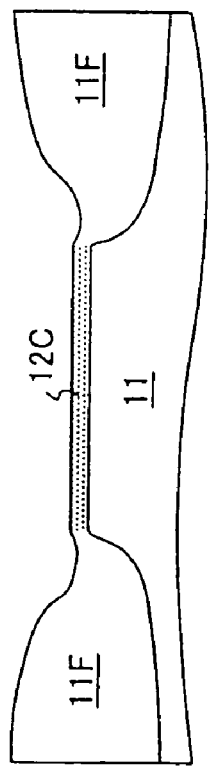
Figure 11C:
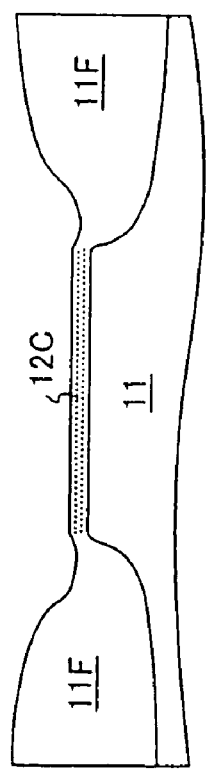
Figure 11D:
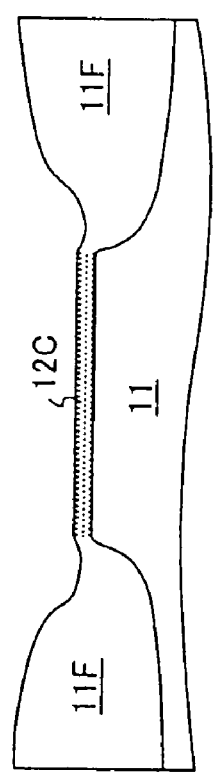
Figure 13A:
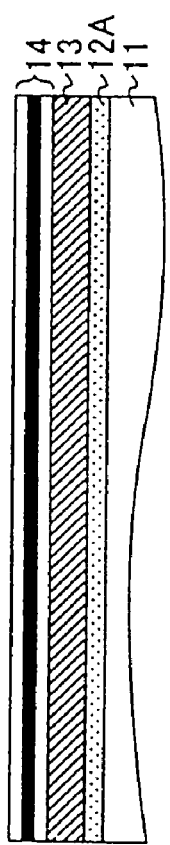
FIGS. 13A-13D are further diagrams explaining the problem of the fabrication process of the different conventional semiconductor integrated circuit.
Figure 13B:
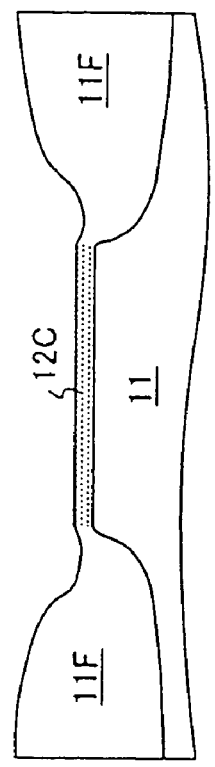
Figure 13C:
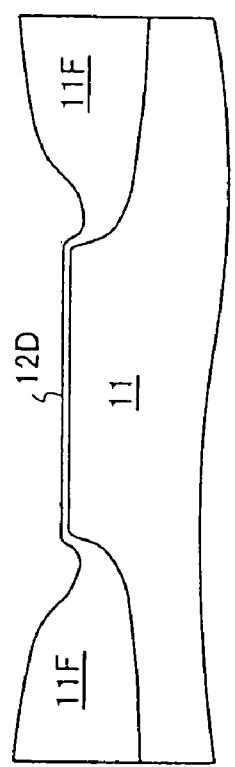
Figure 13D:
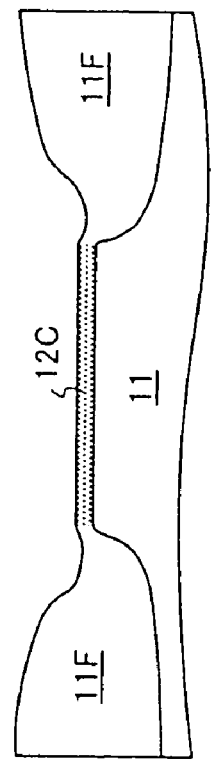
Figures 14A, 14B, 14C, 14D:
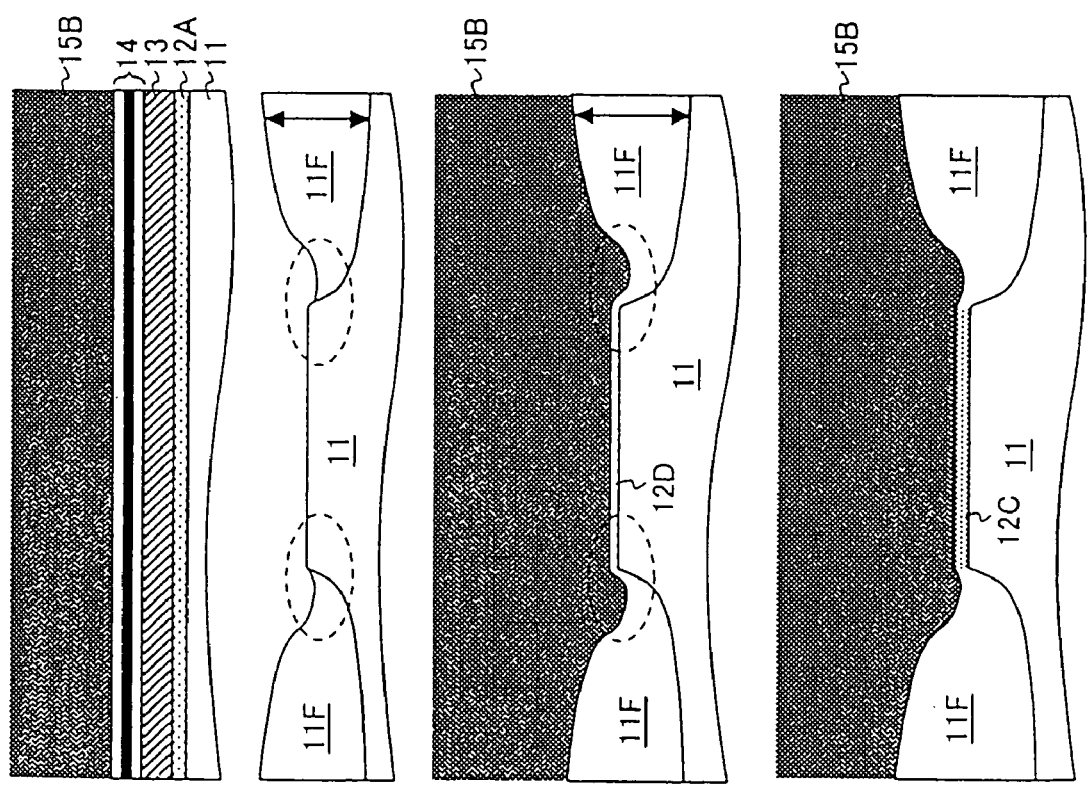
FIGS. 14A-14D are further diagrams explaining the problem of the fabrication process of the different conventional semiconductor integrated circuit.

It can be seen that the problem of formation of deep depression in the boundary part between the STI region 11G and the region B or region C similar to the one shown in FIGS. 7A and 7B is eliminated, and the threshold characteristics of the transistor formed thereon are stabilized.

[First Modification]

FIGS. 38A-38D show the fabrication process of a semiconductor integrated circuit according to a first modification of this embodiment.

Figure 38A:
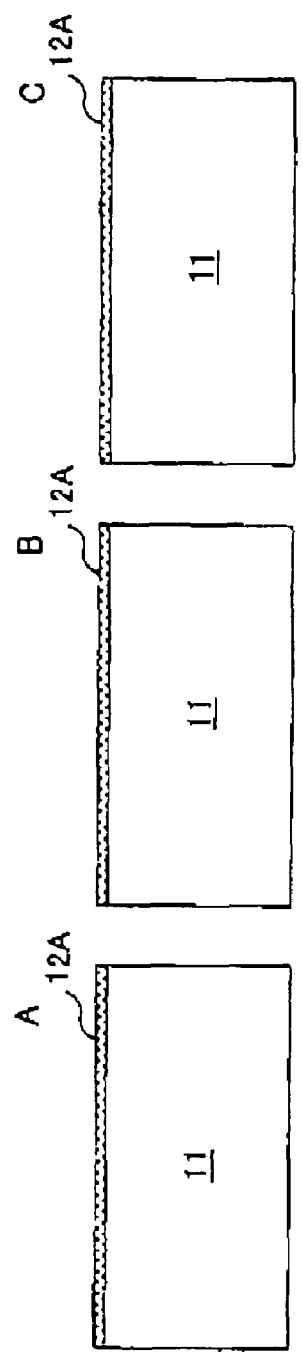
FIGS. 38A-38D are diagrams showing a first modification of the first embodiment of this invention.

FIG. 38A is referred to.

Figure 38B:
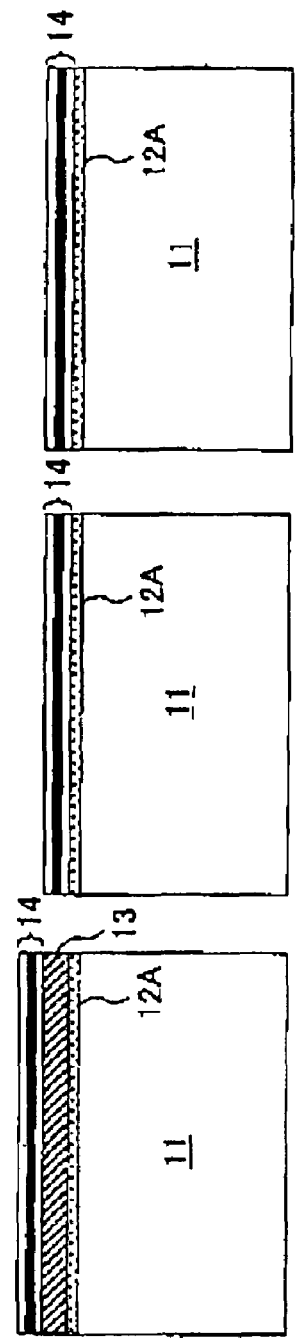

A tunneling insulation film 12A is formed on the Si substrate 11 in this modification in each of the regions A-C, and an amorphous silicon film 13 and an ONO film 14 are deposited consecutively in the step of FIG. 38B. Further, in the process of FIG. 38B, the amorphous silicon film 13 is patterned and removed from the regions B and also C. As a result, the ONO film 14 is formed directly on the surface of the tunneling insulation film 12A in regions B and C.

Figure 38C:
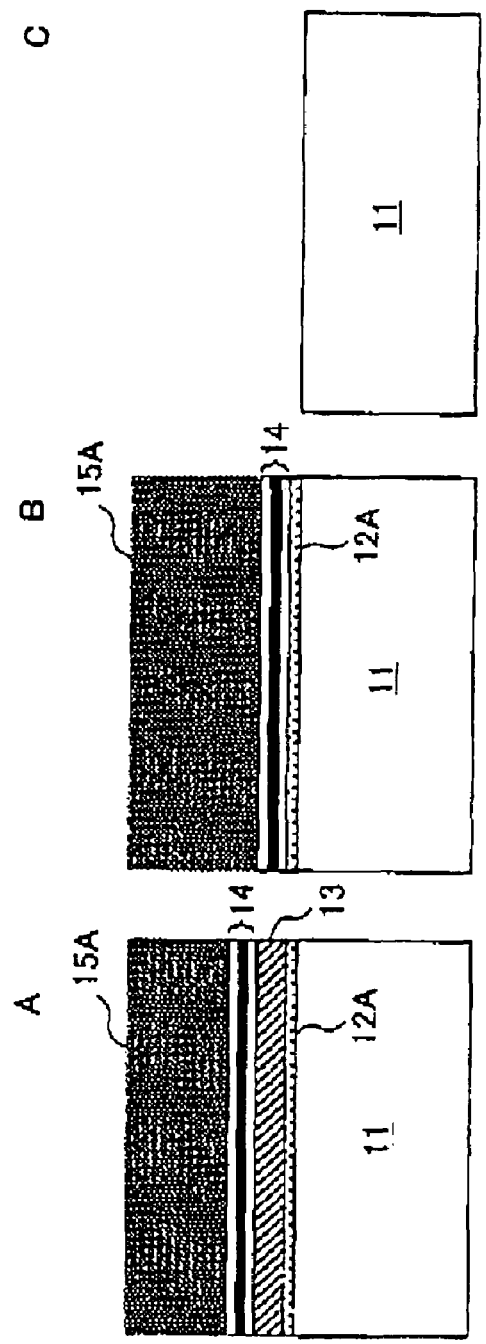
Figure 38D:
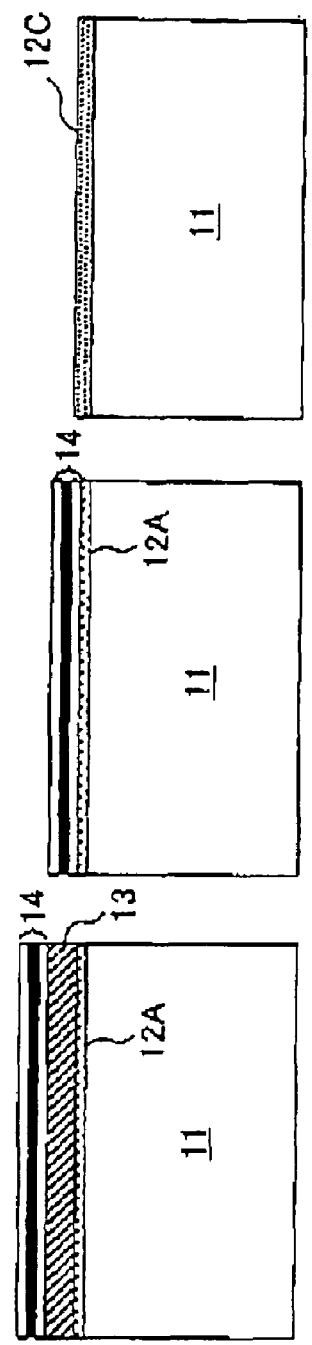
Figure 40A:
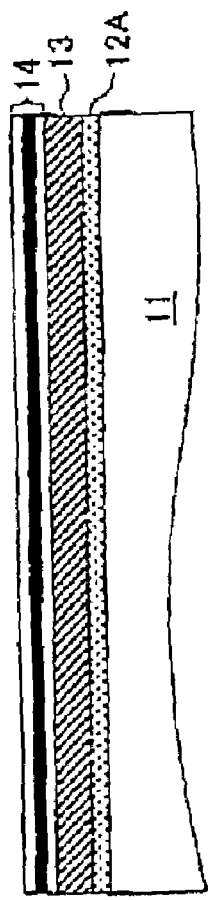
FIGS. 40A-40D are diagrams explaining the effect of this embodiment.
Figure 40B:
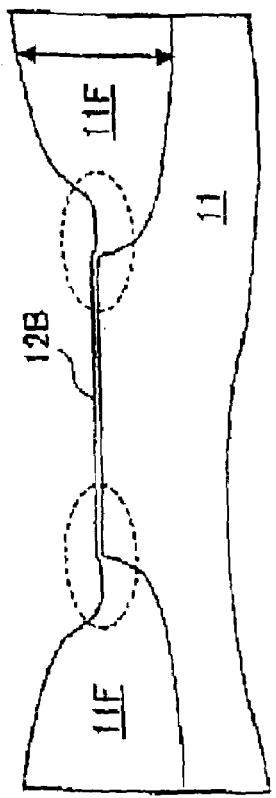
Figure 40C:
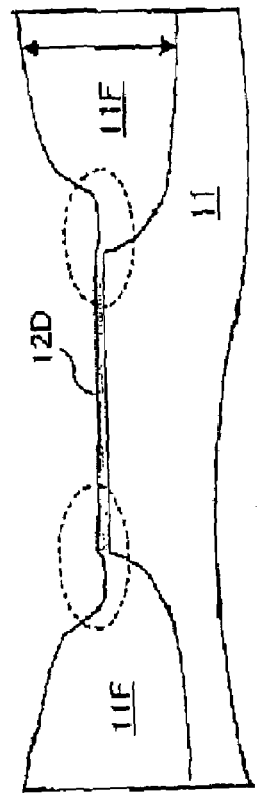
Figure 40D:
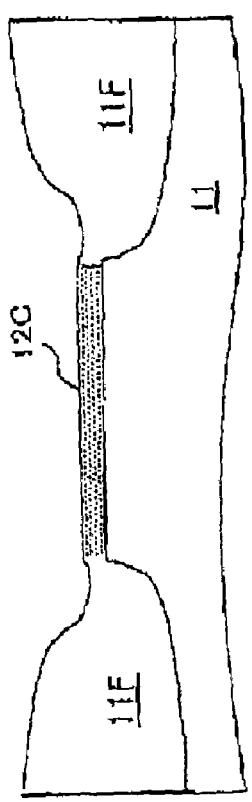

Furthermore in this embodiment, the ONO film 14 and the tunneling insulation film 12A are removed from the surface of the Si substrate 11 in the region C by a patterning that uses the resist pattern 15A in the step of FIG. 38C, and a thermal oxidation processes is conducted in the step of FIG. 38D at the temperature of 800-1100° C. on the surface of Si substrate 11 thus exposed. As a result, a thermal oxide film 12C is formed with a thickness of 8-50 nm.

Furthermore, by conducting a process similar to the one explained with reference to FIGS. 31E-31G previously, the desired semiconductor integrated circuit is obtained.

In the present modification, too, the low-voltage transistor region B is covered by the oxidation-resistant ONO film 14 during the thermal oxidation process of FIG. 38D, and thus, there occurs no growth of the tunneling oxide film 12A. As a result, there is no formation of such a deep depression at the peripheral part of n the region B even when the tunneling oxide film 12A is removed a by wet etching processing later.

[Second Modification]

FIGS. 39A-39H shows a modification of this embodiment applied to the case in which there is further formed a mid-voltage transistor in the region D defined on the Si substrate 11.

FIG. 39A is referred to.

In each of the regions A-D, the tunneling oxide film 12 is formed on the surface of the Si substrate 11 by a thermal oxidation process processes conducted at the temperature of 800-1100° C. with a thickness of 8-12 nm. Further, the amorphous silicon film 13 and the ONO film 14 are formed in the step of FIG. 39B according to the process explained previously with respective thicknesses of 50-120 nm and 13-30 nm.

Next, in the step of FIG. 39C, the resist pattern 15A is formed on the structure of FIG. 39B so as to expose the region C, and the ONO film 14 and the amorphous silicon film 13 and also the tunneling oxide film 12A are etched consecutively by a wet etching process while using the resist pattern 15A as a mask. As a result, the surface of Si substrate 11 is exposed in the region C.

Next, in the step of FIG. 39D, the resist pattern 15A is removed and a thermal oxidation processes is applied at 800-1100° C. while using the ONO film 14 as an anti-oxidation mask in the regions A, B and also D. As a result, a thermal oxide film 12C is formed on the region C with a thickness of 5-50 nm.

Next, in the step of FIG. 39E, the resist pattern 15D is formed on the structure of FIG. 39D so as to expose the mid-voltage transistor region D selectively, and the ONO film 14 and the amorphous silicon film 13 and also the tunneling oxide film 12A are removed from the region D by a wet etching processing.

Next, in the step of FIG. 39F, the resist pattern 15D is removed and a thermal oxidation processes is applied at 800-1100° C. while using the ONO film 14 as an anti-oxidation mask. As a result, the thermal oxide film 12D is formed on the region D with a thickness of 5-10 nm. In the step of FIG. 39F, there occurs a growth in the thermal oxide film 12C in the region C with the thermal oxidation process that forms the thermal oxide film 12D.

Next, in the step of FIG. 39G, the resist pattern 15B is formed on the structure of FIG. 39F so as to expose the region B, and the ONO film 14 and the amorphous silicon film 13 and the tunneling oxide film 12A are removed consecutively by a wet etching process while using the resist pattern 15B as a mask. As a result, the surface of the Si substrate 11 is exposed in the region B.

Furthermore, in the step of FIG. 39H, the resist pattern 15B is removed, and a thermal oxidation process is conducted at 800-1100° C. to form the thermal oxide film 12B on the Si substrate 11 in correspondence to the region B with a thickness 1.5-9 nm. In the step of FIG. 39H, there occurs an increase in the thickness of the thermal oxide films 12C and 12D with the thermal oxidation process that forms the thermal oxide film 12B.

Further, the process that explained previously with reference to FIGS. 8I-8M is conducted after the step of FIG. 39H, and a semiconductor integrated circuit in which the flash memory cell A, the low-voltage transistor B, the mid-voltage transistor D and the high-voltage transistor C are integrated on the Si substrate 11 is obtained.

According to this modification, the process of forming a thermal oxide film and removing the thermal oxide film by a wet etching process is is not repeated in any of the regions A-D, and as a result, the problem of depression formation in the peripheral part of device regions A-D is suppressed effectively as shown in FIGS. 40A-40D. Thereby, the problem of modification of the threshold characteristics in the low-voltage transistor region B and also in the mid-voltage transistor region D, in which a thin gate insulation film is formed, is successfully avoided.

This invention is effective also in the semiconductor integrated circuits that has an STI structure G as shown in FIGS. 41A-41C. When the present invention is applied to such an STI structure, the problem of thinning of the gate insulation film in the peripheral part of device regions B and C is effectively avoided.

According to this invention, it should be noted that the etching process of the thermal oxide film by using HF is conducted only in any of the regions B-D. Thus, the threshold characteristics of the transistor formed on these regions are stabilized further.

Second Embodiment

FIGS. 42A-42K show the fabrication process of a semiconductor integrated circuit according to a second embodiment of this invention, wherein those parts corresponding to the part described previously are designated by the same reference numerals and description thereof will be omitted.

FIG. 42A is referred to.

An oxide film 110 is formed on the Si substrate 11 and a resist pattern 111A having an opening that expose the mid-voltage transistor formation region B is formed on the oxide film 110. Further, while using the resist pattern 111 as a mask, an ion implantation process of nitrogen ions is conducted under an accelerating voltage of 20-50 keV with a dose $1 \times 10^{14}$-$1 \times 10^{15}$ cm$^{-2}$.

Next, in the step of FIG. 42B, the resist pattern 111A is removed and a thermal oxidation process is applied at the temperature of 800-1100° C. As a result, a tunneling oxide film 12A is formed on the surface of Si substrate 11 in each of the regions A-C. In the step of FIG. 42B, it should be noted that the oxidization rate is small in the region D in which nitrogen is introduced into the Si substrate 11. As a result, the thermal oxide film 12D thus formed by a thermal oxidation process has a smaller thickness as compared with the thermal oxide film 12A that is formed concurrently.

Next, in the step of FIG. 42C, an amorphous silicon film 13 and an ONO film 14 are deposited consecutively, and a resist pattern 11B that exposes high-voltage transistor region C is formed in the step of FIG. 42D. Further, the ONO film 14 and the amorphous silicon film 13 and the tunneling oxide film 12A are removed by a wet etching in the region C.

Figure 42E:
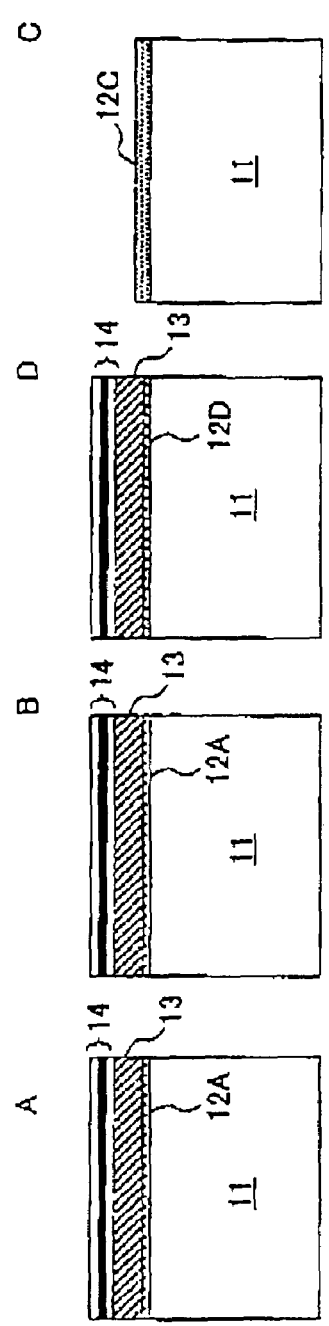

Further, in the step of FIG. 42E, the resist pattern 111B is removed and a thermal oxidation process is applied at 800-1100° C. As a result, the thermal oxide film 12C is formed on region C. In the thermal oxidation process of FIG. 42E, it should be noted that the regions A, B D are protected by the ONO film 14 having the nature of oxidization resistance.

Figure 42F:
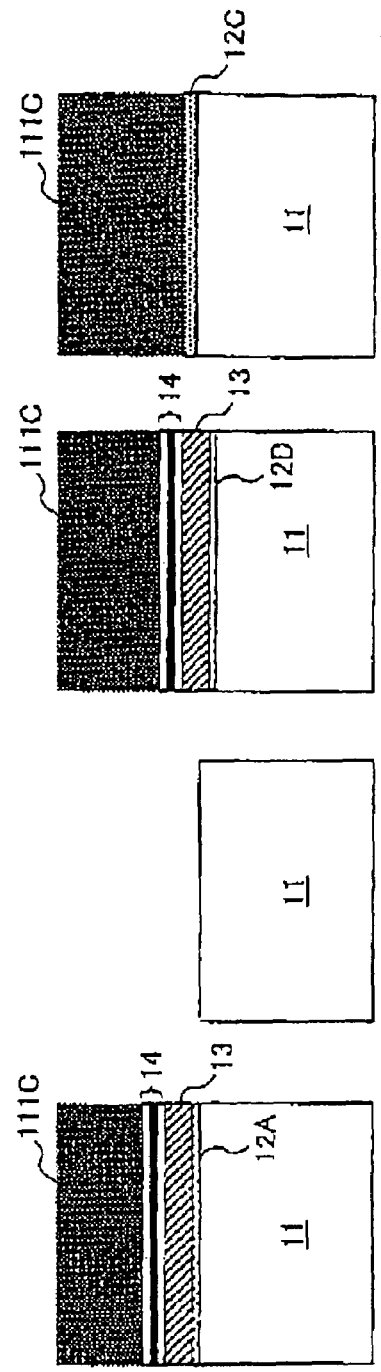

Next, in the step of FIG. 42F, a resist pattern 111C exposing the low-voltage transistor region B is formed on the structure of FIG. 42E, and the ONO film 14 and the amorphous silicon film 13 and the thermal oxide film 12A are removed consecutively by a wet etching process using HF.

Figure 42G:
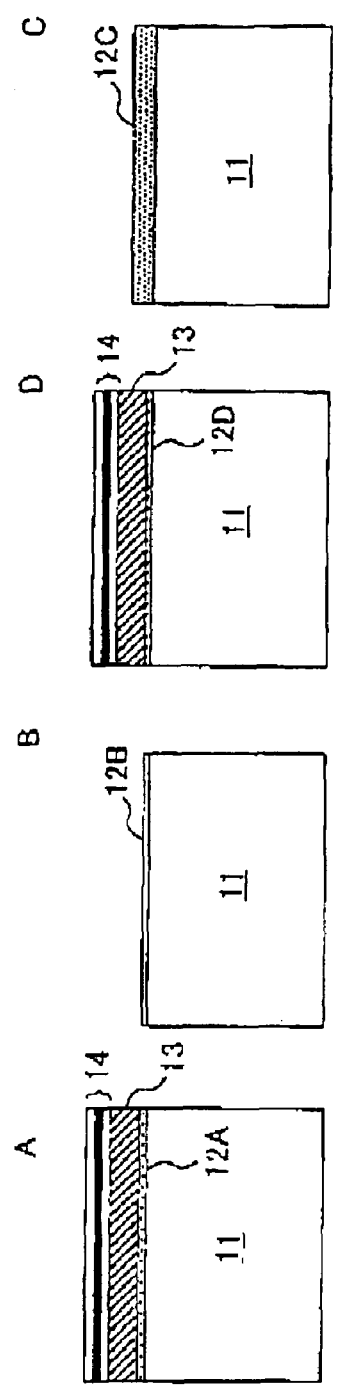

Next, in the step of FIG. 42G, the resist pattern 111C is removed and a thermal oxidation process is applied with the temperature of 800-1100° C. As a result, the thermal oxide film 12B is formed with a thickness of 1.5-5 nm on the Si substrate 11 surface in correspondence to the region B. In the step of FIG. 42G, there occurs a growth of the thermal oxide film 12C in the region C simultaneously to the formation of the thermal oxide film 12B.

Figure 42H:
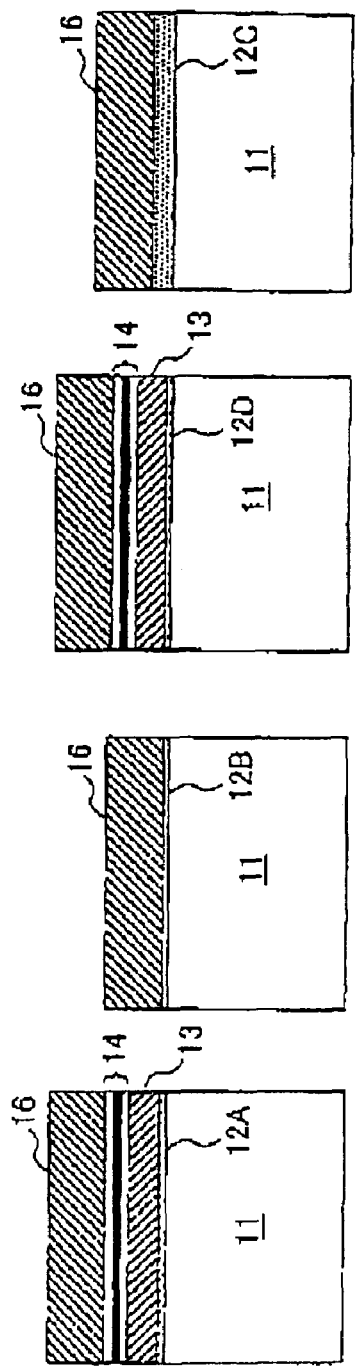

Next, in the step of FIG. 42H, the amorphous silicon film 16 that is doped with P to a concentration level of $2 \times 10^{20}$-$3 \times 10^{21}$ cm$^{-3}$ is deposited on the structure of FIG. 42G with a thickness of 100-250 nm. Further, in the step of FIG. 42I, the gate electrode structure 16F of stacked-type is patterned in the flash-memory cell region A while using a resist pattern 111D that covers the regions B-D as a mask. In the step of FIG. 42G, it is possible to form a low-resistance silicide film of WSi, CoSi, and the like on the amorphous silicon film 16.

Next, in the step of FIG. 42J, the amorphous silicon film 16 is patterned in the region B and in the region C while using another resist pattern 111E that covering the region A as a mask, and the gate electrode pattern 16B is formed in the region B and the gate electrode pattern 16C is formed in the region C.

Figure 42K:
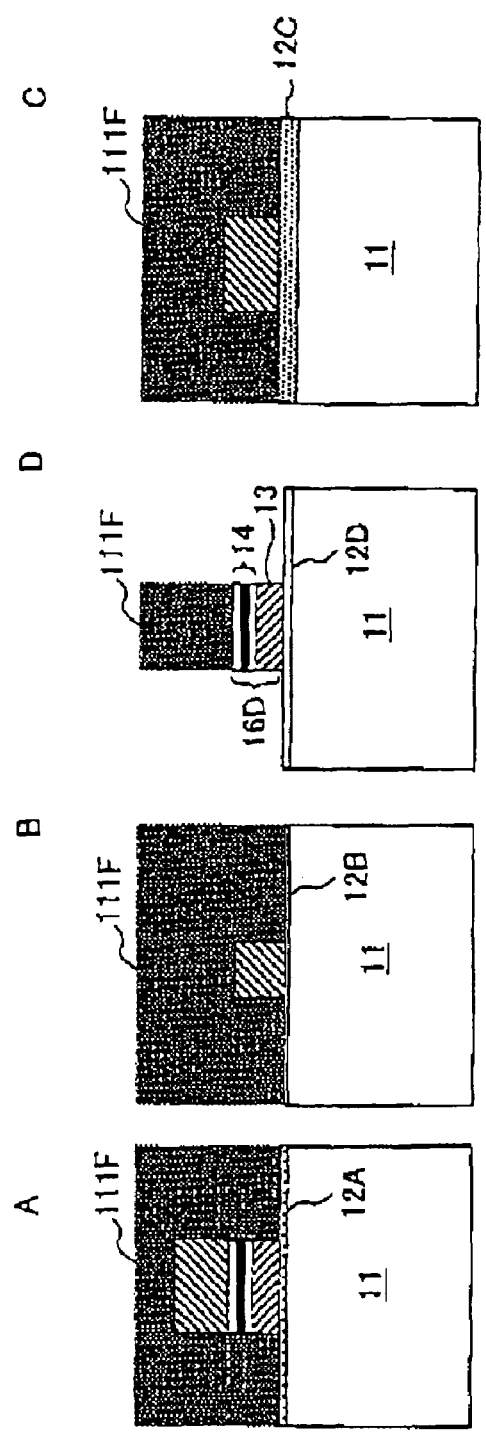

Next, in the process of FIG. 42K, a resist pattern 111F covering the regions A-C is formed, and the ONO film 14 and the amorphous silicon film 13 are patterned in the region D while using the resist pattern 111F as a mask. As a result, the gate electrode 16D is formed.

Next, after the step of FIG. 42K, the process corresponding to the steps of FIG. 20J-20O explained previously is conducted, and a semiconductor integrated circuit in which the flash memory cell A, the low-voltage transistor B, the mid-voltage transistor D and the high-voltage transistor C are integrated on the Si substrate 11 is obtained.

In the present embodiment, too, it should be noted that the process of applying a thermal oxidation process and then a wet etching process is not repeated in any of the regions B-D, and no deep depression is formed in the peripheral part of the device region. Because of this, the problem of thickness of the gate oxide film is reduced in the peripheral part of the device region and associated problem of change of the threshold characteristics of the MOS transistors is successfully avoided.

FIGS. 43A-43C show the schematic construction of the low-voltage transistor, the mid-voltage transistor and the high-voltage transistor formed respectively on the regions B, D and C according to the present embodiment, wherein it should be noted that FIGS. 43A-43C shows the state in which the resist pattern 11F and the ONO film 14 shown in FIG. 42K is removed.

As will be understood from the process explained previously and from the process of FIG. 43B, an excellent film quality is achieved for the gate insulation film 12D of the mid-voltage transistor D in the present embodiment due to the fact that the gate insulation film 12D is formed by a single thermal oxidation step. Also, it becomes possible to control the film thickness exactly. As a result, the operational characteristics of the transistor D is improved.

Further, as will be understood from the process explained previously and further from FIG. 43C, the second thermal oxidation process takes place in this embodiment at the occasion of formation of the gate insulation film 12C of the high-voltage transistor C, simultaneously to the formation of the thermal oxide film 12B in the low-voltage transistor region B. However, the increase of the film thickness by such a thermal oxidation process is trifling, and the thickness of the gate insulation film 12C is determined substantially in the step of FIG. 42E. Because of this, the operational characteristics of the high-voltage transistor C are improved also in this embodiment.

Third Embodiment

FIGS. 44A-44L show the fabrication process of a semiconductor integrated circuit according to a third embodiment of this invention, wherein those parts corresponding to the part described previously are designated by the same reference numerals and the description thereof will be omitted.

Figure 44C:
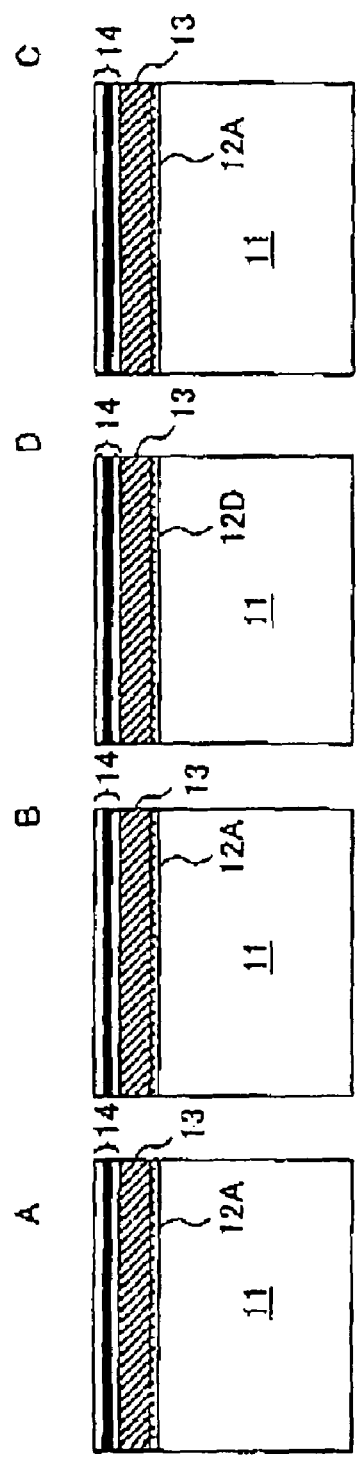
Figure 44D:
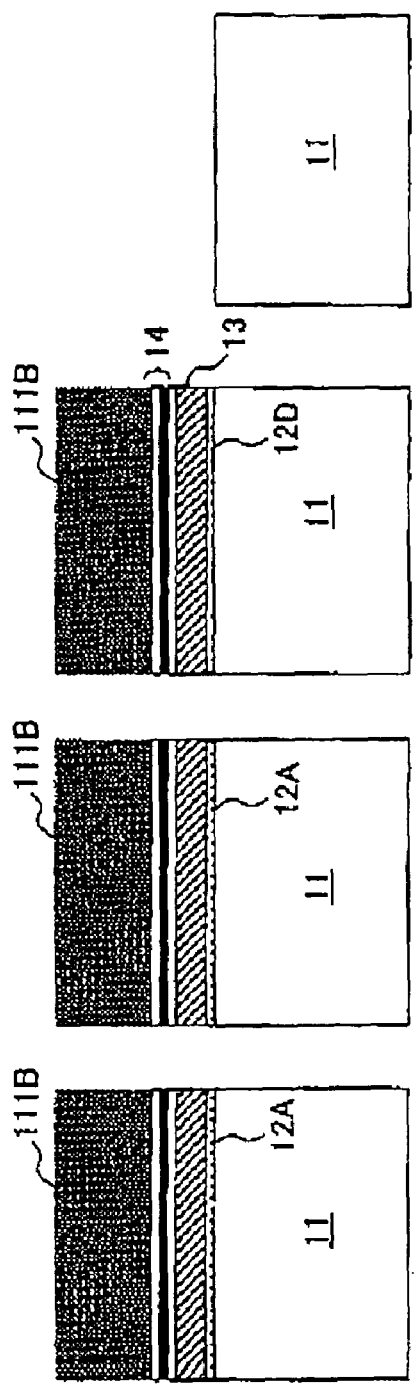

In this embodiment, the process of FIGS. 44A-44G is identical with the process of FIGS. 42A-42G, and the same structure as FIG. 42G is obtained in the step of FIG. 44G.

Figures 44I, 44J:
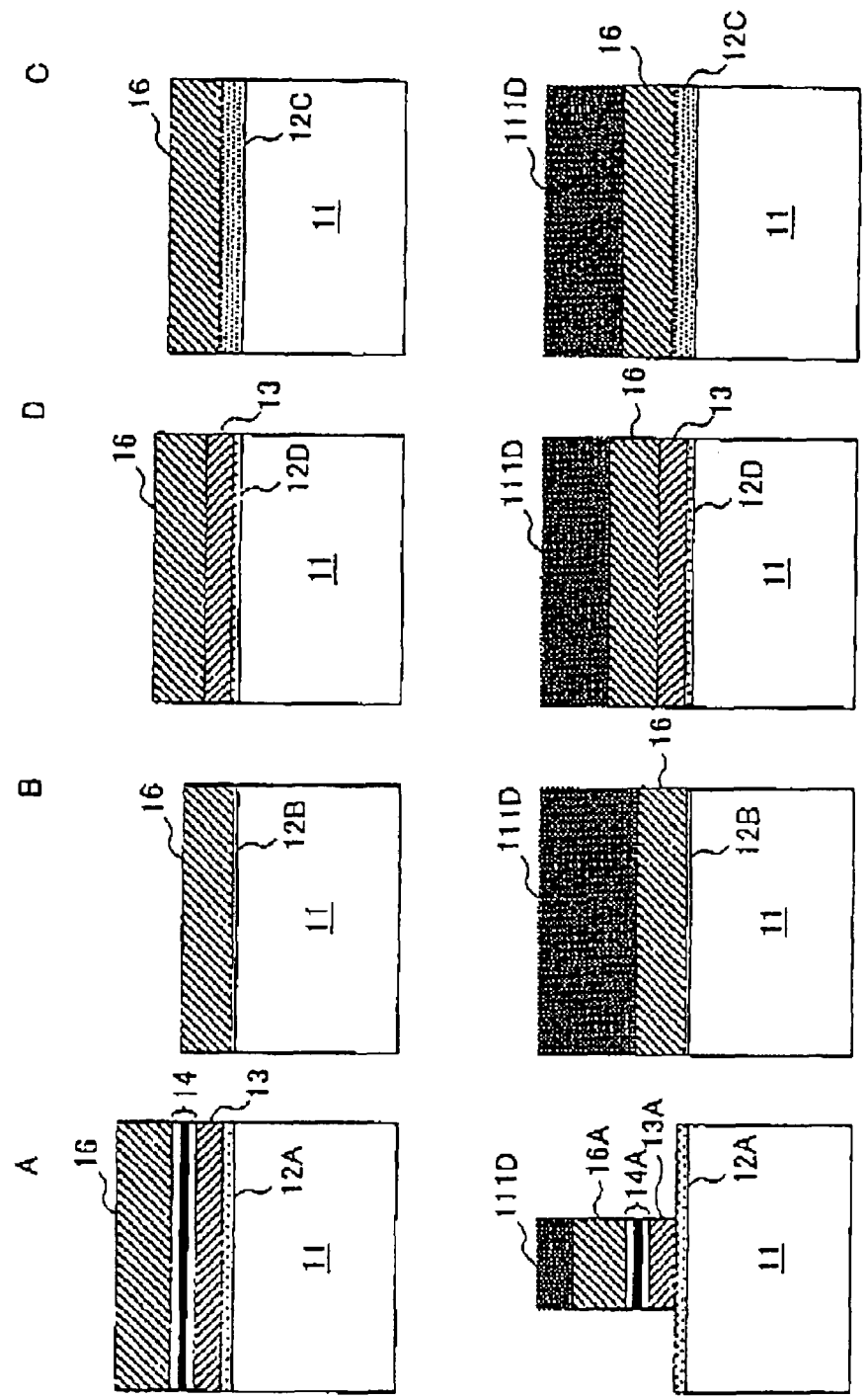

Next, in this embodiment, while using the resist pattern 112A as a mask, the ONO film 14 is removed from the mid-voltage transistor region D in the step of FIG. 44H, and the amorphous silicon film 16, doped by P to a concentration level of $2\times10^{20}$-$3\times10^{21}$ cm$^{-3}$, is deposited in the step of FIG. 44I after removing the resist pattern 112A. Because the amorphous silicon film 13 is exposed in region D in the state of FIG. 44H, a structure in which the amorphous silicon film 13 and the amorphous silicon film 16 are stacked consecutively is obtained on the thermal oxide film 12D in the region D.

Furthermore, in the step of FIGS. 44J-44L, a patterning process is implemented while using the resist patterns 111D, 111E and also 111F as a mask, and a flash memory cell is formed on the region A, a low-voltage transistor is formed on the region B, a high-voltage transistor is formed on the region C, and a mid-voltage transistor is formed on the region D.

Figure 45A:
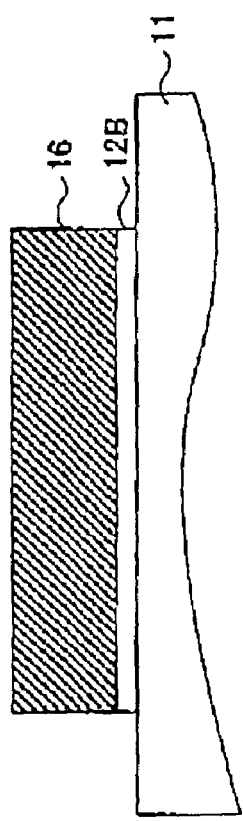
FIGS. 45A-45C are diagrams showing a part of the semiconductor integrated circuit according to a third embodiment of this invention.
Figure 45B:
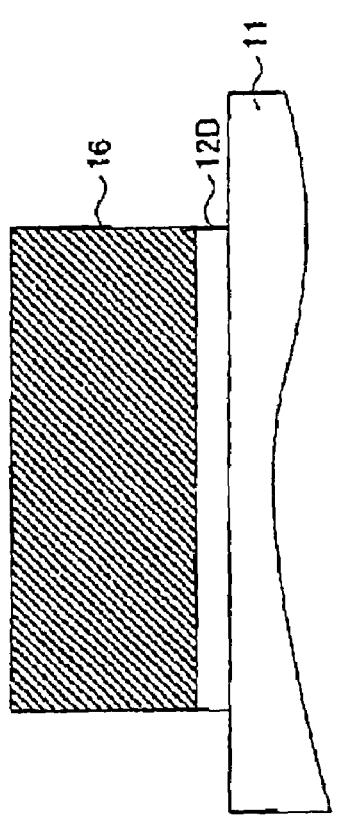
Figure 45C:
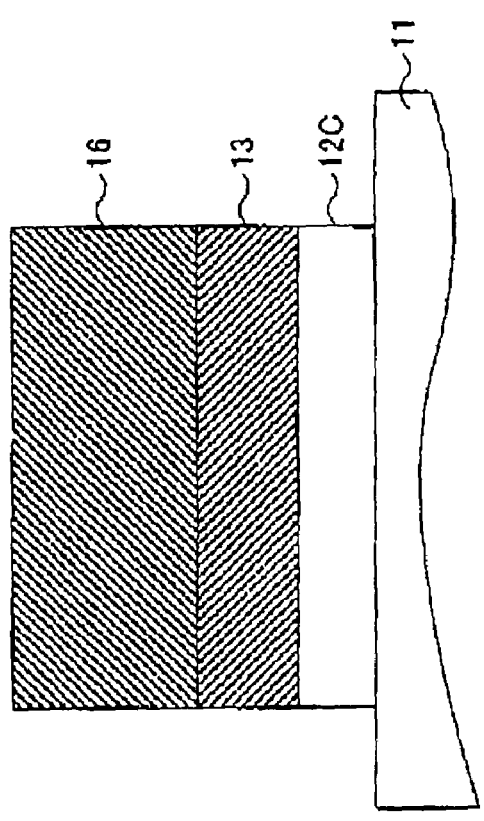

FIGS. 45A-45C show a schematic cross-sectional view of the low-voltage transistor, the and mid-voltage transistor and the high-voltage transistor formed respectively on the region B, the region D and the region C.

FIGS. 45A-45C are referred to.

It is possible that in the semiconductor integrated circuit of this embodiment to change the thickness of the gate electrode in each region. In addition to such a change of height of the gate electrode, it is possible to change specific resistance gate between the amorphous silicon film 13 and the amorphous silicon film 16 in this embodiment. Thereby, it becomes possible to change the gate resistance of the transistors in the semiconductor integrated circuit according to the needs. Such an adjustment of gate resistance is especially important in semiconductor integrated circuits including an analog circuit. It is desirable to form a silicide layer on the surface of the amorphous silicon film 16 in the case of forming a gate electrode, which is required to provide an especially low resistance.

Fourth Embodiment

FIGS. 46A-46L show the fabrication process of a semiconductor integrated circuit according to a fourth embodiment of this invention, wherein those parts corresponding to the parts described previously are designated by the same reference numerals and the description thereof will be omitted.

FIGS. 46A-46L are referred to.

The process to FIGS. 46A-46G are substantially the same with the processes of FIGS. 44A-44G described previously. Accordingly, a structure corresponding to the structure of FIG. 44G is obtained in the step of FIG. 46G.

Figure 46A:
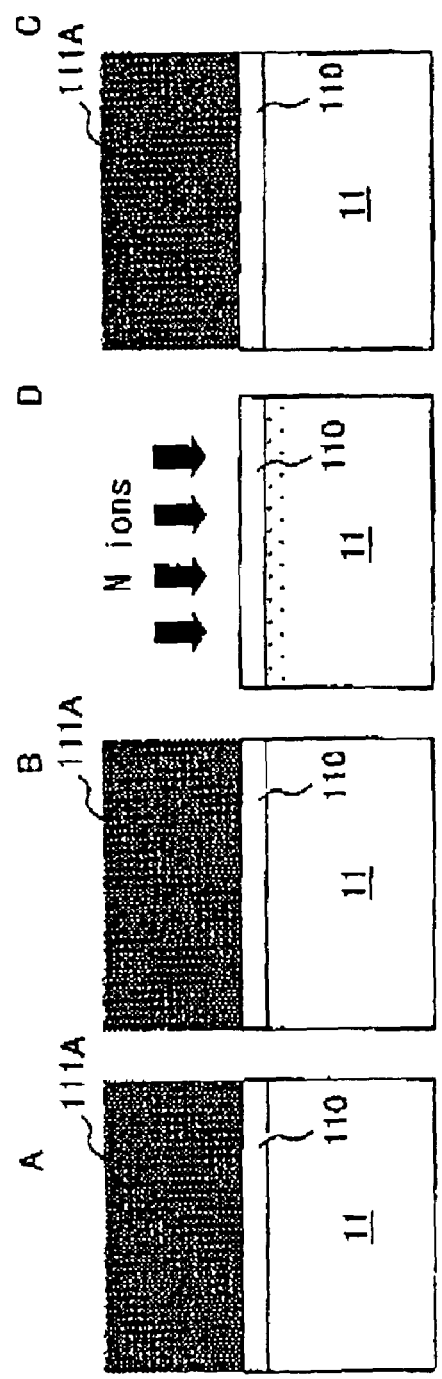
Figure 46B:
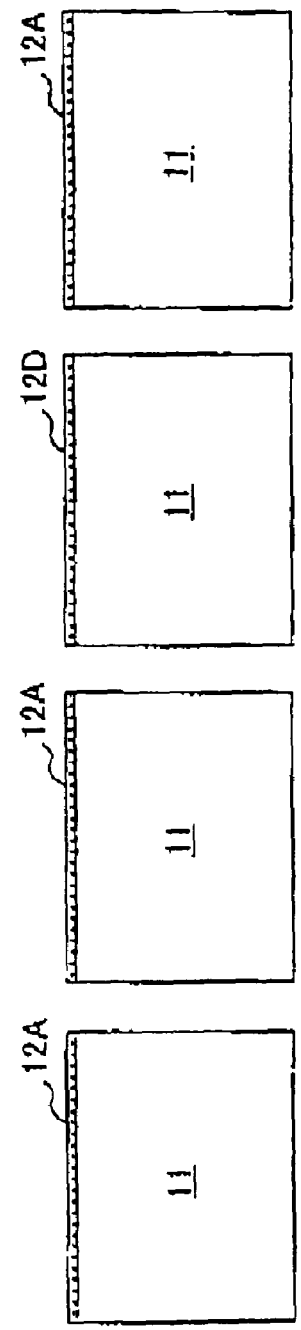
Figure 46G:
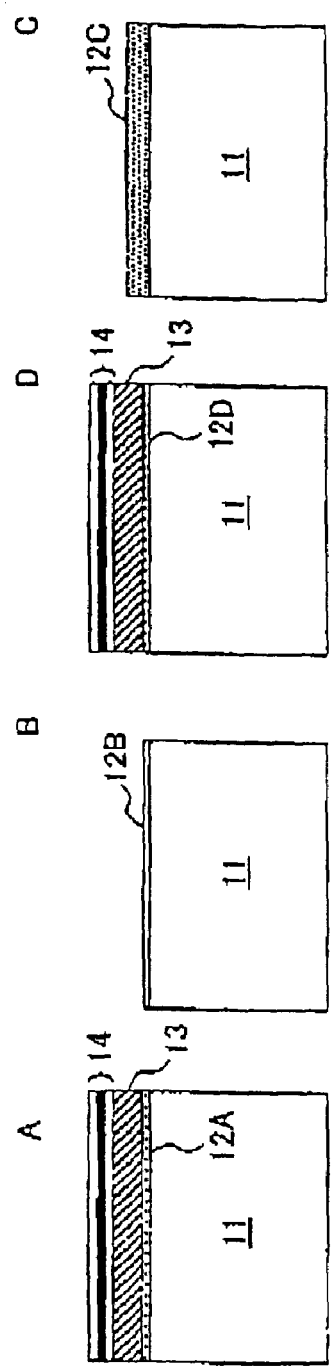
Figure 46H:
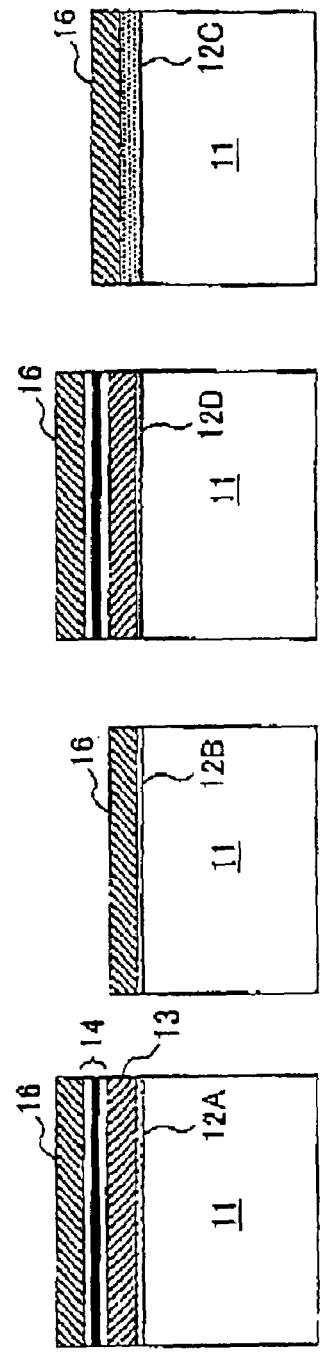
Figure 46I:
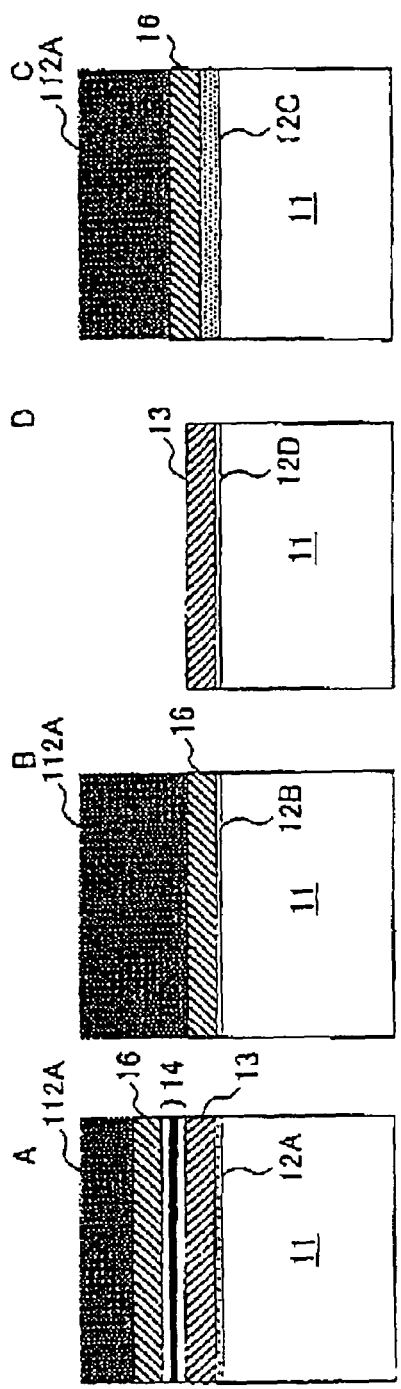

Next, in the step of FIG. 46H, the amorphous silicon film 16 doped with P to a concentration level of $2\times10^{20}$-$3\times10^{21}$ cm$^{-3}$ is deposited on the structure of FIG. 46G by a CVD process with a thickness of 80-120 nm, followed by the step of FIG. 46I in which the amorphous silicon film 16 and the ONO film 14 are removed from the region D while using the resist pattern 112A that exposes the mid-voltage transistor region D as a mask.

Figure 46J:
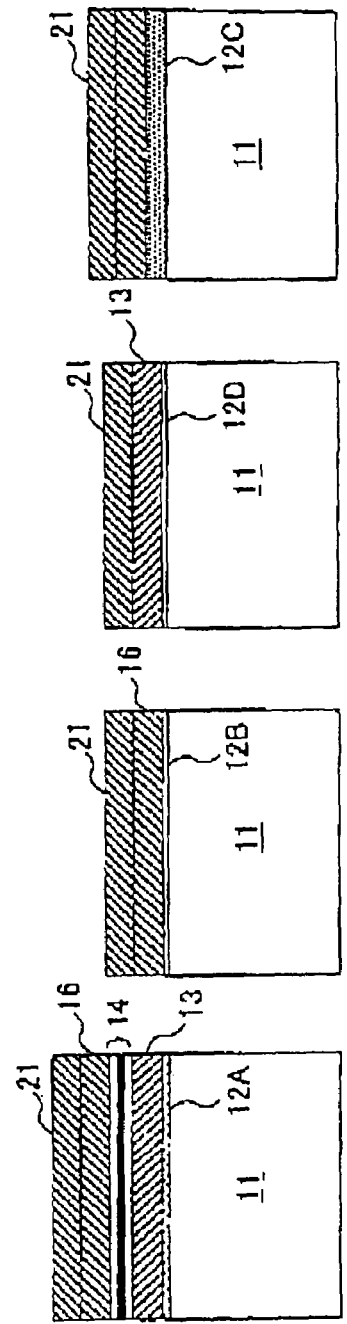

Next, in the step of FIG. 46J, the resist pattern 112A is removed, and an amorphous silicon film 21 doped with P to a concentration level of $2\times10^{20}$-$3\times10^{21}$ cm$^{-3}$ is deposited by a CVD process with a thickness of 80-120 nm. Alternatively, a low-resistance silicide film may be used for the amorphous silicon film 21. Further, it is as well possible to form a silicide layer after formation of the diffusion region is place of the amorphous silicon film 21 by using a salicide process.

Next, in the step of FIG. 46K, the stacked gate structure 16F is formed in the flash-memory cell region A while using the resist pattern 111D as a mask. In this embodiment, the stacked gate structure 16F is formed of stacking of the amorphous silicon pattern 13A, the ONO pattern 14A, the amorphous silicon pattern 16A and an amorphous silicon pattern 21A that is formed by patterning the amorphous silicon film 21.

Next, in the step of FIG. 46L, the amorphous silicon film 21 and the amorphous silicon film 16 or 13 underneath the amorphous silicon film 12 are patterned by using a different resist pattern 111G, and the gate electrode 16B is formed in the region B, the gate electrode 16C is formed in the region C, the gate electrode 16D is formed in the region D, each in the form of stacking of the amorphous silicon films 16 and 21 or in the form of stacking of the amorphous silicon films 13 and 21.

FIGS. 47A-47D show a schematic cross-sectional structure of the flash memory cell and the low-voltage transistor and the mid-voltage transistor and the high-voltage transistor that are formed on the Si substrate 11.

FIGS. 47A-47D is referred to.

It will be understood that is possible to arrange the height of the gate electrodes 16B, 16C, and 16D in common, by choosing the thicknesses of the amorphous silicon films 13, 16 and also 21 appropriately. By arranging the height of the electrodes 16B-16D as such, it becomes possible to pattern the gate electrodes of the transistor concurrently at the time of forming a peripheral circuit that includes these transistors. Further, it becomes possible to adjust resistance value of the gate electrodes 16B-16D to a value required by circuitry design, by changing the specific resistance of the amorphous silicon films 13,16 and 21.

Fifth Embodiment

FIGS. 48A-48K show the fabrication process of a semiconductor integrated circuit according to a fifth embodiment of this invention, wherein those parts corresponding to the parts described previously are designated by the same reference numerals and the description thereof will be omitted.

FIGS. 48A-48K are referred to.

Figure 48C:
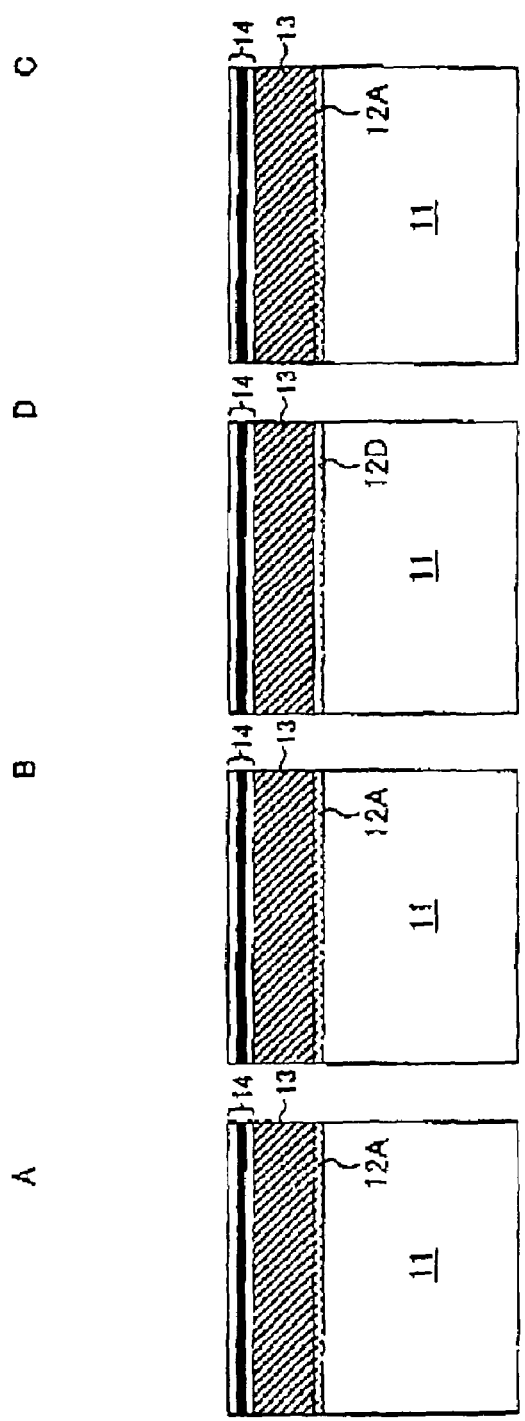
Figure 48D:
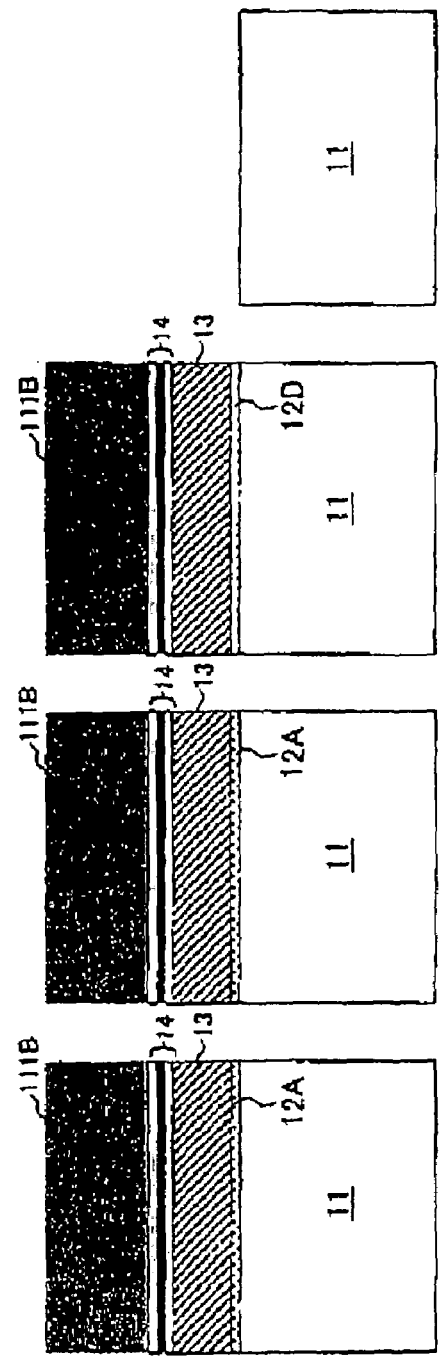
Figures 48G, 48H:
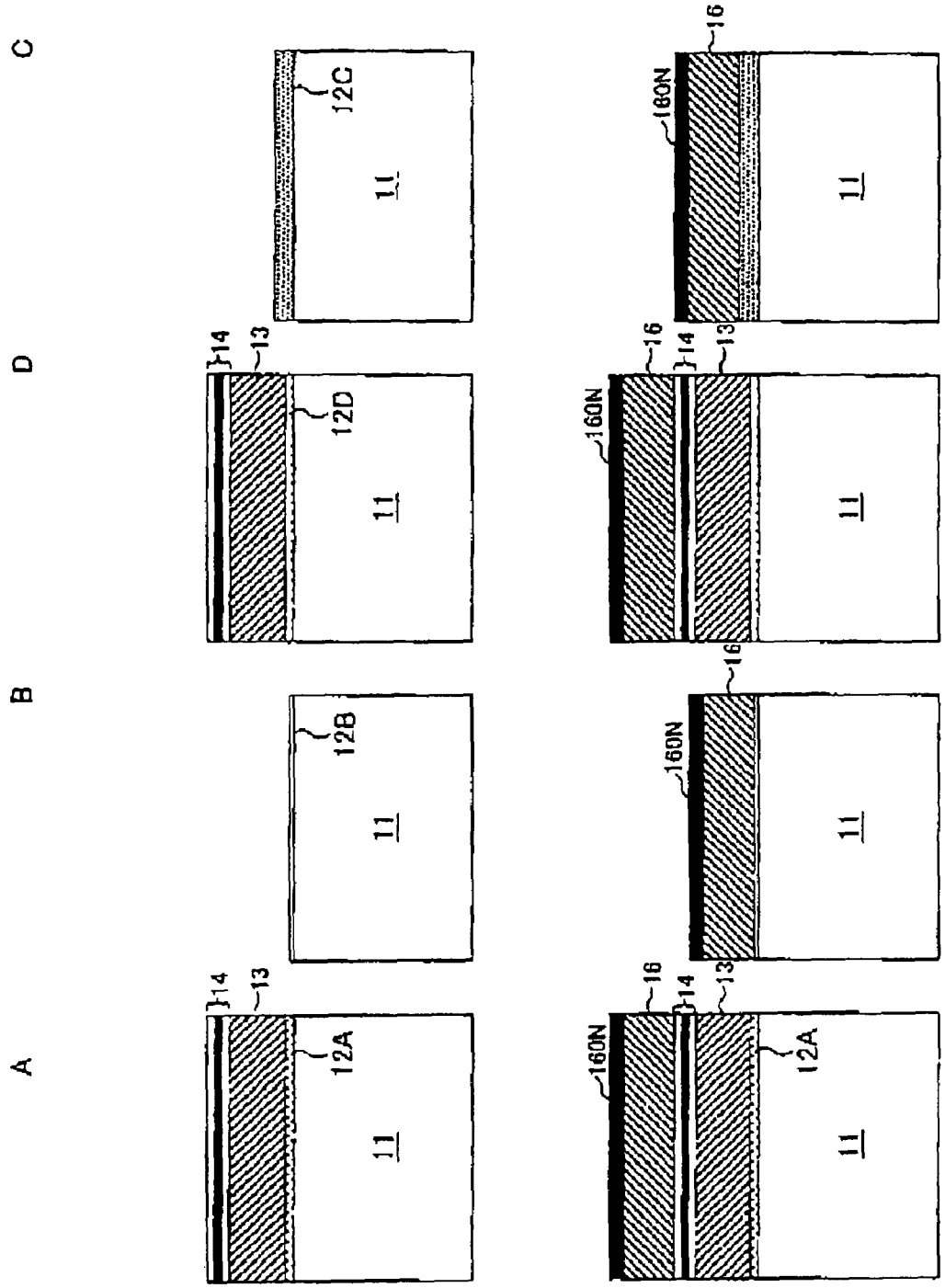

The process of FIGS. 48A-48G is similar to the processes of FIGS. 46A-46G described previously and a structure corresponding to FIG. 46G is obtained in the process of FIG. 48G.

Next, in the step of FIG. 48H, an amorphous silicon film 16 doped with P to a concentration level of $2\times10^{20}$-$3\times10^{21}$ cm$^{-3}$ is formed on the structure of FIG. 48G by a CVD process with a thickness 120-250 nm, followed by formation of an oxynitride film 16 by a CVD process with a thickness of 20-150 nm. Further, a low-resistance silicide layer may be formed by a salicide process after formation of the diffusion region according to the needs.

Next, in the step of FIG. 48I, the oxynitride film 16 and the amorphous silicon film 16 are patterned in the flash-memory cell region A while using a resist pattern 111H as a mask to form an amorphous silicon pattern 16A. Further, the amorphous silicon film 16 is removed from the mid-voltage transistor region D.

Further, in the step of FIG. 48J, the regions B-D are covered by a resist pattern 111I, and the ONO film 14 and the amorphous silicon pattern 13 are patterned in the flash-memory cell region A while using the oxynitride film 16ON on the amorphous silicon pattern 16A as a mask, to form the stacked gate electrode structure 16F.

Further, in the step of FIG. 48K, a resist pattern 111G that covers the flash-memory cell region A is formed, and the oxynitride film 16 or the ONO film 14 and the amorphous silicon film 16 or the amorphous silicon film 13 are patterned in each of the regions B-D while using the resist pattern 111G as a mask. As a result, respective gate electrodes are formed.

FIGS. 49A-49D show a schematic cross-sectional structure of the flash memory cell A, the low-voltage transistor B, the mid-voltage transistor D and the high-voltage transistor C formed in the semiconductor integrated circuit according to this embodiment. It should be noted that structure of FIGS. 49A-49D represents the state in which the resist pattern 111G shown in FIG. 48K is removed and further the oxynitride film 16 and the ONO film 14 are removed.

Figure 49A:
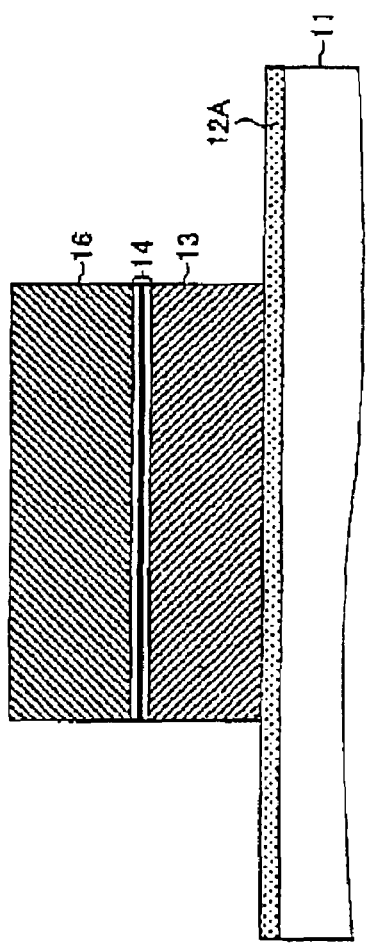
FIGS. 49A-49D are diagrams showing a part of the semiconductor integrated circuit by the fifth embodiment of this invention.
Figure 49B:
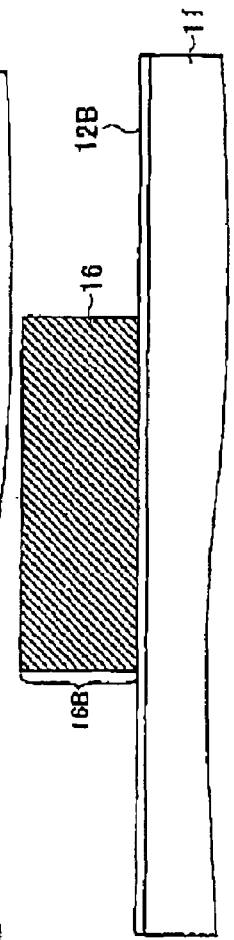
Figure 49C:
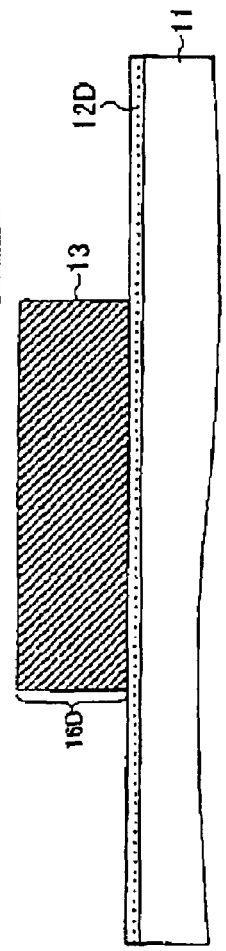
Figure 49D:
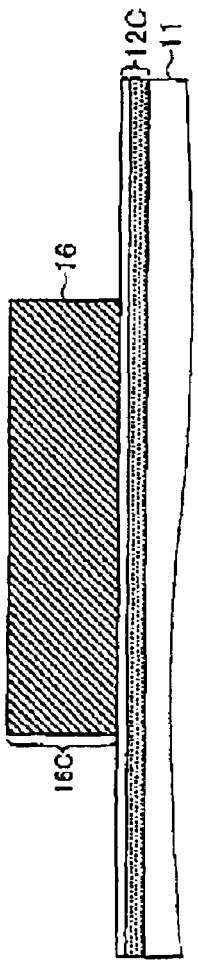

As shown in FIGS. 49A-49D, especially in FIGS. 49B-49D, it becomes possible in this embodiment to arrange the height of the gate electrodes of the low-voltage transistor B, the mid-voltage transistor D and the high-voltage transistor C to a common height, by using the same thickness for the amorphous silicon films 13 and 16. Further, it becomes possible to change the gate resistance while using the same gate electrode height in these gate electrodes, by causing to differ the specific resistance of the amorphous silicon film 16 from the specific resistance of the amorphous silicon film 13.

Sixth Embodiment

FIGS. 50A-50J show the fabrication process of a semiconductor integrated circuit according to a sixth embodiment of this invention, wherein those parts corresponding to the parts described previously are designated by the same reference numerals and the description thereof will be omitted. In this embodiment, the flash memory cells formed in the semiconductor integrated circuit has a gate electrode of single layer structure explained previously with reference to FIG. 17.

FIG. 50A is referred to.

It can be seen that the thermal oxide film 12B is formed on the surface of the Si substrate 11 by a thermal oxidation process at 800-1100° C. with a thickness of 1.5-5 nm, and an amorphous silicon film 31 doped with P to a concentration level of $2\times10^{20}$-$3\times10^{21}$ cm$^{-3}$ is deposited on the structure of FIG. 50A in the step of FIG. 50B by a CVD process with the thickness of 100-250 nm. According to the needs, it is possible to form a low-resistance silicide layer such as WSi and CoSi on the surface of the amorphous silicon film 31 formed as such by a salicide process after formation of the diffusion regions.

Next, in the step of FIG. 50C, a resist pattern 32A is formed on the structure of FIG. 50B so as to cover the regions A and B and D, and the amorphous silicon film 31 and the thermal oxide film 12B are removed by an etching process in the region C while using the resist pattern 32A as a mask.

Further, in the process of FIG. 50D, the resist pattern 32A is removed and a thermal oxidation process is conducted at the temperature of 800-1100° C. to form the thermal oxide film 12C on the surface of the Si substrate 11 exposed in the region C with a thickness of 5-50 nm. In the step of FIG. 50D, it is noted that the oxide film 12C grows also on the amorphous silicon film 31 in the regions A-B and D. However, no oxidation occurs in the surface of the Si substrate 11, as these regions are covered by the amorphous silicon film 31 and also the thermal oxide film 12B.

Next, resist pattern 32B that exposes region D is formed on the structure of FIG. 50D in the step of FIG. 50E. Further, an ion implantation process of nitrogen ions is conducted into the Si substrate 11 with a dose of $1\times10^{14}$-$1\times10^{15}$ cm$^{-2}$ under an accelerating voltage of 50-150 keV while using the resist pattern 32B as a mask.

Next, in the step of FIG. 50F, the resist pattern 32B is removed and a resist pattern 32C is formed so as to cover the region B. While using the resist pattern 32C as a mask, the thermal oxide film 12C, the amorphous silicon film 31 and the thermal oxide film 12B are removed in the region A and also in the region D by an etching process.

Next, in the step of FIG. 50G, the resist pattern 32C is removed and a thermal oxidation process is conducted at the temperature of 800-1100° C. As a result, the tunneling oxide film 12A is formed in the region A with a thickness of 8-15 nm. In the step of FIG. 50G, there occurs also a growth in the oxide film 12D in the region D. However, the thickness of the thermal oxide film 12D is suppressed to 5-10 nm, because the nitrogen ions are already introduced to the Si substrate 11 in the step of FIG. 50E in the region D. On the other hand, there occurs a further growth of the thermal oxide film 12C in the region C.

Next, in the step of FIG. 50H, an amorphous silicon film 33 doped with P to a concentration level of $2 \times 10^{20}$-$3 \times 10^{21}$ cm$^{-3}$ is deposited on the structure of FIG. 50G by a CVD process with a thickness of 120-250 nm. According to the needs, it is possible to form a low-resistance silicide layer on the surface of the amorphous silicon film 33 by a salicide process after formation of the diffusion region.

Figure 17:
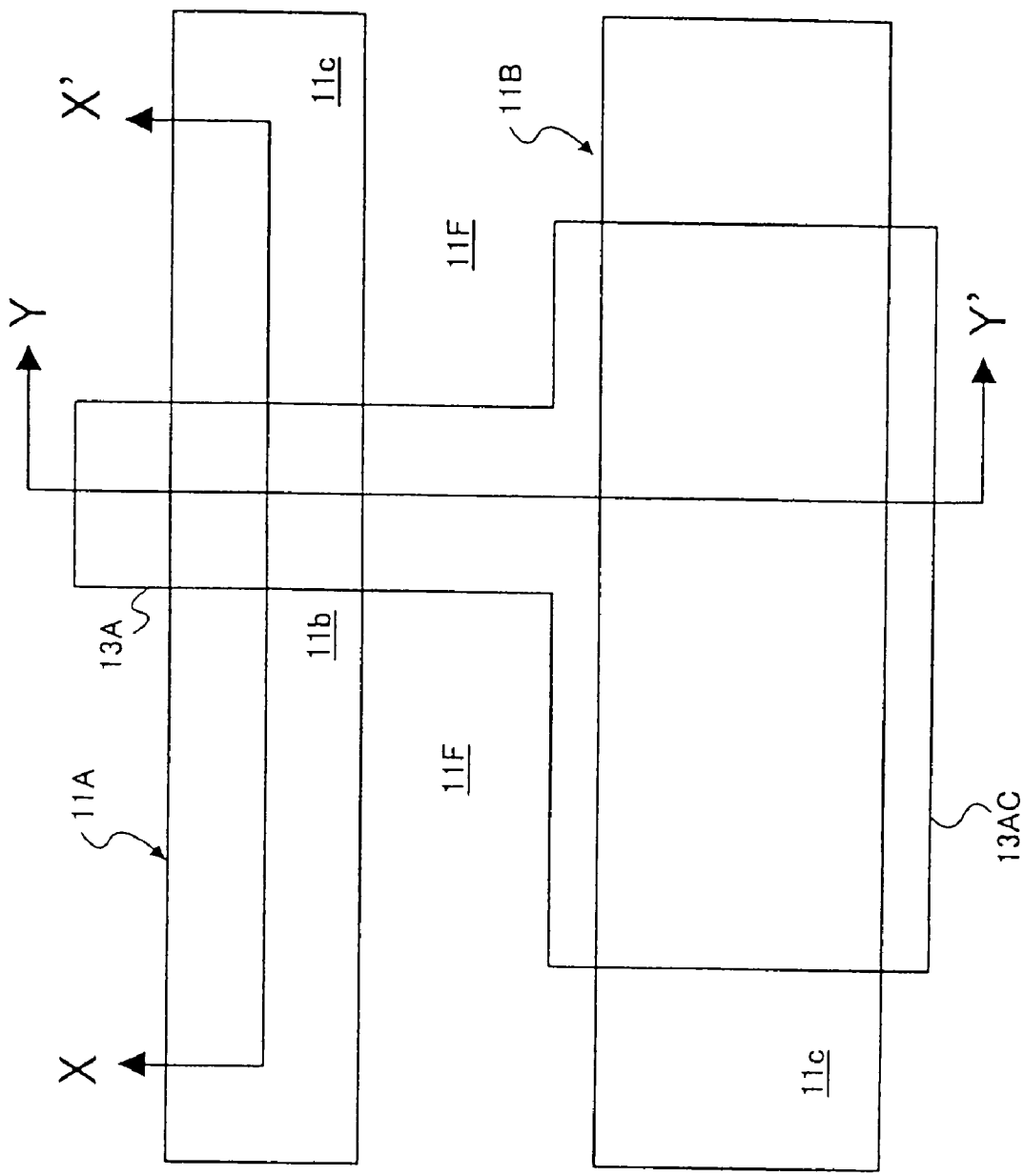
FIG. 17 is a diagram showing the construction of a conventional flash memory in a plan view.
Figures 20A, 20B:
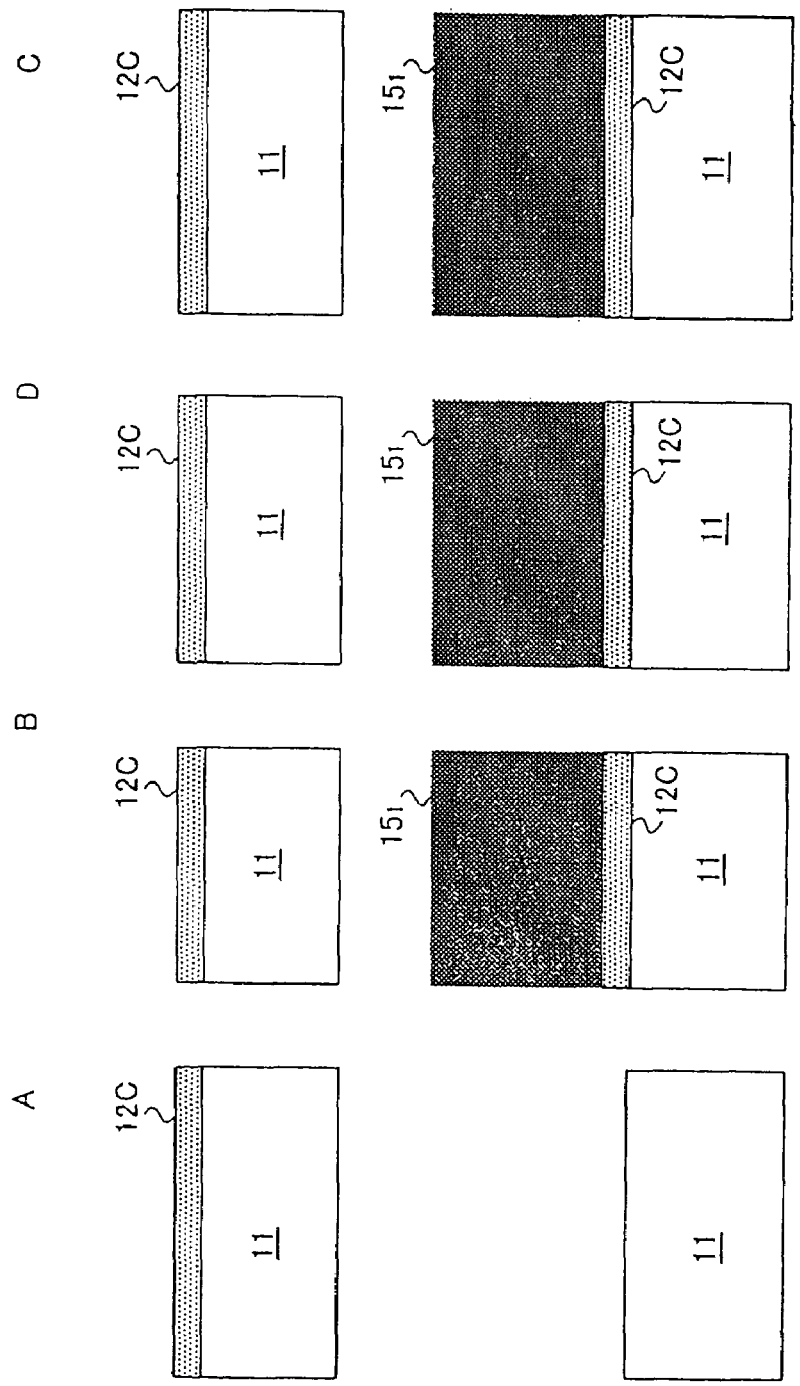
FIGS. 20A-20O are diagrams showing the fabrication process of the semiconductor integrated circuit including the flash memory of FIG. 17.
Figures 20G, 20H:
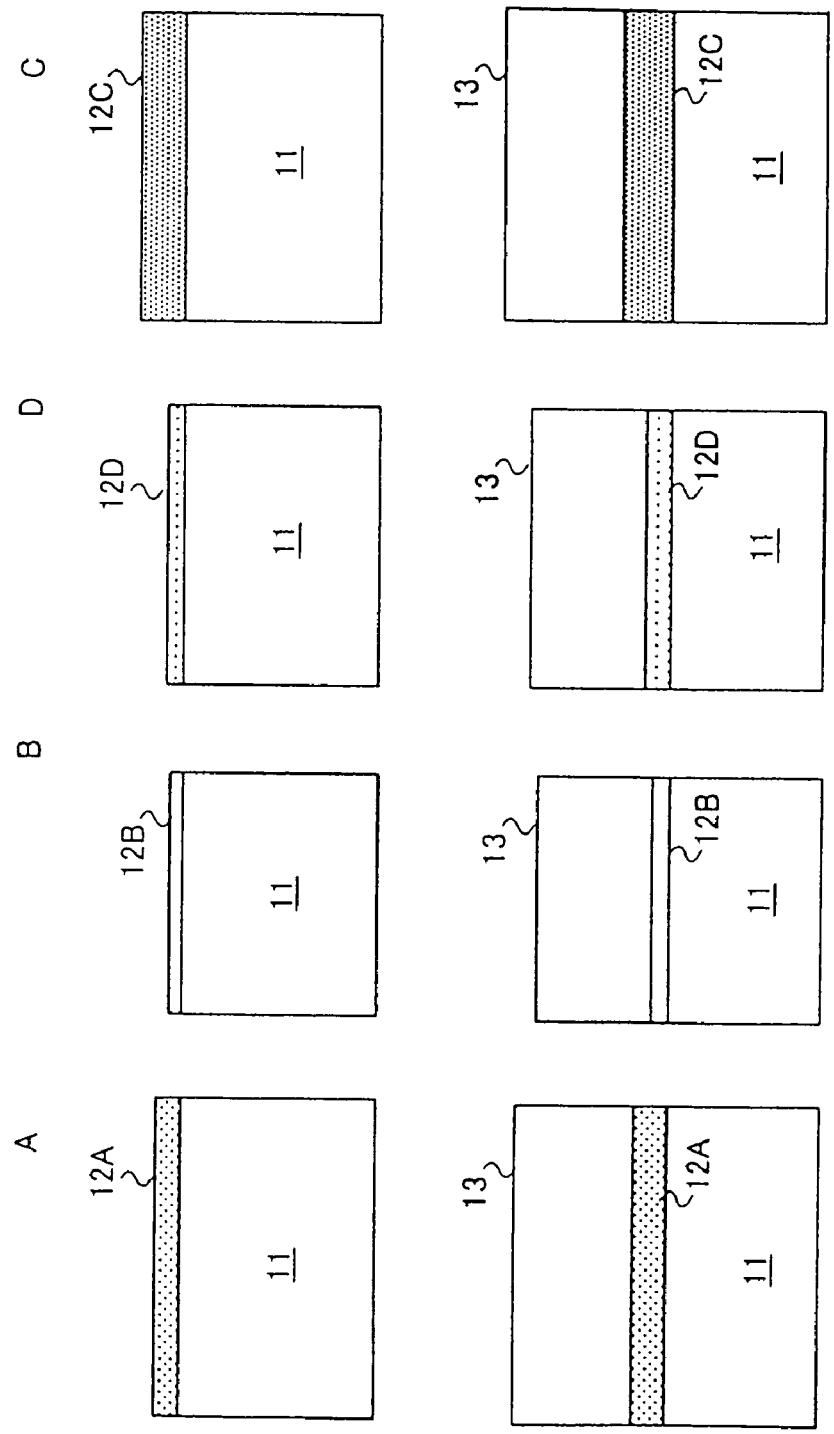
Figures 20I, 20J:
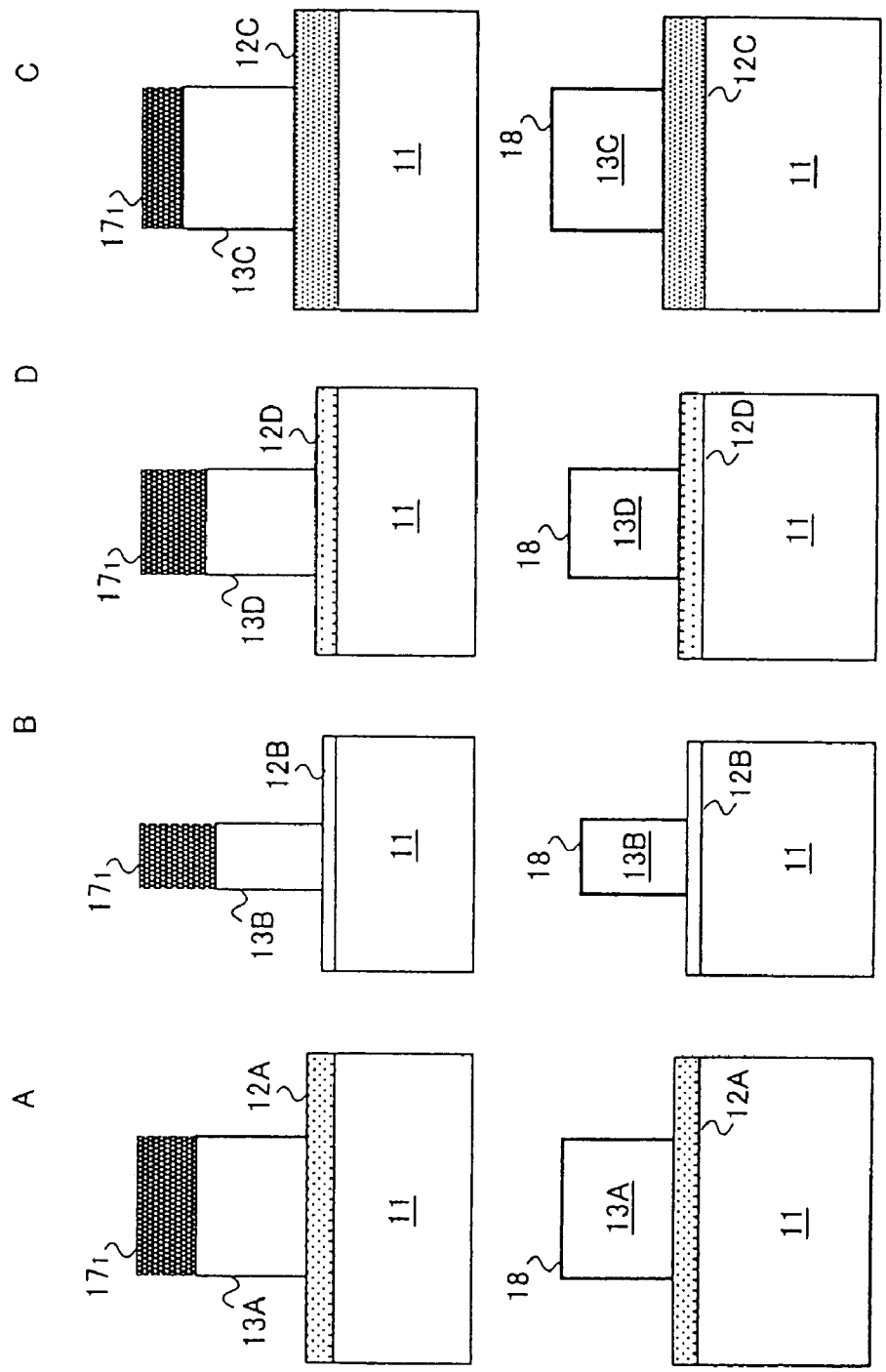
Figure 20M:
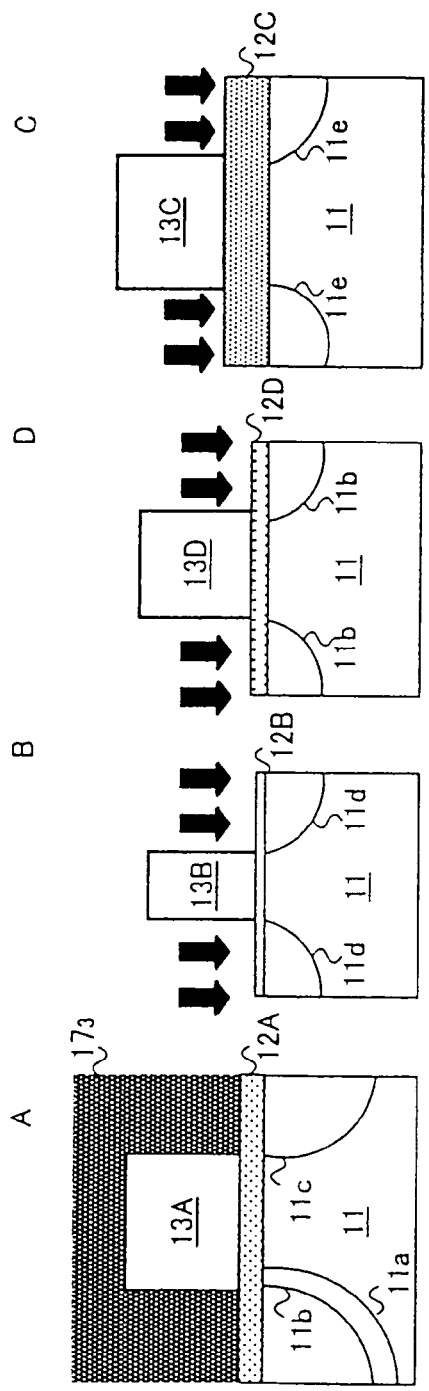
Figure 20N:
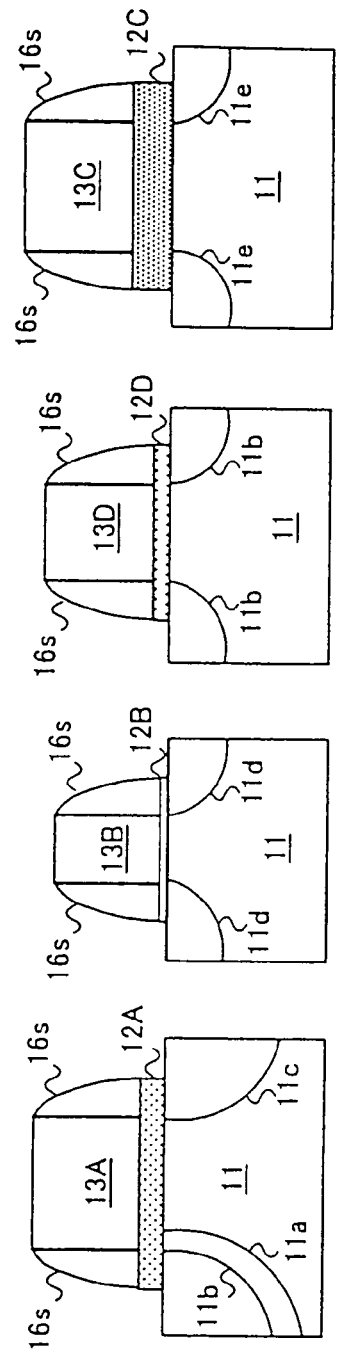
Figure 200:
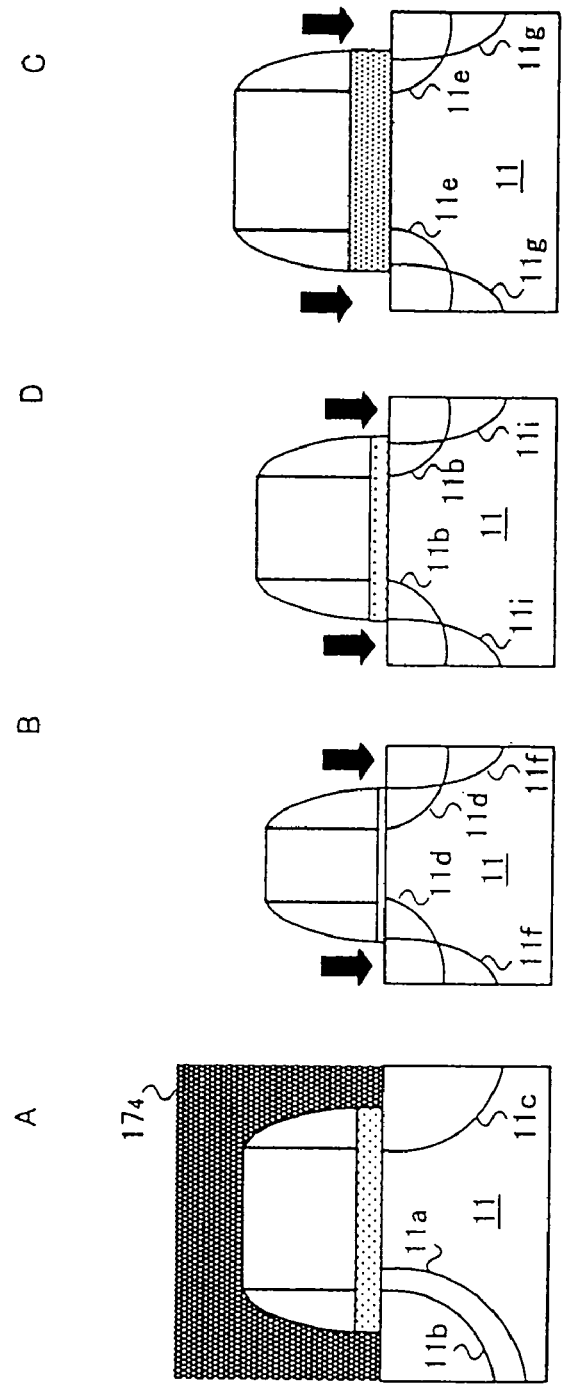
Figure 21A:
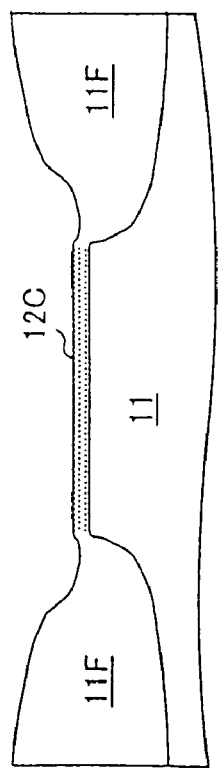
FIGS. 21A-21D are diagrams explaining the problem of the conventional semiconductor integrated circuit.
Figure 21B:
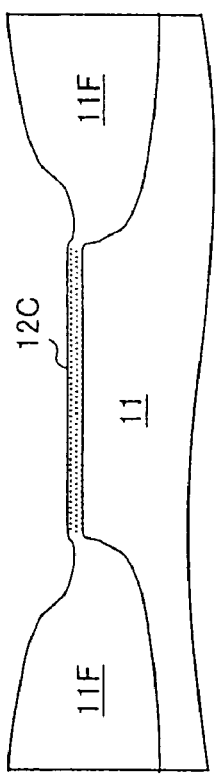
Figure 21C:
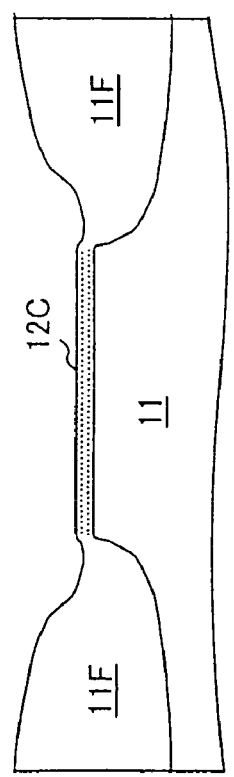
Figure 21D:
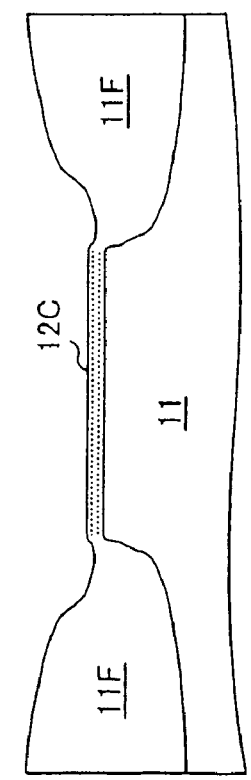
Figure 24A:
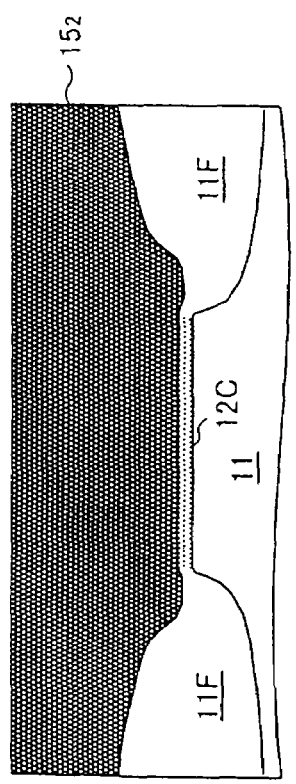
FIGS. 24A-24D are further diagrams explaining the problem of the conventional semiconductor integrated circuit.
Figure 24B:
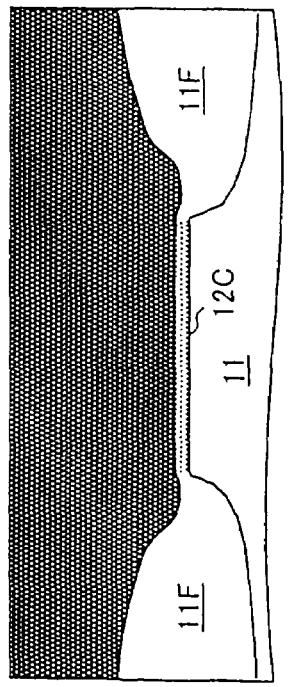
Figure 24C:
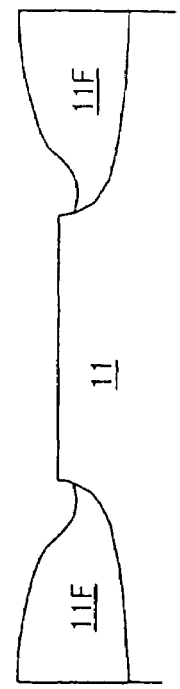
Figure 24D:
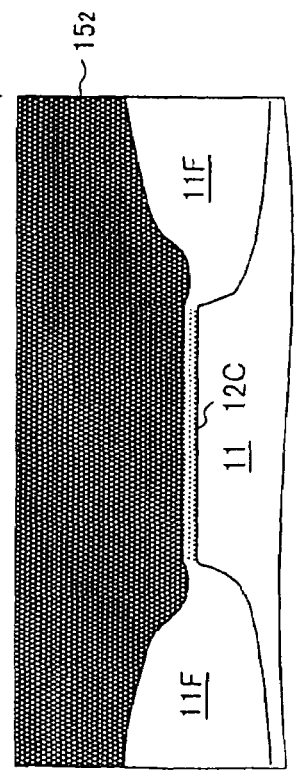
Figure 26A:
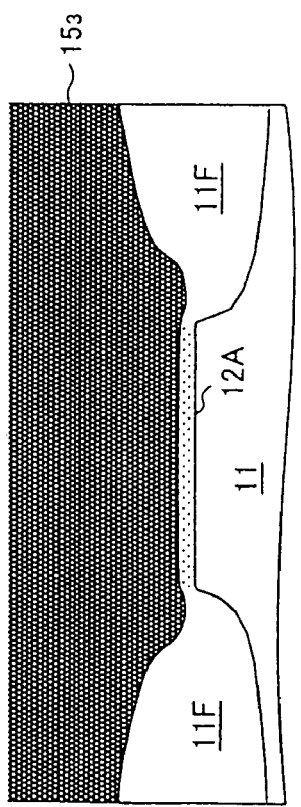
FIGS. 26A-26D are further diagrams explaining the problems of the conventional semiconductor integrated circuit.
Figure 26B:
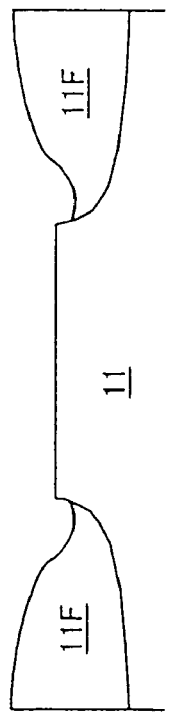
Figure 26C:
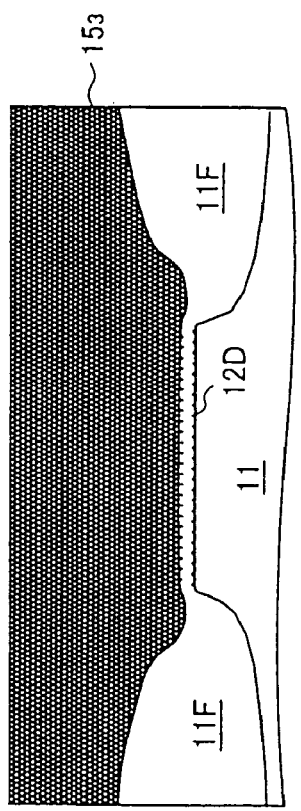
Figure 26D:
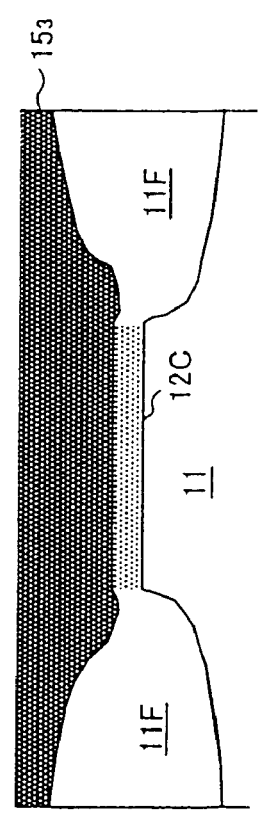
Figure 28A:
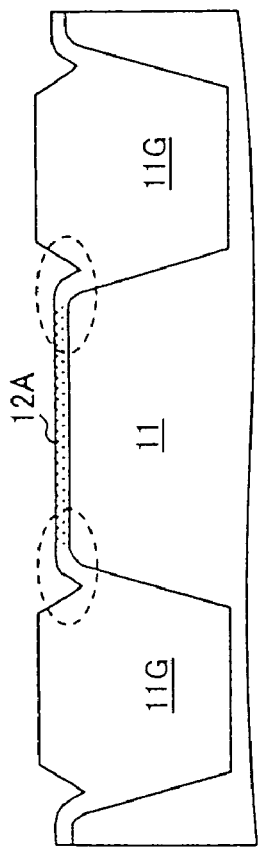
FIGS. 28A-28D are further diagrams explaining the problems of the conventional semiconductor integrated circuit.
Figure 28B:
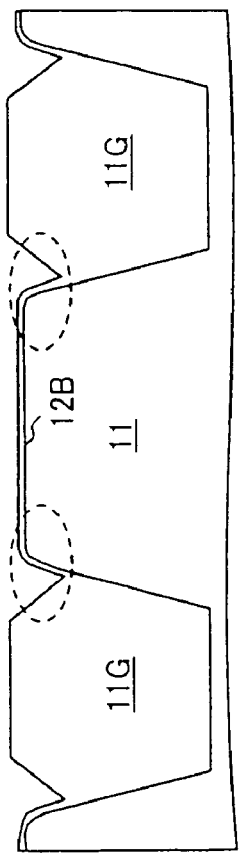
Figure 28D:
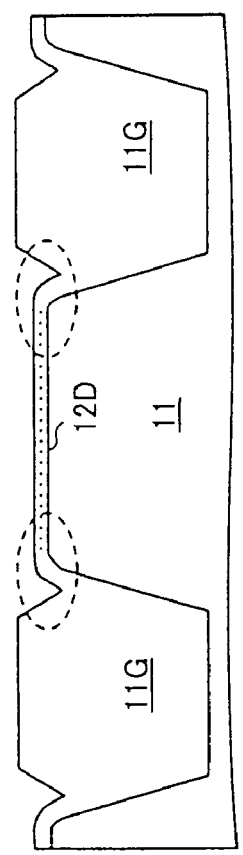
Figure 28C:
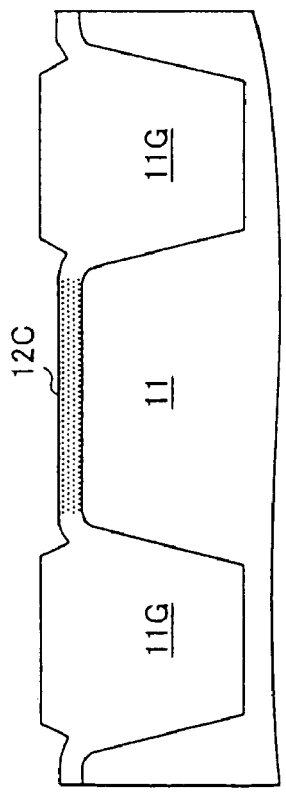
Figure 29A:
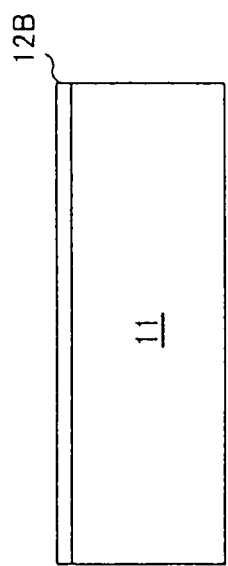
FIGS. 29A-29C are further diagrams explaining the problems of the conventional semiconductor integrated circuit.
Figure 29B:
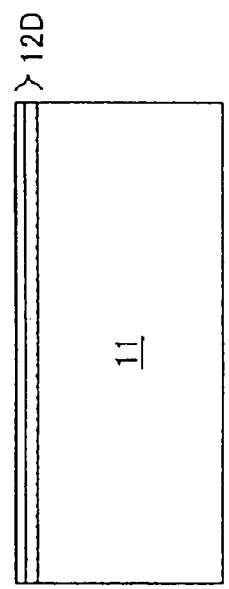
Figure 29C:
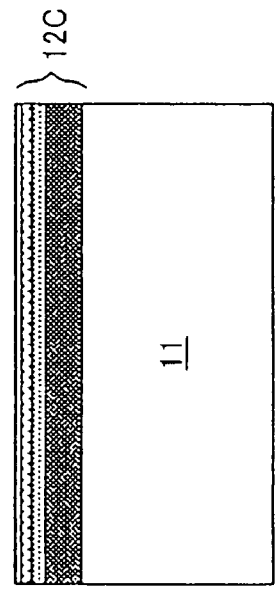

Next, in the step of FIG. 50I, the amorphous silicon film 33 is patterned in the flash-memory cell region A while using the pattern 32D as a mask. As a result, the floating-gate electrode pattern 13A shown in FIG. 17 is formed. Simultaneously to this, the amorphous silicon film 33 is removed from the region B in the step of FIG. 50I.

Furthermore, in the step of FIG. 50J, the thermal oxide film 12C and the amorphous silicon film 31I are patterned in the region B and the amorphous silicon-film 33 is patterned in the regions C and also D, while using the resist pattern 32E as a mask. As are result, gate electrodes corresponding to the gate electrodes 16B, 16C and 16D of the previous embodiment are formed.

FIGS. 51A-51D shows the regions A-D of the semiconductor integrated circuit thus obtained according to the present embodiment in an enlarged scale.

Figure 51A:
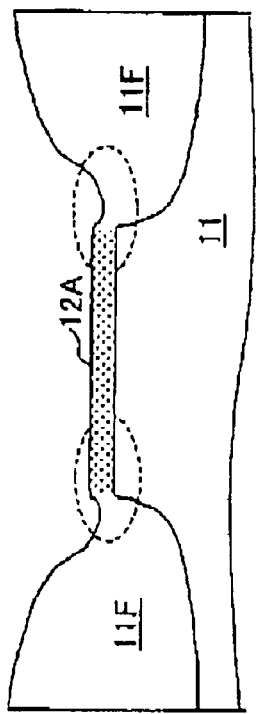
FIGS. 51A-51D are diagrams showing a part of the semiconductor integrated circuit of the sixth embodiment of this invention.
Figure 51B:
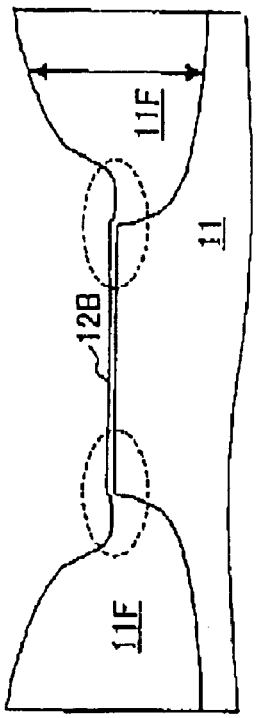

FIG. 51B is referred to.

Figure 51C:
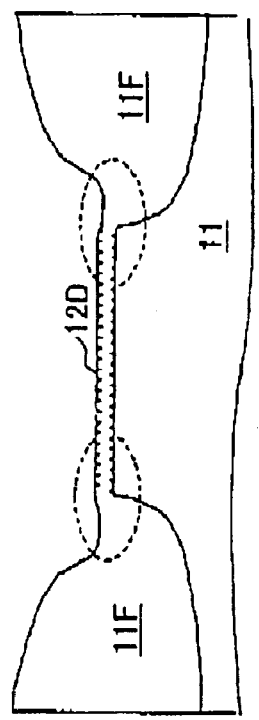
Figure 51D:
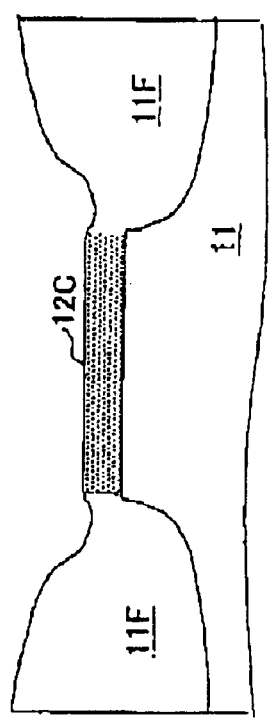

It should be noted that the present embodiment does not include the process of exposing the surface of the Si substrate 11 to an HF etchant in the region B. Thus, there occurs no etching of the field oxide film 11F in the peripheral part of the region B, and thus, there occurs no formation of depression in these regions. Further, it is noted that the surface of the Si substrate 11 is subjected to an etching process only once in any of the regions A, C and D. Thus, the formation of depression in the field oxide film 11F along the peripheral part of the device region is successfully minimized as represented in FIGS. 51A, 51C and 51D. As a result, the problem of modification of threshold characteristics of the MOS transistor at the peripheral part of the device region is eliminated. Further, the problem of decrease of film thickness of the gate oxide film at the peripheral part of the device region is avoided, and the reliability of the MOS transistor is improved accordingly. Furthermore, the problem of field reversal does not result in the semiconductor integrated circuit of this embodiment as the decrease of thickness of the field oxide film 11F.

It should be noted that the above-noted effect of this invention is obtained similarly even in the case the STI structure 11G is used for the device isolation structure in place of the field oxide film 11F as shown in FIGS. 52A-52D. In other words, is possible to suppress the formation of depression at the peripheral part of the device region effectively as circled in FIGS. 52A-52C.

FIGS. 53A-53D show the structure of the tunneling oxide film or the gate oxide film of the flash memory cell A, the low-voltage transistor B, the mid-voltage transistor D and the high-voltage transistor C obtained by this embodiment.

Figure 53A:
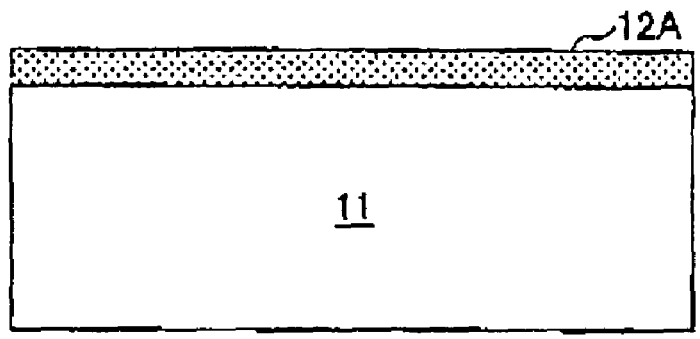
FIGS. 53A-53D are further diagrams showing a part of the semiconductor integrated circuit of the sixth embodiment of this invention.
Figure 53B:
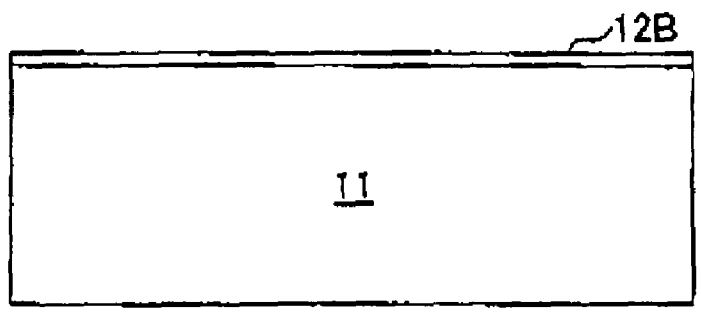
Figure 53C:
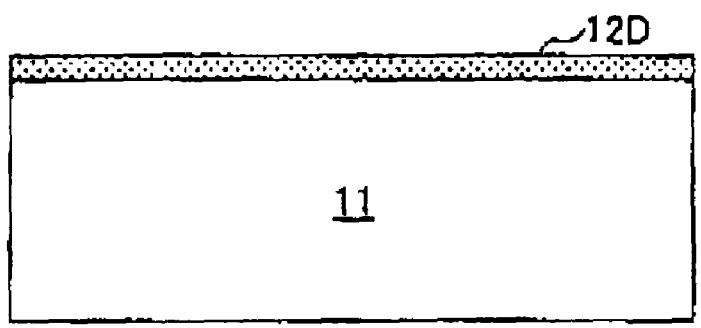
Figure 53D:
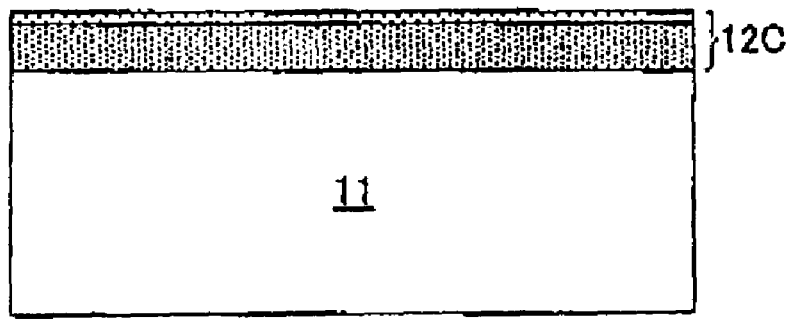

As can be seen from FIGS. 53A-53C, the tunneling oxide film of the flash memory cell A is formed of a single thermal oxide film 12A. Similarly, the gate oxide films of the low-voltage transistor B and the mid-voltage transistor D are formed of a single thermal oxide film 12B or 12D. As a result, the control of the film thickness of the gate oxide film is easily achieved in these transistors and an excellent film quality is guaranteed. Further, in the high-voltage transistor C, too, the principal part of the gate oxide film 12C is formed by a single thermal oxidation process and excellent film quality is guaranteed.

[Modification]

FIGS. 54A-54I show a modification of the sixth embodiment of this invention.

FIGS. 54A-54I are referred to.

The process of FIGS. 54A-54D is similar to the process of FIGS. 50A-50D explained previously, and thus, a structure corresponding to the step of FIG. 50D is obtained in the step of FIG. 54D.

Figures 54E, 54F:
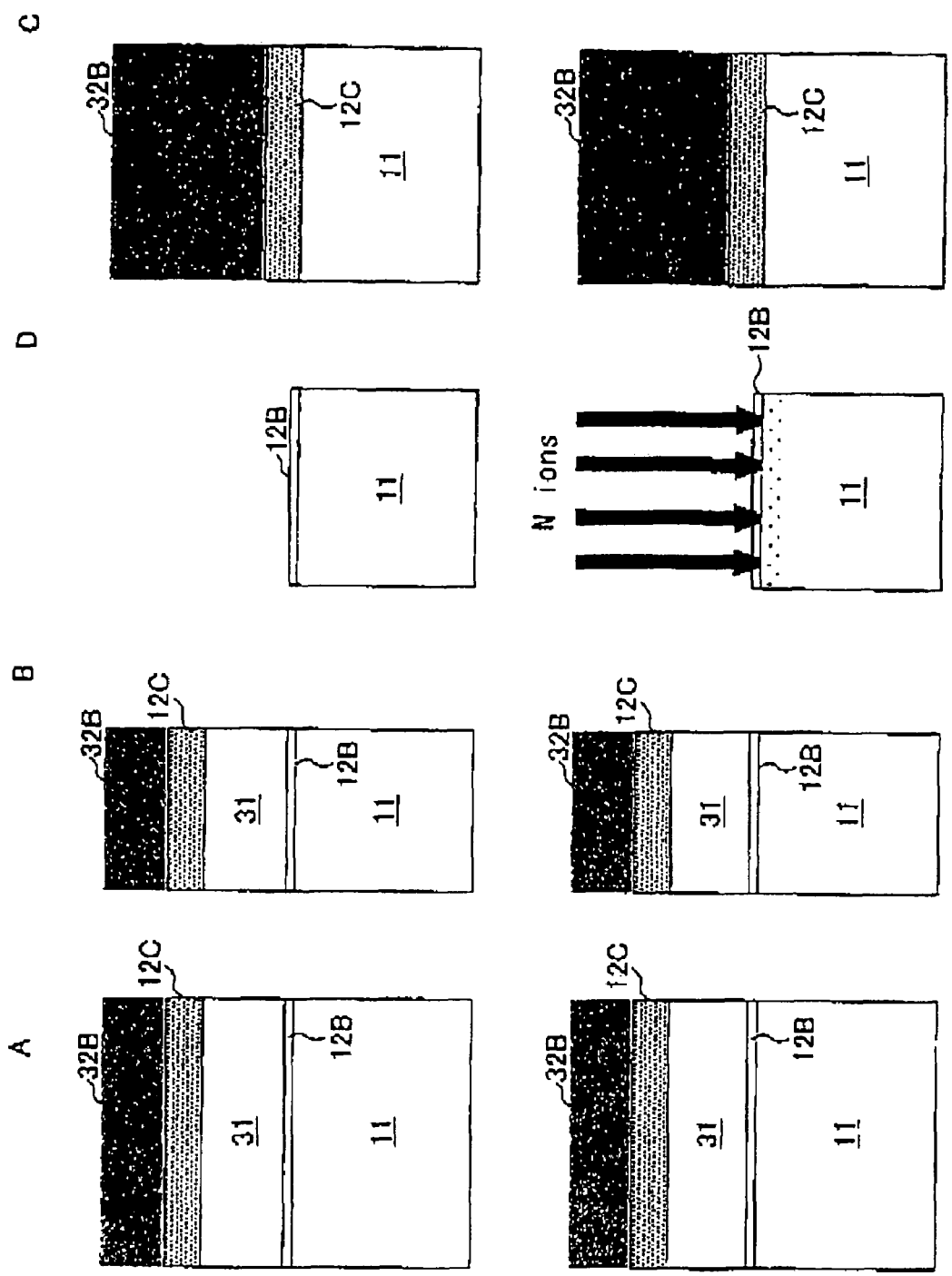

Next, in the step of FIG. 54F, the resist pattern 32B exposing the region D is formed similarly to the step of FIG. 50E explained before. In the step of FIG. 54E, the thermal oxide film 12C and the amorphous silicon film 31 are removed while using the resist pattern 32B as a mask. Further in the step of FIG. 54F, an ion implantation process of nitrogen ions is conducted into the silicon substrate 11 under an accelerating voltage of 20-50 keV with a dose of $1 \times 10^{14}$-$1 \times 10^{15}$ cm$^{-2}$, while using the same resist pattern 32B as a mask. Thereby, it should be noted that no ion implantation of the nitrogen ions takes place in the regions A, B and C, as the surface of the substrate is covered by the resist pattern 32B except for the region D.

Figures 54G, 54H:
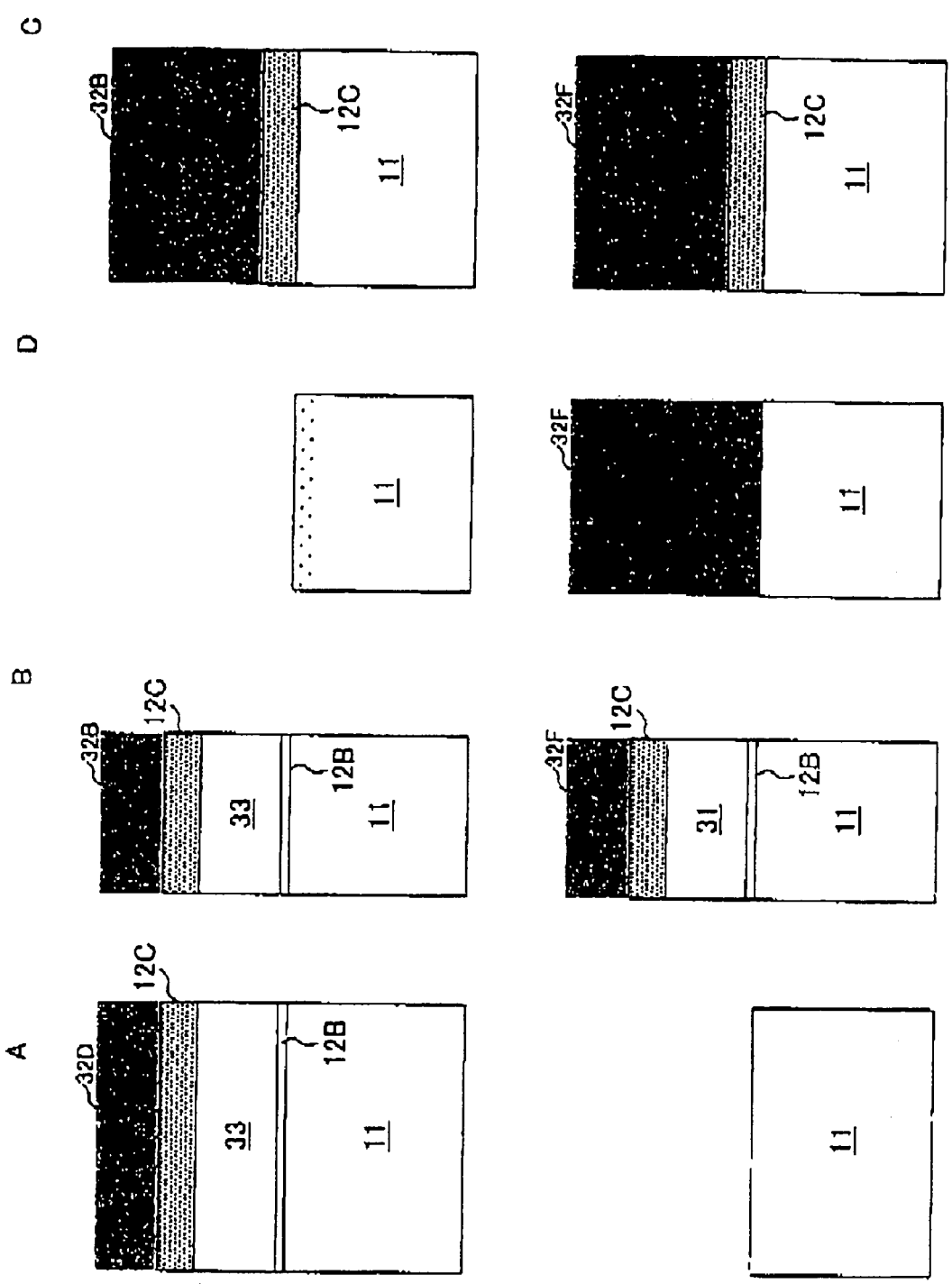

Next, in the step of FIG. 54G, the thermal oxide film 12B is removed from the region D while using the same resist pattern 32B as a mask, and the resist pattern 32B is removed further in the step of FIG. 54H. Further, the thermal oxide film 12C and the amorphous silicon film 31 are removed from the flash-memory cell region A while using a newly formed resist pattern 32F as a mask.

Figure 54I:
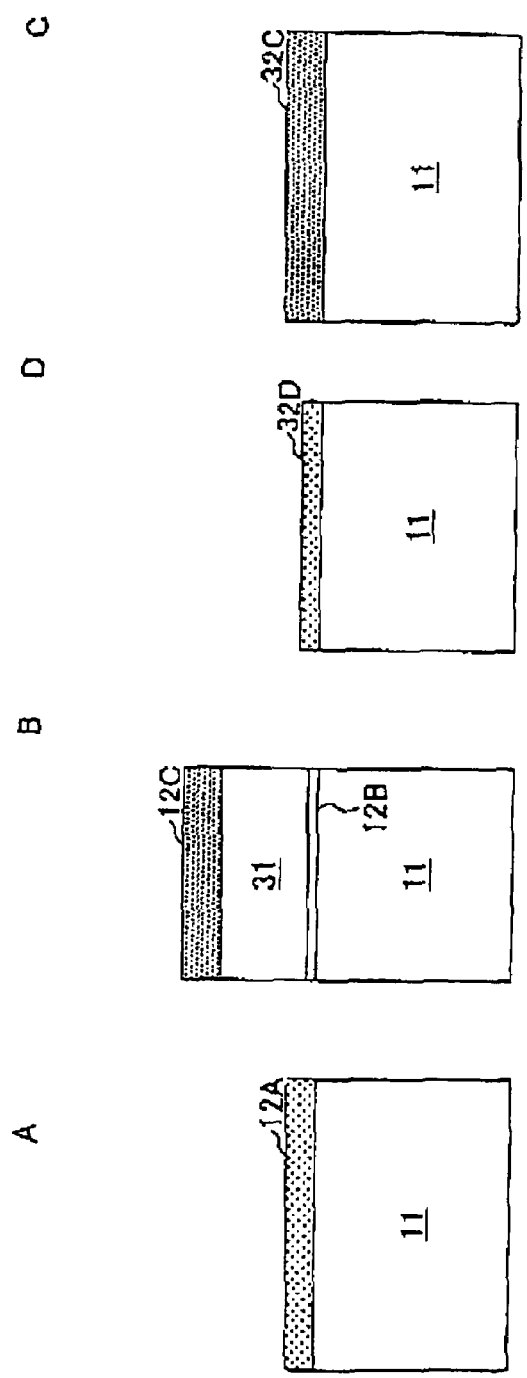

Next, the resist pattern 32F is removed in the step of FIG. 54I, and as a result, a structure similar to the one explained previously with reference to FIG. 50G is obtained.

Thus, by conducting the process of FIGS. 50H-50J, a semiconductor integrated circuit having the feature of FIGS. 51A-51D, FIGS. 52A-52D and FIGS. 53A-53D explained previously is obtained.

Seventh Embodiment

FIGS. 55A-55J show the fabrication process of a semiconductor integrated circuit according to a seventh embodiment of this invention, wherein those parts corresponding to the parts described previously are designated by the same reference numerals and the description thereof will be omitted.

In this embodiment, a flash memory cell having the single layer gate electrode structure explained previously with reference to the embodiment of FIGS. 50A-50J is formed in the region A, except that the flash memory cell formed in this embodiment uses an ONO film for the tunneling insulation film.

Figures 55A, 55B:
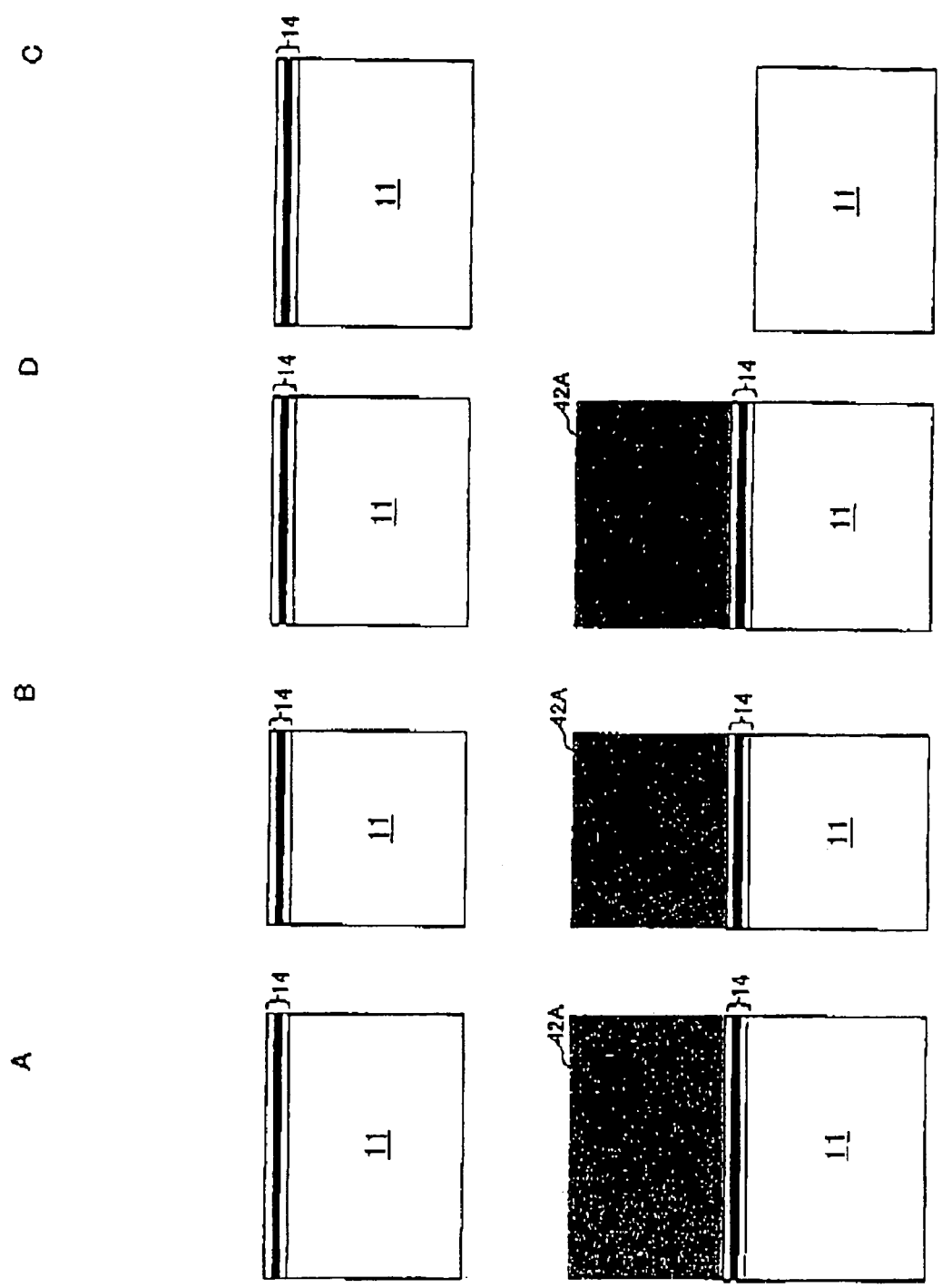

FIG. 55A is referred to.

On the Si substrate 11, the ONO film 14 is formed in each of the regions A-D by forming an SiN film on a thermal oxide film formed by a thermal oxidation process at 800-1100° C., by conducting a CVD processes at 600-800° C. with a thickness of 8-15 nm. Further, a thermal oxide film is formed on the surface of the SiN film with a thickness of 4-10 nm by conducting a thermal oxidation process at 900-1000° C.

Next, in the step of FIG. 55B, a resist pattern 42A is formed on the structure of FIG. 55A so as to expose the region C, and the ONO film 14 is removed by an etching process from the region D while using the resist pattern 42A as a mask.

Figures 55C, 55D:
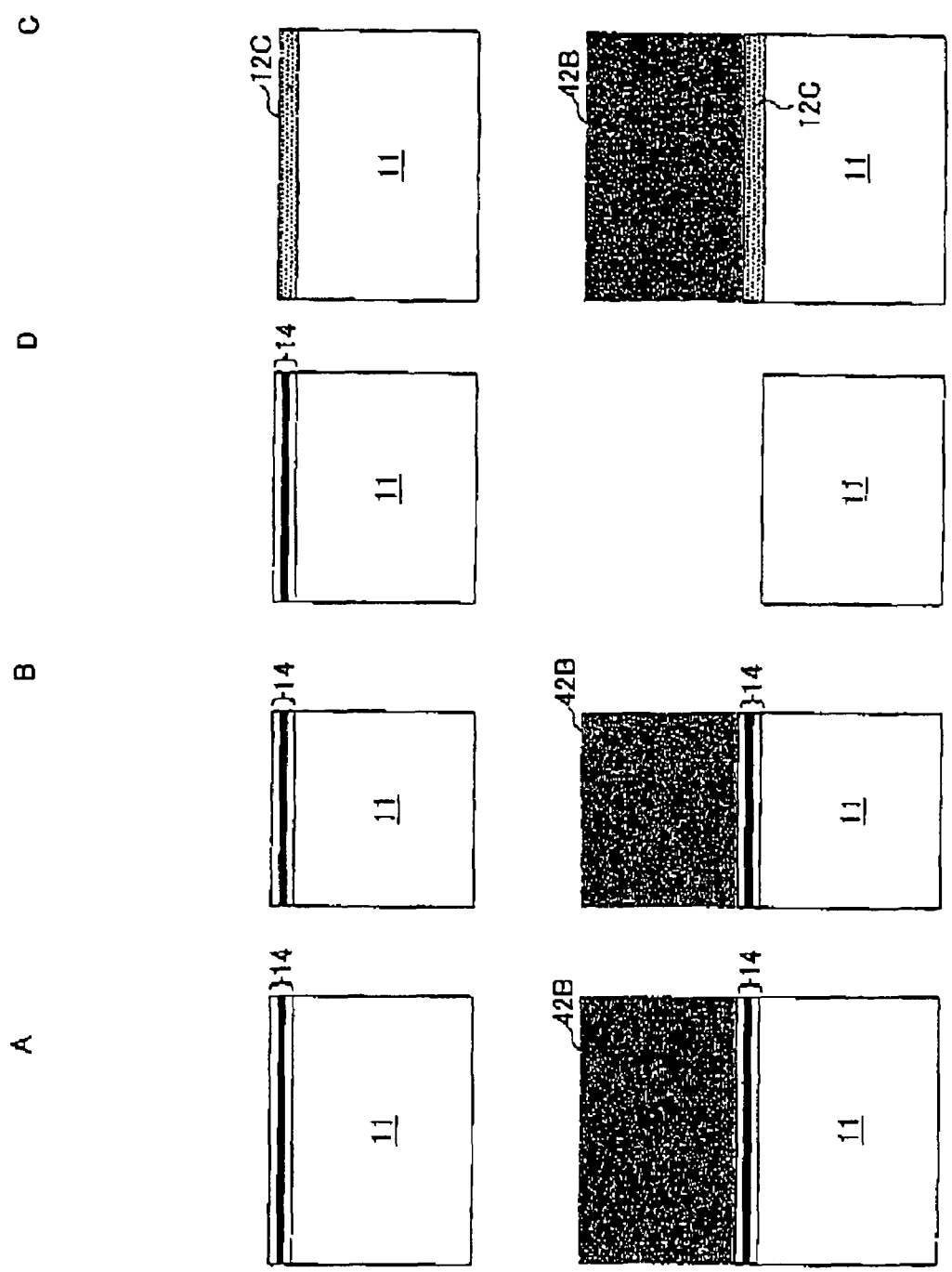

Next, a thermal oxidation process is applied to the structure of FIG. 55B at the temperature of 800-1100° C. in the step of FIG. 55C, and the thermal oxide film 12 is formed with a thickness of 5-50 nm. As the regions A, B and D are covered by the ONO film 14 in the step of FIG. 55C, no oxidation occurs on the surface of the Si substrate 11.

Next, in the step of FIG. 55D, a resist pattern 42B is formed on structure of FIG. 55C so as to expose the region D, and the ONO film 14 is removed while using the resist pattern 42B as a mask. As a result, the surface of Si substrate 11 is exposed in the region D.

Next, in the step of FIG. 55E, the resist pattern 42B is removed, and a thermal oxidation process is applied at the temperature of 800-1100° C. As a result, the thermal oxide film 12D is formed on the region C with the thickness of 5-10 nm. As a result of the thermal oxidation process of FIG. 55E, the thickness of thermal oxide film 12C is increased in the region C. On the other hand, the surface of the Si substrate 11 is not oxidized as the regions A and B are covered by the ONO film 14.

Next, in the process of FIG. 55F, a resist pattern 42C is formed on the structure of FIG. 55E so as to expose the region B, and the ONO film 14 is removed by a wet etching process from the region B while using the resist pattern 42C as a mask. As a result, the surface of the Si substrate 11 is exposed.

Next, in the step of FIG. 55G, the resist pattern 42C is removed, and a thermal oxidation processes is conducted at the temperature of 800-1100° C. As a result, the thermal oxide film 12B having a thickness of 1.5-5 nm is formed on the surface of the Si substrate 11.

Next, in the step of FIG. 55H, an amorphous silicon film doped with P to a concentration level of $2\times10^{20}$-$3\times10^{21}$ cm$^{-3}$ is deposited on the structure of FIG. 55G with a thickness of 150-200 nm. Further, while using the resist pattern 42D as a mask, the control gate electrode 16A is formed on the region A, the gate electrode 16B is formed on region B, the gate electrode 16C is formed on the region C, and the gate electrode 16D is formed on the region D in the step of FIG. 55I.

Next, in the step of FIG. 55J, the resist pattern 42E is removed and a resist pattern 42D is formed so as to expose the region A. Further, an ion implantation process of As$^+$ is conducted in the region A under an accelerating voltage of 30-50 keV with a dose of $1\times10^{15}$-$4\times10^{15}$ cm$^{-2}$ while using the control gate electrode 16A as a self-aligned mask. As a result, the source region 11$b$ and the drain region 11$c$ are formed.

Further, by conducting the step of FIG. 50J and the steps thereafter, a semiconductor integrated circuit having the flash memory cell of SONOS structure similar to those explained previously with reference to FIGS. 51A-51D, FIGS. 52A-52D and FIGS. 53A-53D is obtained.

Eighth Embodiment

FIG. 56 is a plane view showing the construction of a flash memory cell according to an eighth embodiment of this invention.

FIG. 56 is referred to.

On the surface of Si substrate 11, there are formed a pair of n$^+$-type diffusion regions 11$_l$ and also 11$_m$ defined by the field oxide film 11F as the source region and the drain region. Further, the control gate electrode 16A is formed on the Si substrate 11 so as to traverse the diffusion regions 11$_l$ and 11$_m$.

Figure 57:
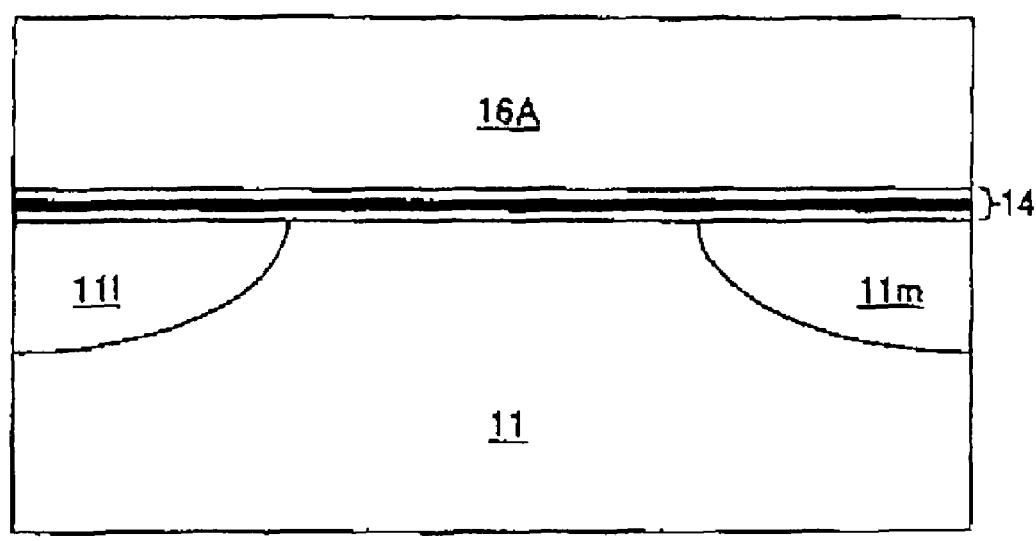
FIG. 57 is a diagram showing the flash memory of FIG. 56 in a cross-sectional view.

FIG. 57 shows the flash memory cell of FIG. 116 in a cross-sectional view taken along Y-Y'.

FIG. 57 is referred to.

The ONO film 14 is formed on the Si substrate 11 and it will be noted that the control gate electrode 16A extends on the ONO film 14 from the diffusion region 11$_l$ to the diffusion region to 11$_m$.

FIGS. 58A and 58B explain the principle of the flash memory cell of FIGS. 56 and 57.

FIG. 58A is referred to.

At the time of writing operation, a writing voltage of +10V is applied to the control gate electrode 16A, and a writing voltage of +5V is applied to the drain region 11$m$. As a result, the electrons flowing from the source region 11$l$ to the drain region 11$m$ form hot electrons in the Si substrate 11 in the vicinity of the drain region 11$m$, and the hot electrons thus formed are injected into the ONO film 14. The hot electrons are thereby held therein as information.

In the case of erasing information that was already written into the ONO film, an erasing voltage of −10V is applied to the control gate electrode 16A and an erasing voltage of +5V is applied to the drain electrode 10$b$ as shown in FIG. 58B. As a result, the holes flowing through the Si substrate 11 from the source region 11$_l$ to the drain region of 11$_m$ form hot holes in the vicinity of the drain region 11$m$, and the hot holes thus formed are injected into the ONO film 14. Thereby, the electrons held therein are neutralized. It should be noted that the writing operation of FIG. 58A may be conducted by inducing drain avalanche. Further, it is possible to conduct the erasing operation of FIG. 58B also by inducing drain avalanche.

FIGS. 59A and 59B show the fabrication process of a semiconductor integrated circuit that includes the flash memory cell of FIG. 56, wherein those parts corresponding to the parts described previously are designated by the same reference numerals and the description thereof will be omitted.

FIG. 59A is referred to.

An ONO film 14 similar to the embodiments explained previously is formed on the Si substrate 11 in each of the regions A-D, and a resist pattern 52A is formed in the step of FIG. 59B on the structure of FIG. 59A so as to cover the regions B-D. Further, while using the resist pattern 52A as a mask, in region A an ion implantation process of As$^+$ is conducted under accelerating voltage of 30-50 keV with a dose of $1\times10^{15}$-$4\times10^{15}$ cm$^{-2}$. As a result, the source region 11$_l$ and the drain region 11$_m$ are formed.

Next, by implementing the process similar to those of FIGS. 50C-50J after the step of FIG. 59B while replacing the thermal oxide film 12$b$ with the ONO film 14, the semiconductor integrated circuit that having the characteristic explained with reference to FIGS. 51A-51D, FIGS. 52A-52D and FIGS. 52A-52D is obtained.

It should be noted that the present invention is applicable also to the case in which the flash memory is a general non-volatile memory device such as an EEPROM that uses a high-voltage transistor in addition to a low-voltage transistor for generating erase voltage. In an EEPROM, flash erasing is not carried out contrary to a flash memory. Further, the non-volatile memory device may be a mask ROM, an EPROM, and the like, as long as the non-volatile memory device is used together with a low-voltage transistor and a high-voltage transistor.

Further, the present invention is not limited to the embodiments described heretofore, but various variations and modifications may be made without departing from the scope of the invention.

What is claimed is:

1. A method of fabricating a semiconductor integrated circuit device, comprising the steps of:
   forming a device isolation structure on a surface of a semiconductor substrate so as to define at least a first active region, a second active region and a third active region;
   introducing, after said step of forming said device isolation structure, an impurity element that suppresses oxidation of said semiconductor substrate into said first active region;
   applying, after said step of introducing said impurity element, a thermal oxidation process to said surface of said semiconductor substrate to form a first insulation film so as to cover said semiconductor substrate surface in said first active region with a first thickness and a second insulation film so as to cover said semiconductor substrate surface in said second and third active regions with a second thickness;
   forming, after said step of applying said thermal oxidation process, an oxidation-resistant film on said surface of said semiconductor substrate so as to cover at least said first active region and said second active region and said third active region;
   exposing, after step of forming said oxidation-resistant film, said surface of said semiconductor substrate by removing said oxidation-resistant film and said second insulation film from said third active region while leaving said oxidation-resistant film on said first and second active regions; and
   applying, after said step of exposing said surface of said semiconductor substrate, a thermal oxidation process to said semiconductor substrate to form a third thermal oxide film on said third active region with a third thickness and to increase a thickness of said second thermal oxide film simultaneously,
   after said step of forming said device isolation region, said third active region experience an HF etching process only once, while said first and second active regions does not experience an HF-etching process after said step of forming said device isolation region.

2. A method as claimed in claim 1, wherein said oxidation-resistant insulation film has a structure in which a nitride film is sandwiched by a pair of oxide films.

3. A method as claimed in claim 1, wherein one of said first and second insulation films has a structure in which a plurality of insulation films are stacked.

4. A method as claimed in claim 1, wherein said impurity element is nitrogen.

5. A method of fabricating a semiconductor integrated circuit, comprising the steps of:
   forming a device isolation region on a surface of a semiconductor substrate so as to define at least a non-volatile memory cell region, a first active region and a second active region,
   applying, after said step of forming said device isolation region, a thermal oxidation process to said semiconductor substrate to form a tunneling oxide film so as to cover at least said non-volatile memory cell region and said first active region and said second active region;
   depositing, after said step of applying said thermal oxidation process, a silicon film on said semiconductor substrate so as to include at least said non-volatile memory cell region and said first and second active regions;
   removing, after said step of depositing said silicon film, said silicon film selectively from said first and second active regions;
   depositing, after said step of removing said silicon film, an oxidation-resistant insulation film on said semiconductor substrate so as to cover at least said non-volatile memory cell region and said first active region and said second active region;
   exposing, after said step of depositing said oxidation-resistant insulation film said surface of said semiconductor substrate by removing said oxidation-resistant insulation film selectively from said first active region while leaving said oxidation-resistant film over said non-volatile memory cell region and said second active region;
   applying, after said step of exposing said surface of said semiconductor a thermal oxidation process to said semiconductor substrate while using said oxidation-resistant insulation film remaining on said semiconductor substrate as an anti-oxidation mask, to form a first insulation film so as to cover said surface of said semiconductor substrate in said first active region;
   removing, after said step of applying said thermal oxidation process, said oxidation-resistant insulation film selectively in said second active region to expose said surface of said semiconductor substrate;
   applying, after said step of removing said oxidation-resistant insulation film a thermal oxidation process to said semiconductor substrate while using said oxidation-resistant insulation film remaining on said semiconductor substrate as an anti-oxidation mask to form a second insulation film in said second active region so as to cover said surface of said semiconductor substrate,
   after forming said device isolation region, said first active region experiences an HF etching process only once, while said second active region and said non-volatile memory cell region do not experience an HF etching process after said step of forming said device isolation region.

6. A method of fabricating a semiconductor device, comprising the steps of:
   forming a device isolation structure on a surface of a semiconductor substrate so as to define a non-volatile memory cell region and a first active region and a second active region and a third active region;
   introducing, after said step of forming said device isolation structure, an impurity element that suppresses oxidation of said semiconductor substrate into said first active region;
   applying, after said step of introducing said impurity element, a thermal oxidation process to said semiconductor substrate to form a tunneling oxide film having a first thickness in said non-volatile memory cell region and in said second and third active regions with a first thickness and a first insulation film having a second thickness smaller than said first thickness in said first active region;
   depositing, after said step of applying said thermal oxidation process, a silicon film and an oxidation-resistant film consecutively on said semiconductor substrate so as to include said non-volatile memory cell region and said first through third active regions;
   removing, after said step of depositing said silicon film and said oxidation-resistant film, said oxidation-resistant film and said silicon film selectively in said second active region to expose said surface of said semiconductor substrate while leaving said oxidation-resistant film and said silicon film over said non-volatile memory cell region and said first and third active regions;
   forming, after said step of removing said oxidation-resistant film and said silicon film, a second insulation film in said second active region so as to cover said surface of said semiconductor substrate in said second region by applying a thermal oxidation process to said semiconductor substrate while using said oxidation-resistant insulation film remaining on said semiconductor substrate as an anti-oxidation mask;

exposing, after said step of forming said second insulation film, said surface of said semiconductor substrate in said third active region by selectively removing said oxidation-resistant insulation film and said silicon film therefrom while leaving said oxidation-resistant film and said silicon film over said non-volatile memory cell region and said first active region;

applying, after said step of exposing said surface of said semiconductor a thermal oxidation process to said semiconductor substrate while using said oxidation-resistant insulation film as a mask to form a third insulation film in said third active region so as to cover said surface of said semiconductor substrate, after said step of forming said device isolation region, said second and third active regions experiences an HF etching process only once, respectively, while said non-volatile memory cell region and said first active region do not experience an HF etching process after said step of forming said device isolation region.

7. A method as claimed in claim 6, wherein one of said first through third insulation films has a structure in which a plurality of insulation films are stacked.

8. A method of fabricating a semiconductor device, comprising the steps of:

forming a device isolation structure on a surface of a semiconductor substrate so as to define a non-volatile memory cell region, a first active region, a second active region and a third active region;

introducing, after said step of forming said device isolation structure, an impurity element suppressing oxidation into said first active region;

applying, after said step of introducing said impurity element, a thermal oxidation process to said semiconductor substrate to form a tunneling oxide film having a first thickness in said non-volatile memory cell region and in said second and third active regions and a first insulation film having second thickness smaller than said first thickness in said first active region;

depositing, after said step of applying said thermal oxidation process, a first silicon film and an oxidation-resistant insulation film consecutively on said semiconductor substrate so as to cover said tunneling oxide film in each of said non-volatile memory cell region and in said second and third active regions and so as to cover said first insulation film in said first active region;

exposing, after said step of depositing said first silicon film and said oxidation-resistant insulation film, said surface of said semiconductor substrate in said second active region by selectively removing said oxidation-resistant insulation film and said first silicon film from said second active region while leaving said oxidation-resistant insulation film and said first silicon film over said non-volatile memory cell region and said first and third active regions;

applying, after said step of exposing said surface of said semiconductor substrate a thermal oxidation process to said semiconductor substrate while using said oxidation-resistant insulation film remaining on said semiconductor substrate as a mask to form a second insulation film so as to cover said surface of said semiconductor substrate in said second active region;

exposing, after said step of applying said thermal oxidation process, said surface of said semiconductor substrate by selectively removing said oxidation-resistant insulation film and said first silicon film from said third active region while leaving said oxidation-resistant insulation film and said first silicon film over said non-volatile memory cell region and said first active region;

applying, after said step of exposing said surface of said semiconductor rate a thermal oxidation process to said semiconductor substrate while using said oxidation-resistant insulation film remaining on said semiconductor substrate as a mask to form a third thermal oxide film so as to cover said surface of said semiconductor substrate in said third active region;

removing, after said step of applying said thermal oxidation process, said oxidation-resistant insulation film and said first silicon film selectively from said first active region; and depositing, after said step of removing said oxidation-resistant insulation film and said first silicon film, a second silicon film on said semiconductor substrate so as to cover said non-volatile memory cell region and said first through third active regions, after said step of forming said device isolation region, said second and third active regions experience an HF etching process only once, respectively, while said non-volatile memory cell region and said first active region do not experience an HF etching process after said step of forming said device isolation region.

9. A method of fabricating a semiconductor integrated circuit, comprising the steps of:

forming a device isolation structure on a surface of a semiconductor substrate so as to define a non-volatile memory cell region, a first active region, a second active region and a third active region;

introducing, after said step of forming said device isolation structure, an impurity element suppressing oxidation into said first active region;

applying, after said step of introducing said impurity element, a thermal oxidation process to said semiconductor substrate to form a tunneling oxide film having a first thickness in said non-volatile memory cell region and in said second and third active regions and a first insulation film having a second thickness smaller than said first thickness in said first active region;

depositing, after said step of applying said thermal oxidation process, a first silicon film and an oxidation-resistant insulation film consecutively on said semiconductor substrate so as to include said non-volatile memory cell region and said first through third active regions;

exposing, after said step of depositing said first silicon film and said oxidation-resistant insulation film, said surface of said semiconductor substrate by removing therefrom said oxidation-resistant insulation film and said first silicon film selectively from said second active region while leaving said oxidation-resistant insulation film and said first silicon film over said non-volatile memory cell region and said first and third active regions;

applying, after said step of exposing said surface of said semiconductor a thermal oxidation process to said semiconductor substrate while using said oxidation-resistant insulation film remaining on said semiconductor substrate as an anti-oxidation mask to form a second insulation film in said second active region so as to cover said surface of said semiconductor substrate;

exposing, after said step of applying said thermal oxidation process, said surface of said semiconductor substrate by removing said oxidation-resistant insulation film and said first silicon film selectively from said third active region while leaving said oxidation-resistant insulation film and said first silicon film over said non-volatile memory cell region and said first active region;

applying, after said step of exposing said surface of said semiconductor substrate a thermal oxidation process to said semiconductor substrate while using said oxidation-resistant insulation film remaining on said semiconductor substrate as a mask to form a third insulation film on said third active region so as to cover said surface of said semiconductor substrate;

depositing, after said step of applying said thermal oxidation process, a second silicon film on said semiconductor substrate so as to include said non-volatile memory cell region and said first through third active regions; and removing, after said step of depositing said second silicon film, said second silicon film and said oxidation-resistant insulation film from said first active region selectively, after said step of forming said device isolation region, said second active region and said third active region experience an HF etching process only once, respectively, while said first active region and said non-volatile memory cell region do not experience an HF etching process after said step of forming said device information region.

10. A method as claimed in claim 9, further comprising the step of depositing a third silicon film on said semiconductor substrate so as to include said non-volatile memory cell region and said first through third active regions.

11. A method of fabricating a semiconductor integrated circuit device, comprising the steps of:

forming a device isolation structure on a surface of a semiconductor substrate so as to define a non-volatile memory cell region, a first active region, a second active region and a third active region;

applying, after said step of forming said device isolation structure, a thermal oxidation process to said semiconductor substrate to form a tunneling oxide film in said non-volatile memory cell region and in said second and third active regions with a first thickness and a first insulation film having a second thickness smaller than said first thickness in said first region;

depositing, after said step of applying said thermal oxidation process, a first silicon film and an oxidation-resistant insulation film on said semiconductor substrate so as to cover said tunneling oxide film in each of said non-volatile memory cell region and said second and third active regions and so as to cover said first insulation film in said first active region;

exposing, after said step of depositing said first silicon film and said oxidation-resistant insulation film, said surface of said semiconductor substrate by selectively removing said oxidation-resistant insulation film and said first silicon film from said second active region while leaving said oxidation-resistant insulation film over said non-volatile memory cell region and said first and third active regions;

applying, after said step of exposing said surface of said semiconductor substrate a thermal oxidation process to said semiconductor substrate while using said oxidation-resistant insulation film as a mask to form a second insulation film in said second active region so as to cover said surface of said semiconductor substrate;

exposing, after said step of applying said thermal oxidation process, said surface of said semiconductor substrate in said third active region by removing said oxidation-resistant insulation film and said first silicon film selectively therefrom while leaving said oxidation-resistant insulation film over said non-volatile memory cell region and said first active region and further leaving said second insulation film over said second device region;

applying, after said step of exposing said surface of said semiconductor a thermal oxidation process to said semiconductor substrate while using said oxidation-resistant insulation film remaining on said semiconductor substrate as an anti-oxidation mask to form a third insulation film in said third active region so as to cover said surface of said semiconductor substrate;

depositing, after said step of applying said thermal oxidation process, a second silicon film on said semiconductor substrate so as to include said non-volatile memory cell region and said first through third active regions; and forming, after said step of depositing said second silicon film, a control gate pattern in said non-volatile memory cell region by patterning said second silicon film and simultaneously removing said second silicon film from said first active region, after said step of forming said device isolation region, said second and third active regions experience an HF etching process only once, respectively, while said first active region and said non-volatile memory cell region do not experience an HF etching process after said step of forming said device isolation region.

12. A method of fabricating a semiconductor integrated circuit, comprising the steps of:

forming a device isolation structure on a surface of a semiconductor substrate so as to define a non-volatile memory cell region and a first active region and a second active region and a third active region;

applying, after said step of forming said device isolation structure, a thermal oxidation process to said semiconductor substrate to form a first insulation film in said non-volatile memory cell region and said first through third active regions; depositing a first silicon film on said semiconductor substrate so as to include said non-volatile memory cell region and said first through third active regions;

exposing, after said step of applying said thermal oxidation process, said surface of said semiconductor substrate selectively in said second active region by removing said first silicon film from said second active region while leaving said oxidation-resistant film over said non-volatile memory cell region and said first and third active regions;

applying, after said step of exposing said surface of said semiconductor substrate a thermal oxidation process to said semiconductor substrate to form a second insulation film in said second active region so as to cover said surface of said semiconductor substrate in said second active region and further to cover said first silicon film in said non-volatile memory cell region and said first and third active regions;

introducing, after said step of applying said thermal oxidation process, an impurity element suppressing oxidation into said semiconductor substrate selectively in said first active region through said second insulation film and said first silicon film;

exposing, after said step of introducing said impurity element, said surface of said semiconductor substrate by removing said first silicon film and said first insulation film thereon selectively from said non-volatile memory cell region and said first active region while leaving said second insulation film over said second active region and said first silicon film and said first insulation film over said third active region;

applying, after said step of exposing said surface of said semiconductor substrate, a thermal oxidation process to said semiconductor substrate to form a tunneling oxide film so as to cover said surface of said semiconductor substrate in said non-volatile memory cell region and simultaneously a first insulation film so as to cover said surface of said semiconductor substrate in said first active region;

depositing, after said step of applying said thermal oxidation process, a second silicon film on said semiconductor substrate so as to include said non-volatile memory cell region and said first through third active regions;

forming, after said step of depositing said second silicon film, a gate electrode in said non-volatile memory cell region by patterning said second silicon film and simultaneously removing said second silicon film from said third active region, after said step of forming said device isolation region, said second active region and said non-volatile memory cell region experience an HF etching process only once, respectively, while said second and third active regions do not experience an HF etching process after said step of forming said device isolation region.

13. A method of fabricating a semiconductor integrated circuit, comprising the steps of:

forming a device isolation structure on a semiconductor substrate so as to define a non-volatile memory cell region and first through third active regions;

forming, after said step of forming said device isolation structure, a first insulating film on each of said non-volatile memory cell region and said first through third active regions so as to cover said surface of said semiconductor substrate;

depositing, after said step forming said first insulating film, a first silicon film on said silicon substrate so as to include said memory cell region and said first through third active regions, exposing, after said step of depositing said first silicon film, said surface of said semiconductor substrate by selectively removing said first silicon film and said first insulation film from said second active region while leaving said first silicon film and said first-insulation film over said non-volatile memory cell region and said first and third active regions;

applying, after said step of exposing said surface of said semiconductor substrate, a thermal oxidation process to said semiconductor substrate to form a second insulation film on said surface of said semiconductor substrate in said second active region and on said first silicon film in said memory cell region and said first and third active regions;

exposing, after said step of applying said thermal oxidation process, said first insulation film by selectively removing said second insulation film and said first silicon film from said first active region while leaving said second insulation film over said second active region and further leaving said second insulation film and said first silicon film over said non-volatile memory cell region and said second and third active regions;

introducing, after said step of exposing said first insulation film, an impurity element selectively into said first active region through said first insulation film;

exposing, after said step of introducing said impurity element, said surface of said semiconductor substrate by selectively removing said first insulation film from said first active region while leaving said second insulation film over said second active region and further leaving said first silicon film and said second insulation film over said non-volatile memory cell region and said third active region; and exposing, after said step of exposing said surface of said semiconductor substrate by selectively removing said first insulating film, said surface of said semiconductor substrate by selectively removing said second insulation film and said first silicon film from said memory cell region while leaving said second insulation film and said first silicon film over said third active region and further leaving said second insulation film over said second active region;

applying, after said step of exposing said surface of said semiconductor substrate by selectively removing said second insulating film, a thermal oxidation process to said semiconductor substrate to form a third insulation film in said memory cell region and simultaneously a fourth insulation film in said first active region, after said step of forming said device insulation region, said second active region and said memory cell region experiences an HF etching process only once, respectively, while said second and third active regions do not experience an HF etching process after said step of forming said device isolation region.

14. A method of fabricating a semiconductor integrated circuit, comprising the steps of:

forming a device isolation structure on a semiconductor substrate so as to define a non-volatile memory cell region and first through third active regions;

forming, after said step of forming said device isolation structure, a first oxide film, a nitride film and a second oxide film on each of said non-volatile memory cell region and said first through third active regions so as to cover a surface of said semiconductor substrate;

exposing, after said step of forming said first oxide film, a nitride film and a second oxide film, said surface of said semiconductor substrate by removing said first oxide film, said nitride film and said second oxide film selectively from said second active region while leaving said first oxide film, said nitride film and said second oxide film over said non-volatile memory cell region and said first and third active regions;

applying, after said step of exposing said surface of said semiconductor substrate a thermal oxidation process to said semiconductor substrate, said first oxide film, said nitride film and said second oxide film to form a first insulation film on said surface of said semiconductor substrate in said second active region;

exposing, after said step of applying said thermal oxidation process, said surface of said semiconductor substrate by removing said first oxide film, said nitride film and said second oxide film selectively from said first active region while leaving said first oxide film, said nitride film and said second oxide film over said non-volatile memory cell region and said second and second active regions;

applying, after said step of exposing said surface of said semiconductor substrate, a thermal oxidation process to said semiconductor substrate, said first oxide film, said nitride film and said second oxide film to form a second insulation film) on said surface of said semiconductor substrate in said first active region;

exposing, after said step of applying said thermal oxidation process, said surface of said semiconductor substrate by selectively removing said first oxide film, said nitride film and said second oxide film from said third active region while leaving said first oxide film, said nitride film and said second oxide film over said non-volatile memory cell region and further leaving said second insulation film over said first active region and said first insulation film over said second active regions;

applying, after said step of exposing said surface of said semiconductor substrate, a thermal oxidation process to said semiconductor substrate, said first oxide film, said nitride film and said second oxide film to form a third insulation film on said surface of said semiconductor substrate in said third active region, after said step of forming said device isolation region, said first and second active regions experience a HF etching process only once, respectively, while said non-volatile memory cell region and said third device region do not experience an HF etching process after said step of forming said device isolation region.

* * * * *

UNITED STATES PATENT AND TRADEMARK OFFICE
CERTIFICATE OF CORRECTION

PATENT NO.      : 7,635,653 B2                                    Page 1 of 1
APPLICATION NO. : 11/134419
DATED           : December 22, 2009
INVENTOR(S)     : Hashimoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 367 days.

Signed and Sealed this

Ninth Day of November, 2010

David J. Kappos
*Director of the United States Patent and Trademark Office*